United States Patent [19]
Maesako et al.

[11] Patent Number: 6,101,146
[45] Date of Patent: Aug. 8, 2000

[54] SEMICONDUCTOR INTEGRATED CIRCUIT DEVICE

[75] Inventors: Taketo Maesako; Kouki Yamamoto; Yoshinori Matsui; Kenichi Sakakibara, all of Tokyo, Japan

[73] Assignee: NEC Corporation, Tokyo, Japan

[21] Appl. No.: 09/153,535

[22] Filed: Sep. 16, 1998

[30]     Foreign Application Priority Data

Sep. 16, 1997 [JP] Japan .................................. 9-290236

[51] Int. Cl.⁷ .................................................. G11C 8/00
[52] U.S. Cl. ........................................ 365/230.03; 365/63
[58] Field of Search ............................... 365/230.03, 51, 365/63

[56]                References Cited

U.S. PATENT DOCUMENTS

| | | | |
|---|---|---|---|
| 4,541,076 | 9/1985 | Bowers et al. ........................... | 365/190 |
| 5,226,009 | 7/1993 | Arimoto .................................... | 365/49 |
| 5,680,363 | 10/1997 | Dosaka et al. ...................... | 365/230.03 |
| 5,793,686 | 8/1998 | Furutani ............................. | 365/230.03 |
| 5,844,856 | 12/1998 | Taylor ................................ | 365/230.03 |

FOREIGN PATENT DOCUMENTS

| | | |
|---|---|---|
| 0548 964 A2 | 6/1993 | European Pat. Off. . |
| 57-20983 | 2/1982 | Japan . |
| 60-7690 | 1/1985 | Japan . |
| 62-38590 | 2/1987 | Japan . |
| 1-146187 | 6/1989 | Japan . |
| 4-252486 | 9/1992 | Japan . |
| 4-318389 | 11/1992 | Japan . |
| 5-2872 | 1/1993 | Japan . |
| 5-210974 | 8/1993 | Japan . |
| WO98/19308 | 5/1998 | WIPO . |

OTHER PUBLICATIONS

European Search Report dated Feb. 26, 1999.
JPO; "Patent Abstracts of Japan" dated Jun. 4, 1992; vol. 16; No. 243; P–1364.
Markus Levy, Technical Editor, "The Dynamics of Dram Technology Multiply, Complicate Design Options", Jan. 5, 1995, pp. 46–57.

*Primary Examiner*—Son T. Dinh
*Attorney, Agent, or Firm*—McGinn & Gibb, P.C.

[57]             ABSTRACT

A semiconductor integrated circuit device is comprised a main memory portion constructed with memory cells arranged in a plurality of rows and in a plurality of columns, a sub memory portion constructed with a plurality of memory cells arranged in a plurality of rows and in a plurality of columns and a bi-directional data transfer circuit for connecting the main memory portion and the sub memory portion through data transfer bus lines, respectively, wherein the data transfer bus lines in a memory cell area of the main memory portion are arranged in parallel to bit lines in a column direction and connected to the bit lines through a column selection circuit. Therefore, the semiconductor integrated circuit device of the present invention has a main memory suitable for being accessed from a plurality of data processors.

10 Claims, 100 Drawing Sheets

PIN ARRANGEMENT

64M SDRAM + 16K SRAM ( x 8 )

| | | | | |
|---|---|---|---|---|
| Vcc | 1 | | 54 | Vss |
| DQ0 | 2 | | 53 | DQ7 |
| VccQ | 3 | | 52 | VssQ |
| NC | 4 | | 51 | NC |
| DQ1 | 5 | | 50 | DQ6 |
| VssQ | 6 | | 49 | VccQ |
| NC | 7 | | 48 | NC |
| DQ2 | 8 | | 47 | DQ5 |
| VccQ | 9 | | 46 | VssQ |
| NC | 10 | | 45 | NC |
| DQ3 | 11 | | 44 | DQ4 |
| VssQ | 12 | 54 pin | 43 | VccQ |
| NC | 13 | 400 mil x 875 mil | 42 | NC |
| Vcc | 14 | 0.8 mm Pitch | 41 | Vss |
| NC | 15 | TSOP II | 40 | NC, VREF |
| /WE | 16 | | 39 | DQM |
| /CAS | 17 | | 38 | CLK |
| /RAS | 18 | | 37 | CKE |
| /CS | 19 | | 36 | NC |
| A13 (BA) | 20 | | 35 | A11 |
| A12 | 21 | | 34 | A9 |
| A10 (AP) | 22 | | 33 | A8 |
| A0 | 23 | | 32 | A7 |
| A1 | 24 | | 31 | A6 |
| A2 | 25 | | 30 | A5 |
| A3 | 26 | | 29 | A4 |
| Vcc | 27 | | 28 | Vss |

FIG. 7

PIN ARRANGEMENT

64M SDRAM + 16K SRAM ( x 4 )

| Left Label | Pin | Pin | Right Label |
|---|---|---|---|
| Vcc | 1 | 54 | Vss |
| NC | 2 | 53 | NC |
| VccQ | 3 | 52 | VssQ |
| NC | 4 | 51 | NC |
| DQ0 | 5 | 50 | DQ3 |
| VssQ | 6 | 49 | VccQ |
| NC | 7 | 48 | NC |
| NC | 8 | 47 | NC |
| VccQ | 9 | 46 | VssQ |
| NC | 10 | 45 | NC |
| DQ1 | 11 | 44 | DQ2 |
| VssQ | 12 | 43 | VccQ |
| NC | 13 | 42 | NC |
| Vcc | 14 | 41 | Vss |
| NC | 15 | 40 | NC, VREF |
| /WE | 16 | 39 | DQM |
| /CAS | 17 | 38 | CLK |
| /RAS | 18 | 37 | CKE |
| /CS | 19 | 36 | NC |
| A13 (BA) | 20 | 35 | A11 |
| A12 | 21 | 34 | A9 |
| A10 (AP) | 22 | 33 | A8 |
| A0 | 23 | 32 | A7 |
| A1 | 24 | 31 | A6 |
| A2 | 25 | 30 | A5 |
| A3 | 26 | 29 | A4 |
| Vcc | 27 | 28 | Vss |

54 pin
400 mil x 875 mil
0.8 mmPitch
TSOP II

FIG. 8

PIN ARRANGEMENT

64M SDRAM + 16K SRAM ( x 4 )

| | | | | |
|---|---|---|---|---|
| Vcc | 1 | | 54 | Vss |
| DQ0 | 2 | | 53 | DQ15 |
| VccQ | 3 | | 52 | VssQ |
| DQ1 | 4 | | 51 | DQ14 |
| DQ2 | 5 | | 50 | DQ13 |
| VssQ | 6 | | 49 | VccQ |
| DQ3 | 7 | | 48 | DQ12 |
| DQ4 | 8 | | 47 | DQ11 |
| VssQ | 9 | | 46 | VssQ |
| DQ5 | 10 | | 45 | DQ10 |
| DQ6 | 11 | | 44 | DQ9 |
| VssQ | 12 | 54 pin | 43 | VccQ |
| DQ7 | 13 | 400 mil x 875 mil | 42 | DQ8 |
| Vcc | 14 | 0.8 mm Pitch | 41 | Vss |
| LDQM | 15 | TSOP II | 40 | NC, VREF |
| /WE | 16 | | 39 | UDQM |
| /CAS | 17 | | 38 | CLK |
| /RAS | 18 | | 37 | CKE |
| /CS | 19 | | 36 | NC |
| A13 (BA) | 20 | | 35 | A11 |
| A12 | 21 | | 34 | A9 |
| A10 (AP) | 22 | | 33 | A8 |
| A0 | 23 | | 32 | A7 |
| A1 | 24 | | 31 | A6 |
| A2 | 25 | | 30 | A5 |
| A3 | 26 | | 29 | A4 |
| Vcc | 27 | | 28 | Vss |

FIG. 9

CORRESPONDENCE BETWEEN COMMANDS AND INPUT TERMINAL STATES

| | COMMAND | CKE n-1 | CKE n | /CS | /RAS | /CAS | /WE | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|---|---|---|---|
| ① | READ | H | x | L | H | L | H | x | x | x | SRAM COLUMN SELECTION | | | | | | SRAM ROW SELECTION | | | | |
| ② | WRITE | H | x | L | H | L | L | x | x | x | SRAM COLUMN SELECTION | | | | | | SRAM ROW SELECTION | | | | |
| ③ | PREFETCH | H | x | L | H | H | L | BANK SELECTION | x | x | L | L | x | x | x | x | x | SRAM ROW SELECTION | | | |
| ④ | PREFETCH (AUTO PRECHARGE) | H | x | L | H | H | L | BANK SELECTION | x | x | H | L | x | x | x | x | x | SRAM ROW SELECTION | | | |
| ⑤ | RESTORE | H | x | L | H | H | L | BANK SELECTION | x | x | L | H | x | x | x | x | x | SRAM ROW SELECTION | | | |
| ⑥ | RESTORE (AUTO PRECHARGE) | H | x | L | H | H | L | BANK SELECTION | x | x | H | H | x | x | x | x | x | SRAM ROW SELECTION | | | |
| ⑦ | ACTIVE | H | x | L | L | H | H | BANK SELECTION | x | DRAM ROW SELECTION | | | | | | | | | | | |
| ⑧ | PRECHARGE | H | x | L | L | H | L | BANK SELECTION | x | DRAM ROW SELECTION | | | | | | DRAM COLUMN SELECTION | | | | | |
| ⑨ | ALL BANK PRECHARGE | H | x | L | L | H | L | x | x | x | L | x | x | x | x | x | x | x | x | x | x |
| ⑩ | CBR REFRESH | H | x | L | L | L | H | x | x | x | H | x | x | x | x | x | x | x | x | x | x |
| ⑪ | NON-OPERATION | H | x | L | H | H | H | x | x | x | x | x | x | x | x | x | x | x | x | x | x |
| ⑫ | DEVICE NON-SELECTION | H | x | H | x | x | x | x | x | x | x | x | x | x | x | x | x | x | x | x | x |
| ⑬ | REGISTER SETTING (1) | H | x | L | L | L | L | L | L | L | L | L | L | L | L | REGISTER SETTING | | | | | |
| | REGISTER SETTING (2) | H | x | L | L | L | L | L | L | L | L | L | L | L | H | REGISTER SETTING | | REGISTER SETTING | | | |

H: HIGH LEVEL   L: LOW LEVEL   x: HIGH OR LOW (DON'T CARE)

FIG. 10

REGISTER SETTING (a) 
| A13 | A12 | A11 | A10 | A9 | A8 | A7 | A6 | A5 | A4 | A3 | A2 | A1 | A0 |
|---|---|---|---|---|---|---|---|---|---|---|---|---|---|
| L | L | L | L | L | L | H | x | x | x | x | x | x | x |

REFRESH COUNTER TEST SET (STANDARD TEST SET)

(b)
| A13 | A12 | A11 | A10 | A9 | A8 | A7 | A6 | A5 | A4 | A3 | A2 | A1 | A0 |
|---|---|---|---|---|---|---|---|---|---|---|---|---|---|
|  |  |  |  | H | L |  |  |  |  |  |  |  |  |

UNUSED TEST SET (c)
| A13 | A12 | A11 | A10 | A9 | A8 | A7 | A6 | A5 | A4 | A3 | A2 | A1 | A0 |
|---|---|---|---|---|---|---|---|---|---|---|---|---|---|
| x | x | x | x | H | H | V | V | V | V | V | V | V | V |

DEVICE TEST SET (d)
| A13 | A12 | A11 | A10 | A9 | A8 | A7 | A6 | A5 | A4 | A3 | A2 | A1 | A0 |
|---|---|---|---|---|---|---|---|---|---|---|---|---|---|
| L | L | L | L | L | L | L | V | V | V | V | V | V | V |

MODE REGISTER SETTING COMMAND

H : HIGH LEVEL  
x : INVALID DATA (DON'T CARE)  
L : LOW LEVEL  
V : VALID DATA INPUT

FIG. 25

MODE REGISTER SETTING COMMAND

MODE REGISTER SETTING (1) COMMAND

| A13 | A12 | A11 | A10 | A9 | A8 | A7 | A6 | A5 | A4 | A3 | A2 | A1 | A0 |
|-----|-----|-----|-----|----|----|----|----|----|----|----|----|----|----|
| L | L | L | L | L | L | L | L | x | x | LATENCY | | | LAP TYPE |

| A0 | LAP TYPE |
|----|----------|
| L | SEQUENTIAL |
| H | INTERLEAVE |

| LATENCY | | |
|---|---|---|
| A3 | A2 | A1 | CAS LATENCY |
| L | L | L | UNUSE |
| L | L | H | UNUSE |
| L | H | L | 2 |
| L | H | H | UNUSE |
| H | L | L | UNUSE |
| H | L | H | UNUSE |
| H | H | L | UNUSE |
| H | H | H | UNUSE |

| BURST LENGTH | | | | |
|---|---|---|---|---|
| A5 | A4 | A3 | SEQUENTIAL | INTERLEAVE |
| L | L | L | 1 | 1 |
| L | L | H | 2 | 2 |
| L | H | L | 4 | 4 |
| L | H | H | 8 | 8 |
| H | L | L | 16 | 16 |
| H | L | H | UNUSE | UNUSE |
| H | H | L | UNUSE | UNUSE |
| H | H | H | UNUSE | UNUSE |

MODE REGISTER SETTING (2) COMMAND

| | A13 | A12 | A11 | A10 | A9 | A8 | A7 | A6 | A5 | A4 | A3 | A2 | A1 | A0 |
|---|-----|-----|-----|-----|----|----|----|----|----|----|----|----|----|----|
| CLK2 | L | L | L | L | L | L | L | H | BURST LENGTH | | | x | x | x |
| CLK1 | L | L | L | L | L | L | L | H | UNUSE | | | SRAM ROW DATA | | |

FIG. 26

LAP TYPE AND BURST ADDRESS SEQUENCE

| BURST LENGTH = 2 | LAP TYPE | |
|---|---|---|
| START ADDRESS (A0) | SEQUENTIAL | INTERLEAVE |
| 0 | 0, 1 | 0, 1 |
| 1 | 1, 0 | 1, 0 |

| BURST LENGTH = 4 | LAP TYPE | |
|---|---|---|
| START ADDRESS (A1 - A0) | SEQUENTIAL | INTERLEAVE |
| 0 0 | 0, 1, 2, 3 | 0, 1, 2, 3 |
| 0 1 | 1, 2, 3, 0 | 1, 0, 3, 2 |
| 1 0 | 2, 3, 0, 1 | 2, 3, 0, 1 |
| 1 1 | 3, 0, 1, 2 | 3, 2, 1, 0 |

| BURST LENGTH = 8 | LAP TYPE | |
|---|---|---|
| START ADDRESS (A2 - A0) | SEQUENTIAL | INTERLEAVE |
| 0 0 0 | 0, 1, 2, 3, 4, 5, 6, 7 | 0, 1, 2, 3, 4, 5, 6, 7 |
| 0 0 1 | 1, 2, 3, 4, 5, 6, 7, 0 | 1, 0, 3, 2, 5, 4, 7, 6 |
| 0 1 0 | 2, 3, 4, 5, 6, 7, 0, 1 | 2, 3, 0, 1, 6, 7, 4, 5 |
| 0 1 1 | 3, 4, 5, 6, 7, 0, 1, 2 | 3, 2, 1, 0, 7, 6, 5, 4 |
| 1 0 0 | 4, 5, 6, 7, 0, 1, 2, 3 | 4, 5, 6, 7, 0, 1, 2, 3 |
| 1 0 1 | 5, 6, 7, 0, 1, 2, 3, 4 | 5, 4, 7, 6, 1, 0, 3, 2 |
| 1 1 0 | 6, 7, 0, 1, 2, 3, 4, 5 | 6, 7, 4, 5, 2, 3, 0, 1 |
| 1 1 1 | 7, 0, 1, 2, 3, 4, 5, 6 | 7, 6, 5, 4, 3, 2, 1, 0 |

| BURST LENGTH = 16 | LAP TYPE | |
|---|---|---|
| START ADDRESS (A3 - A0) | SEQUENTIAL | INTERLEAVE |
| 0 0 0 0 | 0, 1, 2, 3, 4, 5, 6, 7, 8, 9, 10, 11, 12, 13, 14, 15 | 0, 1, 2, 3, 4, 5, 6, 7, 8, 9, 10, 11, 12, 13, 14, 15 |
| 0 0 0 1 | 1, 2, 3, 4, 5, 6, 7, 8, 9, 10, 11, 12, 13, 14, 15, 0 | 1, 0, 3, 2, 5, 4, 7, 6, 9, 8, 11, 10, 13, 12, 15, 14 |
| 0 0 1 0 | 2, 3, 4, 5, 6, 7, 8, 9, 10, 11, 12, 13, 14, 15, 0, 1 | 2, 3, 0, 1, 6, 7, 4, 5, 10, 11, 8, 9, 14, 15, 12, 13 |
| 0 0 1 1 | 3, 4, 5, 6, 7, 8, 9, 10, 11, 12, 13, 14, 15, 0, 1, 2 | 3, 2, 1, 0, 7, 6, 5, 4, 11, 10, 9, 8, 15, 14, 13, 12 |
| 0 1 0 0 | 4, 5, 6, 7, 8, 9, 10, 11, 12, 13, 14, 15, 0, 1, 2, 3 | 4, 5, 6, 7, 0, 1, 2, 3, 12, 13, 14, 15, 8, 9, 10, 11 |
| 0 1 0 1 | 5, 6, 7, 8, 9, 10, 11, 12, 13, 14, 15, 0, 1, 2, 3, 4 | 5, 4, 7, 6, 1, 0, 3, 2, 13, 12, 15, 14, 9, 8, 11, 10 |
| 0 1 1 0 | 6, 7, 8, 9, 10, 11, 12, 13, 14, 15, 0, 1, 2, 3, 4, 5 | 6, 7, 4, 5, 2, 3, 0, 1, 14, 15, 12, 13, 10, 11, 8, 9 |
| 0 1 1 1 | 7, 8, 9, 10, 11, 12, 13, 14, 15, 0, 1, 2, 3, 4, 5, 6 | 7, 6, 5, 4, 3, 2, 1, 0, 15, 14, 13, 12, 11, 10, 9, 8 |
| 1 0 0 0 | 8, 9, 10, 11, 12, 13, 14, 15, 0, 1, 2, 3, 4, 5, 6, 7 | 8, 9, 10, 11, 12, 13, 14, 15, 0, 1, 2, 3, 4, 5, 6, 7 |
| 1 0 0 1 | 9, 10, 11, 12, 13, 14, 15, 0, 1, 2, 3, 4, 5, 6, 7, 8 | 9, 8, 11, 10, 13, 12, 15, 14, 1, 0, 3, 2, 5, 4, 7, 6 |
| 1 0 1 0 | 10, 11, 12, 13, 14, 15, 0, 1, 2, 3, 4, 5, 6, 7, 8, 9 | 10, 11, 8, 9, 14, 15, 12, 13, 2, 3, 0, 1, 6, 7, 4, 5 |
| 1 0 1 1 | 11, 12, 13, 14, 15, 0, 1, 2, 3, 4, 5, 6, 7, 8, 9, 10 | 11, 10, 9, 8, 15, 14, 13, 12, 3, 2, 1, 0, 7, 6, 5, 4 |
| 1 1 0 0 | 12, 13, 14, 15, 0, 1, 2, 3, 4, 5, 6, 7, 8, 9, 10, 11 | 12, 13, 14, 15, 8, 9, 10, 11, 4, 5, 6, 7, 0, 1, 2, 3 |
| 1 1 0 1 | 13, 14, 15, 0, 1, 2, 3, 4, 5, 6, 7, 8, 9, 10, 11, 12 | 13, 12, 15, 14, 9, 8, 11, 10, 5, 4, 7, 6, 1, 0, 3, 2 |
| 1 1 1 0 | 14, 15, 0, 1, 2, 3, 4, 5, 6, 7, 8, 9, 10, 11, 12, 13 | 14, 15, 12, 13, 10, 11, 8, 9, 6, 7, 4, 5, 2, 3, 0, 1 |
| 1 1 1 1 | 15, 0, 1, 2, 3, 4, 5, 6, 7, 8, 9, 10, 11, 12, 13, 14 | 15, 14, 13, 12, 11, 10, 9, 8, 7, 6, 5, 4, 3, 2, 1, 0 |

FIG. 29

| COMMAND | CKE | | /CS | /RAS | /CAS | /WE | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|---|---|---|
| | n-1 | n | | | | | | | | | | | | | | | | | | |
| READ (3) | H | x | L | H | L | H | BURST LENGTH SELECTION | | | SRAM COLUMN SELECTION | | | | | | | SRAM ROW SELECTION | | | |
| WRITE (3) | H | x | L | H | L | H | BURST LENGTH SELECTION | | | SRAM COLUMN SELECTION | | | | | | | SRAM ROW SELECTION | | | |

H: HIGH LEVEL    L: LOW LEVEL    x: HIGH OR LOW (DON'T CARE)

FIG. 90

SEMICONDUCTOR INTEGRATED CIRCUIT DEVICE

BACKGROUND OF THE INVENTION

1. Field of the Invention

The present invention relates to a semiconductor integrated circuit device and, particularly, to a semiconductor integrated circuit device having a main memory portion and a sub-memory portion formed in a semiconductor substrate and a data transfer circuit provided between the main memory portion and the sub-memory portion.

2. Description of the Related Art

In general, a relatively low speed, inexpensive semiconductor device having large memory capacity, such as general purpose DRAM, is used as a main memory in a computer system.

In a recent computer system, an operating speed of a DRAM constituting a main memory is increased with increase of an operating speed of the system, particularly, of a MPU thereof. However, the operating speed of the DRAM is still insufficient and, in order to solve this problem, it is usual to provide a sub-memory between the MPU and the main memory. Such sub-memory is generally called as a cache memory and is constructed with a high speed SRAM or an ECLRAM.

The cache memory is generally provided externally of the MPU or within the MPU. In a recent work station or a personal computer, a semiconductor memory device composed of a DRAM constituting the main memory and a high speed SRAM as the cache memory which are formed on one and the same semiconductor substrate is used. Japanese Patent Application Laid-open Nos. Sho 57-20983, Sho 60-7690, Sho 62-38590 and Hei 1-146187 disclose examples of such semiconductor memory. Such semiconductor memory is sometimes called as cache DRAM or CDRAM since it includes the DRAM and the SRAM functioning as the cache memory, etc. The cache memory can ransfer data with respect to the DRAM and the SRAM bi-directionally. These prior arts have problems such as delay of data transfer operation in a case of cache mishit and techniques which solve such problem has been proposed. Examples of the proposed techniques are disclosed in Japanese Patent Application Laid-open Nos. Hei 4-252486, Hei 4-318389 and Hei 5-2872. In the techniques disclosed in these Japanese Patent Application Laid-open Nos., a latch or register function is provided in a bi-directional data transfer circuit between a DRAM portion and an SRAM portion, so that a data transfer from the SRAM portion to the DRAM portion and a data transfer from the DRAM portion to the SRAM portion can be done simultaneously and a speed of data transfer (copy back) at the cache mishit can be increased. This will be described with reference to Japanese Patent Application Laid-open No. Hei 4-318389 as an example. FIG. 92 shows schematically an example of a construction of a memory array portion of a CDRAM. In FIG. 92, a semiconductor memory device includes a DRAM array 9201 including dynamic memory cells, an SRAM array 9202 including static memory cells and a bi-directional transfer gate circuit 9203 for transferring data between the DRAM array 9201 and the SRAM array 9202. The DRAM array 9201 and the SRAM array 9202 are provided with row decoders and column decoders, respectively. Addresses given to the row decoder and the column decoder of the DRAM and the row decoder and the column decoder of the SRAM are mutually independent and given through different address pin terminals. FIGS. 93 and 94 show a construction of the bi-directional transfer gate circuit 9203 in detail. According to this construction, the data transfer from SBL to GIO and the data transfer from GIO to SBL are made through different data transfer paths and it is possible to execute these data transfers simultaneously by functions of a latch 9302 and an amplifier 9306.

However, there are the following problems in the above mentioned CDRAM. First, since address pin terminals and control pin terminals are provided separately for the DRAM array and the SRAM array, the number of external pin terminals is very large compared with that of a single DRAM. Therefore, there is no compatibility of a substrate, etc., on which the semiconductor memory is mounted, with respect to that of a usual DRAM, etc. Second, in the bi-directional transfer gate circuit, the number of circuits each having a area large enough to realize the above mentioned transfer is limited and, therefore, the number of transfer buses is limited. As a result, the number of bits which can be transferred at once between the DRAM array and the SRAM array is limited to 16 bits. Further, the transfer buses are arranged in an area in which column selection lines are not arranged and the number of the transfer buses is limited by a width of the area. Generally, the smaller the number of bits transferred at once provides the lower the cache bit rate.

Japanese Patent Application Laid-open No. Hei 5-210974 discloses a technique in which address input signal pins of a CDRAM are made common for both a DRAM array and an SRAM array. FIGS. 95 and 96 show a construction of this technique. In this example, the second problem that the number of bits transferred at once between the DRAM array and the SRAM array is limited to 16 bits as in the CDRAM is left as it is. FIGS. 97 and 98 show a construction in which a memory capacity of an SRAM is increased in order to improve the cache hit rate. In this construction, however, the substrate compatibility is lost due to input pins for selecting SRAM cell and the second problem that the number of bits transferred at once between the DRAM cell array and the SRAM cell array is limited to 16 bits as in the CDRAM is solved.

As another example in this technical field, there is an EDRAM (Enhanced DRAM) which is a DRAM with a cache SRAM, as disclosed in, for example, EDN Jan. 5, 1995, pp. 46 to 56. An EDRAM shown in FIG. 99 is different in construction from a general purpose DRAM having the same memory capacity and has no substrate compatibility although a DRAM and an SRAM commonly use address input terminals. The number of bits transferred at once to the SRAM is the same as the number of sense amplifiers which are activated at once and, in this example, 512(×4) bits are transferred at once. Although, in this construction of the EDRAM, the number of bits transferred at once is large, the SRAM thereof which holds data has a memory capacity of only 1 set (1 row) for bits to be transferred at once. Although the larger the number of bits transferred at one generally provides the higher the cache hit rate, the cache mishit rate is increased since the EDRAM has cache memories of only 1 set (1 row) and, therefore, a sufficient speed-up of the whole system can not be achieved. In order to increase the number of sets (the number of rows) of the cache memories in the EDRAM, an SRAM register and a block selector, etc., must be additionally provided for every predetermined number of blocks of DRAM cell arrays, resulting in a substantial increase of the area occupied by the circuits.

Further, there is a recent problem of degradation of cache hit rate when there are access requests from a plurality of processing devices as shown in FIG. 100. When the CDRAM or the EDRAM is used as a main memory shown in FIG. 100 and there are access requests from a plurality of processing devices (memory masters), the cache hit rate is lowered and the speed-up of the whole system operation is restricted since the number of address requests of different sets (rows) may be increased.

SUMMARY OF THE INVENTION

With popularization of the system having a plurality of processing devices (memory masters), a memory portion which can respond to not access requests of one kind as in the conventional memory portion but access requests of a plurality of kinds. That is, a memory having a construction different from that of the conventional memory is required.

An object of the present invention is to provide a semiconductor integrated circuit device which, in order to achieve a high speed operation of a whole system without lowering cache hit rate even when there are access requests from a plurality of memory masters, includes a main memory portion and a sub memory portion capable of being assigned correspondingly to a plurality of access requests.

Another object of the present invention is to provide a semiconductor integrated circuit device having a main memory portion and a sub memory portion, an external terminal thereof being constructed similarly to a construction of that of the main memory portion.

A further object of the present invention is to provide a semiconductor integrated circuit device including a main memory portion and a sub memory portion, the number of bits capable of being transferred between the main memory portion and the sub memory portion at once and the number of sets thereof being optimized.

Another object of the present invention is to provide a semiconductor integrated circuit device including a main memory portion and a sub memory portion, in which a read/write operation of the sub memory portion and a data transfer operation between the main memory portion and the sub memory portion can be performed simultaneously.

In order to achieve the above objects, a semiconductor integrated circuit device according to the present invention includes a main memory portion constructed with memory cells arranged in a plurality of rows and in a plurality of columns, a sub memory portion constructed with a plurality of memory cells arranged in a plurality of rows and in a plurality of columns and a bi-directional data transfer circuit for connecting said main memory portion and said sub memory portion through data transfer bus lines, respectively, wherein said data transfer bus lines in a memory cell area of said main memory portion are arranged in parallel to bit lines in a column direction and connected to said bit lines through a column selection circuit.

A semiconductor memory device according to another aspect of the present invention includes a main memory portion constructed with memory cells arranged in a plurality of rows and in a plurality of columns, a sub memory portion constructed with a plurality of memory cells arranged in a plurality of rows and in a plurality of columns and a bi-directional data transfer circuit for connecting said main memory portion and said sub memory portion through data transfer bus lines, respectively, wherein said main memory portion is constituted with a plurality of memory cell arrays, said data transfer bus lines are provided every memory cell array and selection circuits provided between said data transfer bus lines and said memory cell arrays of said sub memory portion, respectively, said selection circuits being controlled by selection signals of said memory cell arrays.

BRIEF DESCRIPTION OF THE DRAWINGS

The above and other objects, features and advantages of the present invention will become more apparent by reference to the following detailed description of the present invention taken in conjunction with the accompanying drawings, in which:

FIG. 7 shows an arrangement of external terminals of the semiconductor memory device shown in FIG. 1;

FIG. 8 shows an arrangement of external terminals of the semiconductor memory device shown in FIG. 1;

FIG. 9 shows an arrangement of external terminals of the semiconductor memory device shown in FIG. 1;

FIG. 10 shows a correspondence between various commands determining operating functions of the semiconductor memory device shown in FIG. 1 and the external terminals;

FIG. 25 shows states of the external terminals showing a register setting command shown in FIG. 10;

FIG. 26 shows states of the external terminals showing a mode register setting command which is a portion of the register setting command shown in FIG. 10;

FIG. 29 is a timing chart of data output having burst length of 4 and write latency of 0 at a write command input;

FIG. 90 is a correspondence table showing read(3)/write (3) command of a real time mode setting function and the state of the respective input terminals;

DETAILED DESCRIPTION OF THE PREFERRED EMBODIMENTS

(1) Basic Construction

A basic construction of an embodiment of the present invention will be described.

A semiconductor integrated circuit device according to the present invention includes a semiconductor memory device and a control device of the semiconductor memory device. The semiconductor memory device includes a main memory portion and a sub memory portion and a bi-directional data transfer is possible between the main memory portion and the sub memory portion. The sub memory portion is constructed with a plurality of memory cell groups each being able to function as an independent cache memory. In the semiconductor memory device of the present invention, the number of control terminals and the number of address terminals can be the same as those necessary to control the main memory portion.

The semiconductor integrated circuit device will be described by taking an embodiment which has a synchronous interface having a ×8 2-bank constriction including a 64-Mbit DRAM array as the main memory portion and a 16-Kbit SRAM array as the sub memory portion.

(2) Block Diagram

Figure 1:
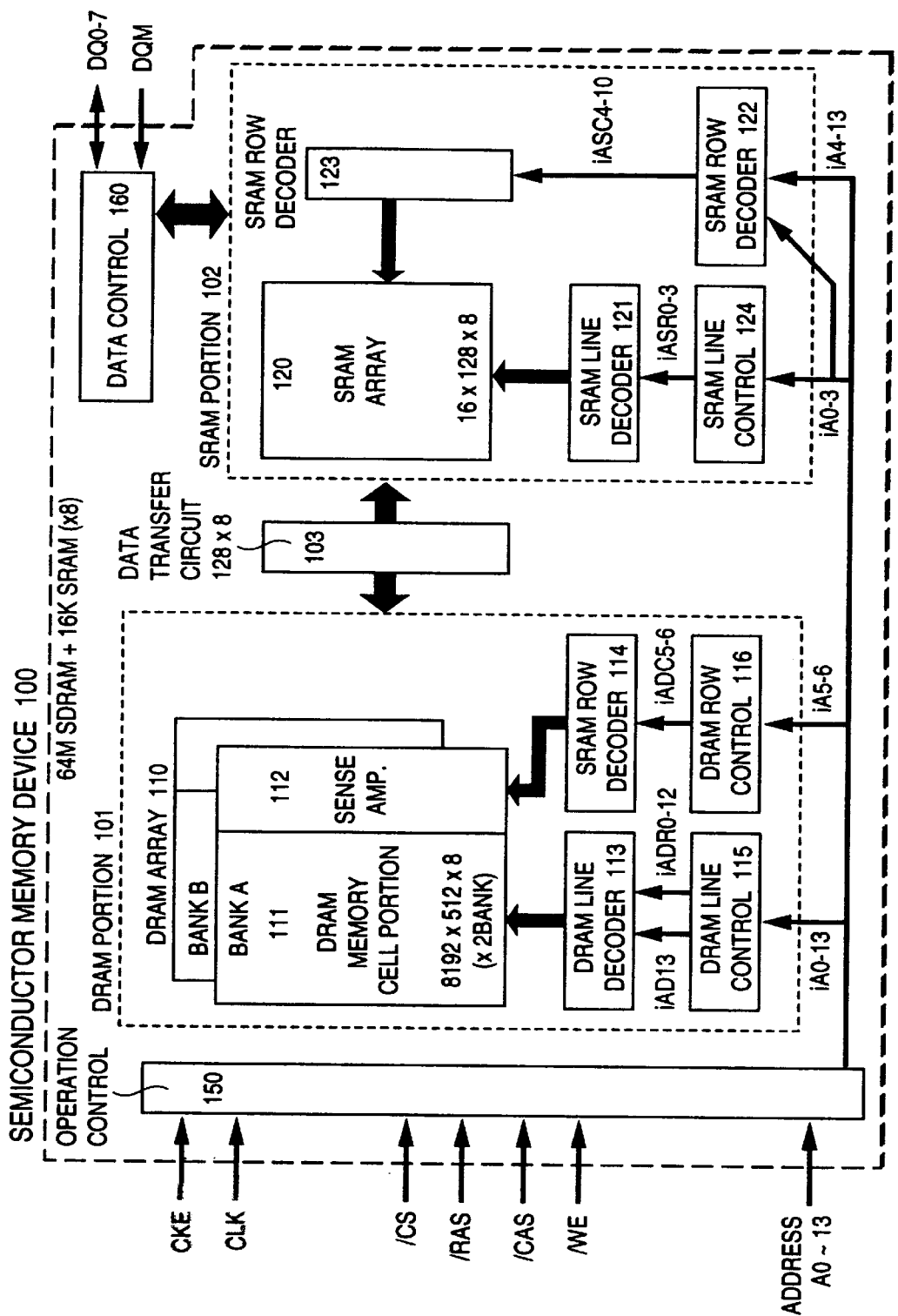
FIG. 1 is a block diagram showing a whole construction of a semiconductor memory device according to a first embodiment of the present invention.

FIG. 1 is a block diagram schematically showing a construction of a whole semiconductor memory device according to an embodiment of the present invention. In FIG. 1, the semiconductor memory device 100 includes a dynamic RAM (DRAM) portion 101 as a main memory portion, a static RAM (SRAM) portion 102 as a sub memory portion and a bi-directional data transfer circuit 103 for data transfer between the DRAM portion 101 and the SRAM portion 102.

The DRAM portion 101 includes a DRAM array 110 having a plurality of dynamic memory cells arranged in a row and column matrix, a DRAM row control circuit 115 for generating a DRAM row selection signal and a bank selection signal from internal address signals iA0~iA13, a DRAM row decoder 113 responsive to the DRAM row selection signals iADR0~iADR12 and the bank selection signal iAD13 for selecting a corresponding row of the DRAM array 110, a DRAM column control circuit 116 for generating a DRAM column selection signal from the internal address signals iA5 and iA6 and a DRAM column decoder 114 responsive to the DRAM column selection signals iADC5 and iADC6 for selecting a corresponding column. Further, the DRAM array 110 includes a memory cell portion 111 and a sense amplifier 112 for detecting and amplifying data held in the selected DRAM cell. Further, the DRAM array 110 is divided to a plurality of blocks called banks and, in this embodiment, to two banks A and B one of which is selected by the bank selection signal iAD13.

The SRAM portion 102 includes an SRAM array 120 having a plurality of static memory cells arranged in a row and column matrix, an SRAM row control circuit 124 for generating an SRAM row selection signal from the internal address signals iA0~iA3, an SRAM row decoder 121 responsive to SRAM row selection signals iASR0~iASR3 for selecting one of SRAM cell groups (in this embodiment, cell groups divided every row), an SRAM column control circuit 122 for generating an SRAM column selection signal from the internal address signals iA0~iA3 and iA4~iA13 and an SRAM column decoder 123 for selecting a column by SRAM column selection signals iASC4~iASC10.

The semiconductor memory device 100 further includes an operation control circuit 150 for controlling an operation of the semiconductor memory device in response to an external input signal and a data control circuit 160 for controlling an external data input/output operation.

Although, in this embodiment, the DRAM and SRAM are used as the main memory portion and the sub memory portion, respectively, the present invention is not limited thereto. Instead of the DRAM, a memory such as SRAM, mask ROM, programmable ROM (PROM), erasable PROM (EPROM), electrically erasable PROM (EEPROM), flush EEPROM and ferroelectric memory may be used as the main memory portion. The memory constituting the main memory portion is preferably constructed such that the kind and specific function thereof can be efficiently utilized. For example, in a case where a DRAM is used as the main memory portion, a usual DRAM, an EDODRAM, a synchronous DRAM, a synchronous GRAM, a burst EDODRAM, a DDR synchronous DRAM, a DDR synchronous GRAM, an SLDRRAM or a RambusDRAM may be used. Further, any random access memory may be used as the sub memory portion provided that the memory allows access at higher speed than that of a memory used as the main memory portion. In a case where the main memory portion is constituted with a flush EEPROM, a memory capacity of the sub memory portion is preferably a half or more of a capacity of a unit erase sector of the flush EEPROM.

(3) System

The semiconductor memory device according to the present invention is provided with the SRAM column control circuit 122 and, therefore, an SRAM column control mode can be changed in SRAM cell group unit, as to be described in detail later. This function allows the setting of a lap time, a burst length and a latency, etc., (referred to as "data input/output mode", hereinafter) every SRAM cell group, so that the data input/output mode of each SRAM cell group is automatically determined within the semiconductor memory device when the SRAM cell group is selected, by preliminarily providing the setting. Therefore, there is no need of data control externally of the semiconductor memory device or an external data processing control for switching the data input/output mode.

Figure 2:
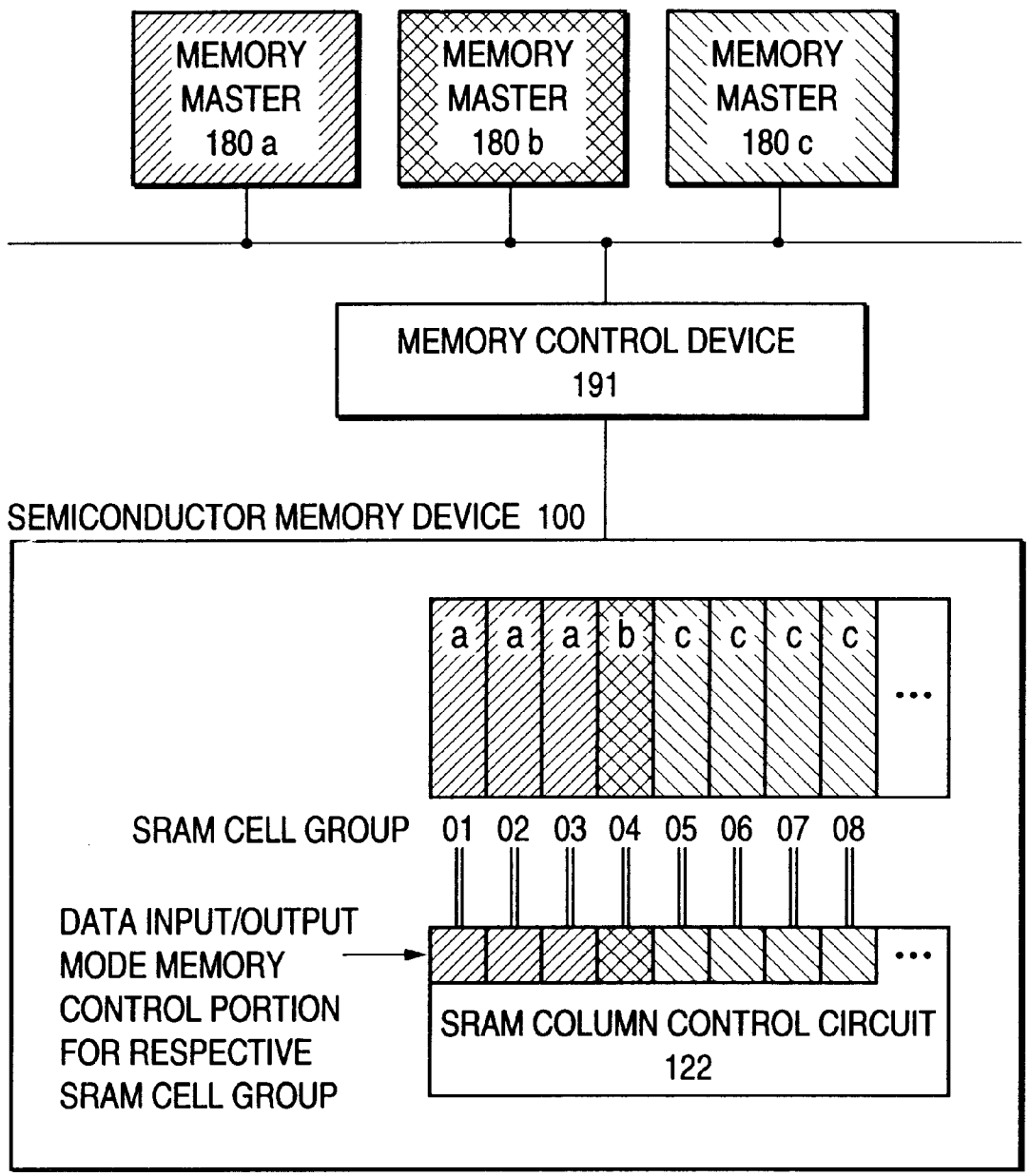
FIG. 2 is a block diagram of a memory system including the semiconductor memory device shown in FIG. 1 and a plurality of memory masters which perform access requests with respect to the semiconductor memory device.
Figure 3:
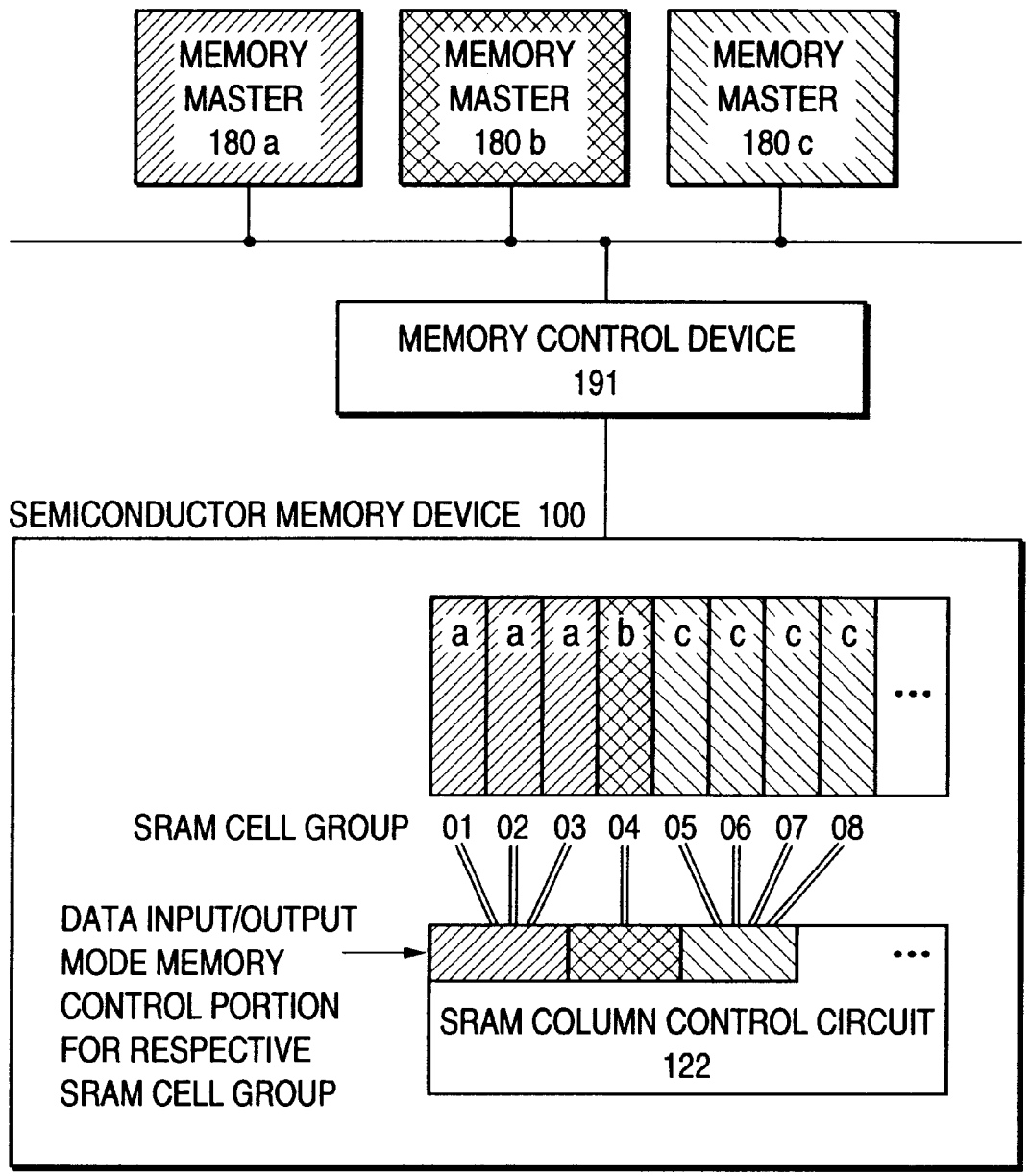
FIG. 3 is a block diagram of a memory system including the semiconductor memory device shown in FIG. 1 and a plurality of memory masters which perform access requests with respect to the semiconductor memory device.

The semiconductor memory device of the present invention has a function that, when it receives a plurality of access requests, the semiconductor memory device receives an allocation, assignment and/or re-assignment in SRAM cell group unit for every access request. FIG. 2 shows a memory system having a plurality of memory masters which perform access request to the semiconductor memory device 100 shown in FIG. 1. In FIG. 2, SRAM cell groups 01, 02 and 03 are assigned to an access request from a memory master 180a, SRAM cell group 04 is assigned to an access request from a memory master 180b and the SRAM cell groups 05, 06, 07 and 08 are assigned to an access request from a memory master 180c. The assignment of the SRAM cell groups to these access requests is variable and can be changed any time. Further, in FIG. 2, when the data input/output mode requested for the semiconductor memory device 100 by the memory master 180a is different from the data input/output mode requested for the semiconductor memory device by the memory master 180b, it is possible to perform the data input/output operation for the memory master 180a and the data input/output operation for the memory master 180b successively without using a special control signal. In order to realize such operation, the SRAM column control circuit 122 of the semiconductor memory device 100 includes a data input/output mode memory portion. The data input/output mode memory portion may have a 1:1 correspondence to the SRAM cell groups as shown in FIG. 2 or may correspond to a plurality of SRAM cell groups as shown in FIG. 3.

Figure 4:
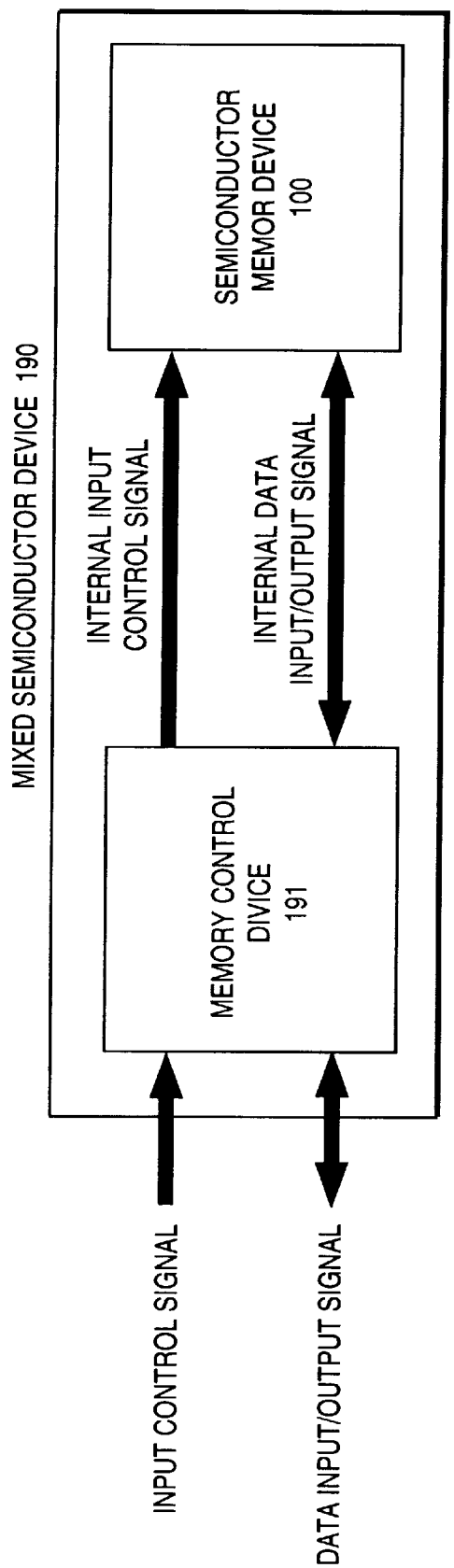
FIG. 4 is a block diagram of a semiconductor device comprising the semiconductor memory device shown in FIG. 1 and a memory control device for controlling and generating an input signal to the semiconductor memory device, which are formed on one and the same semiconductor substrate.
Figure 5:
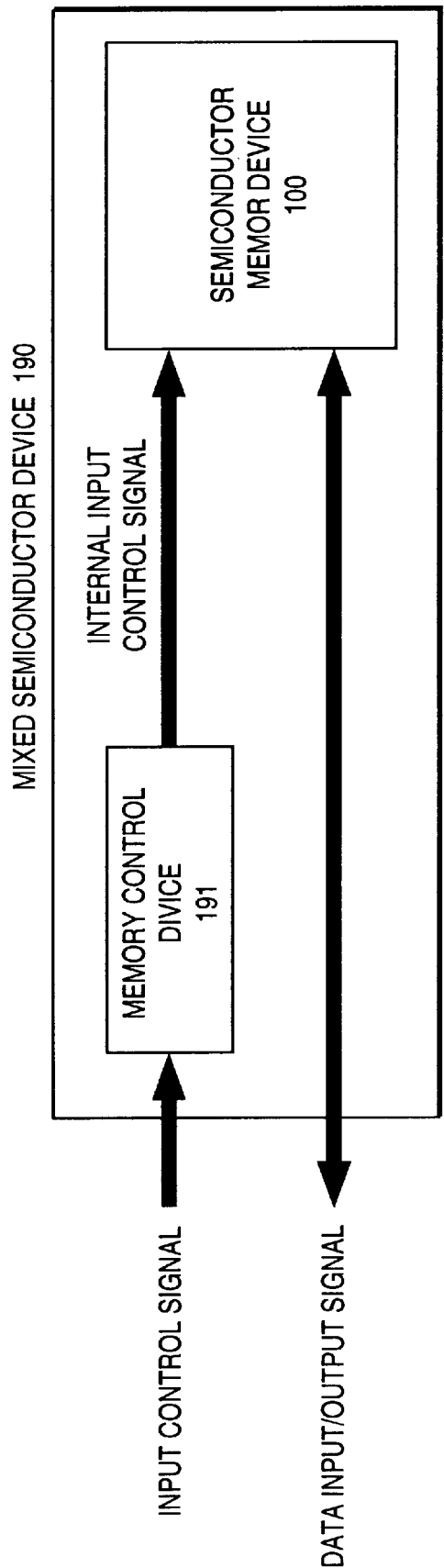
FIG. 5 is a block diagram of a semiconductor device comprising the semiconductor memory device shown in FIG. 1 and a memory control device for controlling and generating an input signal to the semiconductor memory device, which are formed on one and the same semiconductor substrate.
Figure 6:
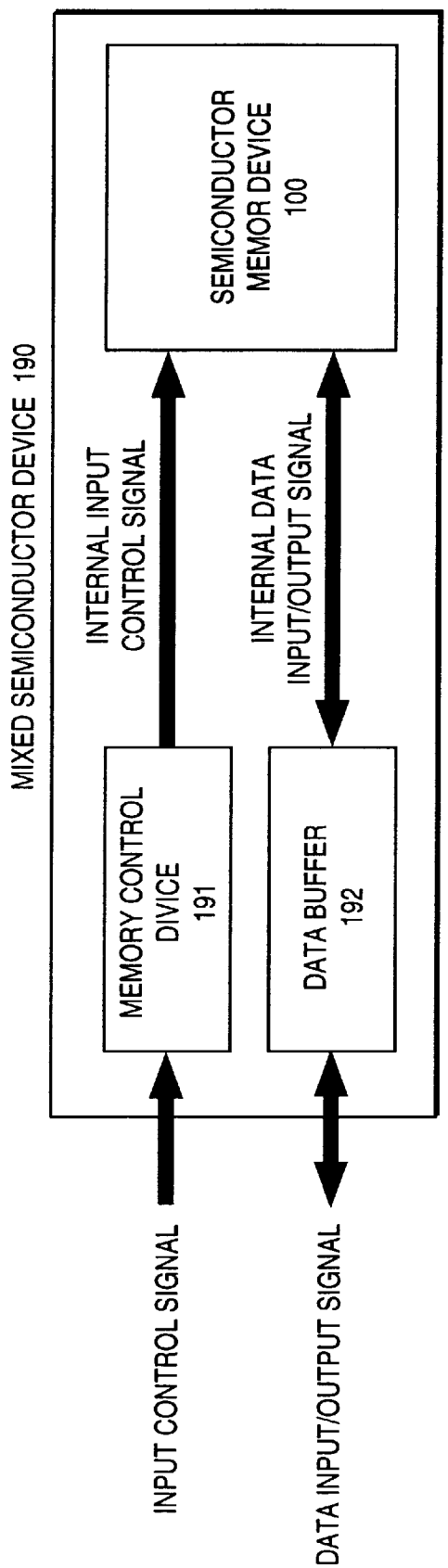
FIG. 6 is a block diagram of a semiconductor device comprising the semiconductor memory device shown in FIG. 1 and a memory control device for controlling and generating an input signal to the semiconductor memory device, which are formed on one and the same semiconductor substrate.

FIGS. 4, 5 and 6 show a mixed semiconductor device 190 composed of the semiconductor memory device 100 and a memory control device 191 mounted on one and the same semiconductor substrate as that of the semiconductor memory device, for controlling and generating an input signal to the semiconductor memory device 100 according to an access request from the memory masters. Such mixed semiconductor device 190 may have a construction in which an input/output operation for all signals is performed through a memory control device as shown in FIG. 4, a construction in which an input/output operation is performed by the semiconductor memory device 100 directly as shown in FIG. 5 or a construction in which a data input/output operation is performed by the semiconductor memory device 100 through a data buffer 192 as shown in FIG. 6. However, the present invention is not limited to these constructions of the mixed semiconductor device 190. In the mixed semiconductor device 190, it becomes possible to automatically assign the SRAM cell group or groups to access requests from the respective memory masters in the system shown in FIG. 2 or 3 within the semiconductor device.

(4) Pin Arrangement

FIG. 7 shows an example of a pin arrangement of a package of the semiconductor memory device according to the present invention. The semiconductor memory device shown in FIG. 7 has a ×8-bit, 2-bank construction including a 64-Mbit DRAM array and a 16-Kbit SRAM array and a synchronous interface and is housed in a 54 pin TSOP type II plastic package of 400 mil×875 mil with lead pitch of 0.8 mm. The number of pins and the pin arrangement of this pin construction are the same as those of a usual 64-Mbit synchronous DRAM. Further, the number of pins and the pin arrangement of a ×4-bit construction (FIG. 8), a ×16-bit construction (FIG. 9), a ×1-bit construction or a ×32-bit construction are the same as those of a corresponding synchronous DRAM, regardless of the number of banks.

Signals of the respective pins are defined as follows:

CLK: A clock signal CLK is a reference clock commonly used for all other input/output signals. That is, the clock signal CLK determines take-in timing of other input signals and output signal timing. A set-up/hold time of each external signal is defined with reference to a rising edge of the clock CLK.

CKE: A clock enable signal CKE determines whether or not a CLK signal subsequent thereto is effective. When the CKE signal is HIGH at the rising edge of the CLK signal, the CLK signal is determined as being effective and, when it is LOW, the CLK signal is determined as being invalid.

/CS: A chip select signal /CS determines whether or not external input signals /RAS, /CAS, /WE are accepted. When the signal /CS is LOW at the leading edge of the signal CLK, the /RAS signal, the /CAS signal and the /WE signal which are input at the same timing are taken in the operation control circuit. When the signal /CS is HIGH at the leading edge of the CLK signal, the /RAS signal, the /CAS signal and the /WE signal input at the same timing are neglected.

/RAS, /CAS, /WE: The respective control signals /RAS, /CAS and /WE in combination determine the operation of the semiconductor memory device.

A0~A13: Address signals A0~A13 are taken in the address control circuit correspondingly to the clock signal, sent to the DRAM row decoder, the DRAM column decoder, the SRAM row decoder and the SRAM column decoder and used to select a cell of the DRAM portion and a cell of the SRAM portion. Further, the address signals are taken in a mode register to be described later, according to an internal command signal to set the data input/output mode of the internal operation. The address signal A13 is a bank selection signal of the DRAM cell array, too.

DQM: A data mask signal DQM functions to invalidate (mask) a data input and output in byte unit.

DQ0~DQ7: Data signals DQ0~DQ7 are input/output data signals.

(5) Basic Operation

A basic operation of the semiconductor memory device according to the present invention will be described. It should be noted that commands and the number of data are a mere embodiment and other combinations are possible arbitrarily.

FIG. 10 shows an example of various commands determining operation functions of the semiconductor memory device according to the present invention and states of the external input control signals. It should be noted, however, that any other combination of the various commands determining the operational functions of the semiconductor memory device and the states of the external input control signals can be used.

In FIG. 10, the states of the respective input control signals at a rising edge of a reference clock signal CLK and operations determined thereby are shown. A symbol "H" indicates a logical high level, "L" a logical low level and "x" an arbitrary level. Further, input control signals CKEn-1 in FIG. 10 shows a state of the input control signal CKE in a period of a reference clock just preceding to an aimed reference clock and the control signal CKE to be described for the respective commands is the CKEn-1. The commands shown in FIG. 10 will be described in sequence.

1. [Read Command]

Read command is to execute a data read operation from an SRAM cell.

Figure 11:
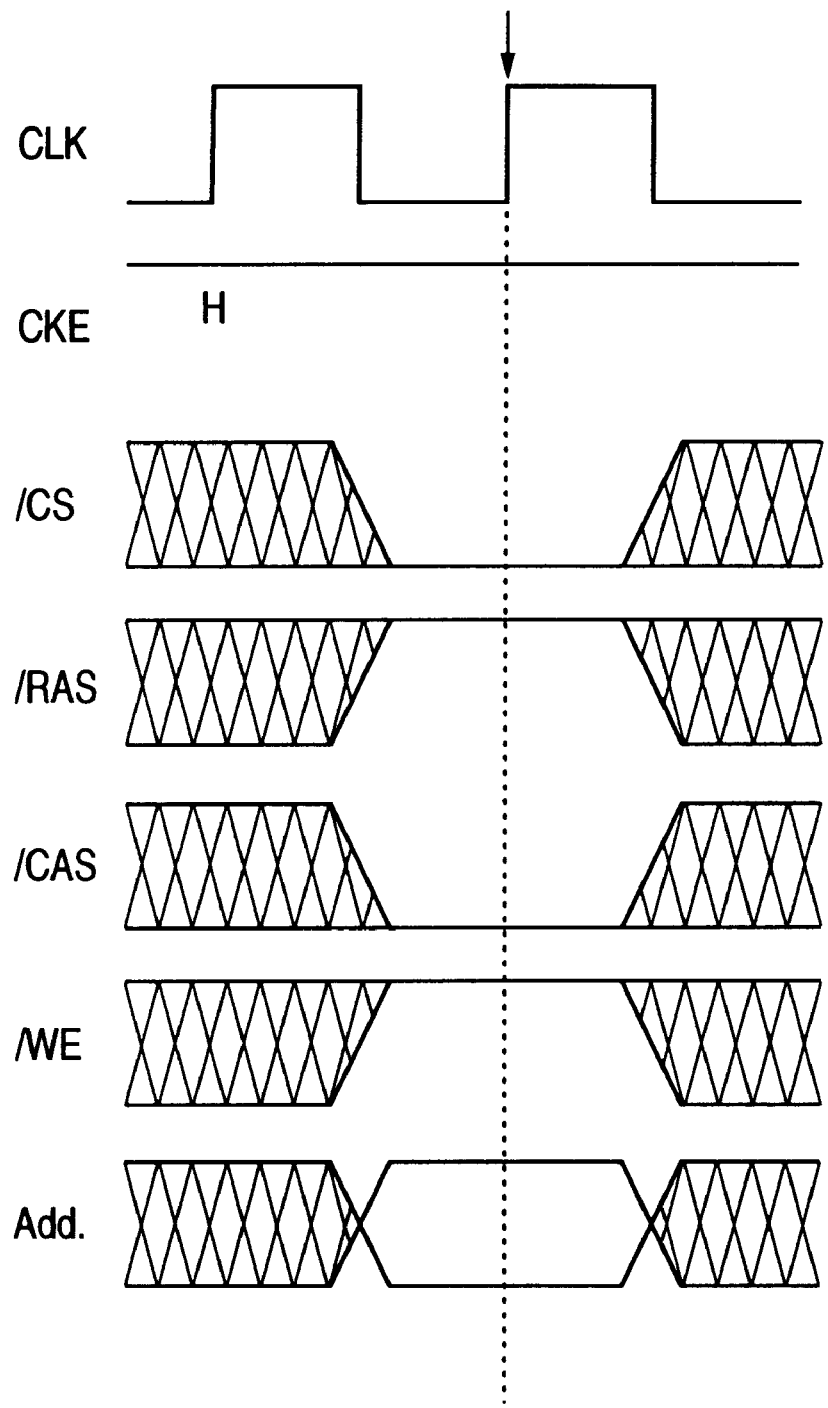
FIG. 11 shows states of the external terminals showing a read command shown in FIG. 10.

As shown in FIG. 11, the states of the respective input control signals at the rising edge of the external clock signal are CKE=H, /CS=L, /RAS=H, /CAS=L and /WE=H. At the time when this read command is input, the addresses A0~A3 and the addresses A4~A10 are taken in as the SRAM row selection addresses and as the SRAM column selection addresses, respectively. Data at these addresses are output to DQ0~DQ7 at a time delayed from the input of the read command by a latency.

When DQM=H with the clock set for the read command, the data output of the DQ0~DQ7 are masked and are not output externally.

Figure 30:
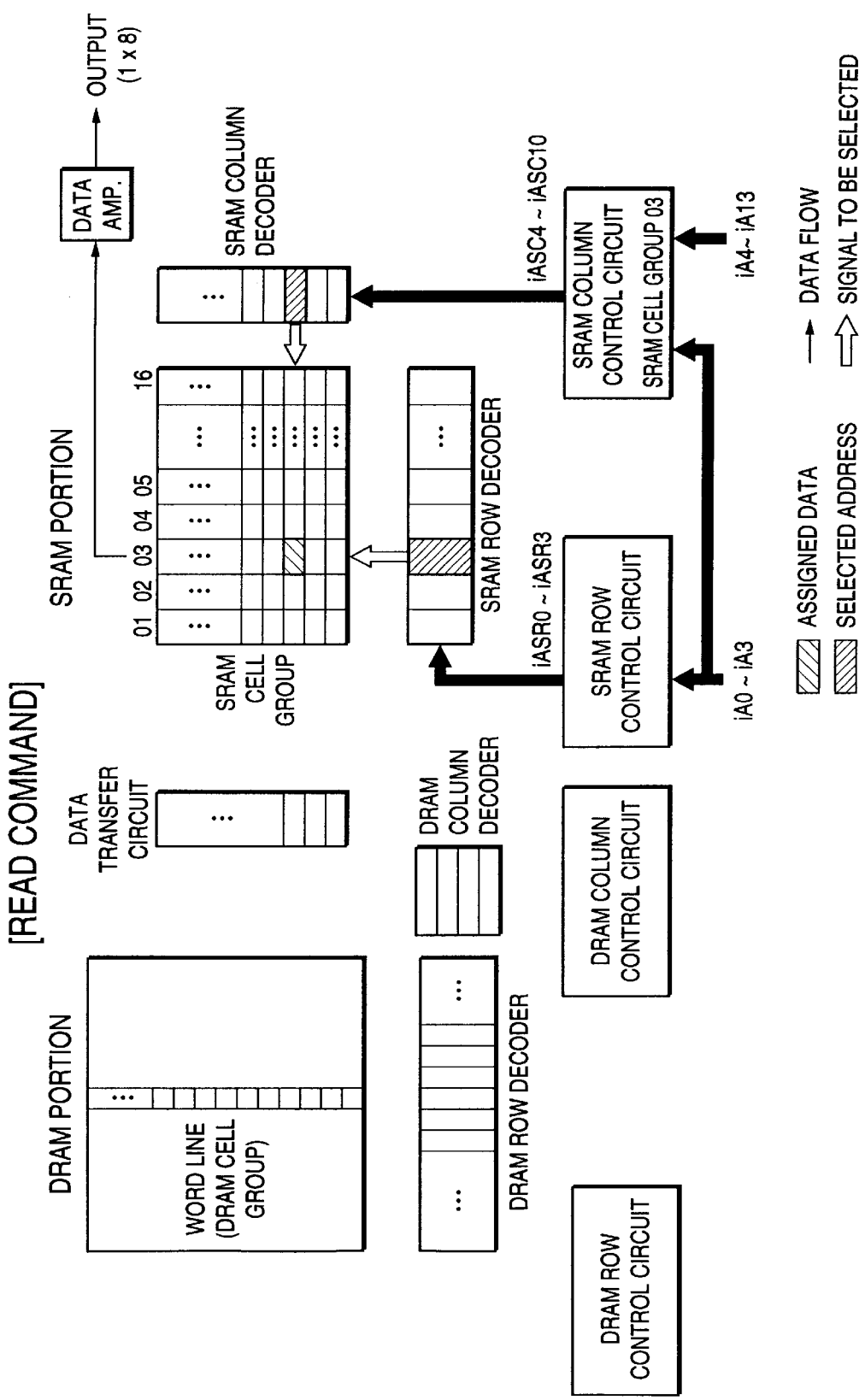
FIG. 30 is a flowchart of an address assignment and data in a read command operation.

FIG. 30 shows an address signal and a data flow in an internal operation according to this read command. SRAM cells are selected by the row selection of the SRAM row decoder by the internal address signals iA0~iA3 and the column selection of the SRAM column decoder by the SRAM selection signals iASC4~iASC10 generated from the internal address signals iA4~iA13. Data of the selected SRAM cells are output externally through the data amplifier in an assigned data input/output mode.

2. [Write Command]

The write command is to perform a write operation of data to the SRAM cell.

Figure 12:
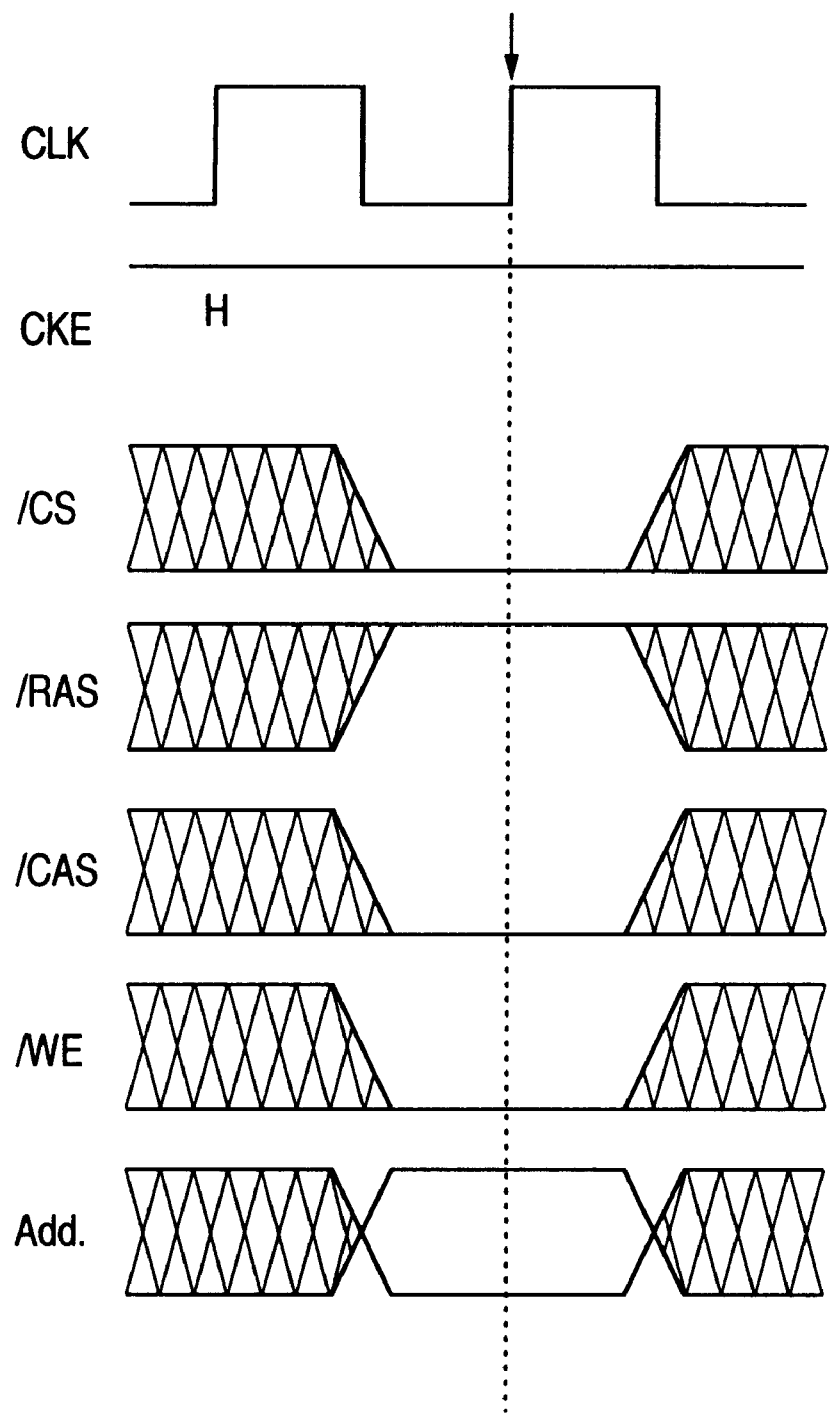
FIG. 12 shows states of the external terminals showing a write command shown in FIG. 10.

As shown in FIG. 12, the states of the respective input control signals at the rising edge of the external clock signal are CKE=H, /CS=L, /RAS=H, and /CAS=/WE=L. At the time when the write command is input, the addresses A0~A3 are taken as SRAM row selection addresses and the addresses A4~A10 are taken in as SRAM column selection addresses. As data to be written, the data of DQ0~DQ7 is taken in at a time delayed from the input of the write command by a latency.

When DQM=H with the clock for data take-in of DQ0~DQ7, the data output of the DQ0~DQ7 are masked and are not taken inside.

Figure 31:
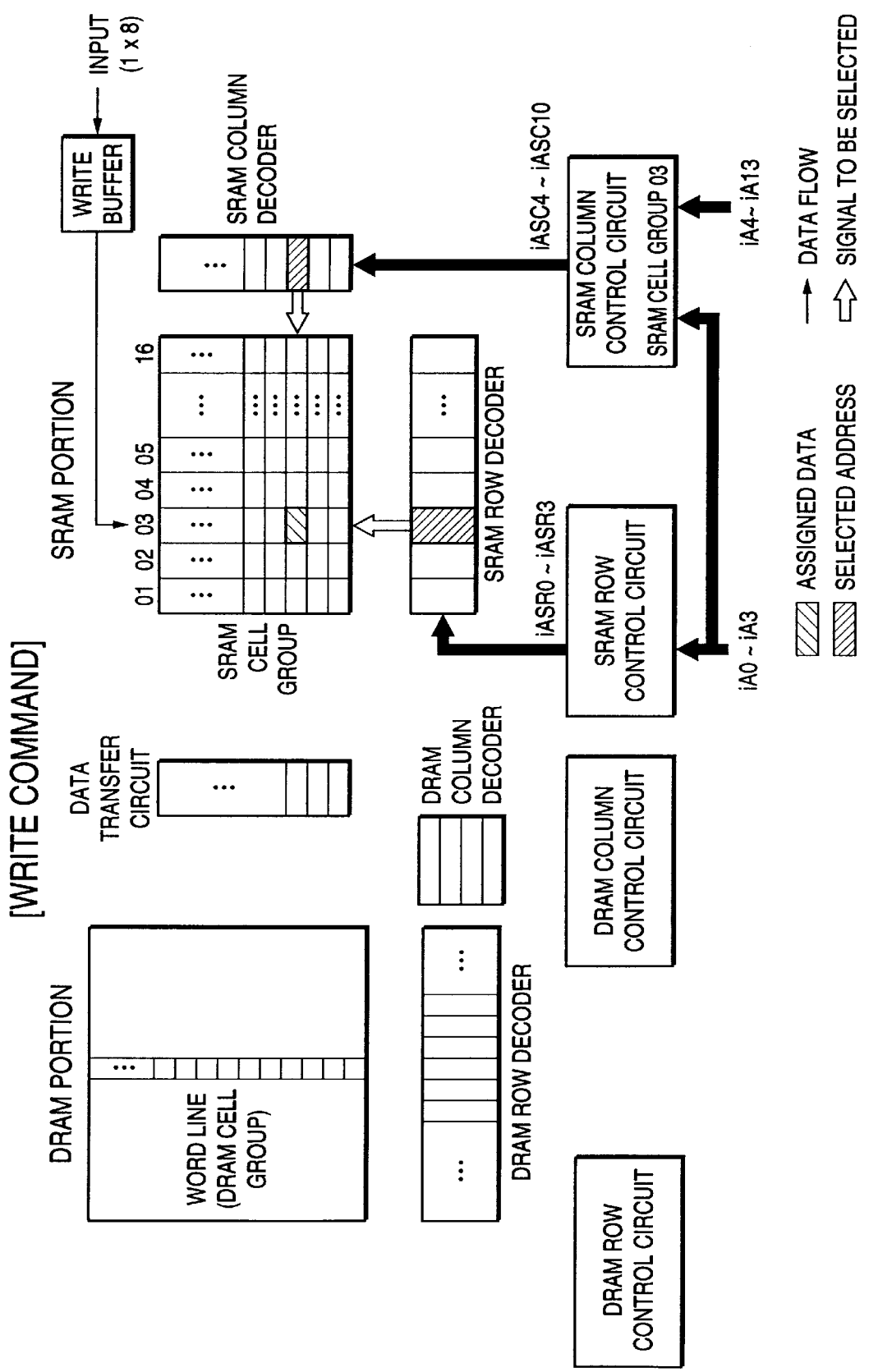
FIG. 31 is a flowchart of an address assignment and data in a write command operation.

FIG. 31 shows an address signal and a data flow in an internal operation according to this write command. SRAM cells are selected by the row selection of the SRAM row decoder by the SRAM row selection signals iASR0~iASR3 generated from the internal address signals iA0~iA3 and the column selection of the SRAM column decoder by the SRAM selection signal iASC4~iASC10 generated from the internal address signals iASR0~iASR3 and iA4~iA13. The write data taken from DQ0~DQ7 is written in the seleced SRAM cell through the write buffer.

As shown in FIGS. 30 and 31, the read command and the write command perform the read and write regardless of the DRAM portion and the data transfer portion. Therefore, these commands can operate even when data transfer operation between SRAM cell groups other than the SRAM row selected for the data input/output and the DRAM portion and/or the operation inside the DRAM portion still continues. On the contrary, even if the read command or the write command is operated, it is possible to operate by commands of data transfer operation between SRAM cell groups other than the SRAM row selected for the data input/output and the DRAM portion and/or the operation inside the DRAM portion.

3. [Prefetch Command]

The prefetch command is to perform a data transfer from a DRAM cell group to an SRAM cell group.

Figure 13:
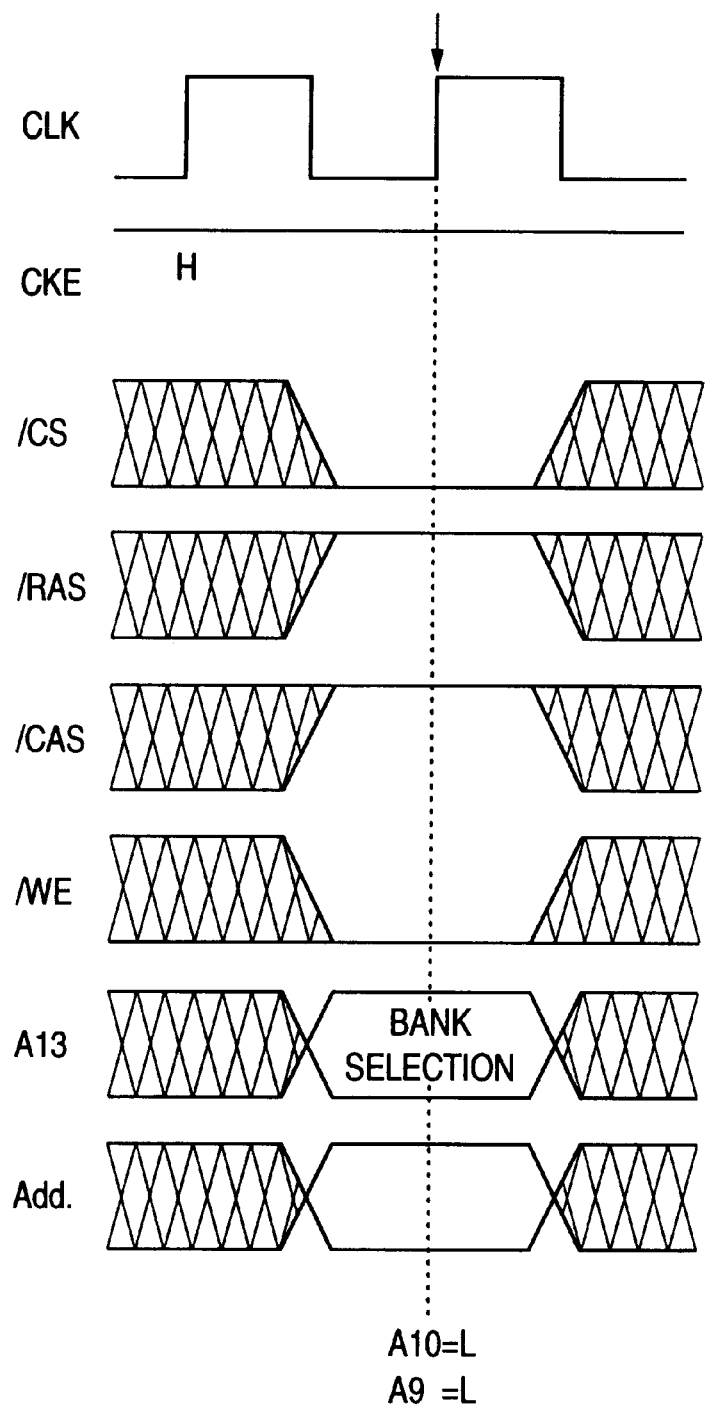
FIG. 13 shows states of the external terminals showing a prefetch command shown in FIG. 10.

As shown in FIG. 13, the states of the respective input control signals at the rising edge of the external clock signal are CKE=H, /CS=L, /RAS=/CAS=H and /WE=L. Further, A10=L and A9=L. At the time when the prefetch command is input, the addresses A0~A3 are taken as SRAM row selection addresses, the addresses A4~A6 are taken in as SRAM column selection addresses and A13 is taken in as a bank selection address of the DRAM array. In this embodiment, the bank A is selected.

Figure 32:
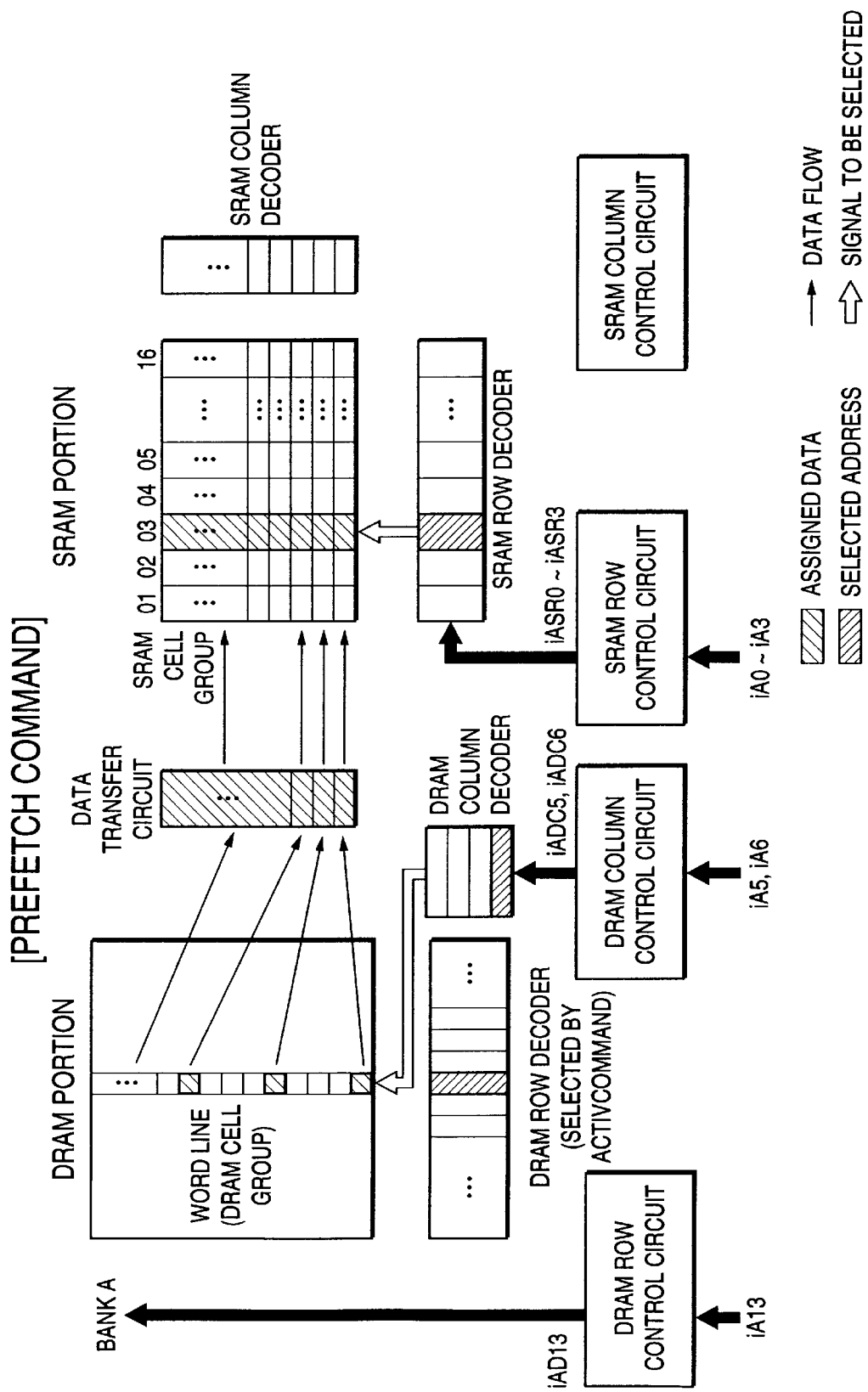
FIG. 32 is a flowchart of an address assignment and data in a prefetch command operation.

FIG. 32 shows an address signal and a data flow in an internal operation according to this prefetch command. Among DRAM cell groups already selected by an active command to be described later, an SRAM cell in a bank assigned by iA13 is selected. In this embodiment, the bank A is selected. Bit lines of the DRAM cell group assigned by the addresses iA5 and iA6. Data of the bit lines is amplified by the sense amplifier at the time of the active command and the data of the selected bit lines is transmitted to a data transfer bus line through the data transfer circuit. The cells on the row of the SRAM selected by the addresses iA0~iA3 stop the holding of the previous data, take in the data on the data transfer bus line and hold data transferred thereafter. An output from the sense amplifier through the data transfer circuit to the data transfer line is stopped after the data transfer.

In this embodiment, the number of data transferred by the prefetch command at once is 128×8.

4. [Prefetch Command with Auto Precharge]

The prefetch command with auto precharge is to transfer data from the DRAM cell group to the SRAM cell group and to automatically precharge the DRAM portion after data transfer.

Figure 14:
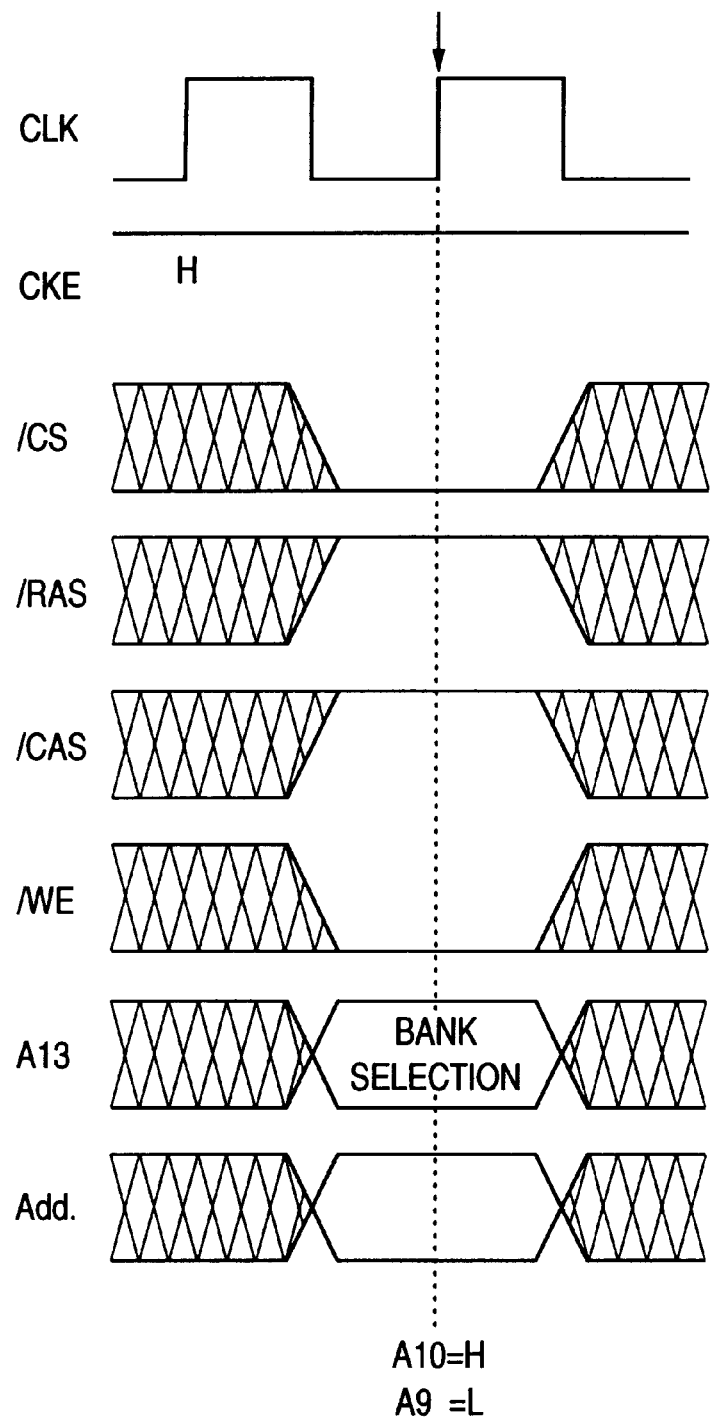
FIG. 14 shows states of the external terminals showing a prefetch command with auto precharge shown in FIG. 10.

As shown in FIG. 14, the states of the respective input control signals at the rising edge of the external clock signal are CKE=H, /CS=L, /RAS=/CAS=H and /WE=L. Further, A10=H and A9=L. Similarly to the above mentioned prefetch command, the addresses A0~A3 are taken as SRAM row selection addresses, the addresses A5 and A6 are taken in as DRAM column selection addresses and A13 is taken in as a bank selection address of the DRAM array at the time when the prefetch command with auto precharge is input.

Address signals in an internal operation and data flow caused by the prefetch command with auto precharge will be described. Among DRAM cell groups already selected by the active command to be described later, an SRAM cell in a bank assigned by iA13 is selected. Bit lines of the DRAM cell group assigned by the addresses iA5 and iA6. Data of the bit lines is amplfied by the sense amplifier at the time of the active command and the data of the selected bit lines is transmitted to a data transfer bus line. The cells on the row of the SRAM selected by the addresses iA0~iA3 stop the holding of the previous data, take in the data on the data transfer bus line and hold data transferred thereafter. An output from the sense amplifier through the data transfer circuit to the data transfer line is stopped after the data transfer. After a predetermined time from the stoppage of output to the data transfer bus line, the word line is made in non-selection state and the internal operation (potential equilibration of the bit line and the sense amplifier) to be described for the precharge command is performed. After a predetermined time from the input of the prefetch command with auto precharge, the DRAM is automatically made in a precharge (non selection) state.

5. [Restore Command]

Figure 15:
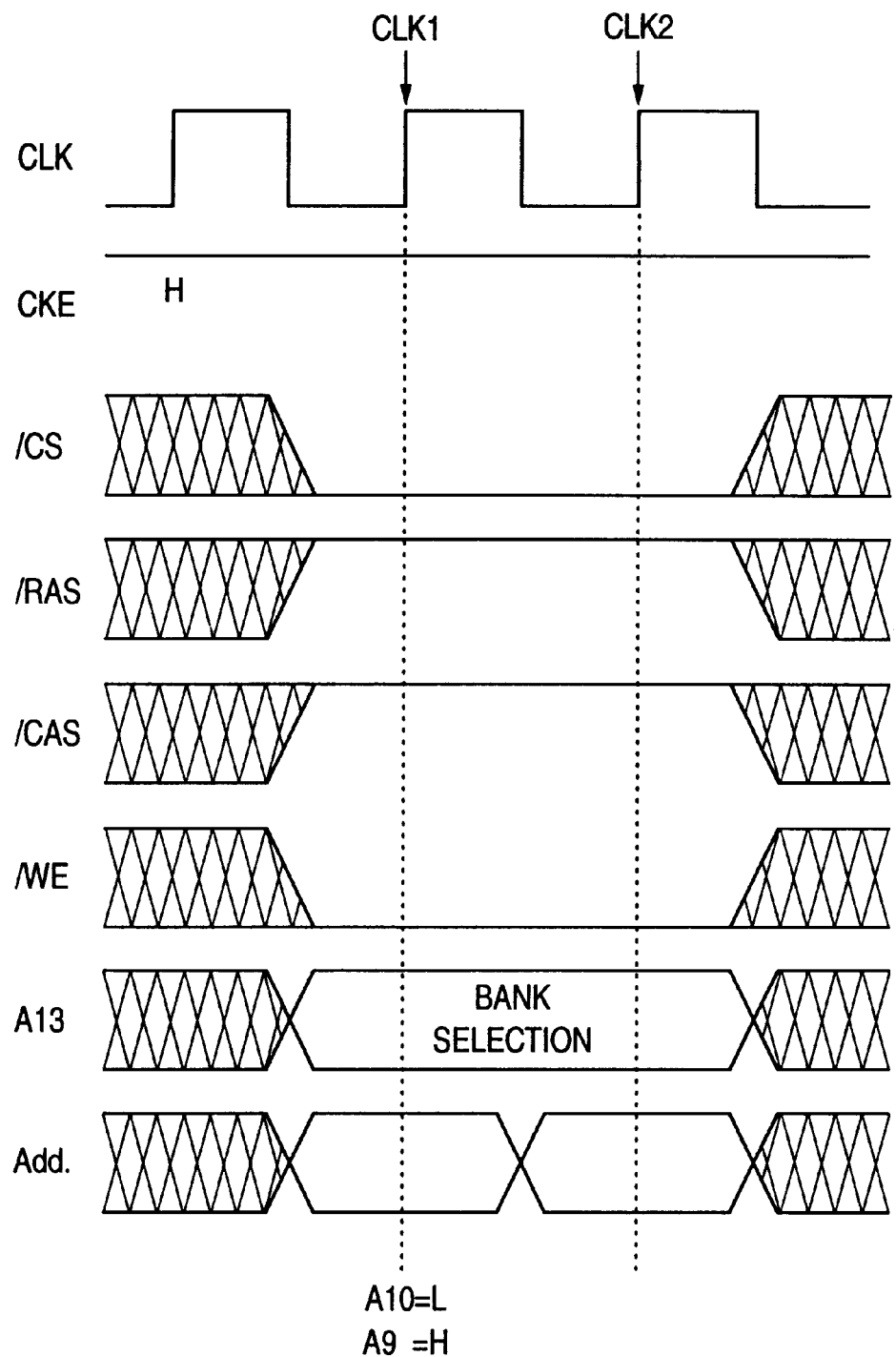
FIG. 15 shows states of the external terminals showing a restore command shown in FIG. 10.

The restore command is to perform a data transfer from the SRAM cell group to the DRAM cell group. As shown in FIG. 15, this command is a continuous input command extending over the external clock signals CLK1 and CLK2.

The states of the respective input control signals at the rising edge of the external clock signal shown in FIG. 15 are CKE=H, /CS=L, /RAS=/CAS=H and /WE=L. Further, A10=L and A9=H. At the rising edge of the first external clock signal CLK1, the addresses A0~A3 are taken as SRAM row selection addresses and the addresses A5 and A6 are taken in as DRAM column selection addresses and, at the rising edge of the second external clock signal CLK2, addresses A0~A12 are taken in as bank selection addresses of the DRAM array which is a destination of transfer. The addresses A13 are taken in as the bank selection addresses of the DRAM array at the rising edges of the CLK1 and CLK2. The A13 addresses input by the CLK1 and CLK2 must be identical.

Figure 33:
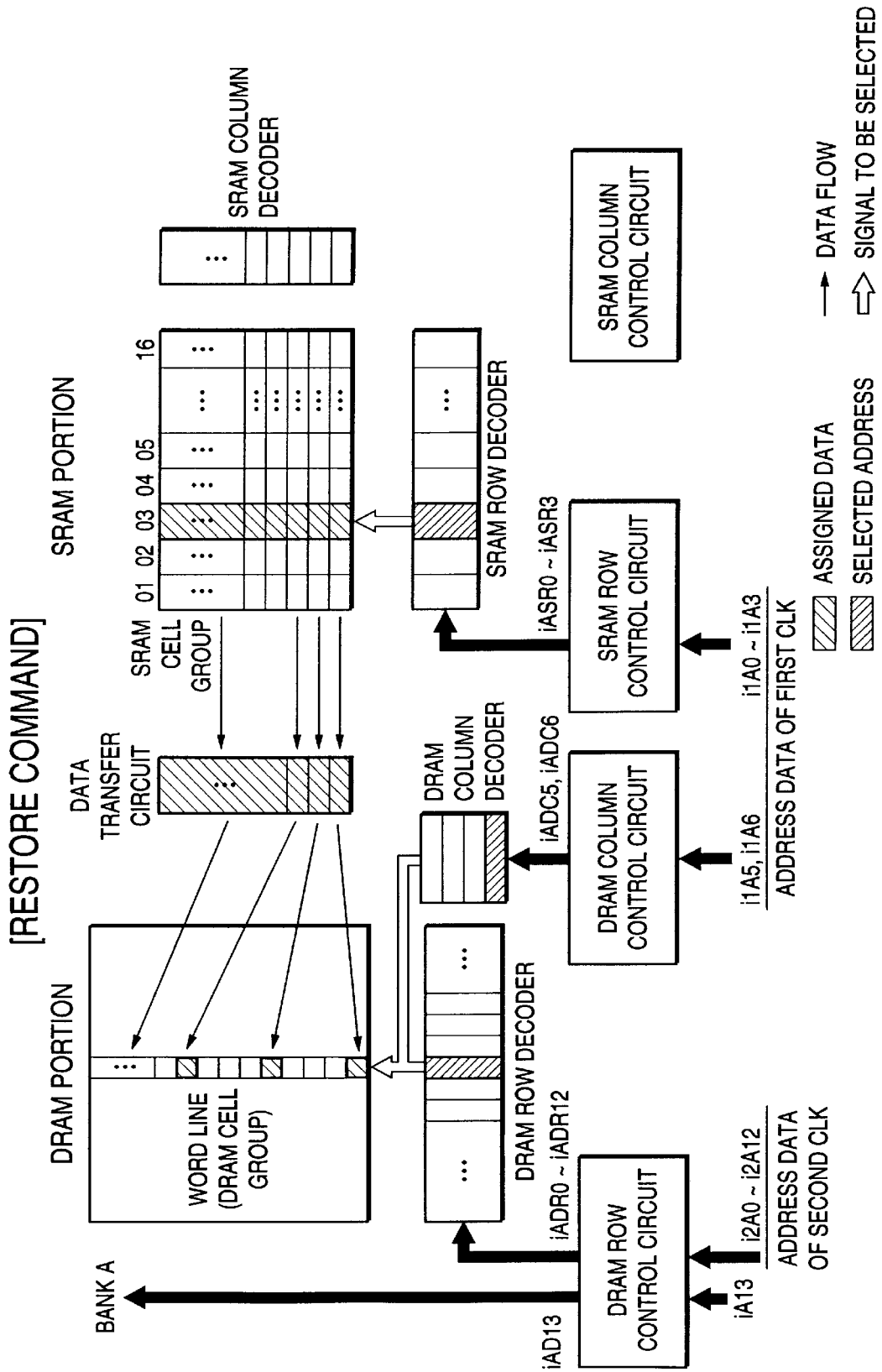
FIG. 33 is a flowchart of an address assignment and data in a restore command operation.

FIG. 33 shows address signals in an internal operation and data flow caused by this restore command. Internal address signals i1A0~i1A12 shown in FIG. 33 are internal address data at the time of the first clock CLK1 and internal address signals i2A0~i2A12 are internal address data at the time of the second clock CLK, data of identical internal address signal line being shown for each clock. Data of SRAM cell group selected by the addresses i1A0~i1A3 generated from the address at the first clock CLK1 is transferred to a data transfer bus line of a bank selected by the address iA13. Thereafter, the data of the data transfer bus line is transferred to bit lines of the DRAM selected by the addresses i1A5 and i1A6. Thereafter, word lines of the DRAM are selected by the addresses i2A0~i2A12 and iA13 are selected and data of the cell groups on the selected word lines are output to corresponding bit lines, respectively. Sense amplifiers corresponding to the bit lines of the DRAM detect and amplify the data of the DRAM cell groups output to the bit lines, respectively. The sense amplifiers corresponding to the bit lines selected by the addresses i1A5 and i1A6 detect and amplify write data transmitted from the data transfer bus line. A data output through the data transfer bus line to the bit lines of the DRAM is stopped after the word line is raised.

In this embodiment, the number of data transferred at once is 128×8.

6. [Restore Command with Auto Precharge]

The restore command with auto precharge is to perform a data transfer from an SRAM cell group to a DRAM cell group and to automatically perform a precharge of the DRAM portion after the data transfer.

Figure 16:
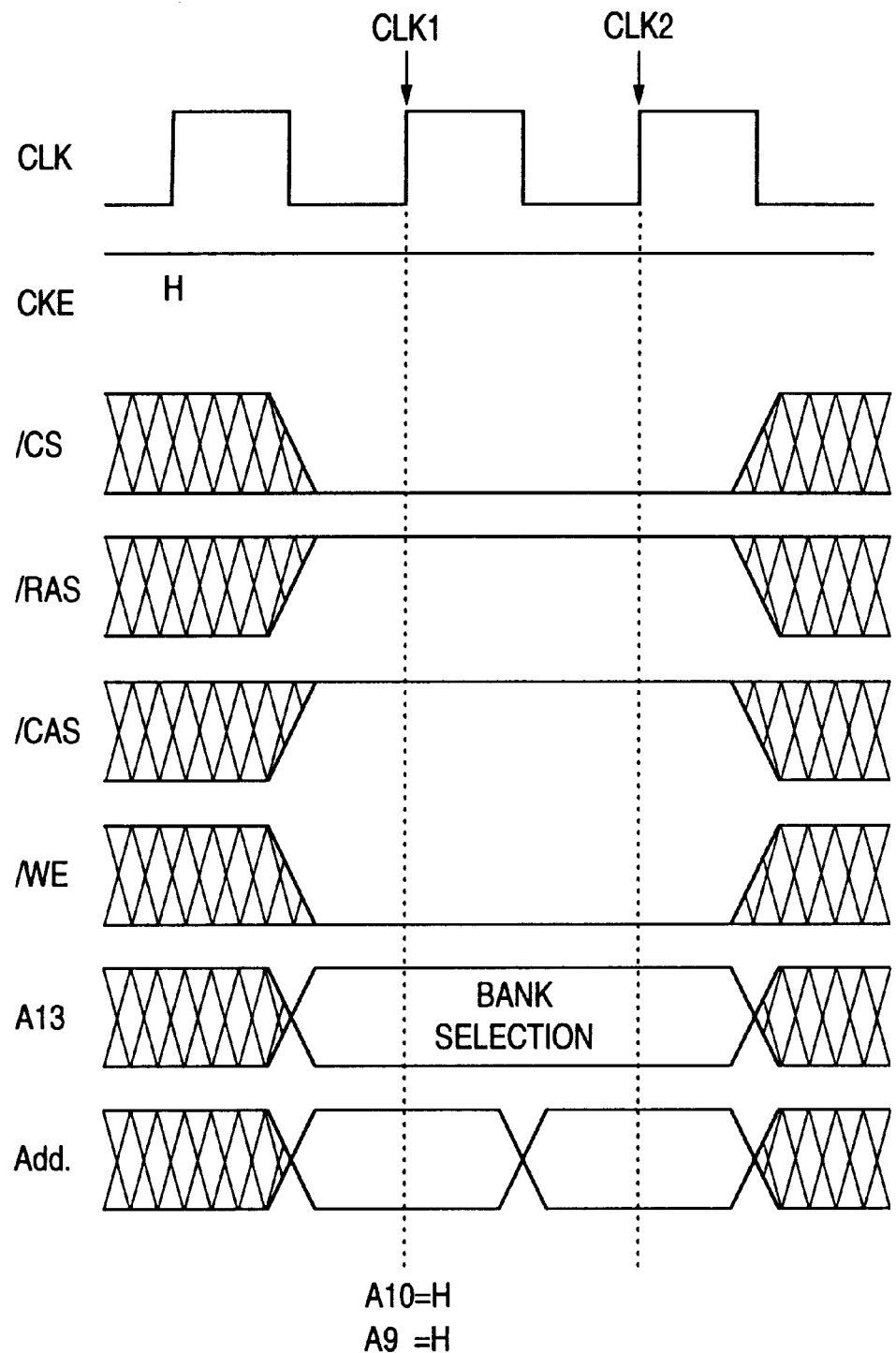
FIG. 16 shows states of the external terminals showing a restore command with auto precharge shown in FIG. 10.

As shown in FIG. 16, the states of the respective input control signals at the rising edges of the external clock signal CLK1 and CLK2 are CKE=H, /CS=L, /RAS=/CAS=H and /WE=L and, further, A10=H and A9=H. At the rising edge of the first external clock signal CLK1, the addresses A0~A3 are taken as SRAM row selection addresses and the addresses A5 and A6 are taken in as DRAM column selection addresses and, at the rising edge of the next, second external clock signal CLK2, addresses A0~A12 are taken in as selection addresses of the DRAM array which is a destination of transfer. The addresses A13 are taken in as the bank selection addresses of the DRAM array at the rising edges of the CLK1 and CLK2. The A13 addresses input by the CLK1 and CLK2 must be identical.

Address signals in an internal operation and data flow caused by this restore command with auto precharge will be described. Data of the SRAM cell group selected by the addresses i1A0~i1A3 generated from the addresses at the time of the first clock CLK1 is transmitted to the data transfer bus line of the bang selected by the address iA13. Thereafter, the data of the data transfer bus line is transmitted to the bit line of the DRAM seleced by the addresses i1A5 and i1A6. Thereafter, word lines of the DRAM are selected by the addresses i2A0~i2A12 and iA13 generated by the addresses at the time of the next clock CLK2 and data of the cell groups on the selected word lines are output to corresponding bit lines. The sense amplifiers corresponding to the respective bit lines detect and amplify data of the DRAM cell group output to the bit lines and the sense amplifiers corresponding to the bit lines selected by the addresses i1A5 and i1A6 detect and amplify write data transferred from the data transfer bus line. The output to the bit lines of the DRAM through the data transfer bus line is stopped after the word line is raised. The word line is made in non-selection state after a predetermined time therefrom and an internal operation (equilibration of the bit line and the sense amplifier) indicated by a precharge command to be described later is performed. After a predetermined time from the command, the DRAM automatically becomes in a precharge (non-selection) state.

7. [Active Command]

The active command is to activate a bank selected from the DRAM array.

Figure 17:
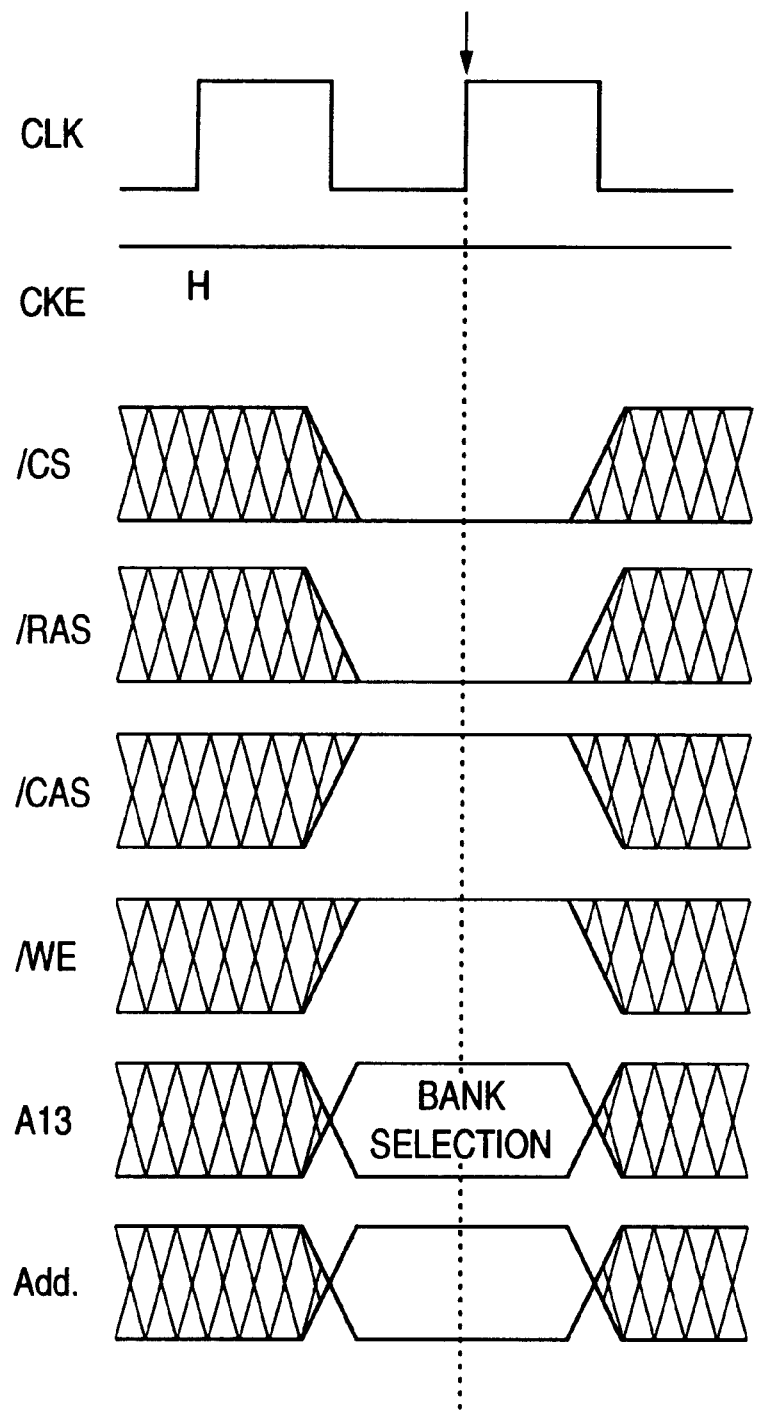
FIG. 17 shows states of the external terminals showing an active command shown in FIG. 10.

As shown in FIG. 17, the states of the respective input control signals at the rising edges of the external clock signal CLK are CKE=H, /CS=/RAS=L, /CAS=/WE=H. An address A13 at the input time of this active command is taken in a bank selection address of the DRAM and addresses A0~A12 are taken in as row selection address of the DRAM.

Figure 34:
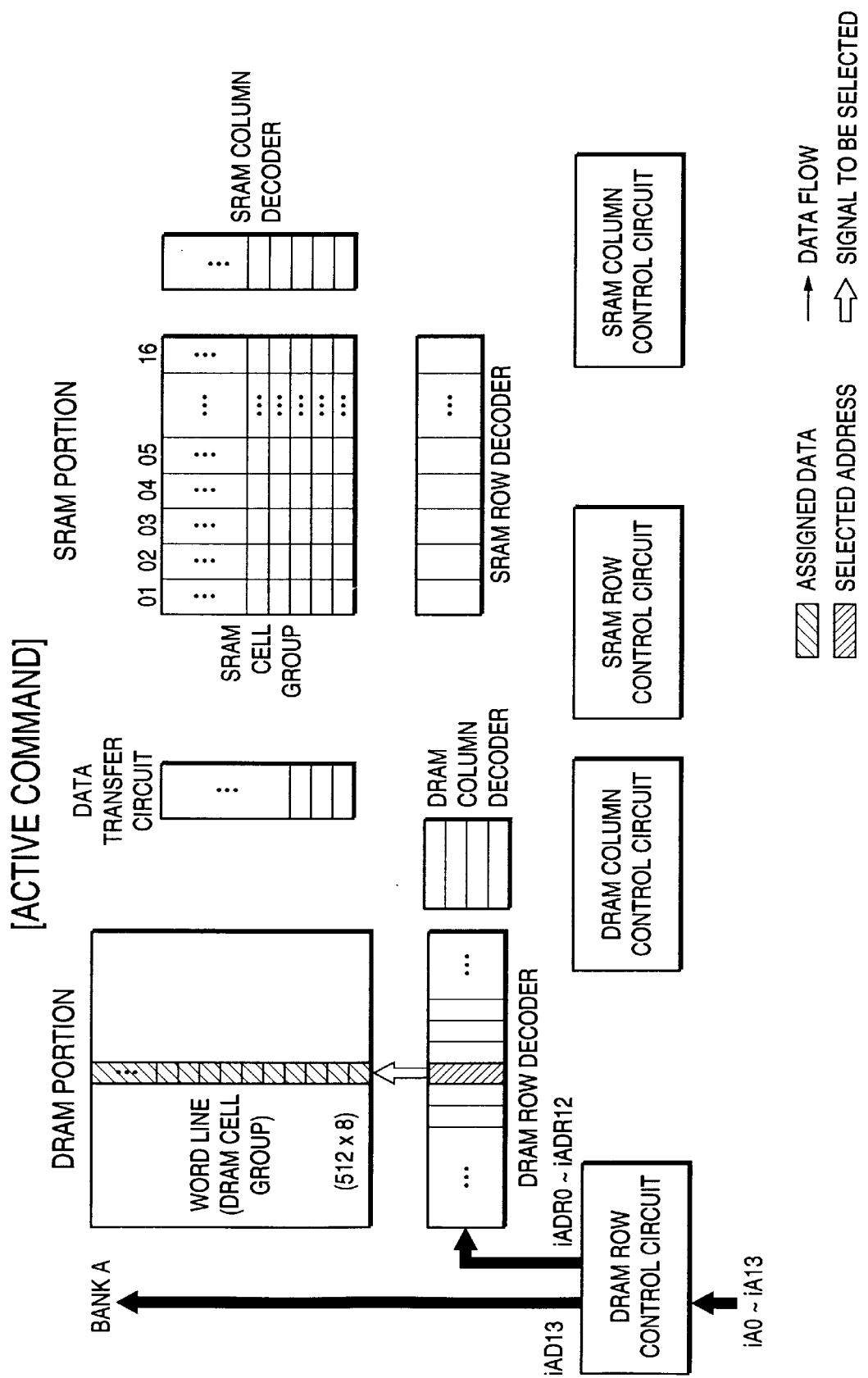
FIG. 34 is a flowchart of an address assignment and data in an active command operation.

FIG. 34 shows address signals in an internal operation caused by the active command and data flow. In the bank selected by the address iA13, the word lines of the DRAM are selected by the addresses iA0~iA12. Data of the DRAM cell groups on the selected word lines are output to bit lines connected thereto and the sense amplifiers corresponding to the respective bit lines detect and amplify the data of the DRAM cell groups output to the bit lines. In this embodiment, the number of data transferred at once is 512×8.

In a case where another word line selection is to be performed with respect to a bank which is already activated, it is necessary to make the bank in a precharge state and then to newly input an active command.

This command corresponds to a case where a /RAS signal of a usual DRAM is made LOW.

8. [Precharge Command]

The precharge command is to precharge (inactivation) of a bank selected from a DRAM array.

Figure 18:
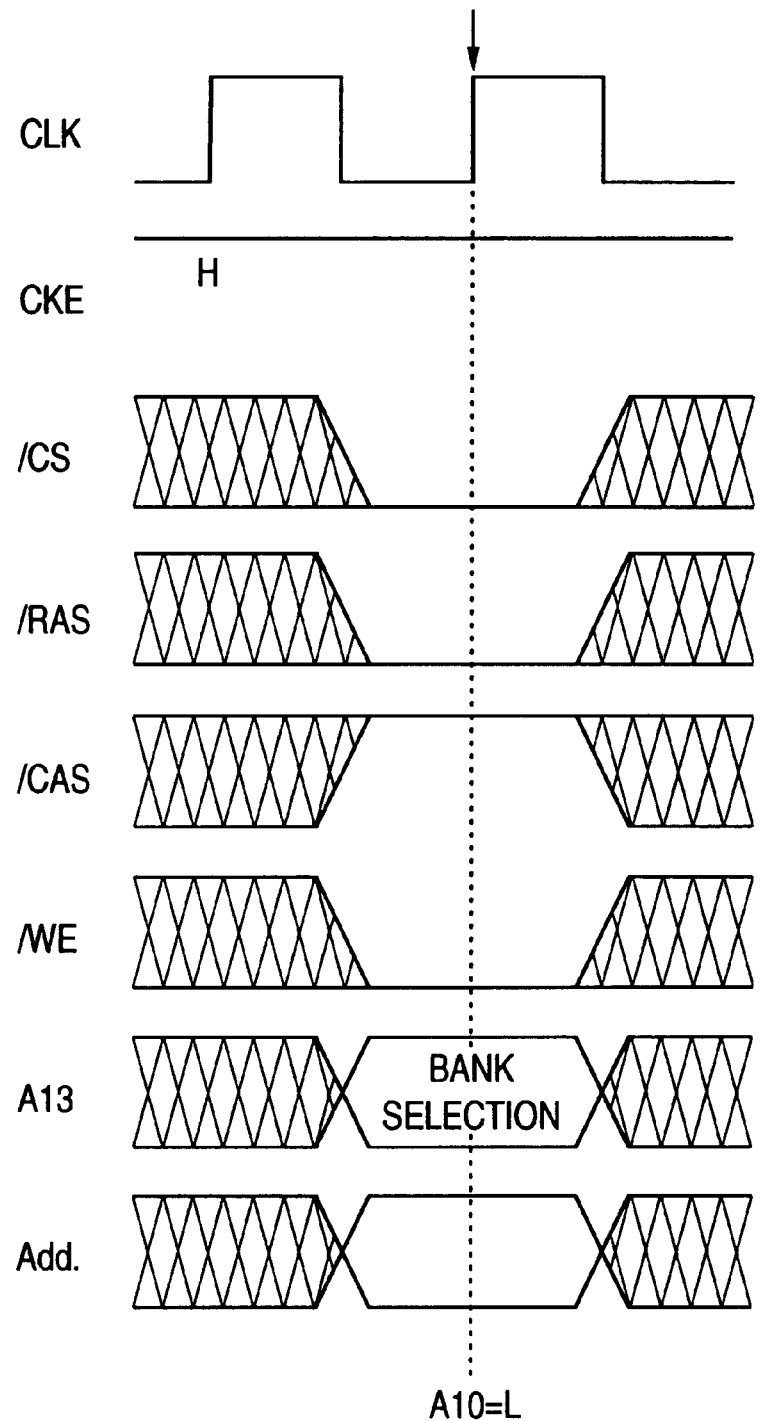
FIG. 18 shows states of the external terminals showing a precharge command with auto precharge shown in FIG. 10.

As shown in FIG. 18, the states of the respective input control signals at the rising edges of the external clock signal CLK are CKE=H, /CS=/RAS=L, /CAS=H and /WE=L. When, at an input of the precharge command, A10=L and A13=valid data, a bank assigned by data of the address A13 is precharged (non-selection). The bank is selected at the active command input prior to this precharge and, when there is no active command input to the bank assigned by this precharge command prior to the input of the latter command thereto, the precharge command is invalid.

Address signals in an internal operation caused by the precharge command and data flow will be described.

Bit line potential and sense amplifier potential are equilibrated by making a word line of a DRAM whose bank selected by the address iA13 is activated in non-selection state. After an operation of the precharge command completes, the selected bank becomes ready to receive a next active command.

The precharge command corresponds to a case where a RAS signal of a usual DRAM is made HIGH.

9. [All Bank Precharge Command]

The all bank precharge command is to precharge (inactivation) all banks of a DRAM array. With this command, the DRAM portion is set to a precharge state and the active state of all banks can be ended.

Figure 19:
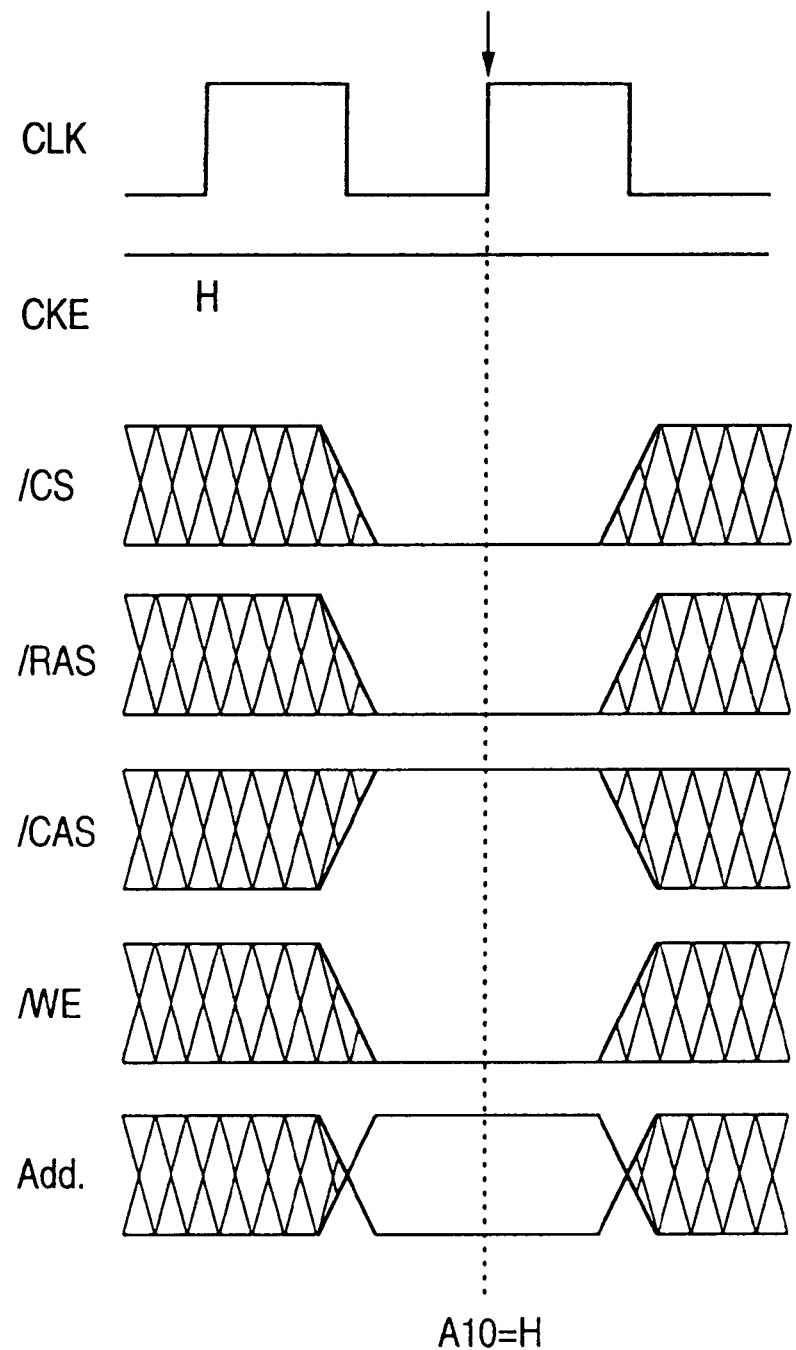
FIG. 19 shows states of the external terminals showing a whole bank precharge command shown in FIG. 10.

As shown in FIG. 19, the states of the respective input control signals at the rising edges of the external clock signal CLK are CKE=H, /CS=/RAS=L, /CAS=H and /WE=L. Further, A10=H.

Address signals in an internal operation caused by the precharge command and data flow will be described.

Bit line potential and sense amplifier potential are equilibrated by making all word lines of a selected DRAM in non-selection state. After an operation of this command is completed, all banks become ready to receive a next active command input.

The all bank precharge conmand corresponds to a case where a /RAS signal of a usual DRAM is made HIGH.

10. [CBR Refresh Command]

The CBR refresh command is to refresh cell data of a DRAM portion. Address signal necessary for refresh is automatically generated internally.

Figure 20:
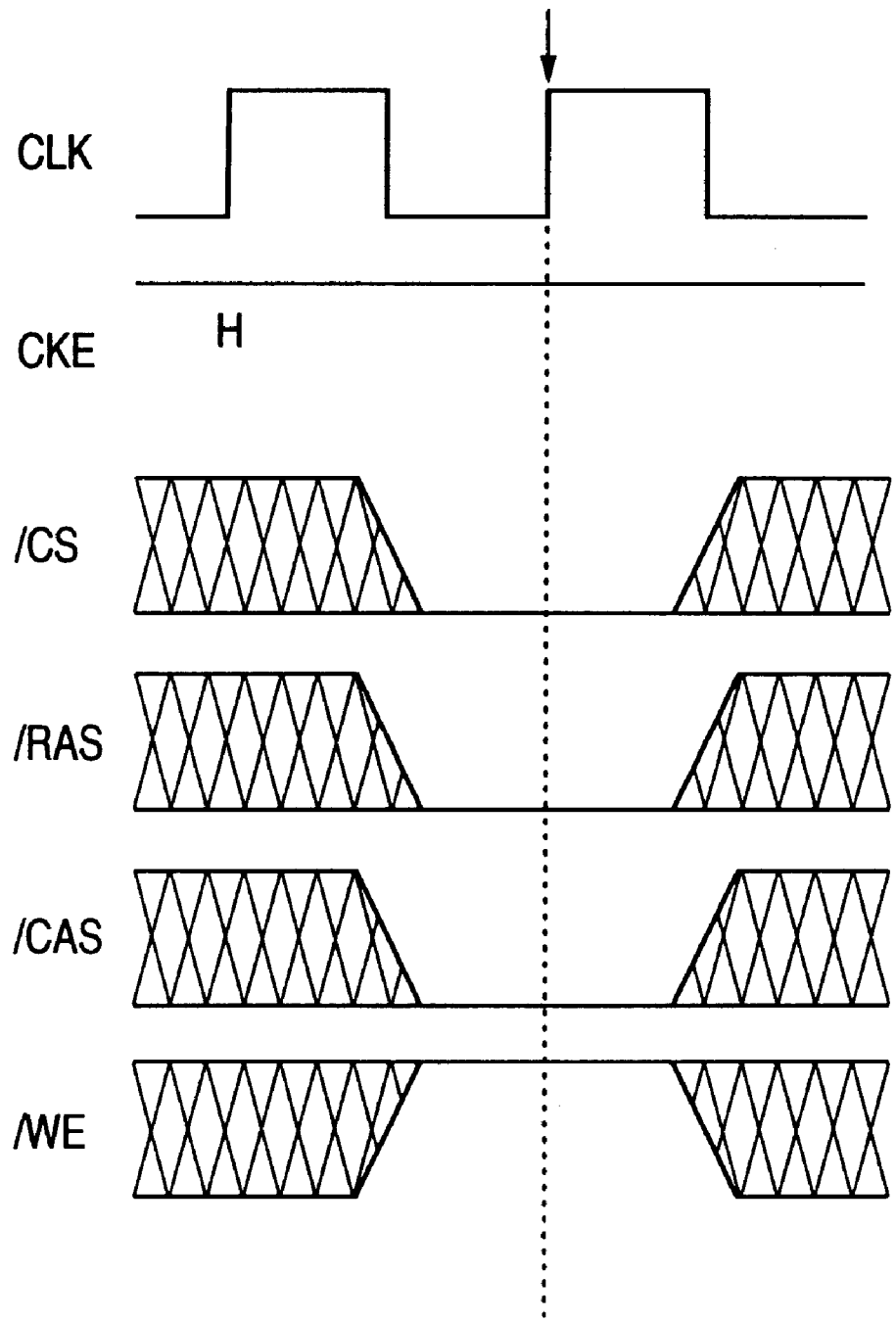
FIG. 20 shows states of the external terminals showing a CBR refresh command shown in FIG. 10.

As shown in FIG. 20, the states of the respective input control signals at the rising edges of the external clock signal CLK are CKE=H, /CS=/RAS=/CAS=L and /WE=H.

Address signals in an internal operation caused by the CBR refresh command and data flow will be described.

Addresses iA0~iA12 and iA13 are automatically generated internally. A bank is selected by the internally generated address iA13, word lines of a DRAM are selected by the internally generated addresses iA0~iA12, DRAM cell groups on the selected word lines output their data to corresponding bit lines, respectively. Sense amplifiers corresponding to the respective bit lines detect and amplify the data of the DRAM cell groups output to the bit lines. The data detected and amplified by the sense amplifiers are written in the DRAM cell groups again through the bit lines. After a predetermined time from the re-write of the data, the word lines are made non-selection state to equilibrate the bit line and sense amplifiers potential, completing a refresh operation.

11. [Non-Operation Command]

Figure 21:
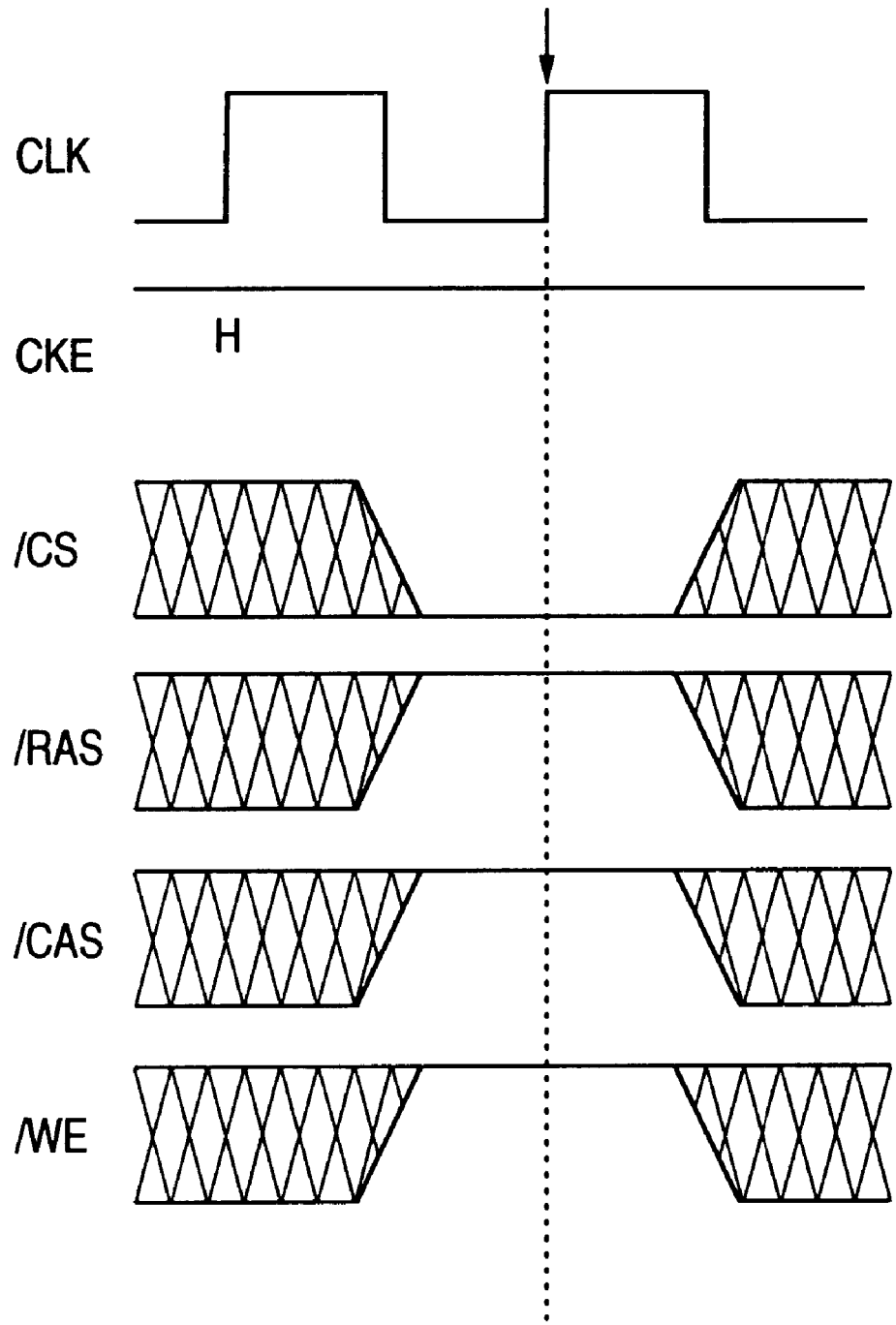
FIG. 21 shows states of the external terminals showing a device non-selection command shown in FIG. 10.

Non-operation commands of CKE=H, /CS=L, /RAS=/CAS=/WE=H shown in FIG. 21 are not execution commands.

12. [Device Non-Selection Command]

Figure 22:
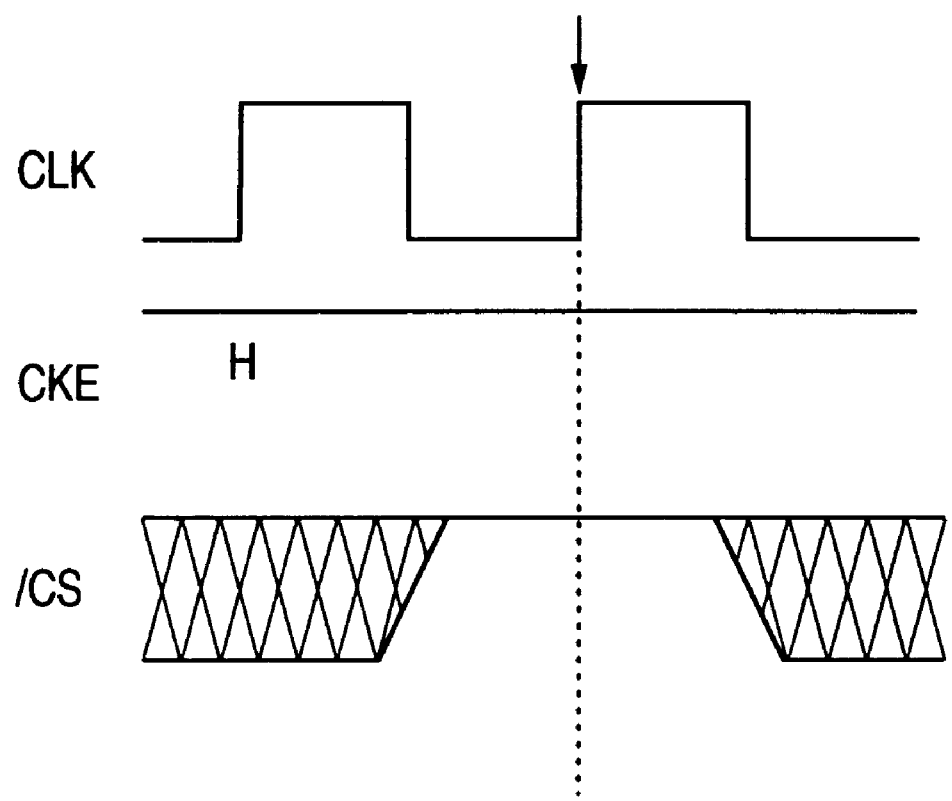
FIG. 22 shows states of the external terminals showing a non-operation command shown in FIG. 10.

Device non-selection commands of CKE=H, /CS=H shown in FIG. 22 are not execution commands.

13. [Register Setting Command]

The register setting command is to set setting data in various operation modes in a register.

Figure 23:
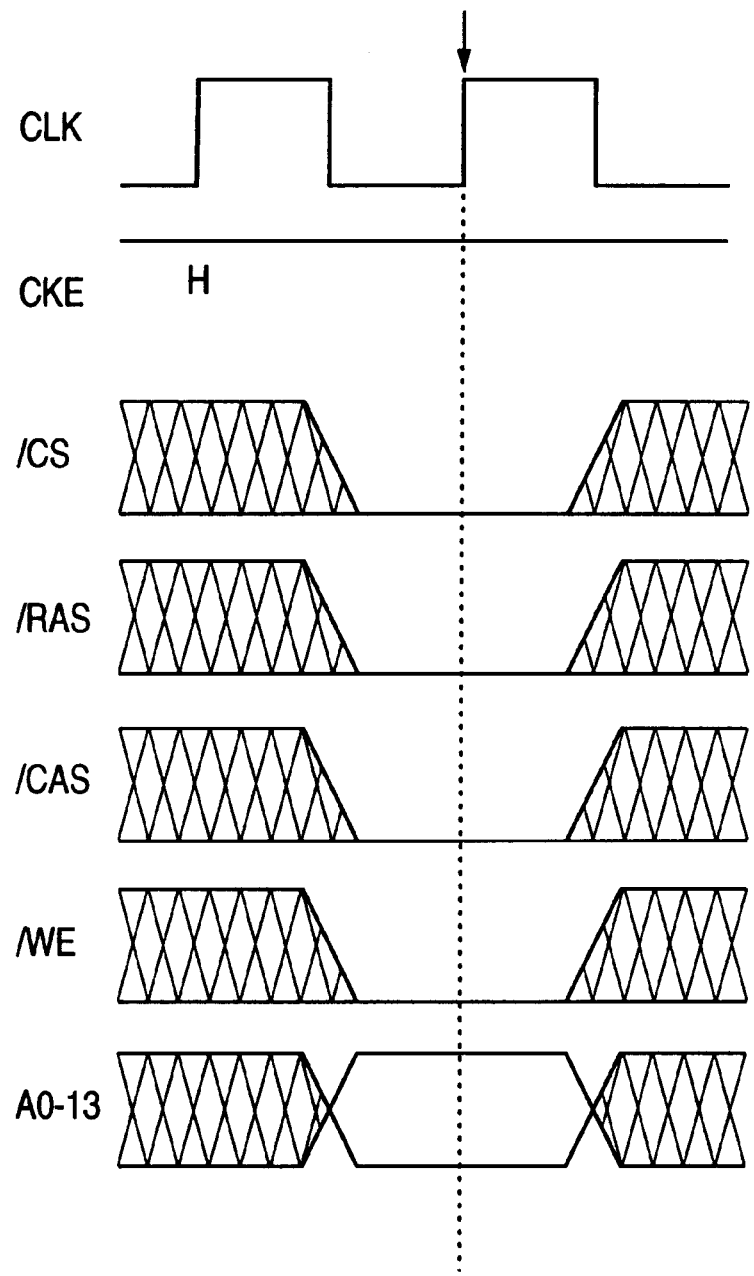
FIG. 23 shows states of the external terminals showing a register setting command (1) shown in FIG. 10.
Figure 24:
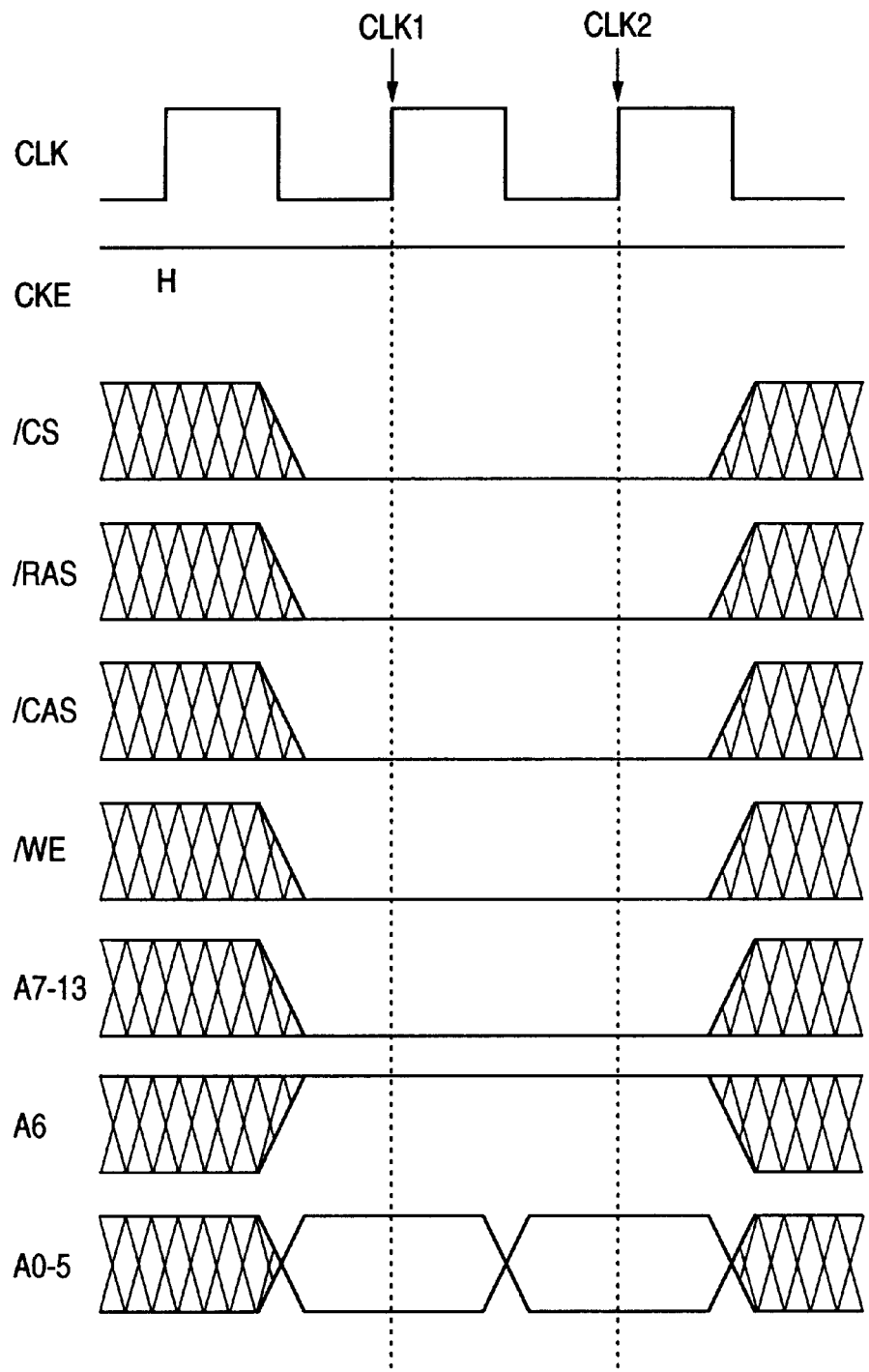
FIG. 24 shows states of the external terminals showing a register setting command (2) shown in FIG. 10.

As shown in FIGS. 23 and 24, the states of the respective input control signals at the rising edges of the external clock signal CLK are CKE=H, /CS=/RAS=/CAS=/WE=L. At a time of input of this command, valid data of the addresses A0~A13 are taken in as setting data of operation modes. An input of register setting by this command is necessary in order to initialize a device after a power source is connected.

FIG. 25 shows an operation by address data at the register setting command.

Portions of register setting commands (a), (b), (c) and (d) shown in FIG. 25 are input by one clock shown in FIG. 23 and another portion of the register setting command (d) to be described later is input by two clocks shown in FIG. 24.

The register setting command (a) in FIG. 25 is a test set of a refresh counter, which is similar to that of a usual synchronous DRAM. This address set is selected at an input of A7=L and A8=L.

The register setting command (b) in FIG. 25 is an unused set. This address set is selected at an input of A7=L and A8=H.

The register setting command (c) in FIG. 25 is a device test set. This address set is selected at an input of A7=H and A8=H.

The register setting command (d) in FIG. 25 is a mode register setting set. This address set is selected at an input of A7=L and A8=L and various data input/output modes to be described later are set. A mode register stores data input/output modes of the respective SRAM cell groups of the sub memory portion.

FIG. 26 is a list of detailed setting items of the mode register setting.

A mode register setting (1) command is to switch between a latency mode and an input/output address sequence (lap type). This command is input by one clock of an external clock signal such as shown in FIG. 23. This address set is selected when A6=L, A7=L and A8=L.

The latency mode setting is made by data of A1, A2 and A3 input simultaneously and the input/output sequence (lap type) is set by data of A0. The latency mode is set to latency=2 when A1=L, A2=H and A3=L and, otherwise, becomes non-setting or unused state. The input/output address sequence (lap type) is set to sequential when A0=L and to interleave when A0=H.

The mode register setting (2) command is an address data set for setting a burst length of every selected row of the SRAM and, in order to input the row assignment of the SRAM and the burst length data, is continuously input over two clocks of the external clock signal as shown In FIG. 24. This address set is selected when A6=H, A7=L and A8=L.

An SRAM cell group is selected by data of A1, A2 and A3 of the first clock CLK1 and the burst length of the selected cell group is set by data of A3, A4 and A5 of the next clock CLK2. The burst length is set to 1 when A3=L, A4=L and A5=L, to 2 when A3=H, A4=L and A5=L, to 4 when A3=L, A4=L and A5=L, to 8 when A3=H, A4=H and A5=L and to 16 when A3=L, A4=L and A5=H.

Various data input/output modes will be described briefly.

Figure 27:
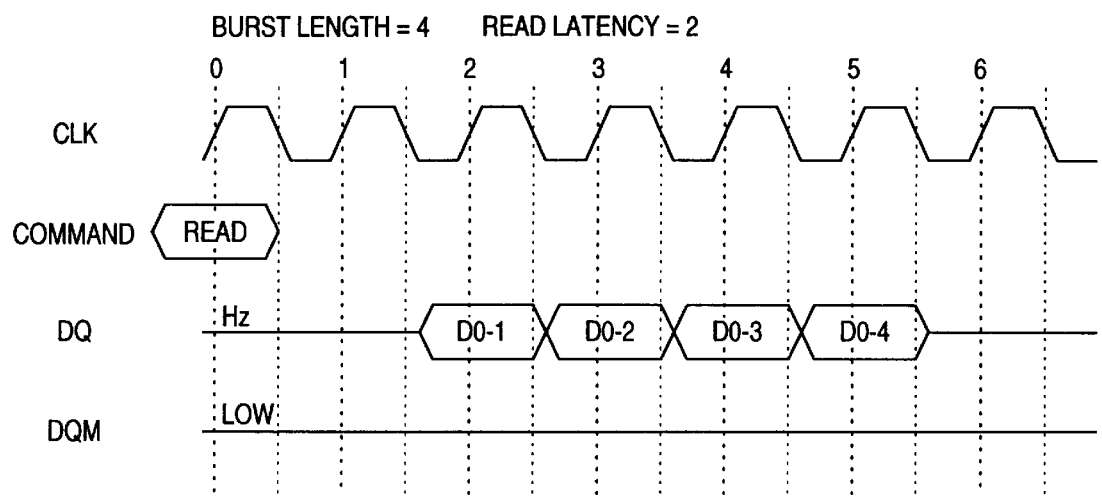
FIG. 27 shows an address sequence accessed correspondingly to respective lap times and burst lengths of data input/output mode.
Figure 28:
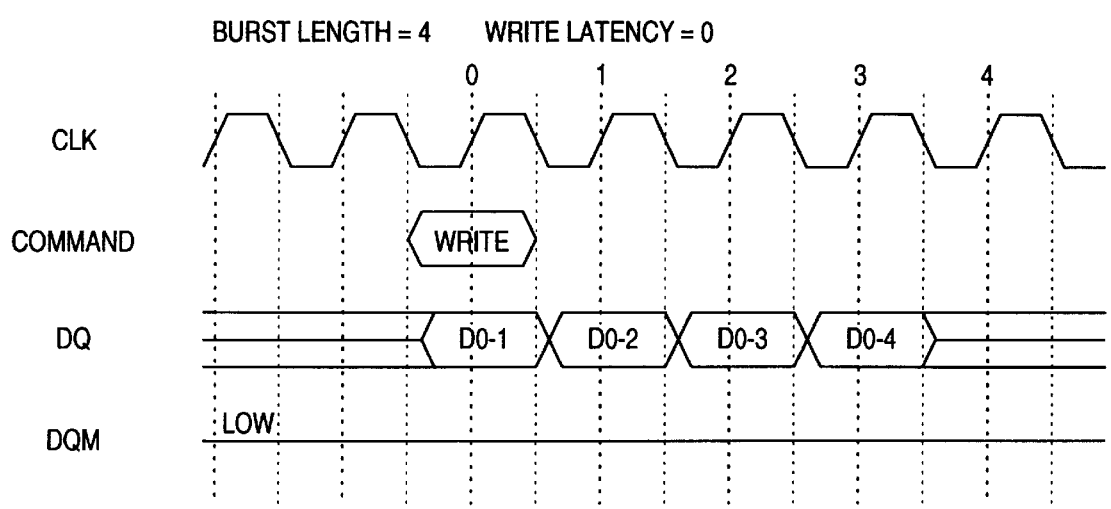
FIG. 28 is a timing chart of data output having burst length of 4 and read latency of 2 at a read command input.

Burst Length: burst length represents the number of data continuously input/output by an input of read command or write command. The continuous data input/output is performed on the basis of a clock signal. FIG. 27 shows a timing of the respective signals for data read, in which the burst length is 4. That is, when the read command is input at CLK0, four data are successively output at CLK2, CLK3, CLK4 and CLK5. FIG. 28 shows a timing of the respective signals for data write. Since the burst length is 4, when the write command is input at CLK0, four data are successively taken in at CLK0, CLK1, CLK2 and CLK3.

Latency: latency represents a waiting time from the input time of a read command or write command to a time at which data input/output becomes possible by the number of clocks. FIG. 27 shows a timing of respective signals at the data read. In this embodiment, the latency at data read is 2. That is, when a read command is input at CLK0, output of data to a DQ terminal is started at CLK2. FIG. 28 shows a timing of the respective signals at a data write. In this embodiment, the latency at data write is 0. That is, when the write command is input at CLK0, the data take-in from the DQ terminal is started simultaneously with the CLK0 input.

Lap Type: Lap type (input/output address sequence) determines an address sequence of data input/output when data is input/output successively for a time corresponding to a set burst length and includes sequence and interleave. FIG. 29 shows address sequences of data for the respective sequence and interleave.

As another operation, there is a function control by control of the clock enable signal CKE, as in the usual synchronous DRAM.

A portion of the operation of the semiconductor memory device according to the present invention will be described.

Read operation when there is an externally assigned data in the SRAM portion: as shown in FIG. 30, data assigned by only read command is output externally through a data amplifier.

Read when there is no externally assigned data in the SRAM portion: after the active command shown in FIG. 34 is completed, the prefetch command shown in FIG. 32 is executed and the assigned data is transferred to the SRAM portion. Then, the assigned data is externally output through the data amplifier by the read command shown in FIG. 30.

Read when there is no externally assigned data in the SRAM portion and there is a write data which is not restored as yet: the write data is transferred to the DRAM portion by the restore command shown in FIG. 33. Thereafter, the active command shown in FIG. 34 and the prefetch command shown in FIG. 32 are executed and the assigned data is transferred to the SRAM portion. Then, the assigned data is output externally through the data amplifier by the read command shown in FIG. 30.

(6) Layout

1. [Array Layout]

Figure 35:
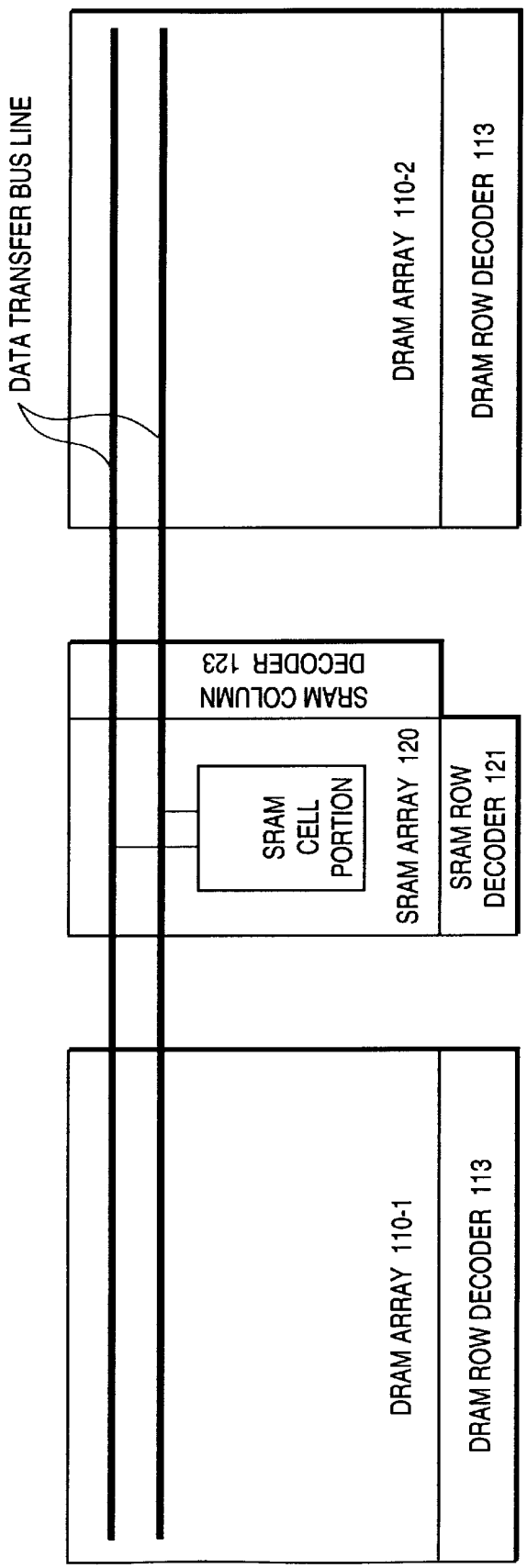
FIG. 35 is a layout of arrays schematically showing an array arrangement of a semiconductor memory device according to an embodiment of the present invention.

FIG. 35 is an array layout schematically showing an array arrangement of the semiconductor memory device according to an embodiment of the present invention.

In the construction of the array arrangement shown in FIG. 35, the whole DRAM array is divided to a DRAM array 110-1 and a DRAM array 110-2 and an SRAM array 120 and an SRAM column decoder 123 are provided between the DRAM arrays. Thus, it is possible to transfer data between the cell groups on any DRAM selected by the DRAM row decoder 113 adjacent to the DRAM arrays 110-1 and 110-2 and the cell groups on a certain row of the SRAM selected by the SRAM row decoder 121 and a direct mapping system and a mapping system of set associative system become possible.

The data transfer bus lines for transferring data are arranged such that these lines traverse the DRAM array 110-1, the DRAM array 110-2, the SRAM array 120 and the SRAM column decoder 123.

In this embodiment, the DRAM array 110-1 and the DRAM array 110-2 correspond to the banks A and B, respectively.

Figure 50:
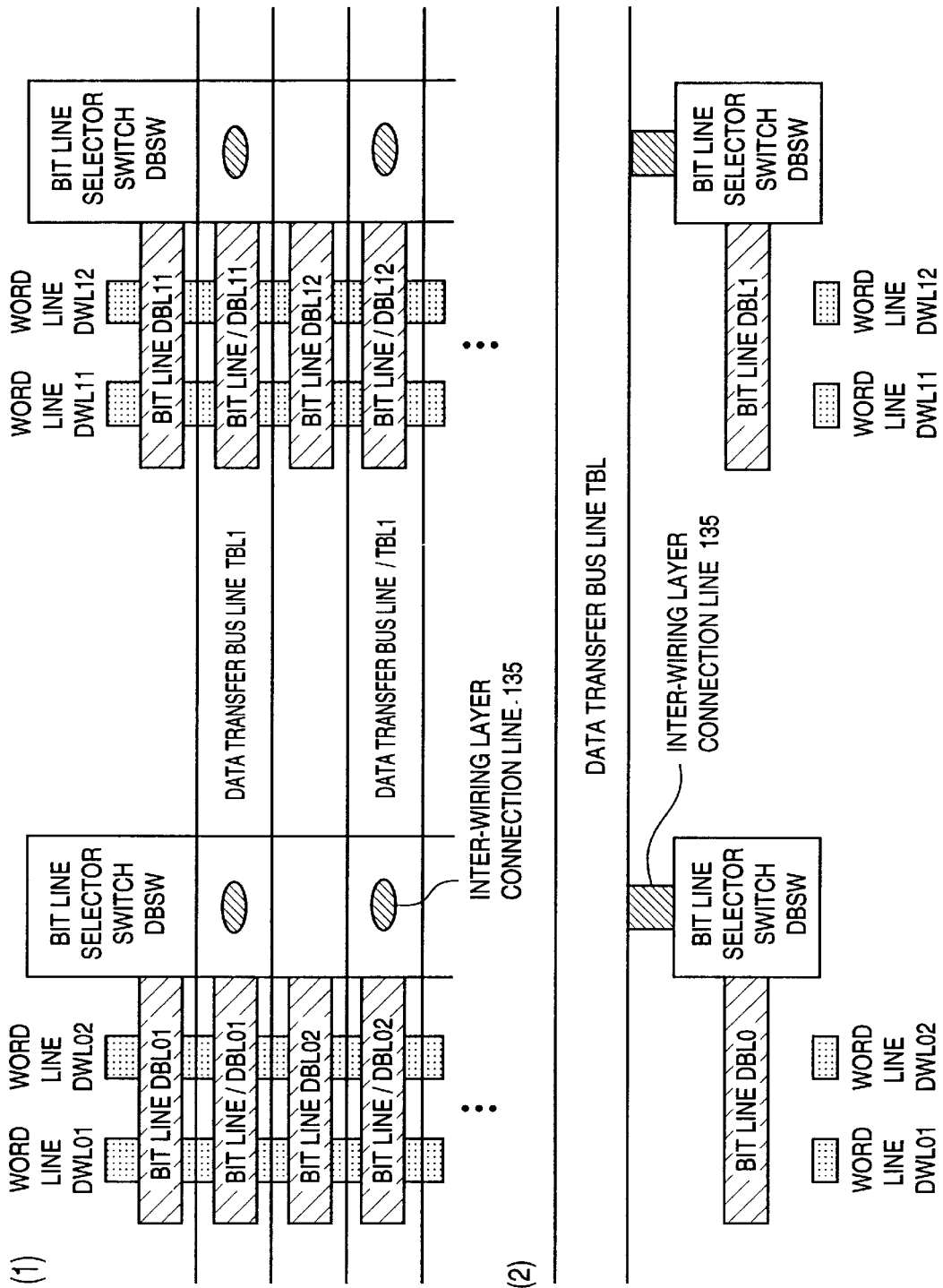
FIG. 50 shows a wiring construction in a DRAM array portion of a semiconductor memory device according to an embodiment of the present invention.

FIG. 50(1) is a plan view of a wiring in the DRAM array portion of this construction and FIG. 50(2) is a hierarchical view of the wiring in the DRAM array portion in a cross sectional direction. A data transfer bus line TBL is formed by an upper wiring layer than those of the word lines DWL, the bit lines DBL and a wiring which is used for the sense amplifiers although not shown. As in the conventional DRAM, the column selection signal does not exist in an upper portion of the DRAM cells and the data transfer bus lines TBL are arranged therein. An operation corresponding to the column selection of the usual DRAM is performed by selectively connecting the bit lines and the data transfer bus lines by bit line selector switches DBSW. In this embodiment, one of four pairs of bit lines is selected and connected to the data transfer bus line pair. The wiring of the bit line selection signal is arranged such that it traverses the data transfer lines and the bit lines. The data transfer bus lines are arranged in parallel to the bit lines in the upper cell portion in the cell array of the DRAM portion and perpendicular to the word lines. In FIG. 50, the connection between the data transfer bus lines and the SRAM array is omitted.

Figure 36:
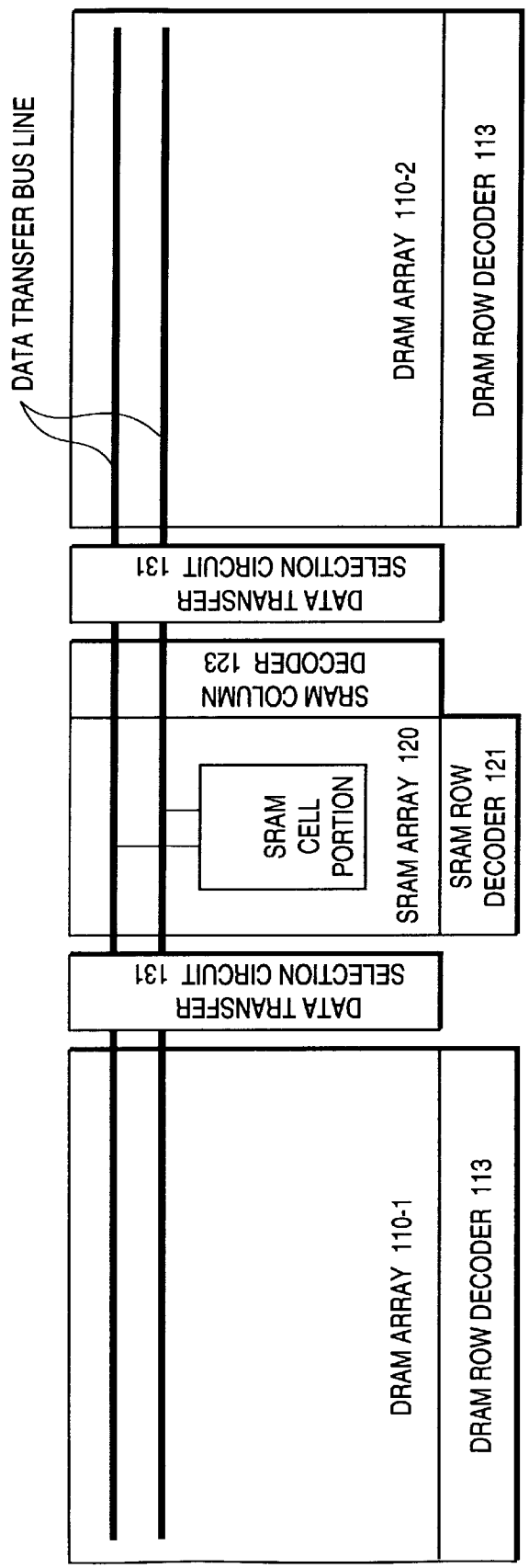
FIG. 36 is a layout of arrays schematically showing an array arrangement of a semiconductor memory device according to an embodiment of the present invention.

FIG. 36 shows another construction which, in addition to the construction shown in FIG. 35, selector circuits 131 are provided between the DRAM arrays 110-1 and 110-2 and the SRAM array 120 so that the data transfer bus line can be selectively connected therethrough. With this construction, it is possible to disconnect the data transfer bus line of the DRAM array on the non-operational side by using a signal for selecting one of the DRAM arrays 110-1 and 110-2, resulting in a reduction of charging/discharging current during a data transfer and an improvement of data transfer speed.

Figure 51:
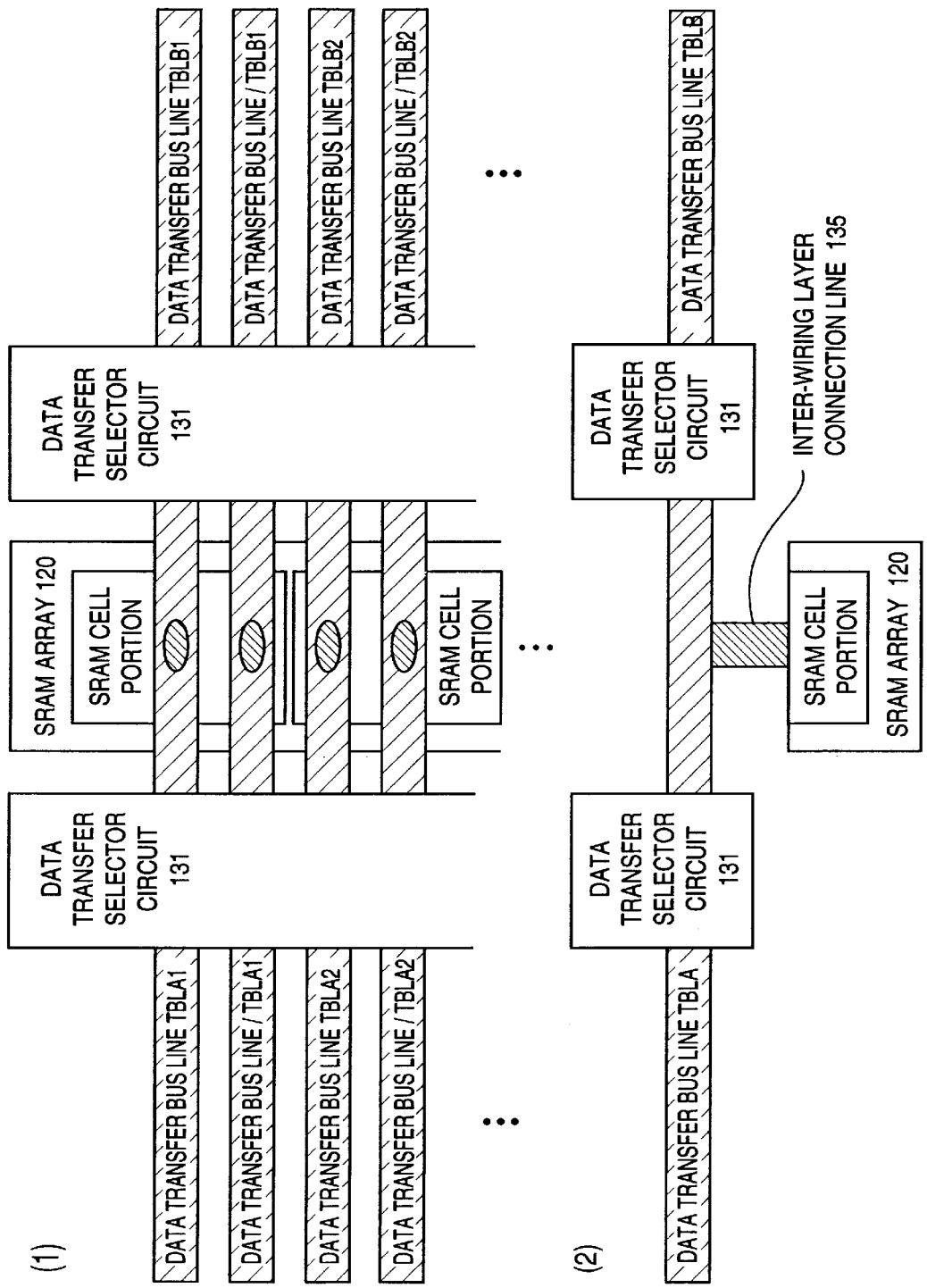
FIG. 51 shows a wiring construction of a DRAM array portion, a data transfer portion and an SRAM array portion of a semiconductor memory device according to an embodiment of the present invention.

FIGS. 51(1) and 51(2) are a plan view of a wiring in the DRAM array portion of this construction and a hierarchical view of the wiring in the DRAM array portion in a cross sectional direction, respectively. The data transfer bus line is divided every DRAM array to a first data transfer bus line TBLA and a second data transfer bus line TBLB and one of the data transfer bus lines TBLA and TBLB is selected by the data transfer selector circuit 131. In this Figure, the bit line selector switch and bit lines connected to the data transfer lines are omitted.

Similarly to FIG. 35, in this embodiment, the DRAM array 110-1 and the DRAM array 110-2 correspond to the banks A and B, respectively. Therefore, in this construction, when data is transferred between a certain bank and the SRAM portion immediately after the data transfer between the other bank and the SRAM portion is performed, that is, when a bank ping-pong operation is performed, it is possible to disconnect a load of the data transfer bus on one side when the bank assignment is performed and thus an interval of successive operations during the bank ping-pong operation is not limited by the operating frequency of the data transfer bus line of the DRAM array portion.

It may be possible to further divide the DRAM array finely and provide a selector circuit for connecting them to the data transfer bus lines. Further, it may be possible to divide the SRAM array more finely and provide a selector circuit for connecting them to the data transfer bus lines.

Figure 37:
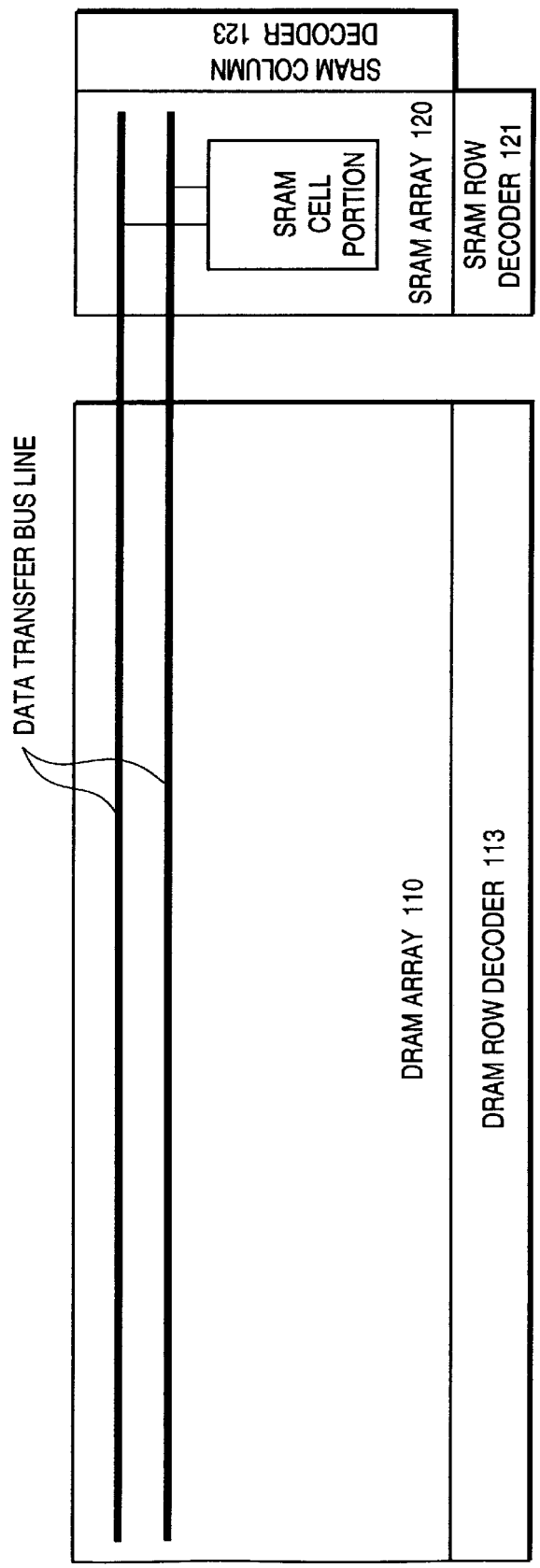
FIG. 37 is a layout of arrays schematically showing an array arrangement of a semiconductor memory device according to an embodiment of the present invention.

FIG. 37 shows another example of the array layout of the semiconductor memory device to which the present invention is applied.

The construction shown in FIG. 37 differs from that shown in FIG. 35 in that the DRAM array is not divided and the SRAM array and the SRAM column decoder are provided adjacent to both sides of the DRAM array, respectively. With this construction, it is possible to shorten a distance between the SRAM portion and the data control circuit and a distance between the data control circuit and the data input/output terminals DQ and hence speed up the read or write operation. In this example, it is also possible to transfer data between the cell groups on any row of the DRAM selected by the DRAM row decoder 113 adjacent to the DRAM array 110 and the cell groups on a certain row of the SRAM selected by the SRAM row decoder 121 and a direct mapping system and a mapping system of set associative system become possible.

The data transfer bus lines for transferring data are arranged such that these lines traverse the DRAM array 110-1, the DRAM array 110, the SRAM array 120. In this embodiment, the banks A and B exist in mixed state in the DRAM array 110.

Figure 38:
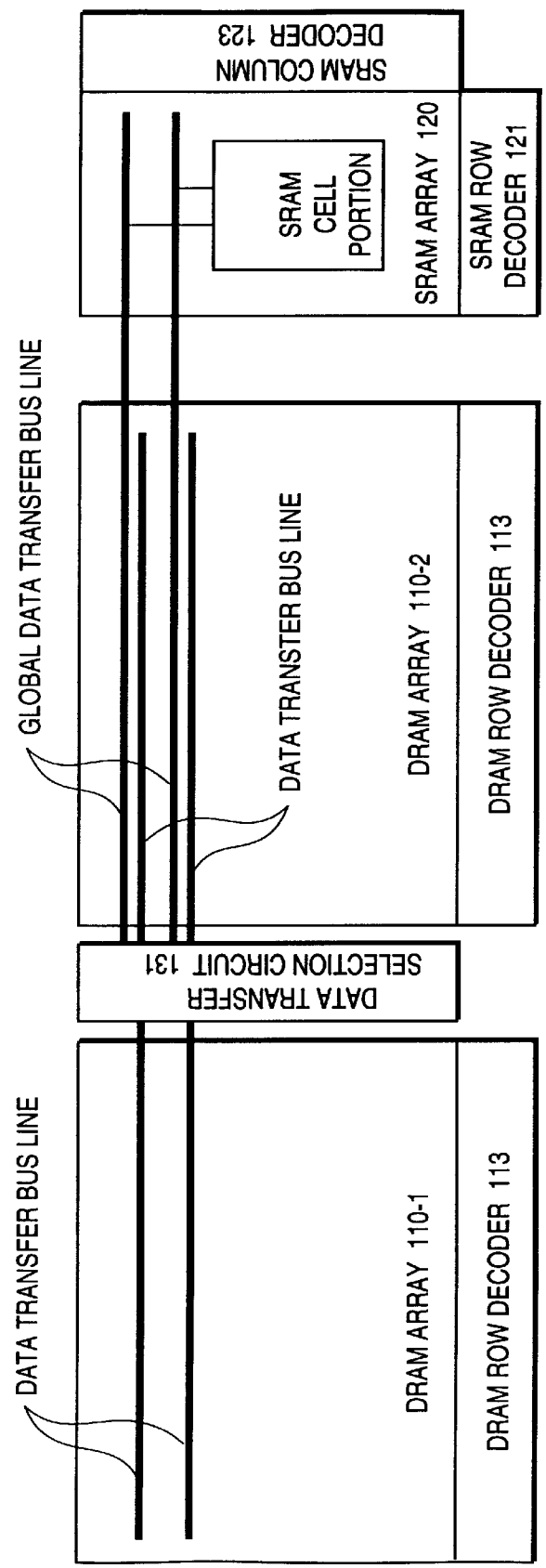
FIG. 38 is a layout of arrays schematically showing an array arrangement of a semiconductor memory device according to an embodiment of the present invention.

FIG. 38 shows an layout when the DRAM array in FIG. 37 is divided. In this layout, the data transfer bus line is divided in order to make the connection between the DRAM arrays and the SRAM array 120 through the data transfer selection circuit 131 by using a wiring layer different from the data transfer bus lines. In this embodiment, the connection line between the data transfer selection circuit 131 and the SRAM array is a global data transfer bus line GTL.

Figure 52:
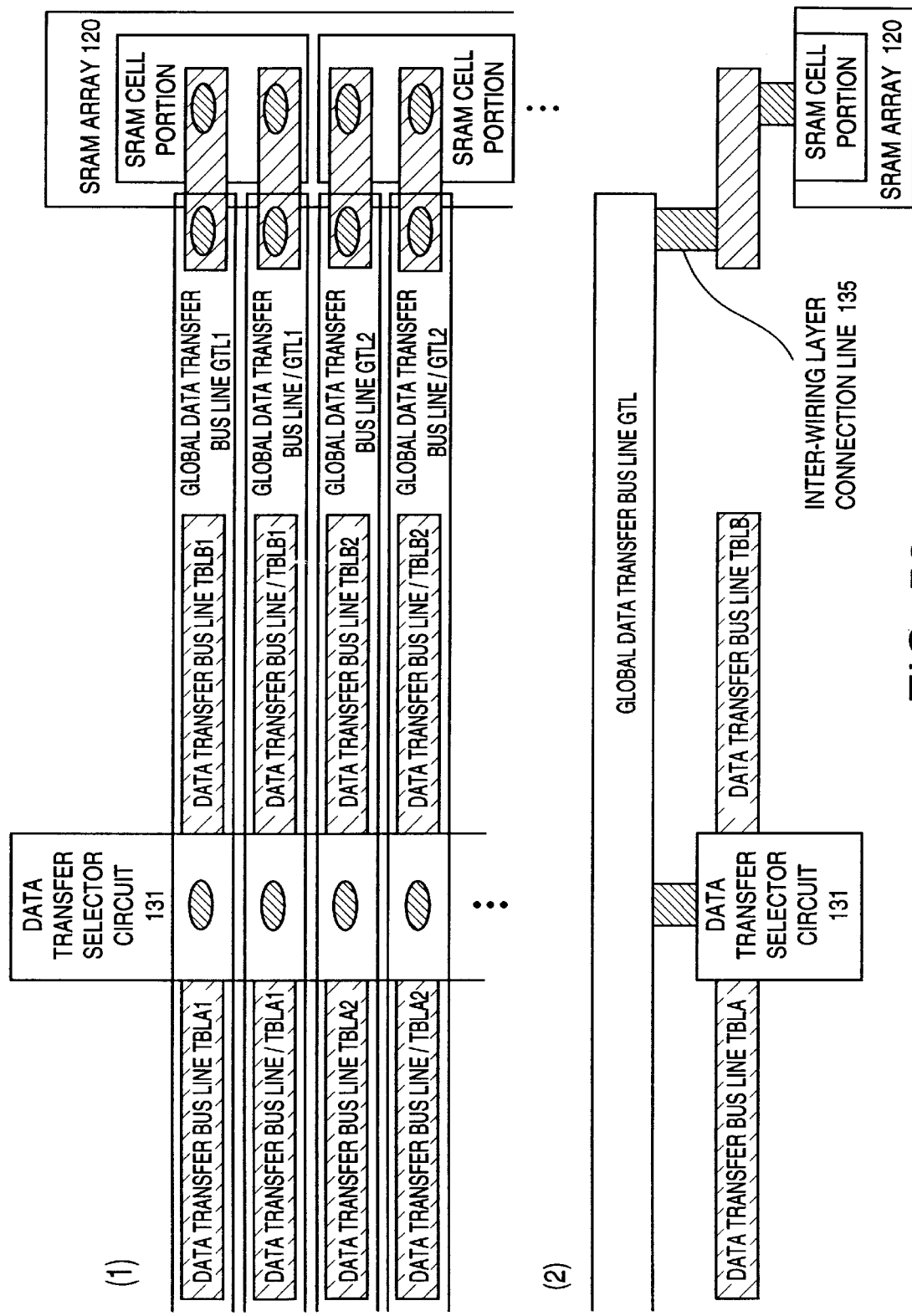
FIG. 52 shows a wiring construction of a DRAM array portion, a data transfer portion and an SRAM array portion of a semiconductor memory device according to an embodiment of the present invention.
Figure 53:
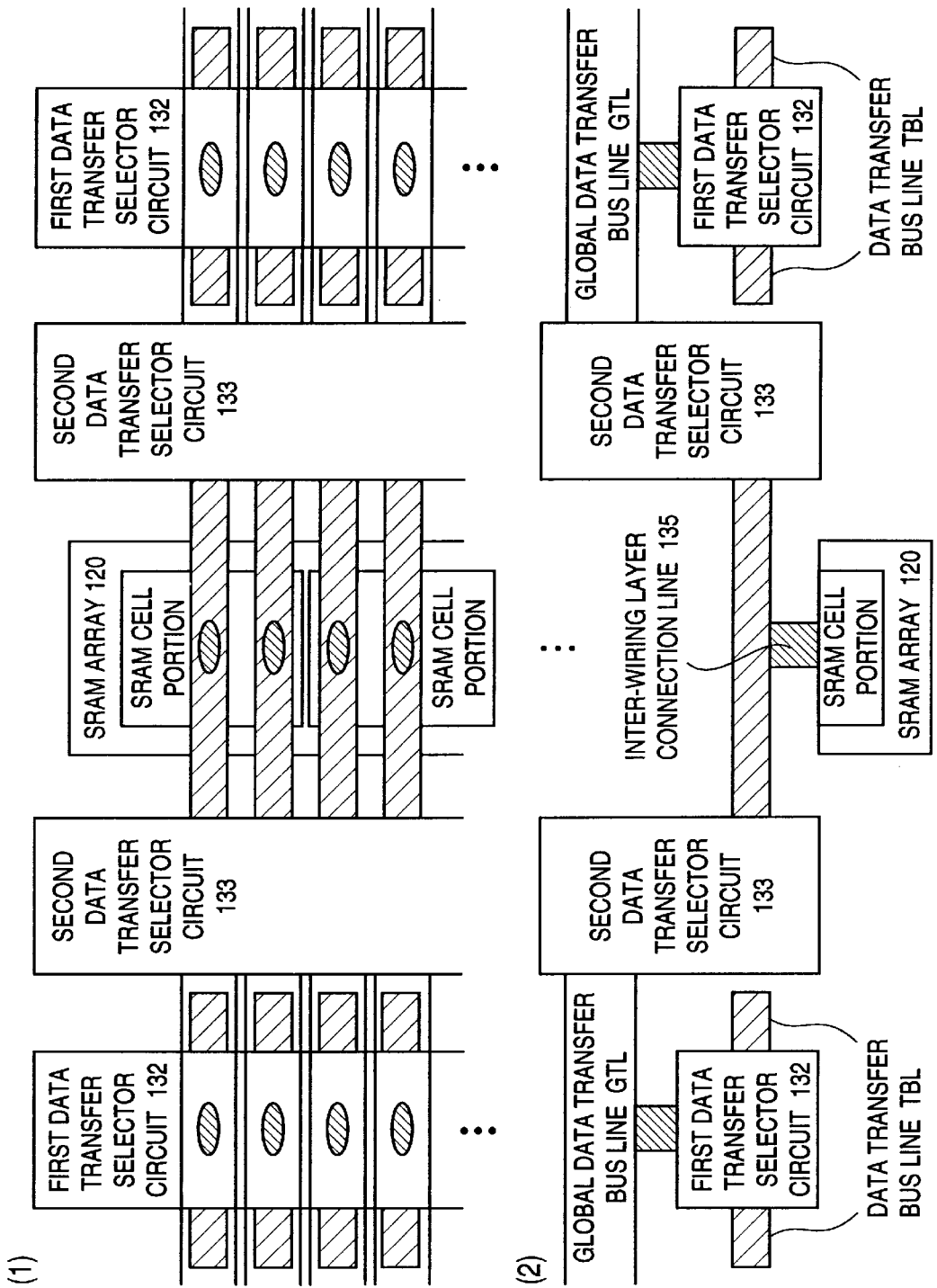
FIG. 53 shows a wiring construction of a DRAM array portion, a data transfer bus line and an SRAM array portion of a semiconductor memory device according to an embodiment of the present invention.

FIGS. 52(1) and 52(2) are a plan view of a wiring in the DRAM array portion of this construction and a hierarchical view of the wiring in the DRAM array portion in a cross sectional direction, respectively. In FIG. 52, the data transfer bus line is divided to a first data transfer bus line TBLA and a second data transfer bus line TBLB and one of the data transfer bus line TBLA and TBLB is selected by the data transfer selection circuit 131 and connected to the global data transfer bus line GTL. Since the global data transfer bus line GTL is connected to the SRAM array 120, it is possible to mutually transfer data between the DRAM and the SRAM. Although the DRAM array is divided by two in this embodiment, it is possible to divide the DRAM more finely. FIG. 53 shows an example in which the DRAM array is divided finely. This construction has the features of the layouts shown in FIGS. 36 and 38. In FIG. 53, the DRAM array is divided by four and it is possible to transfer data between the DRAM and the SRAM by performing the selection of the data transfer bus lines by the first data transfer selector circuits 132 and the selection of the global data transfer bus lines GTL by the second data transfer selector circuits 133, making the direct mapping system and a mapping system of set associative system possible. The DRAM array can be divided more finely. In such case, the data transfer bus lines and the first data transfer selector circuits are connected in parallel to the global data transfer bus lines.

Figure 39:
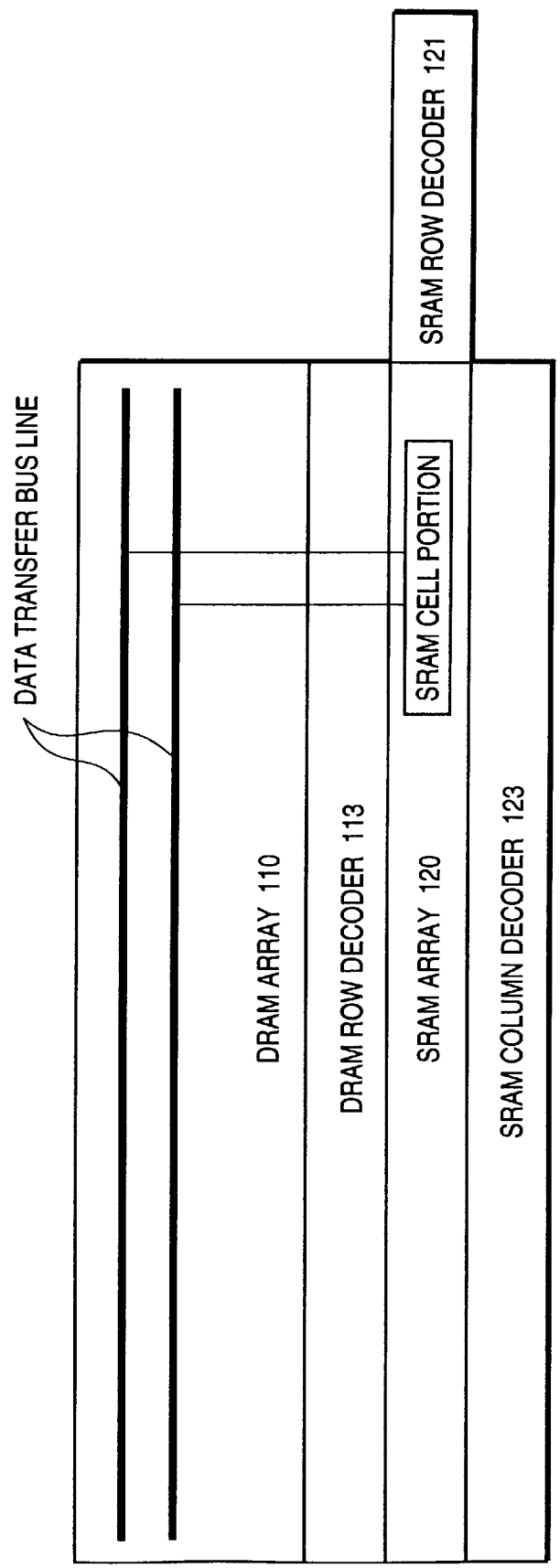
FIG. 39 is a layout of arrays schematically showing an array arrangement of a semiconductor memory device according to an embodiment of the present invention.

FIG. 39 shows another example of the array layout of the semiconductor memory device to which the present invention is applied.

In FIG. 39, wiring layers which are different from the data transfer bus lines shown in FIG. 36 or 38 are used. The wiring for connecting data transfer bus lines arranged on the DRAM array to the SRAM array is formed in a wiring layer which is different from that for the data transfer bus lines. In FIG. 39, the SRAM array and the SRAM column decoder are provided adjacent to the DRAM row decoder. In this example, it is also possible to transfer data between the cell groups on any row of the DRAM selected by the DRAM row decoder 113 adjacent to the DRAM array 110 and the cell groups on a certain row of the SRAM selected by the SRAM row decoder 121 adjacent to the SRAM array 120, making the direct mapping system and a mapping system of set associative system possible.

Figure 40:
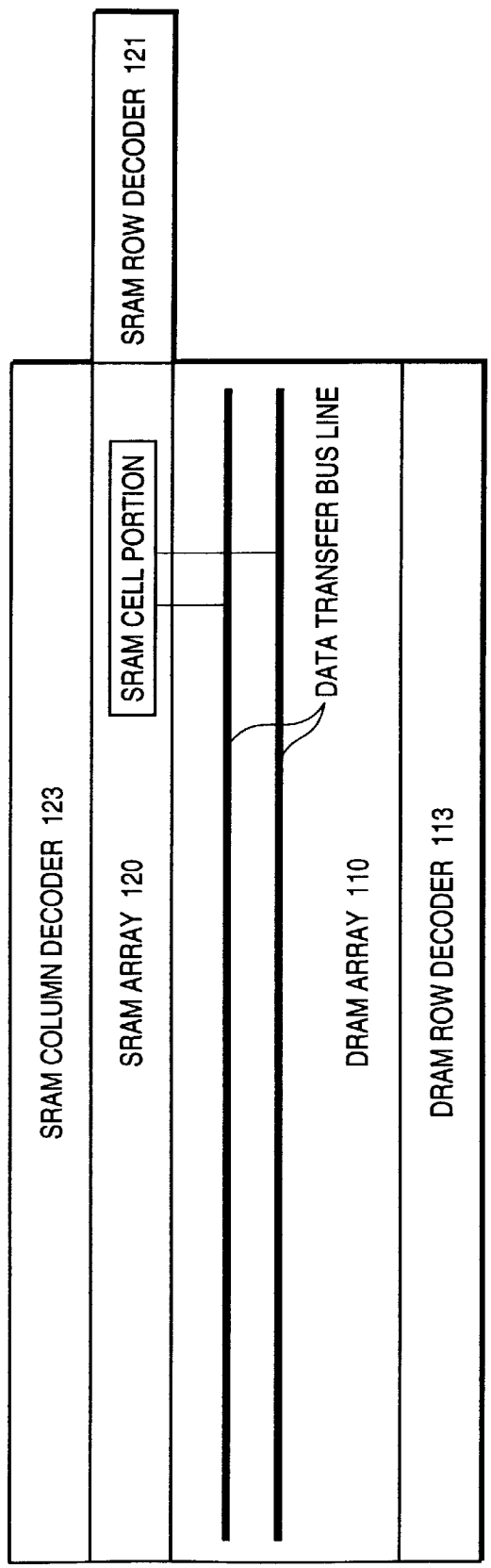
FIG. 40 is a layout of arrays schematically showing an array arrangement of a semiconductor memory device according to an embodiment of the present invention.

As shown in FIG. 40, the data transfer bus lines are not always necessary to arrange adjacent to the DRAM row decoder and the position in which the SRAM array, the SRAM column decoder and the SRAM row decoder are arranged is not limited so long as the DRAM array and the SRAM array are connected such that a mutual data transfer therebetween is possible.

In a case where bus lines such as the data transfer bus lines and the global data transfer bus lines are formed as different wiring layers, these bus lines may be constructed with different wiring layers by combining, in addition to the usual metal wiring, polysilicon wiring, polycide wiring, silicide wiring and/or high melting point metal wiring, etc. In such case, the combination of them is optimized by taking wiring resistance and limitation in process into consideration. For example, a combination of (the first layer of aluminum wiring and the second layer of aluminum wiring) or a combination of (the first layer of tungsten silicide wiring and the second layer of aluminum wiring) may be considered.

2. [Overall Layout]

Figure 41:
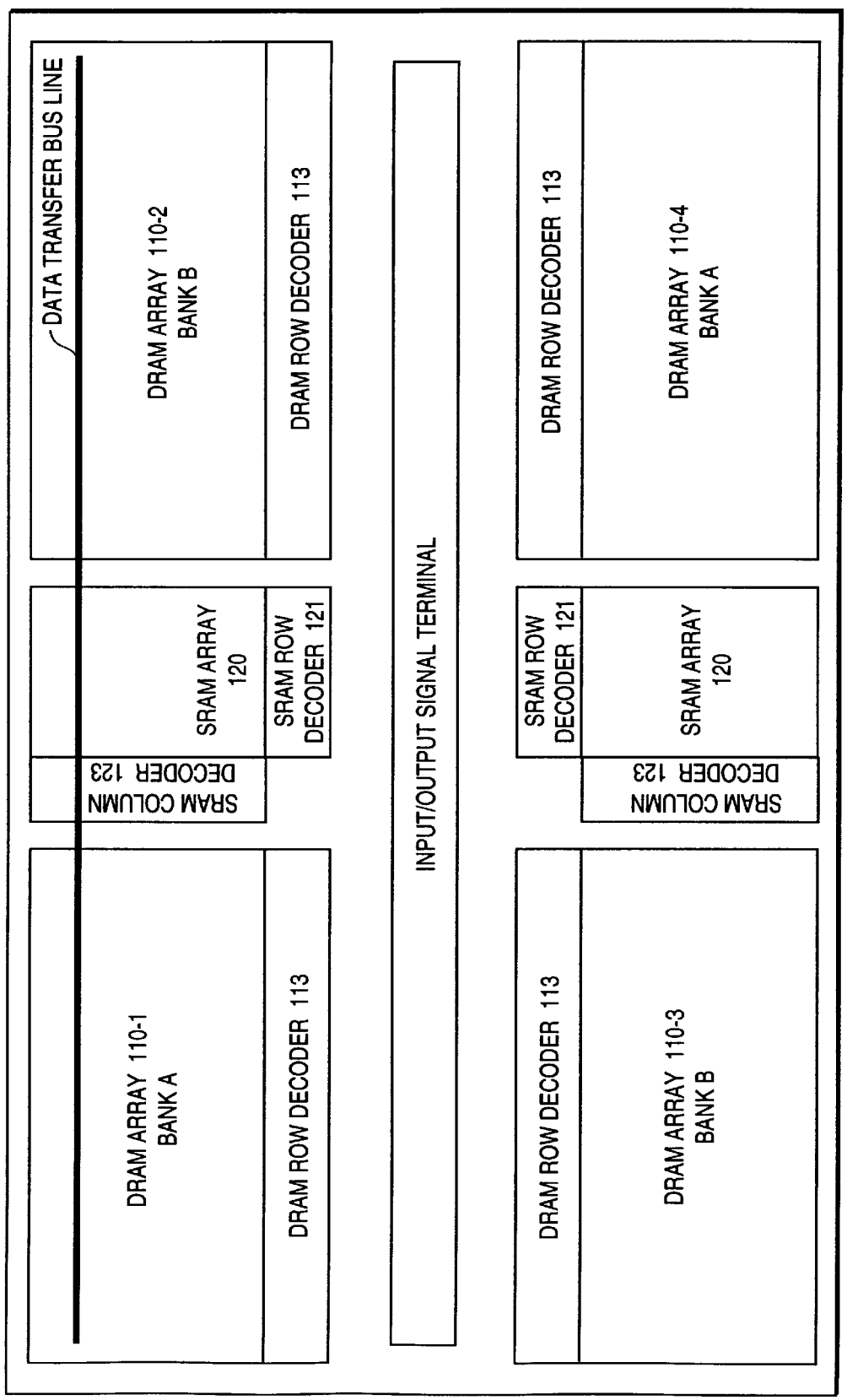
FIG. 41 schematically shows a whole layout of chips of a semiconductor memory device according to an embodiment of the present invention.

FIG. 41 shows an overall chip layout of an embodiment of the semiconductor memory device to which the present invention is applied. The semiconductor memory device shown in FIG. 41 includes a 64-Mbit DRAM array of ×8-bit, 2-bank construction as the main memory portion, a 16-Kbit SRAM array as a sub memory portion and a synchronous interface. However, it is possible to construct the semiconductor memory device in other ways.

A cross shape area including a vertical center portion and a lateral center portion is provided as shown in FIG. 41. DRAM arrays 110-1, 110-2, 110-3 and 110-4 each having a memory capacity of 16-Mbits are arranged in four areas divided by the cross shape area, respectively. An overall memory capacity of the DRAM arrays 110-1, 110-2, 110-3 and 110-4 is 64-Mbits. DRAM row decoders 113 are provided adjacent to lower portions of the DRAM arrays 110-1 and 110-2, respectively. Similarly, DRAM row decoders 113 are arranged adjacent to upper portions of the DRAM arrays 110-3 and 110-4, respectively. An SRAM array 120-1, an SRAM row decoder 121 and an SRAM column decoder 123 are arranged between the DRAM arrays 110-1 and 110-2. Similarly, an SRAM array 120-2, an SRAM row decoder 121 and a column decoder 123 are arranged between the DRAM arrays 110-3 and 110-4. The data transfer bus line traverses the DRAM array 110-1, the SRAM array 120 and the DRAM array 110-2 such that the data transfer between selected DRAM cell groups and a selected SRAM cell group is possible. Similarly, the data transfer bus line traverses the DRAM array 110-3, the SRAM array 120 and the DRAM array 110-4 such that selected DRAM cell groups and a selected SRAM cell group is possible.

An operation control circuit and a data control circuit, etc., are arranged in other portions of FIG. 41. Although other arrangement may be possible, an input/output signal terminal is arranged in the lateral center portion in the shown embodiment.

Figure 48:
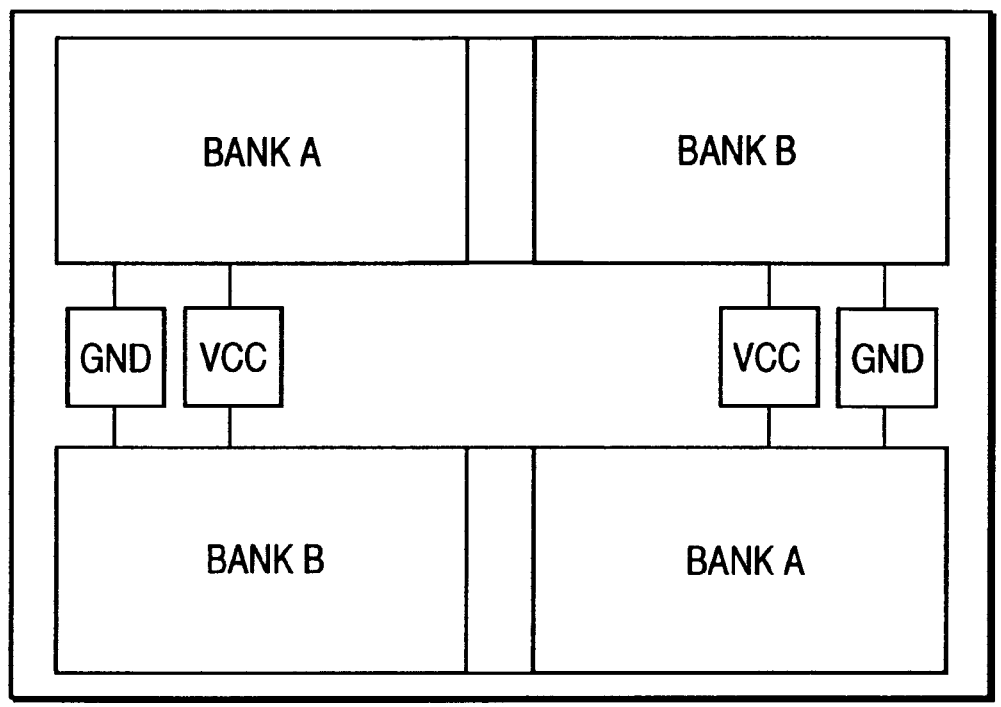
FIG. 48 schematically shows blocks which use a common power source of a semiconductor memory device according to an embodiment of the present invention.

In FIG. 41, the main memory portion has the 2-bank construction having a layout in which portions which are selected simultaneously are not concentrated in a portion so that, when the bank A is selected, the DRAM arrays 110-1 and 110-4 are selected simultaneously and, when the bank B is selected, the DRAM arrays 110-2 and 110-3 are selected simultaneously. That is, as shown in FIG. 48, the arrangement of the DRAM arrays is constructed such that a load on an internal power source wiring VCC and an internal ground wiring GND, etc., is not one sided. It is, of course, possible to use the DRAM arrays 110-1 and 110-3 as the bank A and the DRAM arrays 110-2 and 110-4 as the bank B, to increase the number of division to thereby disperse areas to be selected simultaneously or reduce areas to be selected simultaneously.

Figure 42:
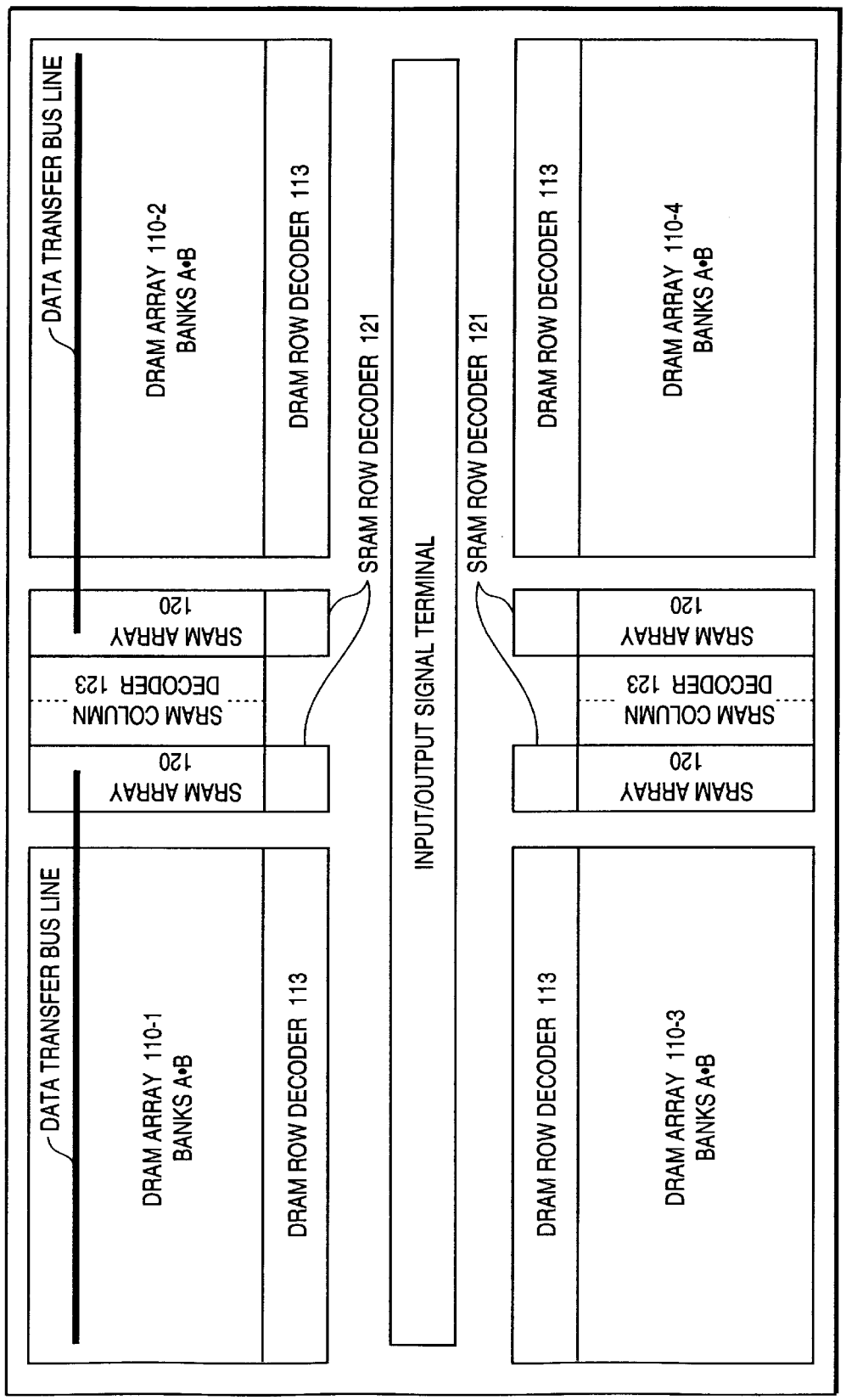
FIG. 42 schematically shows a whole layout of chips of a semiconductor memory device according to an embodiment of the present invention.

FIG. 42 shows an overall chip layout of another embodiment of the semiconductor memory device to which the present invention is applied. DRAM arrays 110-1, 110-2, 110-3 and 110-4 are arranged in divided four areas, respectively. The DRAM arrays 110-1, 110-2, 110-3 and 110-4 each having a memory capacity of 16-Mbits and grouped in banks A and B provide a total memory capacity of 64-Mbits. DRAM row decoders 113 are provided adjacent to lower portions of the DRAM arrays 110-1 and 110-2, respectively. Similarly, DRAM row decoders 113 are arranged adjacent to upper portions of the DRAM arrays 110-3 and 110-4, respectively. Between the DRAM arrays 110-1 and 110-2 and between the DRAM arrays 110-3 and 110-4, SRAM arrays 120-1, 120-2, 120-3 and 120-4, SRAM row decoders 121 and SRAM column decoders 123 are arranged, respectively. Although, in FIG. 42, the SRAM column decoders 123 are shown as one block for the SRAM arrays on both sides, it is possible to provide one SRAM column decoder 123 for each SRAM array. The data transfer bus line for exchanging data between a selected DRAM cell group and a selected SRAM cell group traverses the DRAM array 110-1 and the SRAM array 120-1 such that the data transfer between them is possible. Similarly, the data transfer bus line is provided between other DRAM arrays and other SRAM arrays.

An operation control circuit and a data control circuit, etc., are arranged in other portions of FIG. 42. Although other arrangement may be possible, an input/output signal terminal is arranged in the lateral center portion in the shown embodiment.

Figure 43:
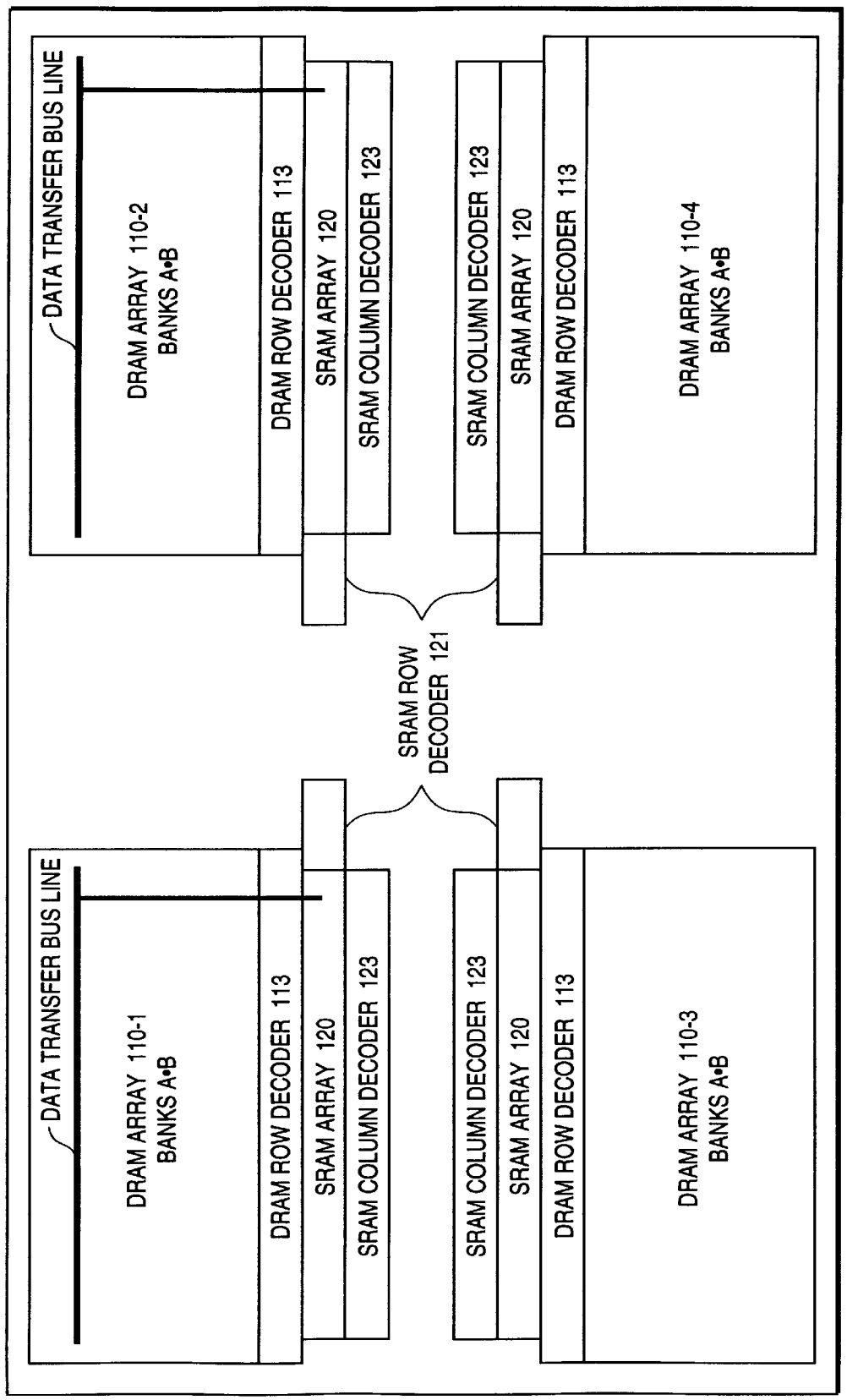
FIG. 43 schematically shows a whole layout of chips of a semiconductor memory device according to an embodiment of the present invention.

FIG. 43 shows an overall chip layout of another embodiment of the semiconductor memory device to which the present invention is applied. DRAM arrays 110-1, 110-2, 110-3 and 110-4 are arranged in divided four areas, respectively. The DRAM arrays 110-1, 110-2, 110-3 and 110-4 each having a memory capacity of 16-Mbits and grouped in banks A and B provide a total memory capacity of 64-Mbits. DRAM row decoders 113 are provided adjacent to upper or lower portions of the DRAM arrays 110-1 and 110-2, respectively. Similarly, SRAM arrays 120, SRAM row decoders 121 and SRAM column decodes 123 corresponding to the respective DRAM arrays 110 are arranged adjacent to the DRAM row decoders 113. The data transfer bus line for exchanging data between a selected DRAM cell group and a selected SRAM cell group traverses the DRAM arrays and are connected to the SRAM arrays through a wiring layer difference from that of the data transfer bus line.

An operation control circuit and a data control circuit, etc., are arranged in other portions of FIG. 43.

Figure 44:
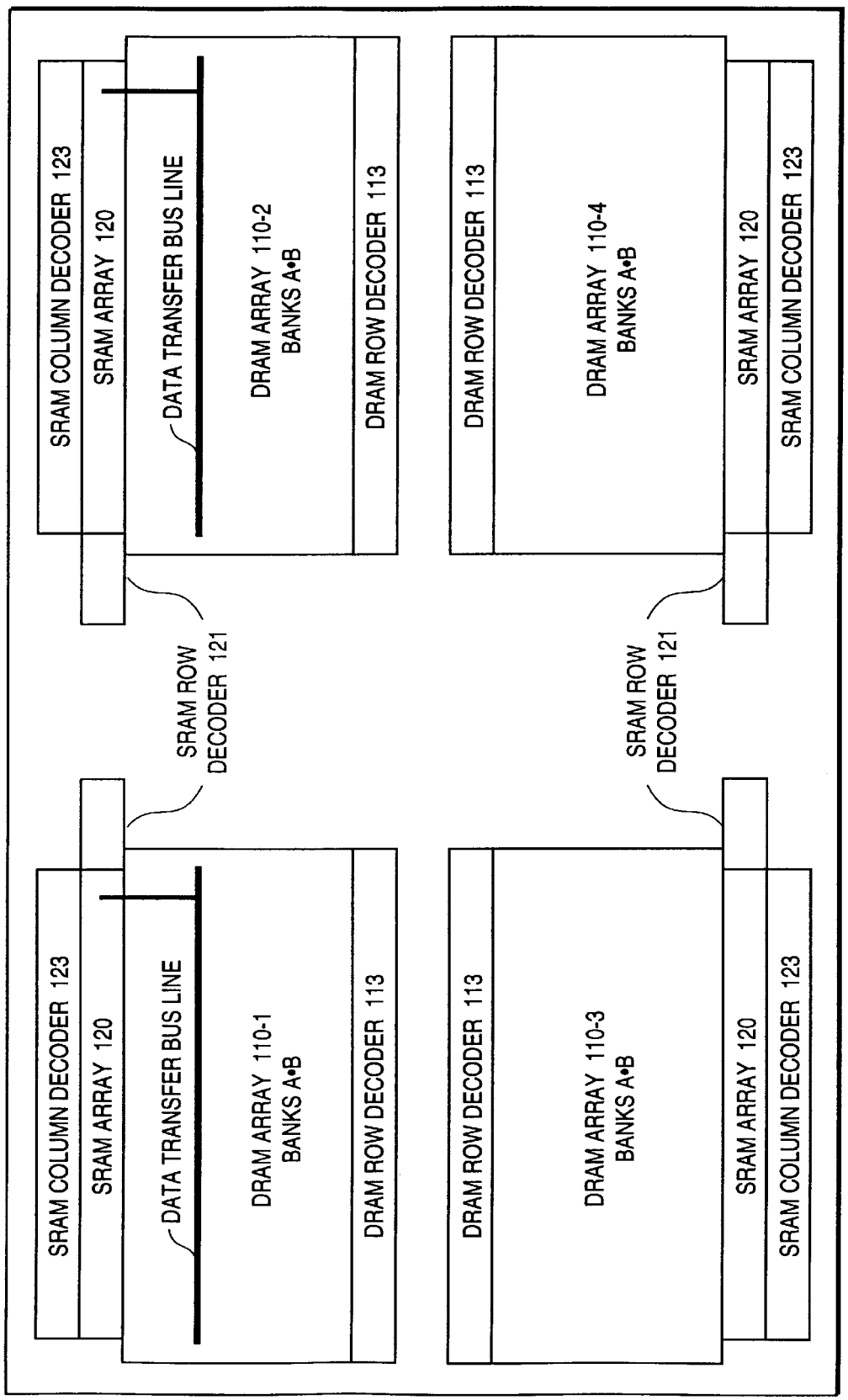
FIG. 44 schematically shows a whole layout of chips of a semiconductor memory device according to an embodiment of the present invention.

FIG. 44 shows an overall chip layout of another embodiment of the semiconductor memory device to which the present invention is applied. In FIG. 44, the arrangement of the SRAM arrays, the SRAM row decoders and the SRAM column decoders shown in FIG. 43 is changed. However, this arrangement may be further changed so long as the data transfer between a selected DRAM cell group and a selected SRAM cell group is possible.

Figure 45:
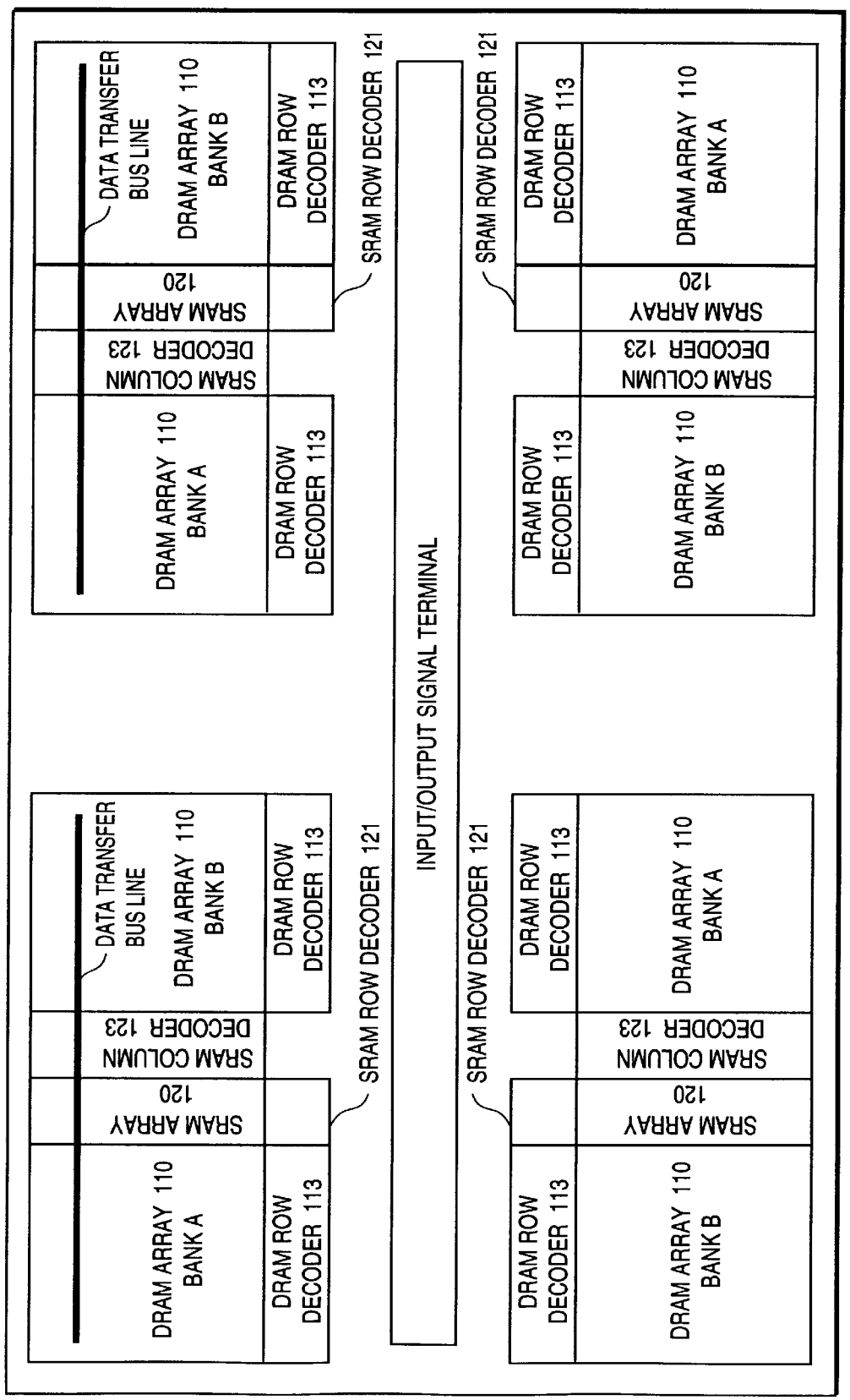
FIG. 45 schematically shows a whole layout of chips of a semiconductor memory device according to an embodiment of the present invention.

FIG. 45 shows an overall chip layout of another embodiment of the semiconductor memory device to which the present invention is applied. In FIG. 45, two of the layout construction shown in FIG. 41 are combined by more finely ididving the main memory portion and the sub main memory portion. The layout may be constructed by combining a number of constructions each shown in FIG. 41 or by using a combination of the constructions each shown in FIG. 42.

Figure 49:
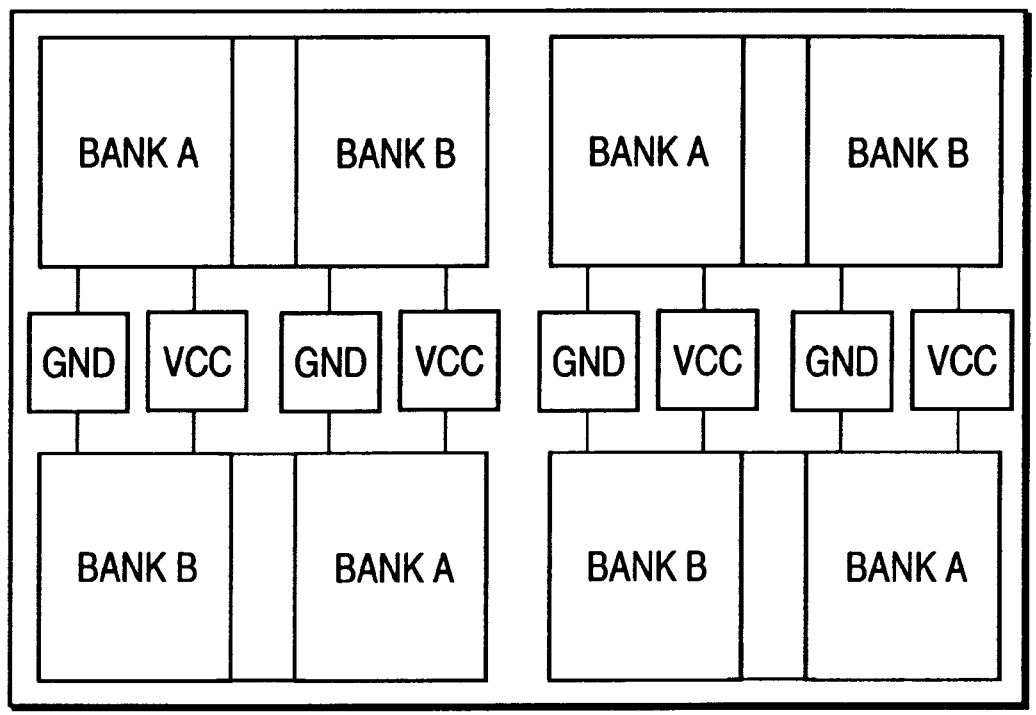
FIG. 49 schematically shows blocks which use a common power source of a semiconductor memory device according to an embodiment of the present invention.

Incidentally, the main memory portion shown in FIG. 45 is of 2-bank construction in which the portions selected simultaneously are not concentrated to portions of the banks A and banks B. Therefore, as shown in FIG. 49, the arrangement of the DRAM arrays is constructed such that a load on an internal power source wiring VCC and an internal ground wiring GND, etc., is not one sided. It is, of course, possible to disperse or reduce areas to be selected simultaneously.

Figure 46:
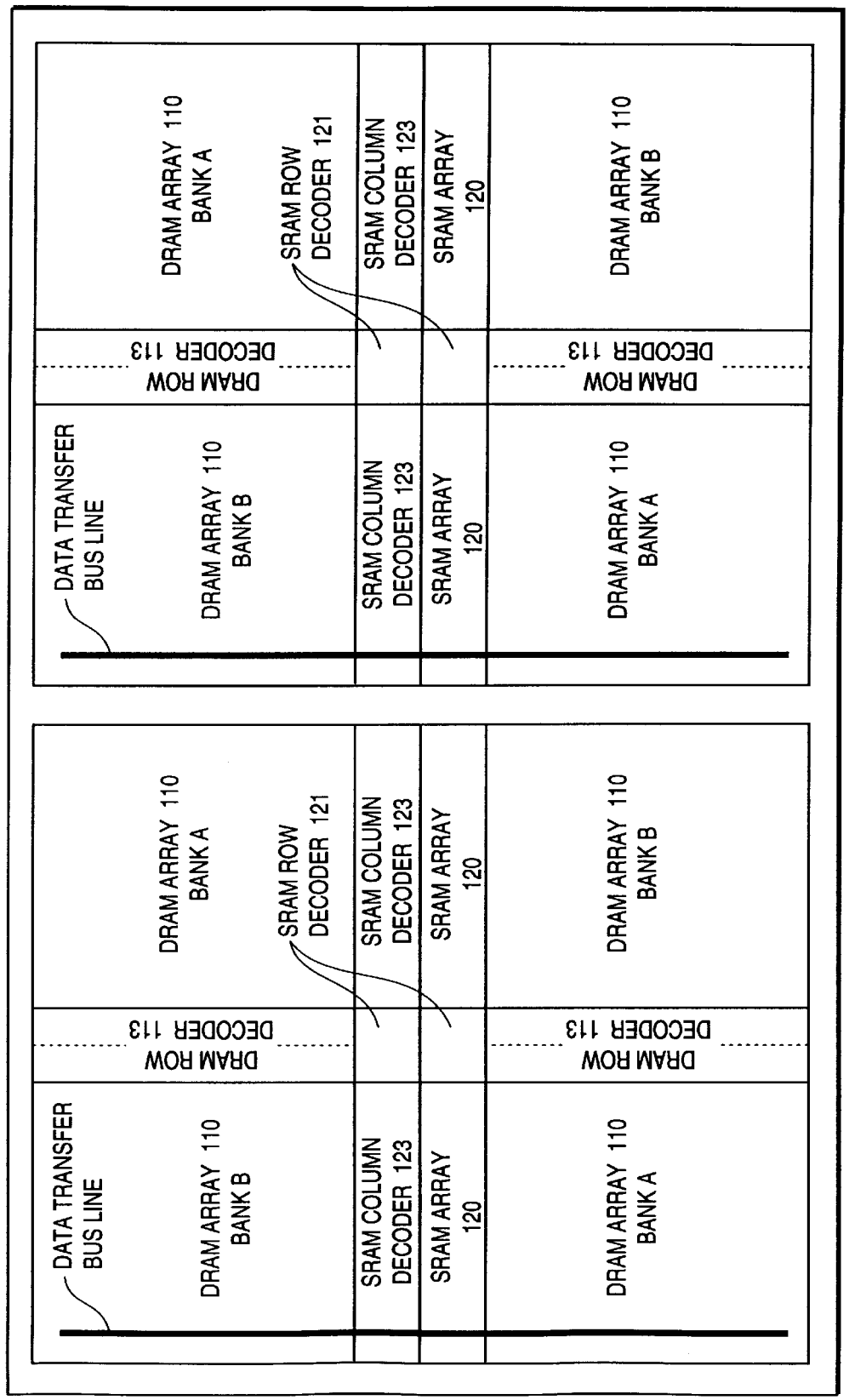
FIG. 46 schematically shows a whole layout of chips of a semiconductor memory device according to an embodiment of the present invention.

FIG. 46 shows an overall chip layout of another embodiment of the semiconductor memory device to which the present invention is applied. In FIG. 46, the data transfer bus lines extend vertically contrary to FIG. 45. Although the DRAM row decoder and the SRAM row decoder are shown in FIG. 46 as one block for the DRAM array and the SRAM array on both sides, the DRAM row decoder may be provided for each DRAM array and the SRAM row decoder may be provided for each SRAM array.

Figure 47:
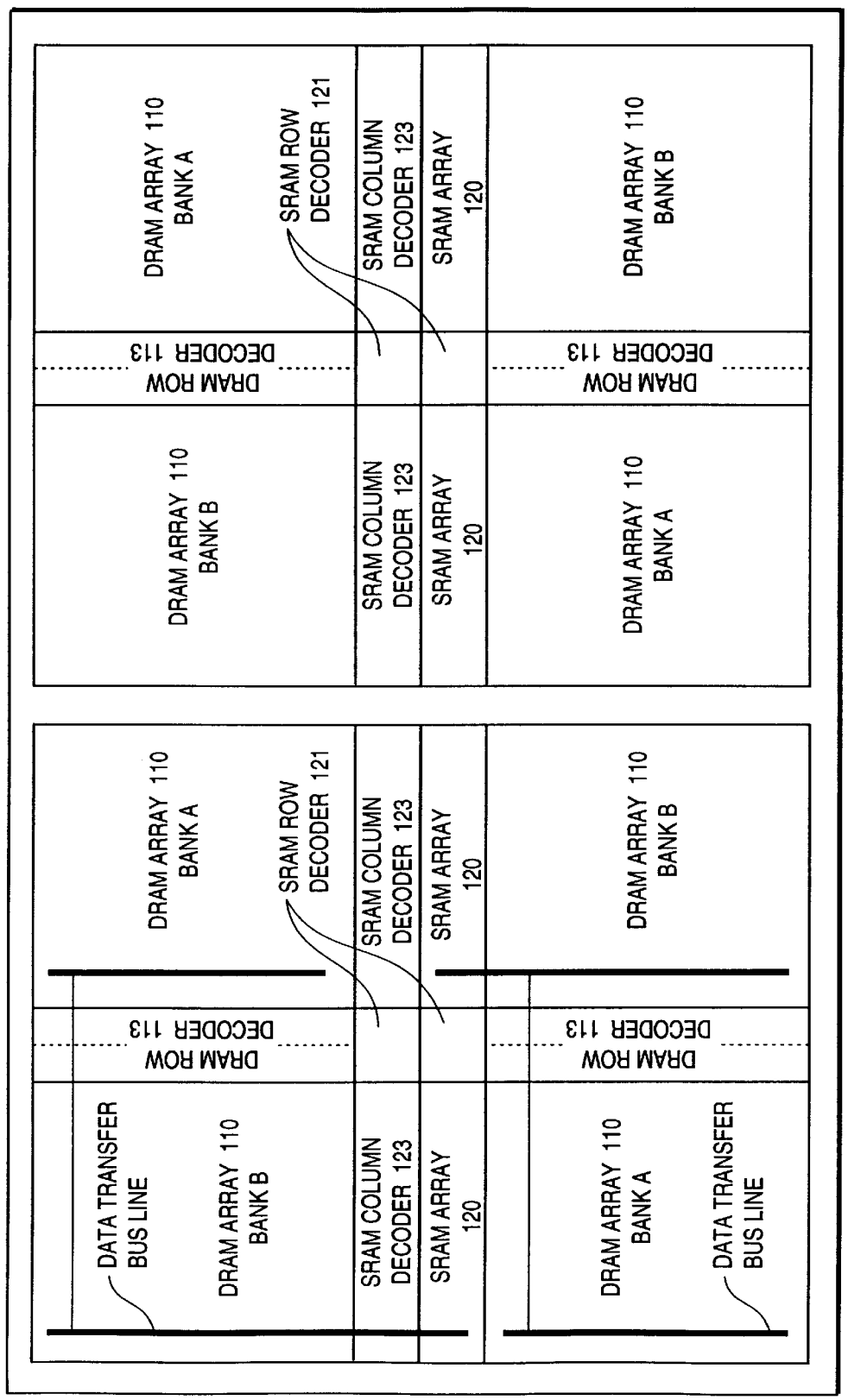
FIG. 47 schematically shows a whole layout of chips of a semiconductor memory device according to an embodiment of the present invention.

Further, the banks on both sides of the DRAM row decoder may be connected through a common data transfer bus line as shown in FIG. 47.

(7) Detailed Description of the Respective Blocks

The respective circuit blocks of the overall block diagram shown in FIG. 1 will be described in detail. It should be noted that the following description is for a mere embodiment and this invention is not limited thereto.

1. {Operation Control Circuit}

Figure 54:
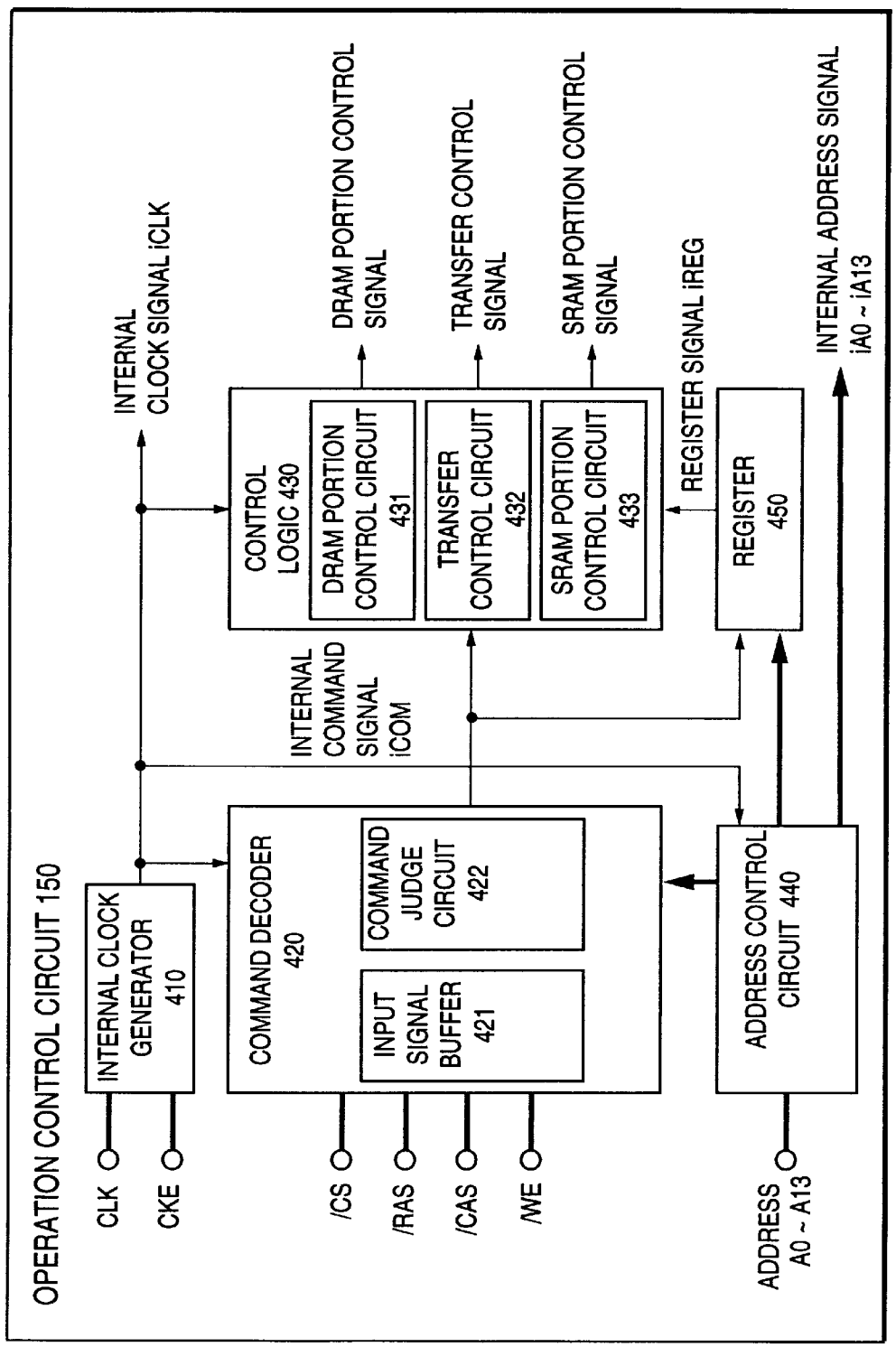
FIG. 54 is a block diagram of an operation control circuit of the semiconductor memory device shown in FIG. 1.

FIG. 54 is a circuit diagram of the operation control circuit 150.

The operation control circuit 150 is constructed with an internal clock generator circuit 410, a command decoder 420, a control logic 430, an address control circuit 440 and a mode register 450.

The internal clock generator circuit 410 generates an internal clock signal iCLK from the external input signals CLK and CKE.

The internal clock signal ICLK is supplied to the command decoder 420, the control logic 430, the address control circuit 440 and the data control circuit to control the timing of the respective portions.

The command decoder 420 includes a buffer 421 for receiving the respective input signals and a command judge circuit 422. The /CS signal, the /RAS signal, the /CAS signal and the /WE signal are transmitted to the command judge circuit 421 in synchronism with the internal clock signal ICLK to generate an internal command signal iCOM. The command generator circuit 421 responds to the respective input signals in manners indicated in a correspondence table of the commands and the respective input terminal states as shown in FIG. 10.

The control logic 430 responds to the internal command signal ICOM, the internal clock signal ICLK and the register signal iREG to generate the control signal necessary to perform operations assigned by these signals. The control logic 430 includes a DRAM control circuit 431, a transfer control circuit 432 and an SRAM control circuit 433 which generate respective control signals.

The register 450 functions to hold data defined by a combination of data of a specific address input when it receives a specific register write signal from the command judge circuit and holds the data until a register write signal is input again. The data held in the register is referenced when the control logic 430 operates.

2. {DRAM Portion}

[DRAM Portion and Data Transfer Circuit]

Figure 55:
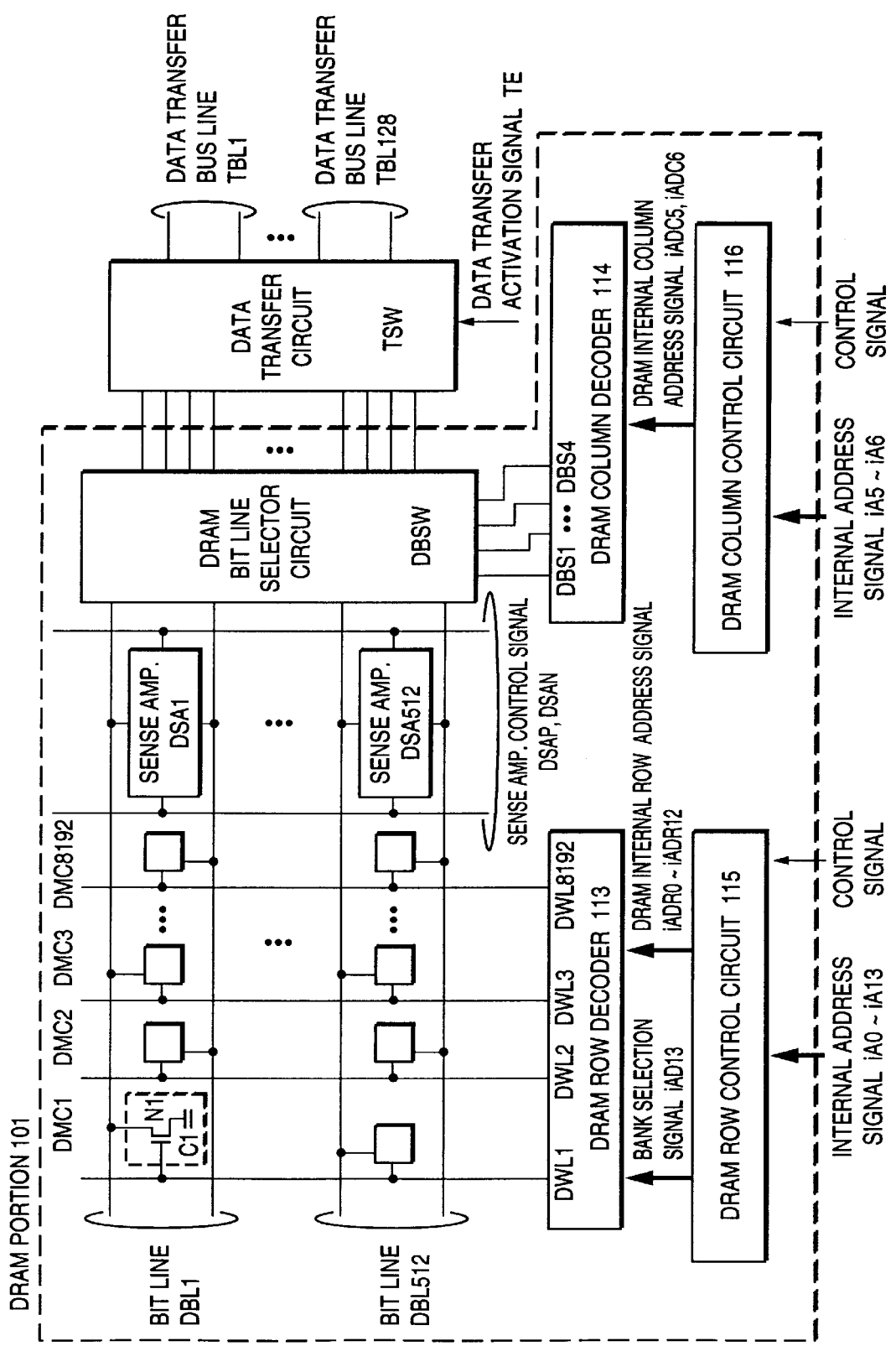
FIG. 55 shows in detail a construction of the DRAM portion and the data transfer circuit shown in FIG. 1.

FIG. 55 shows a concrete construction of the DRAM portion and the data transfer circuit shown in FIG. 1.

In FIG. 55, the DRAM portion 101 includes a plurality of dynamic memory cells DMC arranged in a matrix. Each memory cell DMC includes a memory transistor Nl and a memory capacitor C1. A constant potential Vgg (½ Vcc, etc.) is applied to one terminal of the memory capacitor C1. Further, the DRAM portion 101 includes DRAM word lines DWL to which the DRAM cells DMC are connected in rows and DRAM bit lines DBL to which the DRAM cells DMC are connected in columns. Each bit line is paired with a complementary bit line. The DRAM cells DMC are positioned at cross points of the word lines DWL and the bit lines DBL, respectively. The DRAM portion 101 includes DRAM sense amplifiers DSA correspondingly to the bit lines DBL. The sense amplifier DSA functions to detect and amplify a potential difference between the paired bit lines and is controlled by sense control signals DSAP and DSAN. Since the DRAM array has a ×8-bit, 2-bank construction and has a memory capacity of 64 Mbits, the DRAM array includes word lines DWL1~DWL8192, bit lines DBL1~DBL512 and sense amplifiers DSA1~DSA512. This is a construction corresponding to ×1 bit of 1 bank.

The DRAM portion 101 includes the DRAM row decoder 113 for selecting one of the word lines DWL1~DWL8192 and the DRAM row control circuit 115 for generating DRAM internal row address signals iADR0~iADR12 and bank selection signal iAD13. Further, the DRAM portion 101 includes a DRAM bit line selection circuit DBSW which selects one of four bit line pairs by the DRAM bit line selection signals DBS1~DBS4 generated by the DRAM column decoder 114 and connects it to the data transfer bus line TBL through the data transfer circuit 103. Further, the DRAM portion 101 includes a DRAM column control circuit 116 for generating DRAM column address signals iADC5 and iADC6 which are used by the DRAM column decoder.

Figure 56:
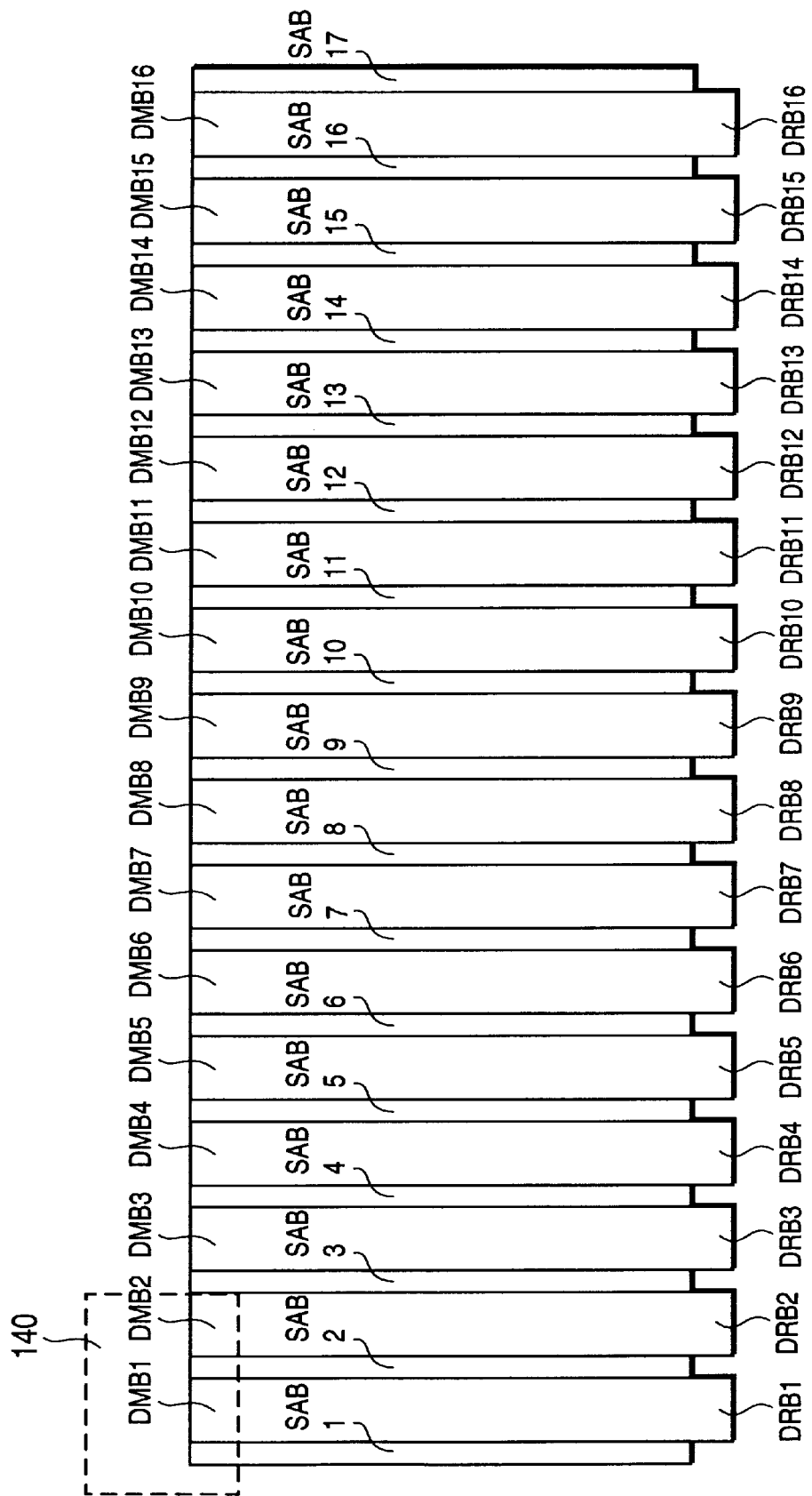
FIG. 56 shows in detail an example of the array construction of a DRAM array 110-1 of the whole layout which is an embodiment of the present invention shown in FIG. 41.

FIG. 56 shows an example of a concrete array construction of the DRAM array 110-1 of the overall layout shown in FIG. 41.

In FIG. 56, the DRAM array is divided to 16 memory cell blocks DMB1~DMB16. DRAM row decoders DRB1~DRB16 corresponding to the respective memory cell blocks DMB1~DMB16 and blocks SAB1~SAB17 corresponding to (sense amplifier +DRAM bit line selector circuit +data transfer circuit) are provided. In this Figure, each memory cell blocks DMB1~DMB16 has a memory capacity of 1-Mbits in 512 rows×2048 columns. It should be noted that the number of memory cell blocks is not limited to 16.

As shown in FIG. 56, when the DRAM memory cell array is divided to a plurality of portions, the length of each bit line is shortened. Therefore, the capacitance of the bit line and it is possible to increase the potential difference between the paired bit lines when data is read out. Further, since, during the operation, only sense amplifier corresponding to the memory block including word line selected by the row decoder is operated, it is possible to reduce power consumption due to charging/discharging of the bit line.

Figure 57:
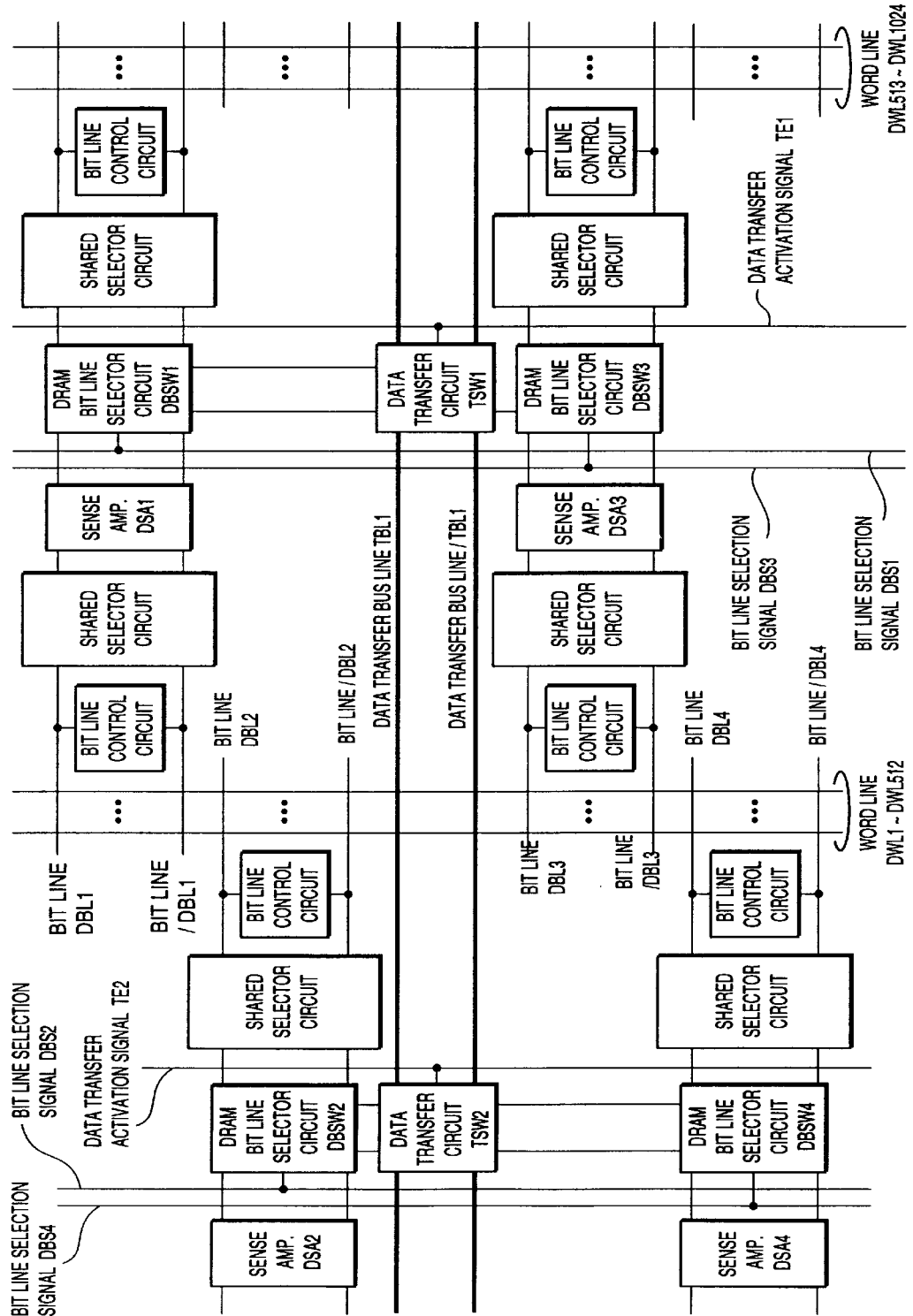
FIG. 57 shows in detail an example of a connecting relation between the transfer bus line and the bit lines for a portion (corresponding to 4 pairs of bit lines) of the layout shown in FIG. 56.

FIG. 57 shows, in detail, an example of a connecting relation between the transfer bus line and bit lines in a portion 140 (including 4 pairs of bit lines) of the layout shown in FIG. 56.

In FIG. 57, sense amplifiers DSA are arranged in zigzag manner such that a sense amplifier DSA1 corresponding to 1 column is located in one end of a memory cell block and a sense amplifier DSA2 corresponding to a next column is located in the other end of the memory cell block, etc. Such zigzag arrangement of the sense amplifiers is employed for the reason that, although the size of the memory cell can be miniaturized in the recent process technology, the miniaturization of sense amplifier in proportion to the miniaturization of memory cell is not achieved, and is necessary when there is no margin for arranging the sense amplifiers correspondingly to the bit line pitch. Therefore, when the bit line pitch is large enough, the sense amplifiers can be arranged in only one end of the memory cell block. One sense amplifier DSA is commonly used by two memory cell blocks through a shared selector circuit. Each bit line pair is provided with a bit line control circuit for equilibrating a potential difference between the bit lines thereof and pre-charging. The bit line control circuit may be used by two memory cell blocks similarly to the sense amplifier.

Figure 58:
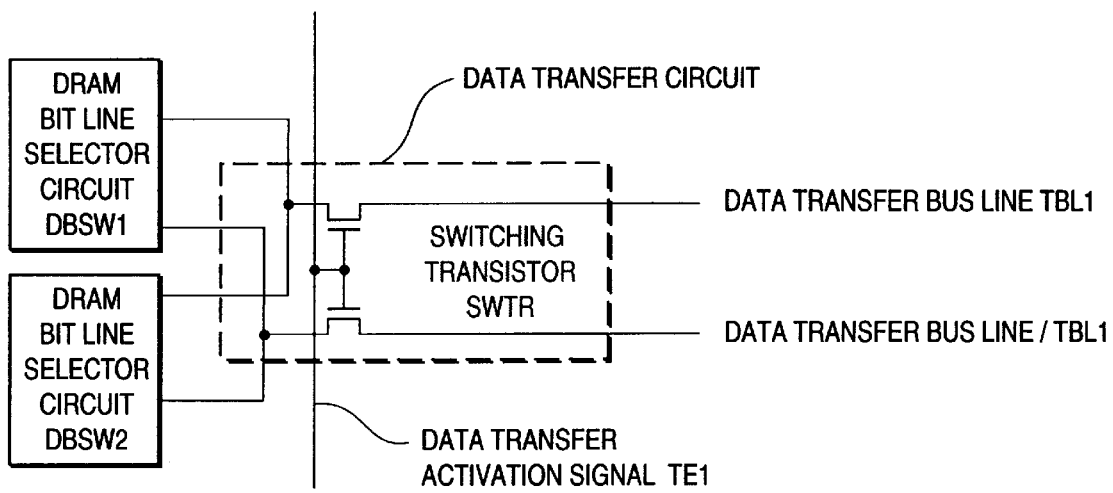
FIG. 58 is a circuit diagram showing the data transfer circuit in detail.
Figure 59:
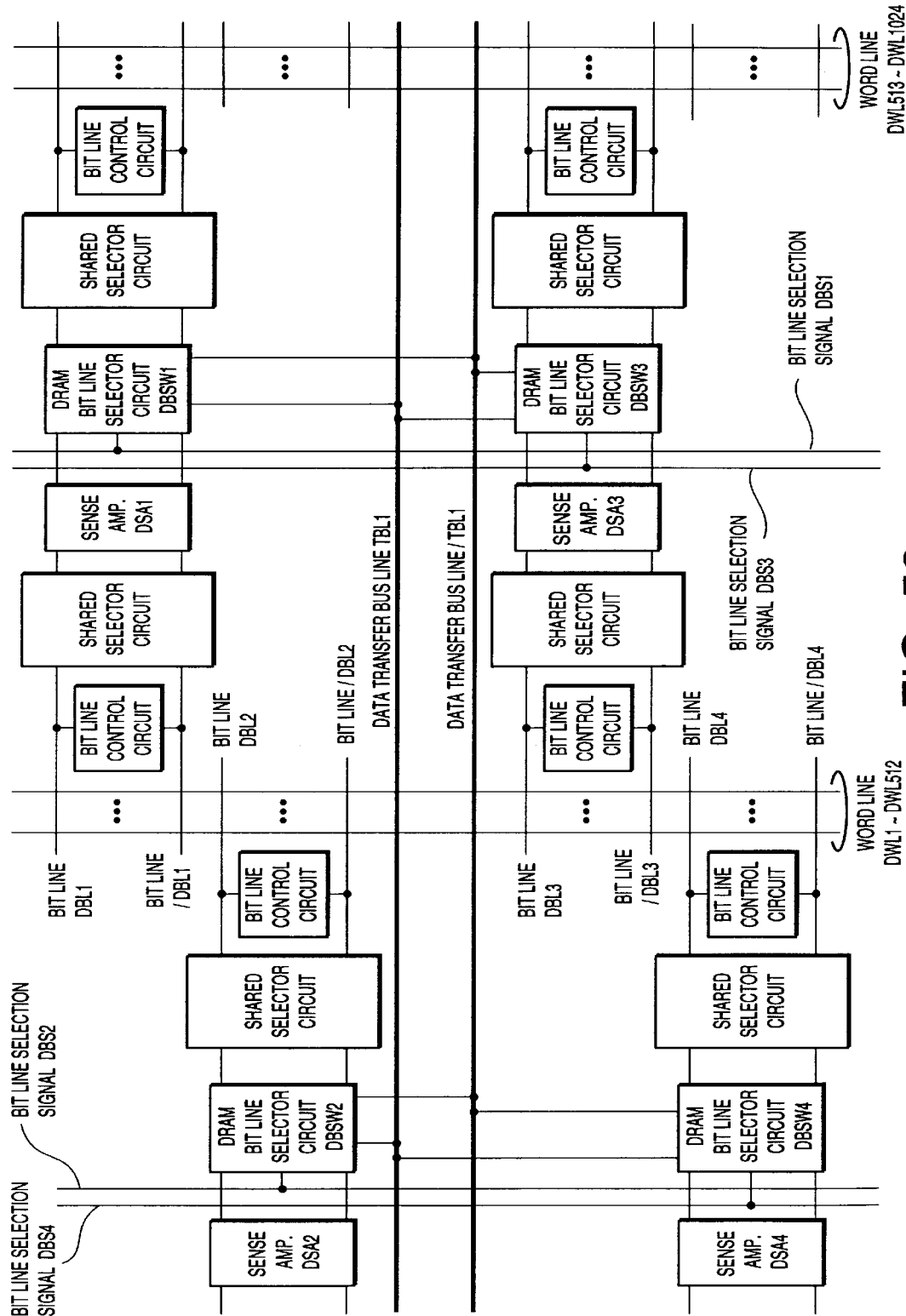
FIG. 59 shows an example of a construction for solving the problem of the example shown in FIG. 57.

The bit lines and the data transfer bus lines are connected through DRAM bit line selector circuits DBSW1~DBSW4 selected by DRAM bit line selection signals DBS1~DBS4 and data transfer circuits TSW1 and TSW2 which use switching transistors SWTR each shown in FIG. 58, in detail. Data transfer activation signals TE1 and TE2 for activating the data transfer circuits are obtained by logical operation of the transfer control signal generated by the operation control circuit shown in FIG. 54 and the address signals for selecting the memory cell block. In FIG. 57, since the bit line is connected to the data transfer bus line through the DRAM the data transfer circuit and the data transfer circuit, the data transfer circuit of a memory cell block, which is not activated, is in non-conduction state and there is no load of a DRAM bit line selection circuit connected thereto. There, it is possible to minimize the load of the data transfer bus line in operation. In the construction shown in FIG. 57, however, there is a problem that a chip area is increased since the data transfer circuits are arranged and the wiring for transmitting the data transfer activation signal for activating the data transfer circuits is provided. FIG. 59 shows an example of construction which solves such problem.

In FIG. 59, the bit line and the data transfer bus line are connected to each other through only the DRAM bit line selector circuits DBSW1~DBSW4 selected by the DRAM bit line selection signals DBS1~DBS4. This construction can be realized by providing the function of the data transfer circuit by adding a logic of the data transfer activation signal to the DRAM column decoder generating the DRAM bit line selection signal DBS1~DBS4. Although the load of the data transfer bus line is increased during operation, it is possible to make the chip area very small.

The activation of the DRAM portion and the column selection and data transfer operation will be described with reference to FIGS. 55 and 57. The activation of the DRAM portion will be described first. In FIG. 55, when the DRAM row selection control signal which is one of the DRAM portion control signals generated by the operation control circuit shown in FIG. 54 and the internal address signal iA0~iA13 are input to the DRAM row control circuit 115, the bank selection signal IAD13 and the internal DRAM row address signal IADR0~IADR12 are generated and the word line DWL of the bank assigned by the DRAM row decoder 113 is selected. With the selected word line DWL, data held in the cell DMC is output to the bit line DBL. The potential difference between the paired bit lines is detected and amplified by the sense amplifier DSA in response to the sense amplifier drive signals DSAN and DSAP. The number of sense amplifiers activated simultaneously in the DRAM portion 101 is 512 and, since the DRAM portion has the ×8-bit construction, the total number of the simultaneously activated sense amplifiers becomes 512×8=4096.

The column selection of the DRAM portion and the data transfer will be described. The DRAM column selection circuit 116 shown in FIG. 55 is input with a control signal which is one of the DRAM portion control signals generated by the operation control circuit shown in FIG. 54 in response to the internal address signals iA5 and iA6 and generates the DRAM column address signals IADC5 and IADC6. The DRAM column address signals IADC5 and IADC6 are input to the DRAM column decoder 114 and, after the DRAM bit line selection signals DBS1~DBS4 are generated and the bit line is selected, data of the bit line is transmitted to the data transfer bus line TBL by the data transfer activation signal TE obtained by a logic between the transfer control signal generated by the operation control circuit shown in FIG. 54 and the address signal for selecting the memory cell block. As shown in FIG. 59, with the logic of the data transfer activation signal in the DRAM column decoder, it is possible to provide the data transfer circuit function and the DRAM bit line selection signals DBS1~DBS4 can be made signals with which the column selection and the transfer operation are performed simultaneously.

Assuming, in FIG. 59, that the DRAM bit line selection signal DBS1 is selected, a signal synchronized with the transfer control signal is input to the DRAM bit line selection circuit DBSW1 and the data on the bit lines DBL1 and /DBL1, which is amplified by the sense amplifier DSA1 is transmitted to the data transfer bus lines TBL1 and /TBL1. The DRAM portion 101 shown in FIG. 55 includes 128 portions each shown in FIG. 59 and, since it has the ×8-bit construction, a total number of data transferred simultaneously from the bit line to the transfer bus line is 128×8= 1024. This number of data transferred simultaneously is the same in other bit construction.

[DRAM Row Control Circuit and DRAM Row Decoder]

Figure 60:
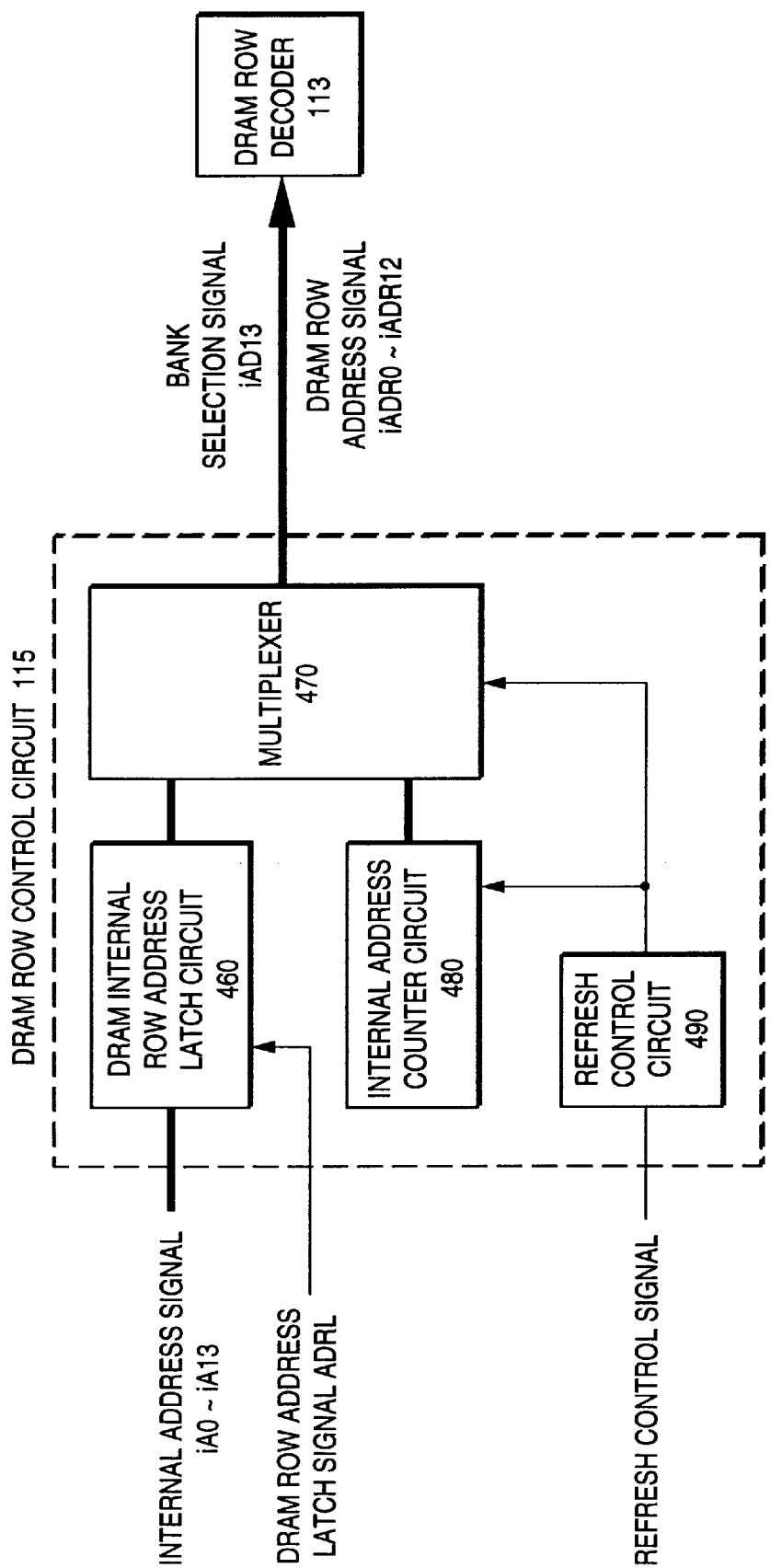
FIG. 60 is a block diagram showing an example of a DRAM line control circuit.

FIG. 60 is a block diagram of the DRAM row control circuit 115. The DRAM row control circuit 115 includes a DRAM internal row address latch circuit 460, a multiplexer 470, an internal address counter circuit 480 and a refresh control circuit 490.

In the usual activation of the DRAM portion, the DRAM row control circuit 115 outputs the DRAM internal row address signal IADR0~IADR12 and the bank selection signal IAD13 from the address latch circuit 460 which is input with the DRAM row address latch signal ADRL and the internal address signal iA0~iA13 to the DRAM row decoder 113 through the multiplexer 470.

In the refresh operation, the DRAM row control circuit 115 receives the refresh control signal and the refresh control circuit 490 operates the internal address counter circuit 480 to control the multiplexer 470 such that the selection signal from the internal address counter circuit is output. As a result, the DRAM internal row address signal IADR0~IADR12 and the bank selection signal IAD13 are output to the DRAM row decoder 113 without input of the address signal. The internal address counter circuit 480 automatically add or subtract the address according to a predetermined method every time the refresh operation is performed, making an automatic selection of all of the DRAM rows possible.

[DRAM Column Control Circuit and DRAM Column Decoder]

Figure 61:
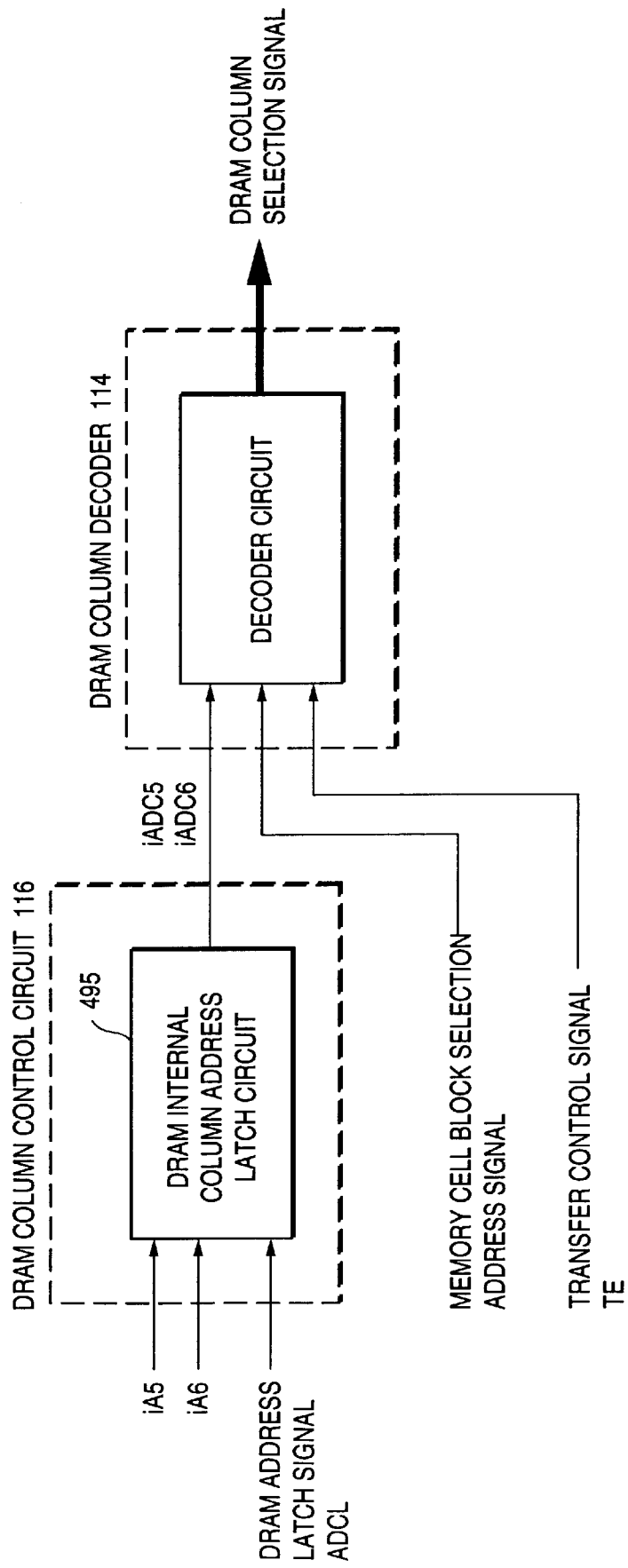
FIG. 61 shows an example of a concrete construction of a DRAM row control circuit and a DRAM row decoder shown in FIG. 55.

FIG. 61 shows a concrete example of the DRAM column control circuit and the DRAM column decoder shown in FIG. 55.

In FIG. 61, the DRAM column control circuit 116 comprises a DRAM internal column address latch circuit 495 and the DRAM internal column address signals IADC5~IADC6 are generated by the internal address signals iA5 and iA6 and the DRAM column address latch signal ADCL taken in a clock cycle of a command input of data transfer from the DRAM cell to the SRAM cell (prefetch transfer operation) and data transfer from the SRAM cell to the DRAM cell (restore transfer operation). The DRAM column address latch signal ADCL is one of the transfer control signals generated in the operation control circuit shown in FIG. 54. Further, the DRAM column decoder 114 decodes the DRAM internal column address signals IADC5~IADC6 generated by the DRAM column control circuit 116 and outputs the DRAM column selection signal generated when the memory block selection address signal and the transfer control signal TE are activated. Therefore, the activation signals TE1 and TE2 of the data transfer circuit shown in FIG. 57 are the output signal of the DRAM column decoder 114 and the function of the data transfer circuit is performed by the DRAM bit line selection circuit to be described later.

[DRAM Bit Line Selection Circuit]

FIGS. 62 to 65 show concrete examples of the circuit construction of the DRAM bit line selection circuit shown in FIG. 59.

Figure 62:
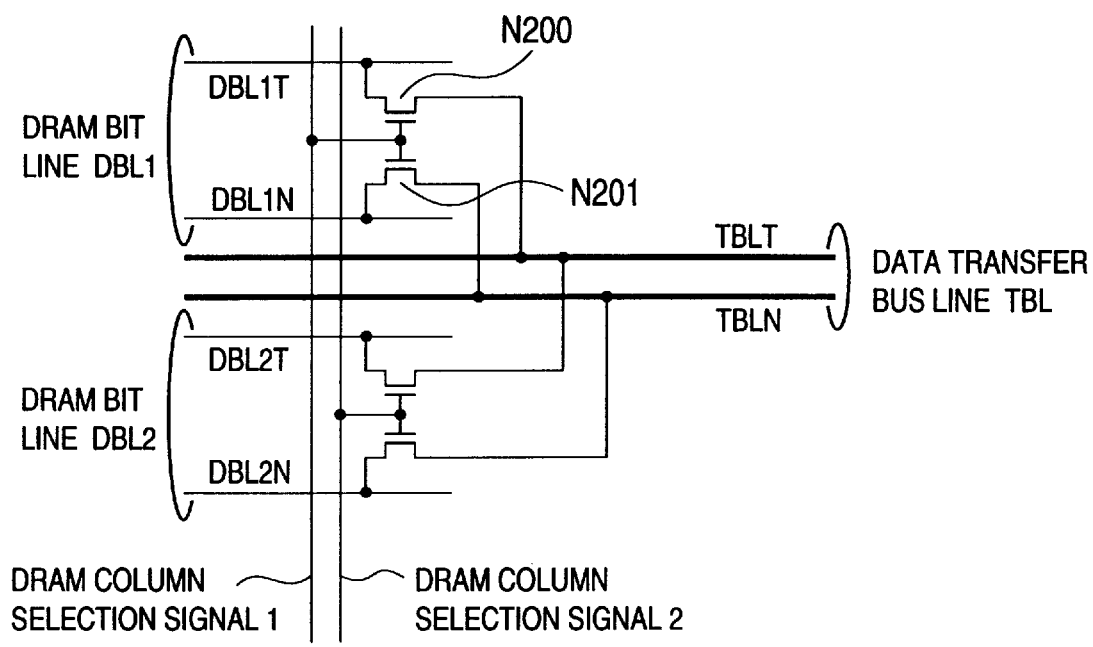
FIG. 62 shows an example of a concrete circuit construction of a DRAM bit line selection circuit.

FIG. 62 shows the simplest construction including N channel MOS switching transistors (referred to as NMOS transistors, hereinafter) N200 and N201, in which the DRAM bit line DBL and the data transfer bus line TBL are connected by the DRAM column selection signal.

Figure 63:
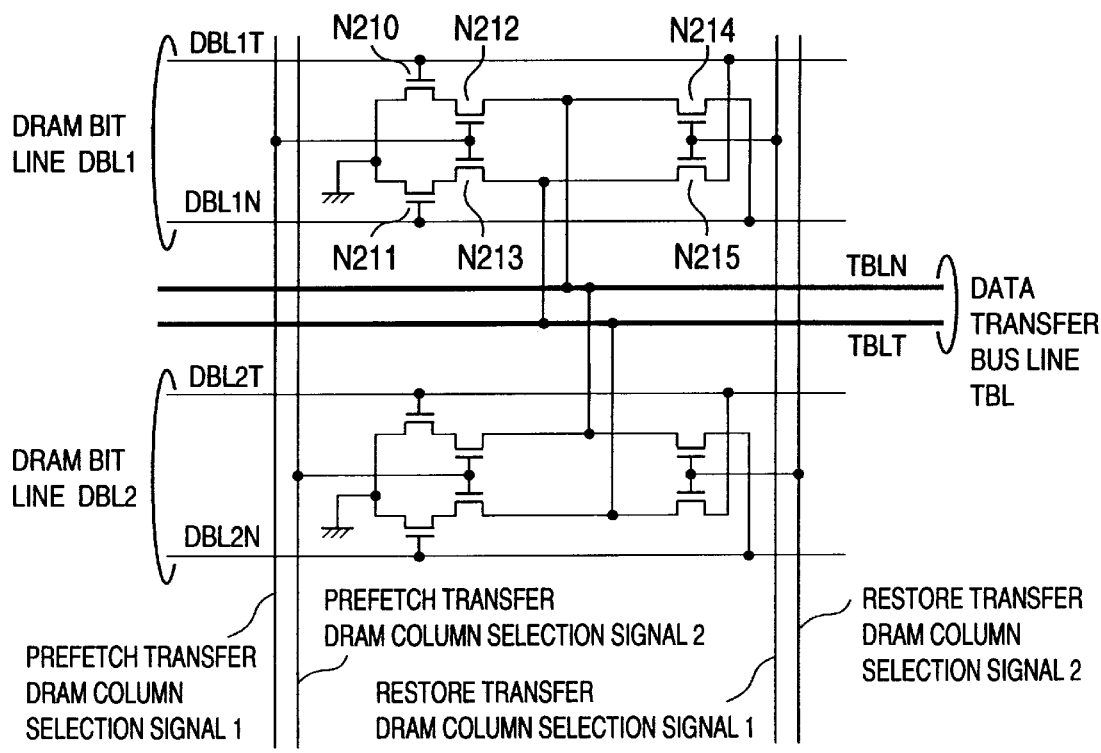
FIG. 63 shows an example of a concrete circuit construction of a DRAM bit line selection circuit.

FIG. 63 shows another construction of the DRAM bit line selection circuit which comprises a switching transistor circuit including NMOS transistors N210 and N211 having gates connected to respective paired DRAM bit lines and differentially amplifying data on the DRAM bit lines when the data on the DRAM bit lines DBL is transmitted to the data transfer bus line TBL and NMOS transistors N212 and N213 for transmitting the amplified signal to the data transfer bus line TBL by the prefetch transfer DRAM column selection signal. One terminals of the NMOS transistors N210 and N211 are connected to a fixed potential such as ground potential. Further, when the data on the data transfer bus line TBL is transmitted to the DRAM bit line DBL, the DRAM bit line selection circuit comprises a switching transistor circuit composed of NMOS transistors N214 and N215 as in the circuit shown in FIG. 62 and the DRAM bit line DBL and the data transfer bus line TBL are connected by the restore transfer DRAM column selection signal.

Figure 64:
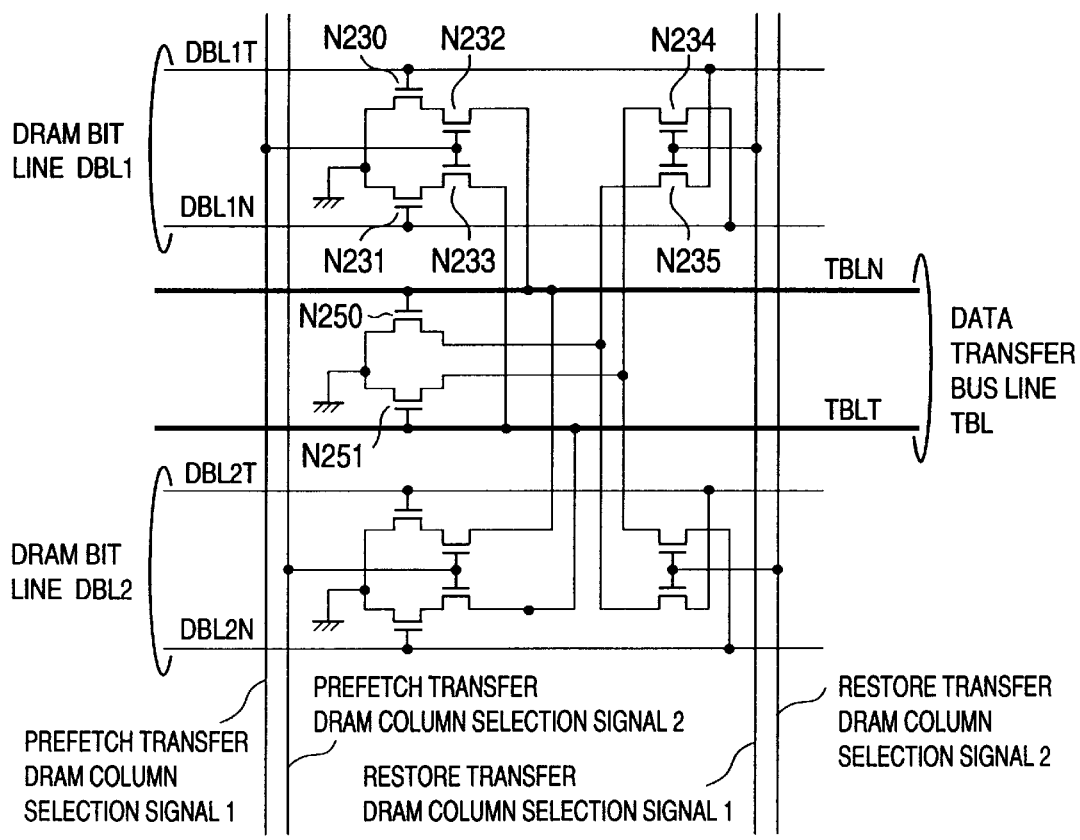
FIG. 64 shows an example of a concrete circuit construction of a DRAM bit line selection circuit.

FIG. 64 shows another construction of the DRAM bit line selection circuit, which comprises a switching transistor circuit including NMOS transistors N230 and N231 having gates connected to respective paired DRAM bit lines and differentially amplifying data on the DRAM bit lines when the data on the DRAM bit lines DBL is transmitted to the data transfer bus lines TBL and NMOS transistors N232 and N233 for transmitting the amplified signal to the data transfer bus lines TBL by the prefetch transfer DRAM column selection signal, as in the construction shown in FIG. 63. One terminals of the NMOS transistors N230 and N231 are connected to a fixed potential such as ground potential. Further, when the data on the data transfer bus lines TBL is transmitted to the DRAM bit lines DBL, the DRAM bit line selection circuit comprises a switching transistor circuit composed of NMOS transistors N250 and N251 as in the circuit shown in FIG. 63 and NMOS transistors B234 and N235 for transmitting the amplified signal to the DRAM bit lines DBL by a restore transfer DRAM column selection signal. One ends of the NMOS transistors N250 and N251 are connected to a fixed potential such as ground potential.

Figure 65:
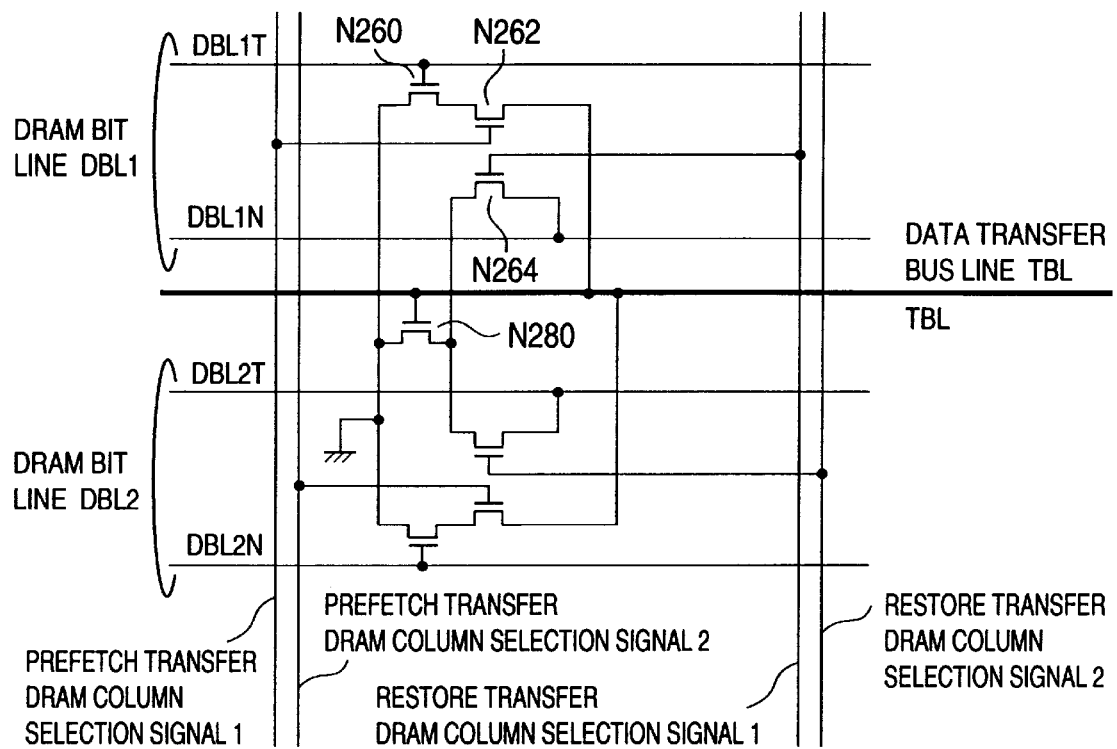
FIG. 65 shows an example of a concrete circuit construction of a DRAM bit line selection circuit.

FIG. 65 shows another construction of the DRAM bit line selection circuit which realizes the construction shown in FIG. 64 with using only one data transfer bus lines. In the construction shown in FIG. 65, an NMOS transistor N260 does not differentially amplify the data on the DRAM bit lines DBL but remove the data transfer bus line by a potential of the DRAM bit line. An NMOS transistor N280 operates similarly. Alternatively, this may be constructed with only a switching transistor circuit as in the case shown in FIG. 62. By using only one data transfer bus line, the wiring layout becomes simple and it is possible to reduce noise between the data transfer bus lines.

Further, in the constructions in which data is received by the DRAM bit lines or the data transfer bus lines and transmitted, as shown in FIGS. 63 to 65, the DRAM bit lines can be completely separated from the data transfer bus lines. Therefore, noise generated in one side is hardly transmitted to the other and a high speed operation becomes possible.

[Construction of DRAM Bit Line Selection Circuit and SRAM cell]

Figure 66:
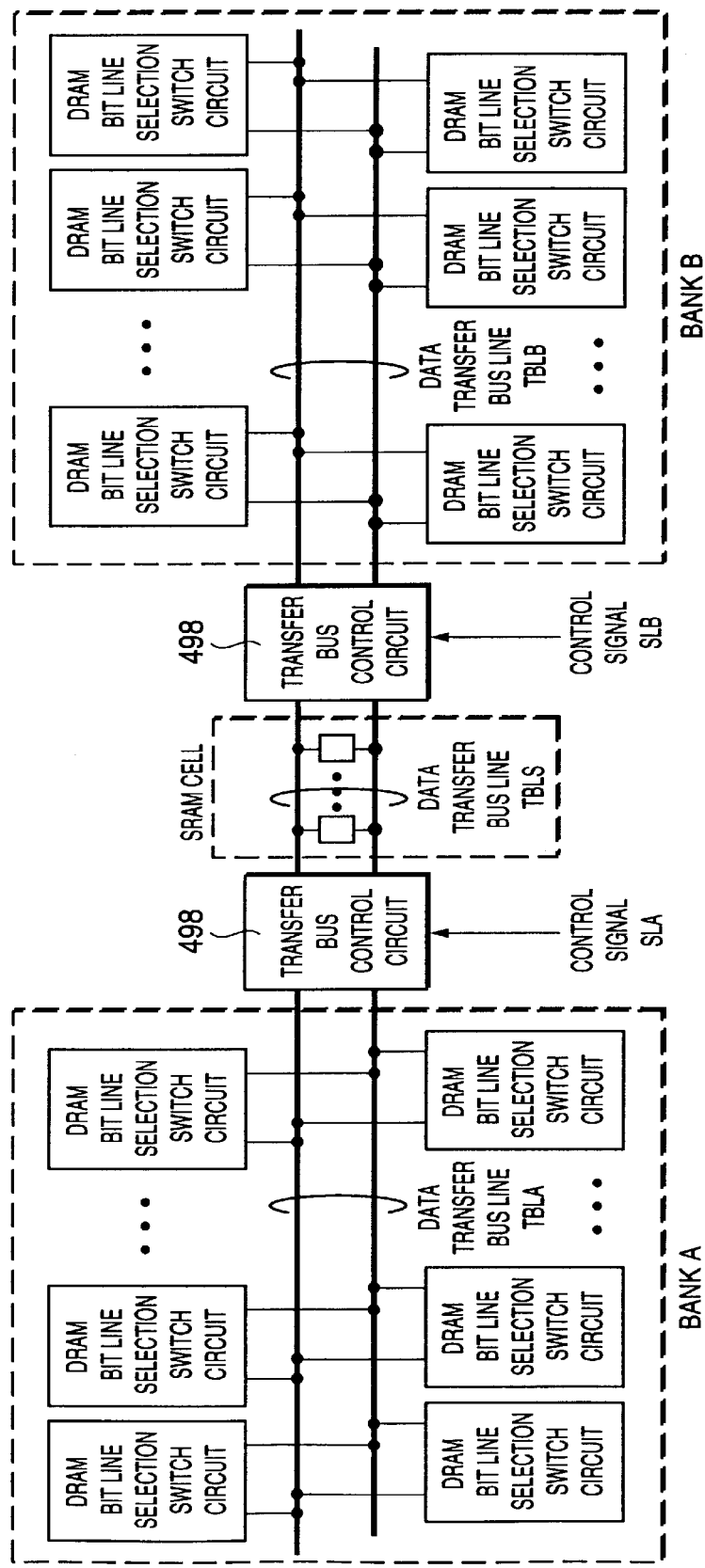
FIG. 66 shows a relation between a pair of data transfer bus lines, the DRAM bit line selection circuit and the SRAM cells in the array layout shown in FIG. 36.

FIG. 66 is a constructive diagram showing a relation between paired data transfer bus lines, the DRAM bit line selection circuit and the SRAM cells in the layout shown in FIG. 36.

Figure 67:
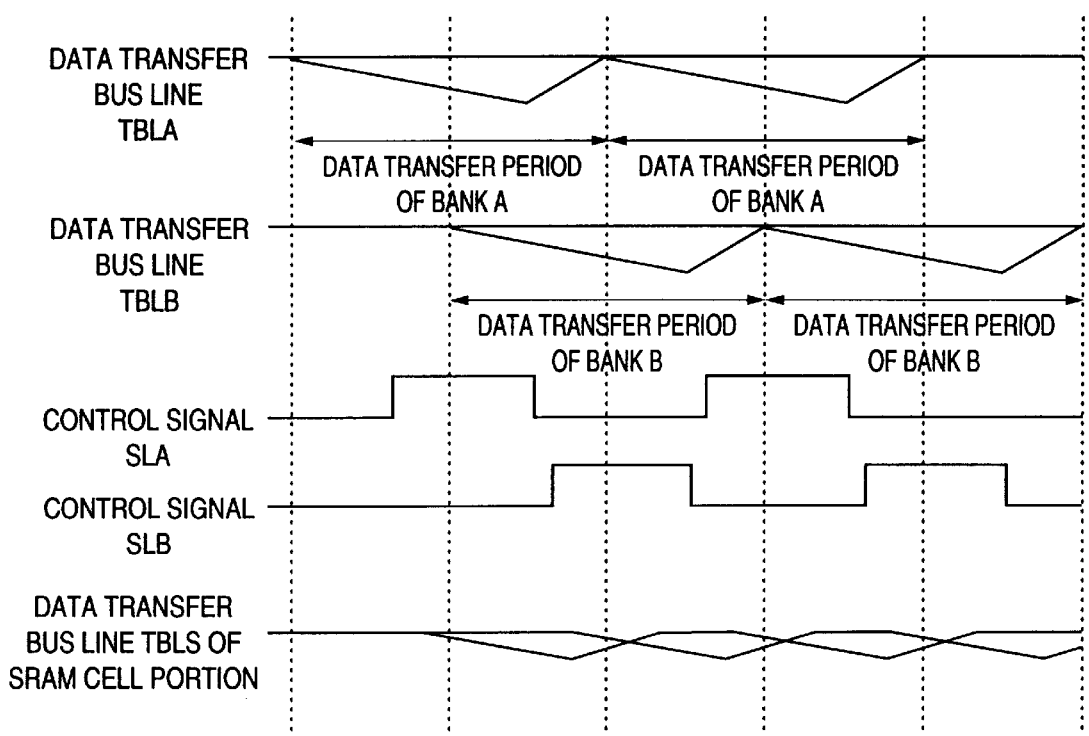
FIG. 67 shows signal waveforms showing an operation of the respective data transfer bus lines in FIG. 66.

In FIG. 66, memory cells on one column of the DRAM cell array are connected to the data transfer bus lines through the DRAM bit line selection circuit, so that data transfer between the cells and cells on one column of the SRAM cell array is possible. Further, the data transfer bus lines and the SRAM cell array are connected to each other through transfer bus control circuits 498. The data transfer bus control circuit 498 includes a circuit for selecting and connecting one of DRAM arrays (in this example, banks A and B) arranged on both sides of the SRAM cell array so that only an activated bank can be connected and, therefore, it is possible to realize a reduction of charging/discharging current and speed up of data transfer by the reduction of load of the data transfer bus lines. Further, since, in performing data transfer of the both banks alternately (bank ping-pong operation), the data transfer bus line of one bank can be separated from the other as shown in FIG. 67, it is possible to execute the data transfers on the both banks simultaneously to thereby shorten an effective data transfer period.

As mentioned previously, since the number of bits which can be transmitted at once by the semiconductor memory device according to this embodiment is 1024 bits and the load of the data transfer bus lines is very large, a peak current and current consumption become very large when amplitude of voltage of all data transfer bus lines is increased to the power source voltage level. In order to substantially reduce the peak current and current consumption, the amplitude of voltage of the data transfer bus lines is limited to a half of the power source voltage at most.

However, if the amplitude of voltage of the data transfer bus line is small, data of the SRAM cell must be amplified by such small potential difference and so the data transfer speed is lowered to some extent. In order to allow only the voltage of the data transfer bus line TBLS in the SRAM cell portion fully changed, a differential amplifier circuit connected to the gate of the data transfer bus line TBLA or TBLB in the DRAM bank for differentially amplifying may be provided. Alternatively, a sense amplifier for amplifying only the voltage on the data transfer bit line TBLS in the DRAM bank in a state where the data transfer bus line TBLA or TBLB in the DRAM bank is separated may be provid. Alternatively, the transfer bus control circuit 498 includes a circuit for equilibrating or precharging.

3. {SRAM portion}

[Construction of SRAM Portion and Data Input/Output Terminal]

Figure 68:
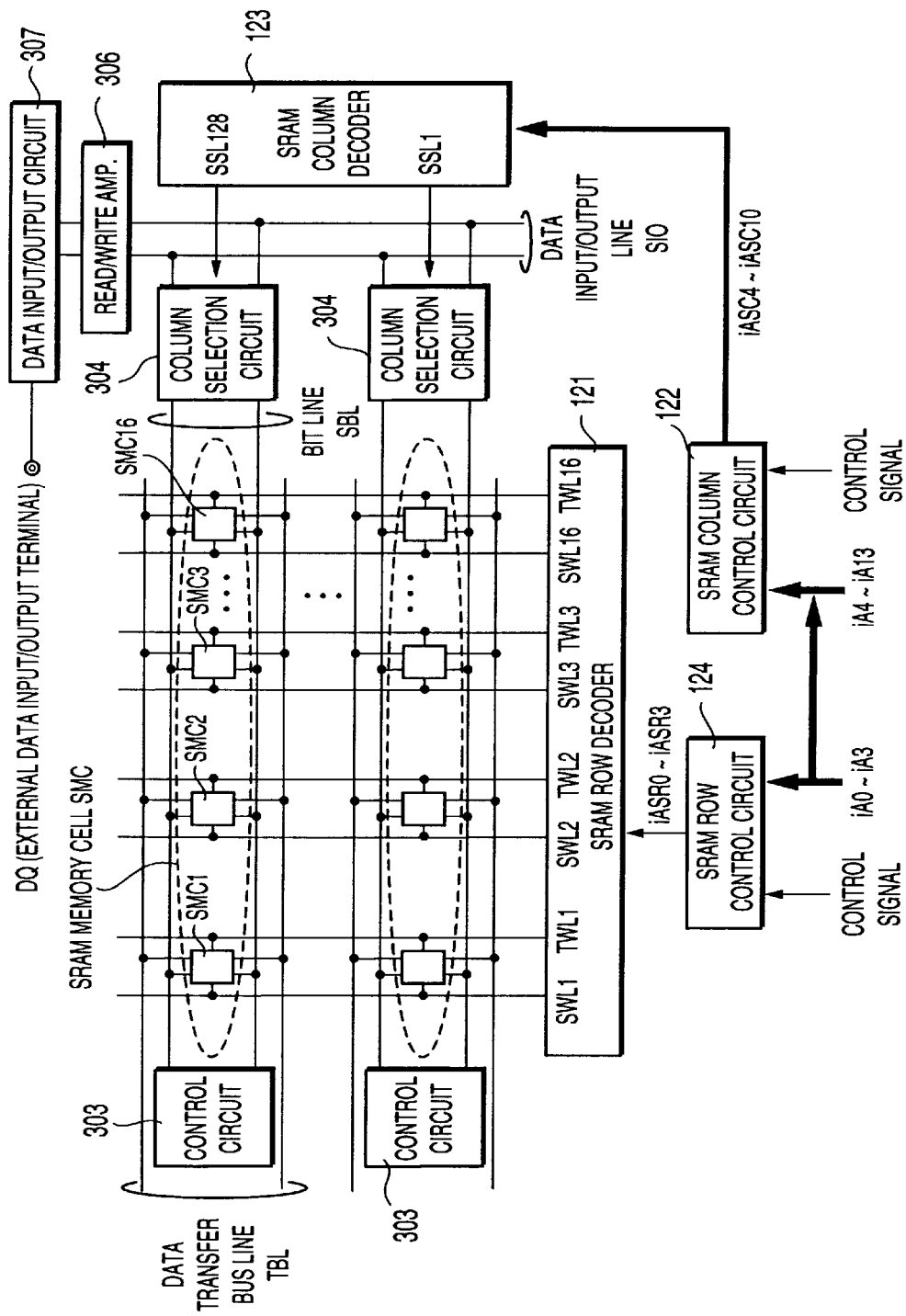
FIG. 68 shows a concrete example of the SRAM portion and the data input/output terminals shown in FIG. 1.

FIG. 68 shows an example of a concrete construction of the SRAM portion shown in FIG. 1 corresponding to one bit of the data input/output terminal DQ. Although this embodiment has the 16-Kbit, ×8-bit construction, the present invention is not limited thereto and can take various constructions in combination of the construction of the main memory portion, with similar effect.

Figure 69:
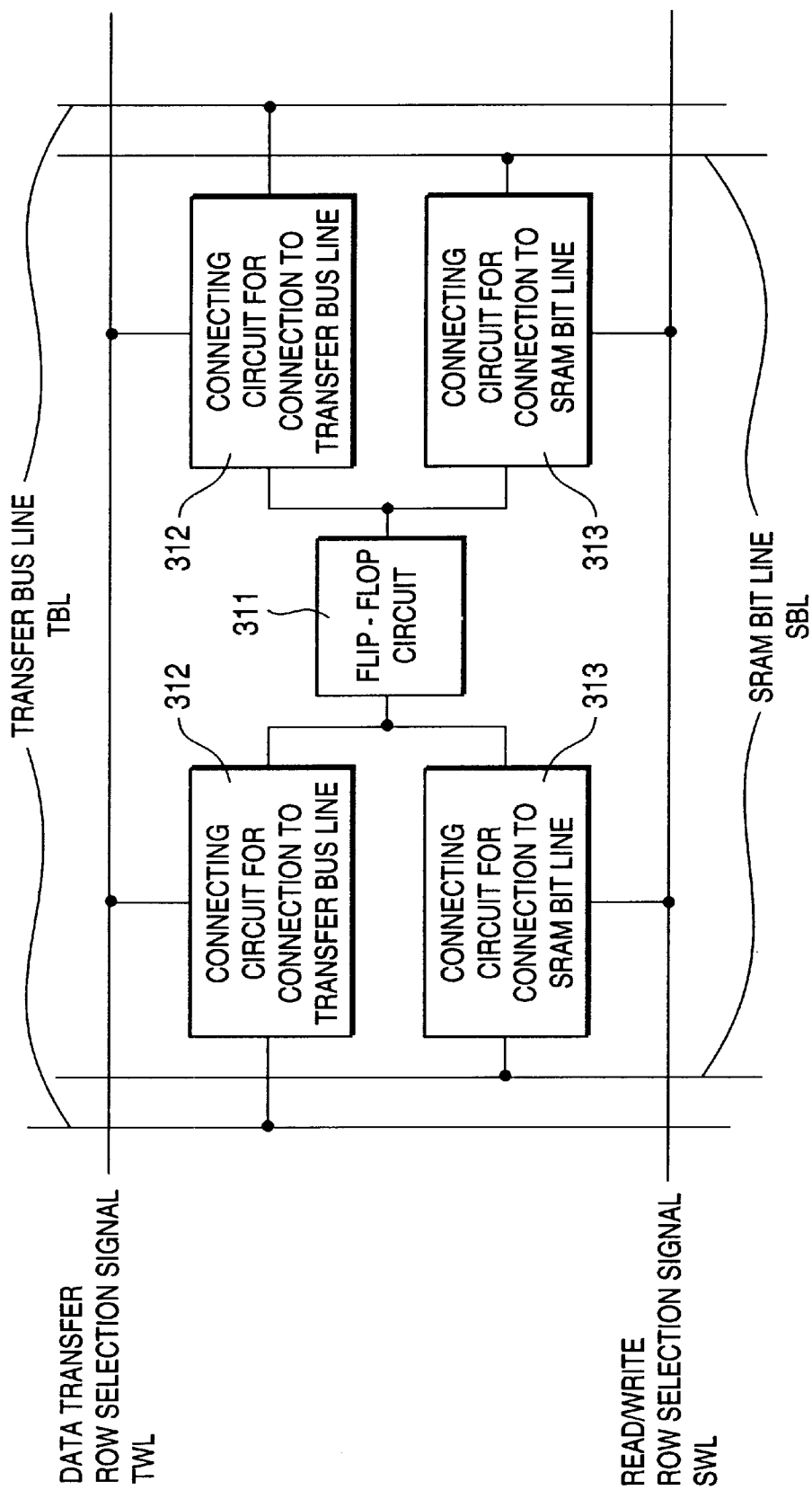
FIG. 69 shows an example of a construction of the SRAM memory cell.

In FIG. 68, the SRAM portion includes the SRAM memory cells SMC each includes a flip-flop circuit 311, which may be any other circuit provided that it can store static data, connecting circuits 312 provided on both sides of the flip-flop circuit 311 for connection to the data transfer bus lines TBL and connecting circuits 313 also provided on the both sides of the flip-flop circuit 311 for connection to the SRAM bit lines SBL, as shown in FIG. 69. The SRAM portion further includes the SRAM row decoder 121 for generating SRAM cell data transfer row selection signals TWL1 to TWL16 for activating the connecting circuits 312 in transferring data between the DRAM cell and the SRAM cell and the SRAM cell read/write row selection signals SWL1 to SWL16 in performing read or write and the SRAM row control circuit 124 for generating the SRAM internal row address signals iASR0 to iASR3 input to the SRAM row decoder 121 on the basis of the internal address signals iA0 to iA3 and the SRAM portion control signal. It is, of course, possible to commonly use the SRAM cell data transfer row selection signals TWL and the SRAM cell read/write row selection signals SWL. The SRAM bit line control circuit 303 for equilibrating and/or precharging the bit lines and the SRAM column selection circuit 304 for making the data input/output line SIO and the SRAM bit line SBL are connected to the SRAM bit lines SBL. The SRAM portion further includes the SRAM column decoder 123 for generating the selection signals SSL1 to SSL128 input to the SRAM column selection circuit 304 and the SRAM column control circuit 122 for generating the SRAM internal column address signals iASC4 to iASC10 on the basis of the internal address signals iA0 to iA13 and the SRAM portion control signal. The SRAM bit line control circuit 303 may include sense amplifier circuits for detecting and amplifying levels of the SRAM bit lines SBL. Further, the data input/output lines SIO are connected to the external data input/output terminals DQ through the data input/output circuit 308 and the read/write amplifier 307. The data input/output lines SIO may be provided for read and write separately.

Since the transfer bus lines TBL for data transfer and the SRAM bit lines SBL for read are provided, it is possible to perform the read operation regardless of the data transfer operation.

[SRAM Cell]

Figure 70:
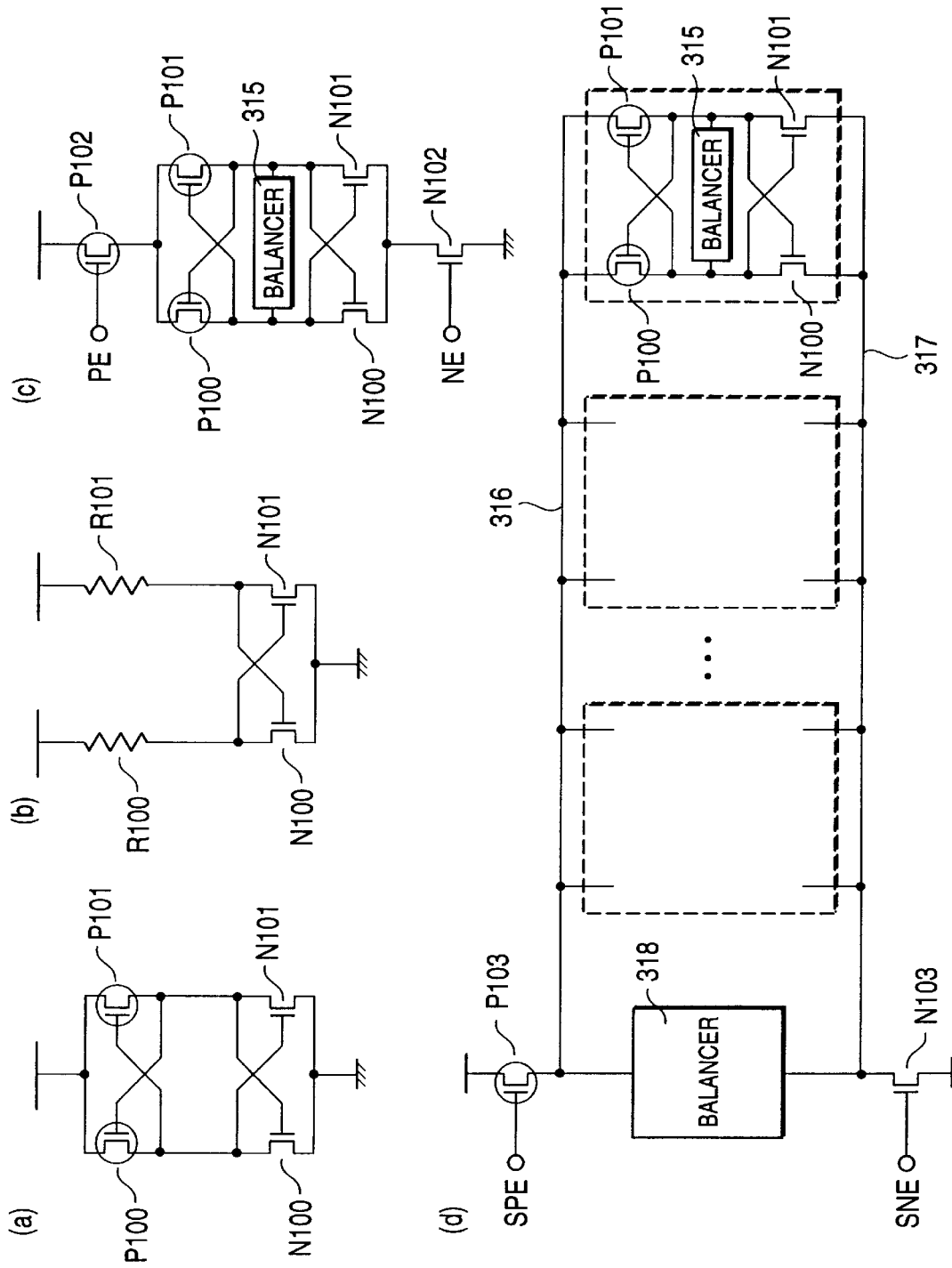
FIG. 70 is a concrete circuit of a flip-flop of the SRAM cell shown in FIG. 69.

FIGS. 70(a) to 70(d) show concrete circuits of the flip-flop circuit 311 of the SRAM cell shown in FIG. 69. FIG. 70(a) shows the flip-flop circuit constructed with P channel MOS transistors (referred to as PMOS transistors, hereinafter) P100 and P101 and NMOS transistors N100 and N101 and FIG. 70(b) shows a flip-flop circuit constructed with resistors R100 and R101 and NMOS transistors N100 and N101, both of which are usually employed in the SRAM. FIG. 70(c) shows a flip-flop circuit constructed with the construction shown in FIG. 70(a) added with a PMOS transistor P102 controlled by control signals PE and NE for power cut, an NMOS transistor N102 and a balancer circuit 315. One of the transistors P102 and N102 and the balancer circuit 315 may be omitted. FIG. 70(d) shows a construction which is similar to a usual sense amplifier used in the DRAM and includes a plurality of the flip-flop circuits each having the construction shown in FIG. 70(a) and arranged in the row direction, a PMOS transistor P103 for controlling a contact point 316 by the control signal SPE, an NMOS transistor N103 for controlling a contact point 317 by the control signal SNE, a balancer circuit 318 for balancing the contact points 316 and 317 and balancers 315 provided in each of the flip-flop circuit as in the case shown in FIG. 70(c). The power source voltage may be an external power source voltage or an internal power source voltage generated by a power source voltage converter circuit. The PMOS transistor P102 for power cut and the PMOS transistor P103 for controlling the contact point 316 by the control signal SPE may be NMOS transistors, respectively, in which case, the levels of the control signals PE and SPE may be the level of an internally generated power source voltage which is higher than the power source voltage generated by the power source voltage converter circuit.

By reducing a current flowing through the flip-flop by using the flip-flop circuit shown in FIG. 70(c) or 70(d), it is possible to substantially reduce noise generated in the transfer operation. Further, by performing the data transfer while balancing the opposite contact points, it is possible to realize a stable, high speed transfer operation.

The transistors constituting the flip-flop circuit are not special and may be identical to those used in the peripheral circuit or the DRAM sense amplifiers.

[Connection Circuits for SRAM Bit Line and Data Transfer Bus Line]

Figure 71:
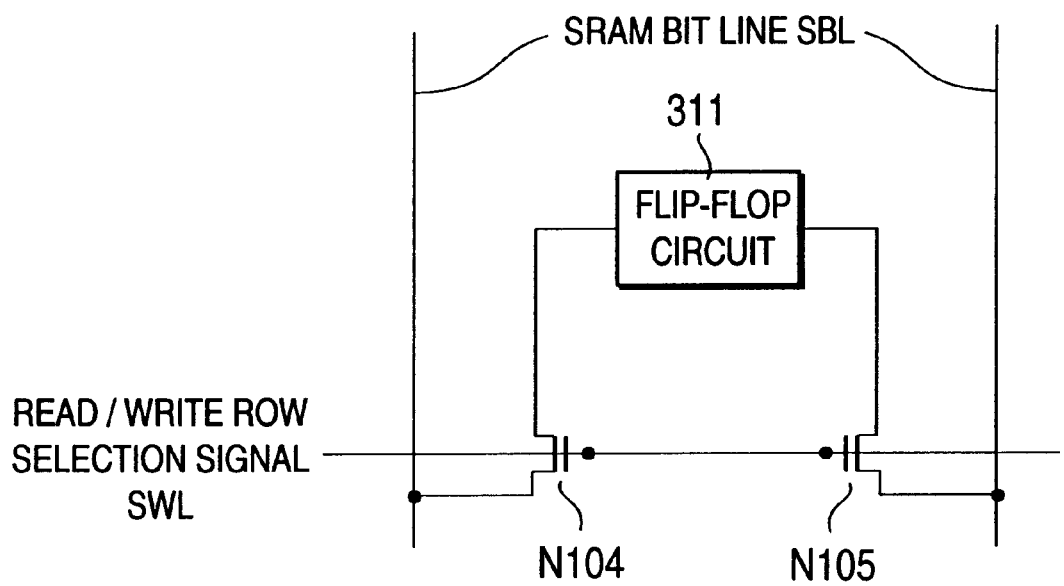
FIG. 71 shows a concrete example of a connecting circuit for connecting the SRAM bit lines shown in FIG. 69.
Figure 72:
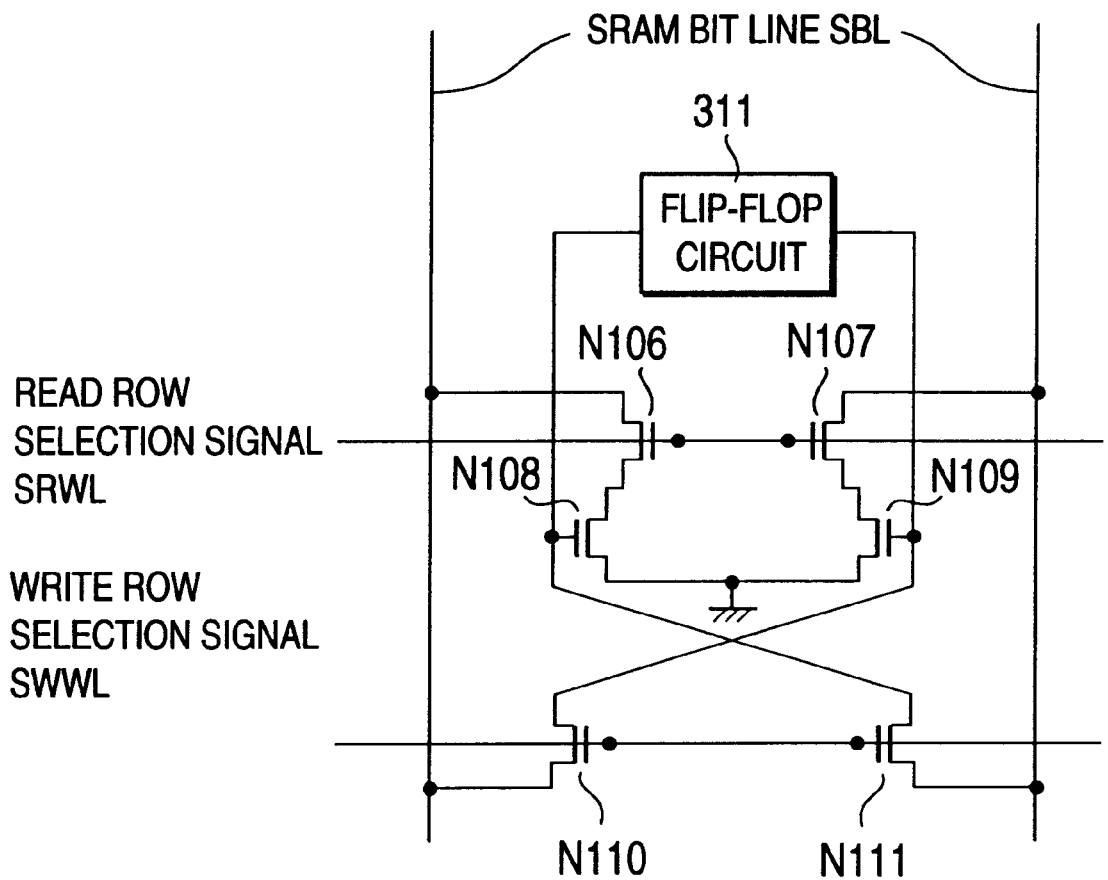
FIG. 72 shows a concrete example of a connecting circuit for connecting the SRAM bit lines shown in FIG. 69.
Figure 73:
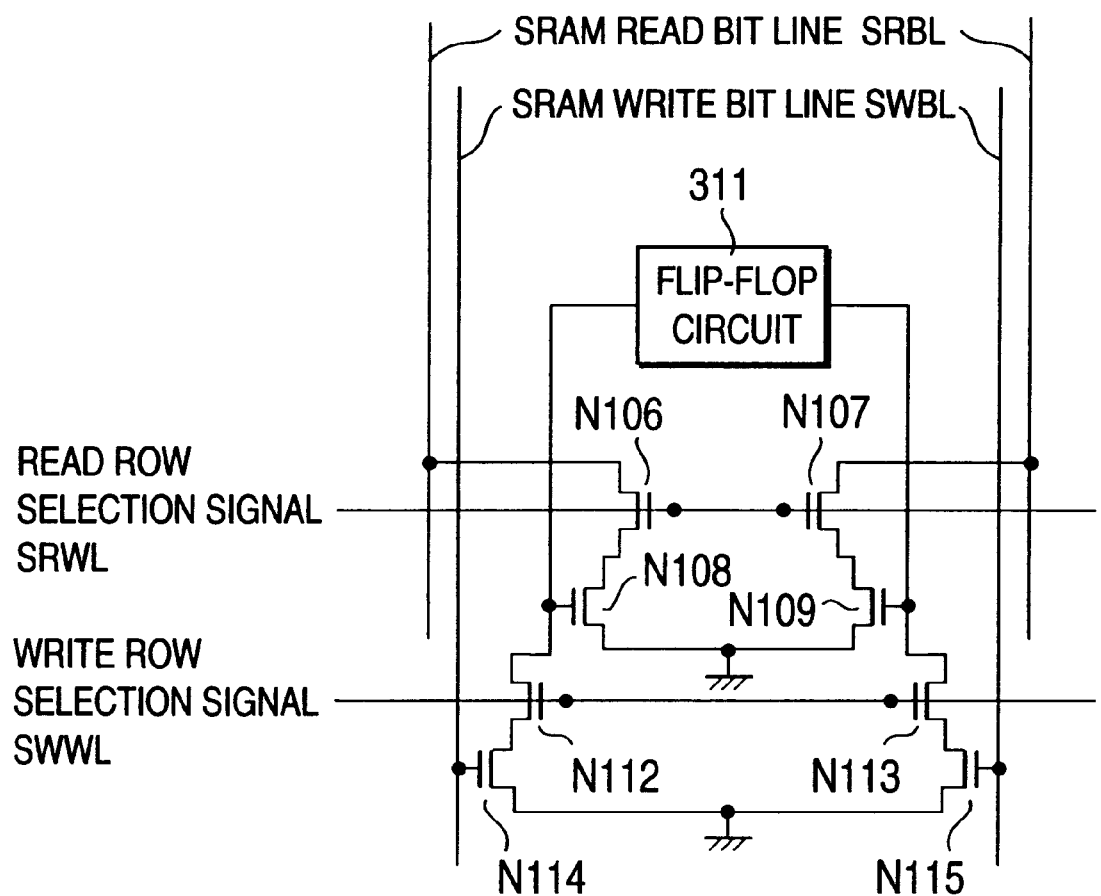
FIG. 73 shows a concrete example of a connecting circuit for connecting the SRAM bit lines shown in FIG. 69.

FIGS. 71 to 73 show circuit examples of the connection circuits for connection to the SRAM bit lines SBL.

FIG. 71 shows the simplest construction which includes NMOS switching transistor N104 and N105 and is connected to the SRAM bit lines SBL by a read/write row selection signal SWL.

The construction shown in FIG. 72 includes a switching transistor circuit composed of NMOS transistors N108 and N109 having gates connected to the respective opposite terminals of the flip-flop circuit for differentially amplifying signals on the terminals in reading data from the flip-flop circuit and NMOS transistors N106 and N107 for transmitting the amplified signals to the SRAM bit lines SBL by a read row selection signal SRWL. One terminals of the NMOS transistors N108 and N109 are connected to a fixed potential such as ground potential. In writing data in the flip-flop circuit, the construction shown in FIG. 72 further includes a switching transistor circuit composed of NMOS transistors N110 and N111, as shown in FIG. 71, which connect the SRAM bit lines SBL to the flip-flop circuit by a write row selection signal SWWL.

A construction shown in FIG. 73 includes a switching transistor circuit composed of NMOS transistors N108 and N109 having gates connected to the respective opposite terminals of the flip-flop circuit for differentially amplifying signals on the terminals in reading data from the flip-flop circuit as in the case shown in FIG. 72 and NMOS transistors N106 and N107 for transmitting the amplified signals to the SRAM bit lines SRBL for SRAM read by a read row selection signal SRWL. One terminals of the NMOS transistors N108 and N109 are connected to a fixed potential such as ground potential. In writing data in the flip-flop circuit, the construction shown in FIG. 73 further includes a switching transistor circuit composed of NMOS transistors N114 and N115 having gates connected to the SRAM write bit line pair for differentially amplifying the signals on the SRAM write bit lines SWBL in writing data in the flip-flop circuit and NMOS transistors N112 and N113 for transmitting the amplified signals to the opposite terminals of the flip-flop circuit by a write row selection signal SWWL. One terminals of the NMOS transistors N114 and N115 are connected to a fixed potential such as ground potential.

In the construction shown in FIG. 72 or 73 in which data is transferred by connecting the opposite ends of the flip-flop circuit or the SRAM bit lines SBL to the gates of the transistors, it is possible to completely separate the opposite terminals of the flip-flop circuit from the SRAM bit lines SBL. Therefore, noise generated in one side is hardly transmitted to the other and a high speed operation becomes possible.

It is possible to construct the connection circuit to the data transfer bus lines TBL in the same manner as in the case shown in FIG. 71, 72 or 73.

[SRAM Row Control Circuit]

Figure 74:
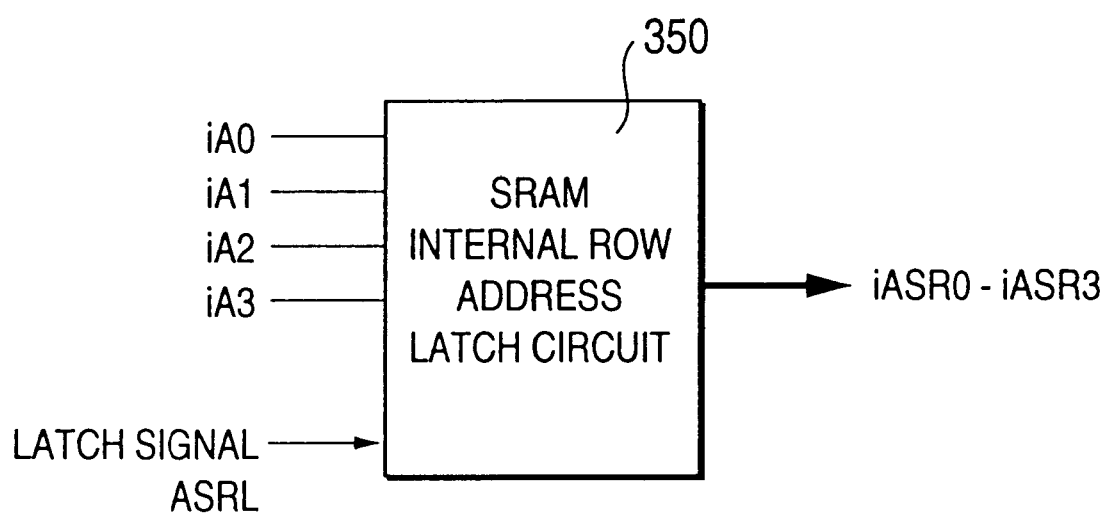
FIG. 74 shows a concrete example of a SRAM row control circuit shown in FIG. 68.

FIG. 74 shows, in detail, the circuit construction of the SRAM row control circuit shown in FIG. 68. In FIG. 74, the SRAM row control circuit is constructed with a SRAM internal row address latch circuit 350 and SRAM internal row address signals iASR0 to iASR3 are generated by the internal address signals iA0 to iA3 and a latch signal ASRL which takes the internal address signals in a clock cycle of a read/write command input. The latch signal ASRL is one of the SRAM control signals generated by the operation control circuit shown in FIG. 54.

[SRAM Column Control Circuit]

Figure 75:
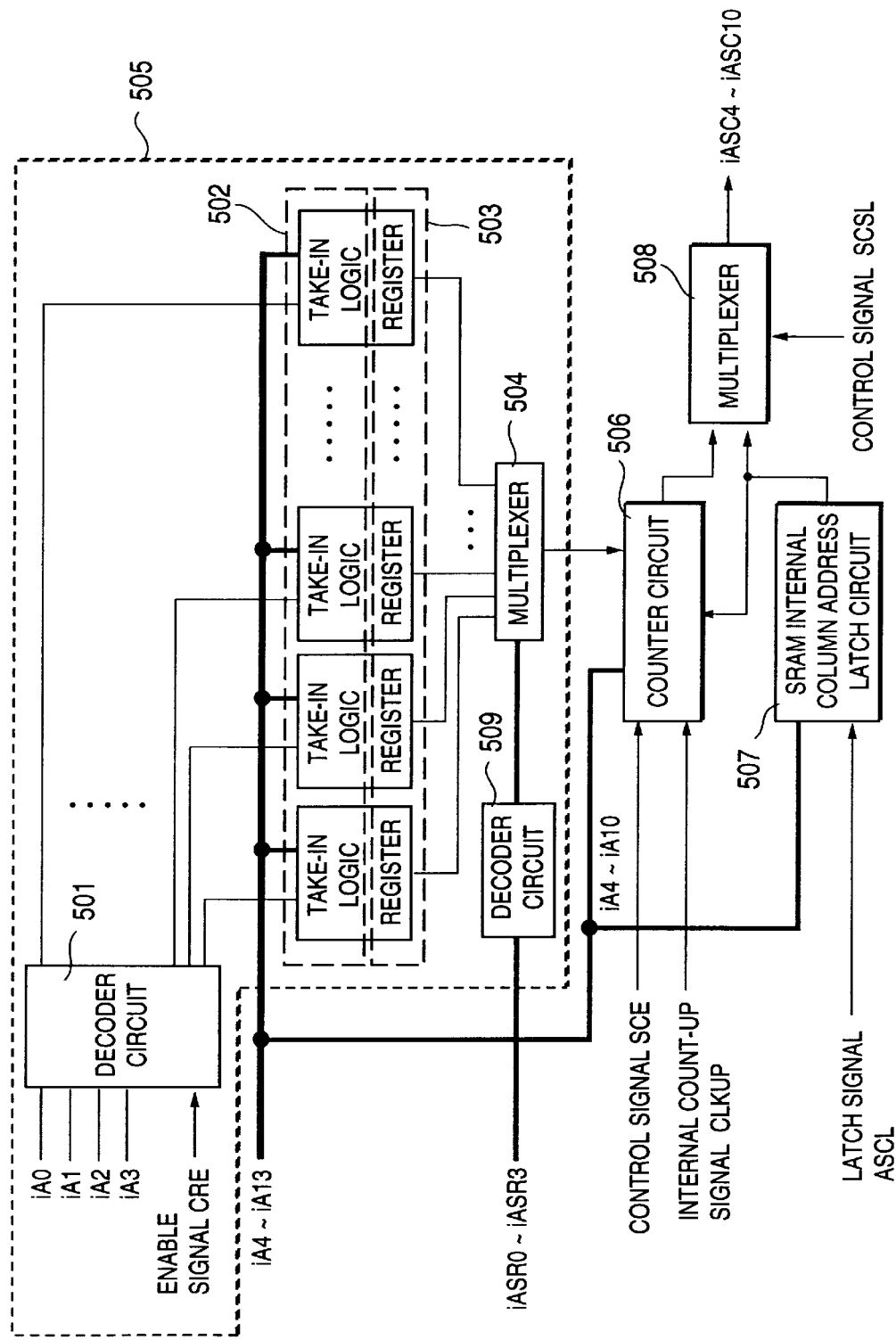
FIG. 75 shows a concrete example of a SRAM column control circuit shown in FIG. 68.

FIG. 75 shows, in detail, the construction of the SRAM column control circuit shown in FIG. 68.

In FIG. 75, the SRAM column control circuit includes an SRAM internal column address latch circuit 507 for latching the internal address signals iA4 to iA10 by a latch signal ASCL generated by the clock cycle at the read/write command input and a counter circuit 506 for taking in the output of the SRAM internal column address latch circuit 507 by a control signal SCE and counting up in a predetermined sequence by an internal count-up signal CLKUP operable during a burst operation for performing read/write with respect to the SRAM and the SRAM internal column address signals iASC4 to iASC10 is output through a multiplexer 508 which passes the output of either the latch circuit 507 or the counter circuit 506. The multiplexer 508 selects the output of the latch circuit 507 in the clock cycle at the read/write command input and is controlled by the control signal SCSL such that the SRAM internal column address signal can be output at a speed as high as possible. Further, the SRAM column control circuit according to the present invention includes a data input/output mode memory portion 505 which, in order to set completely different data input/output modes, for example, burst length, data input/output address sequence and latency, etc., for a plurality of SRAM cell groups (in this example, SRAM cell groups divided every row), takes the data input/output modes according to the states of the internal address iA0 to iA13 in the previously mentioned mode register setting (2) command cycle (in this example, although only the burst length can be set for the respective SRAM cell groups, it is possible to set the data input/output address sequence, latency, etc., for them) and stores the data input/output modes. The data input/output mode memory portion 505 includes take-in logic 502 provided in respective divided SRAM cell groups for generating setting data to be taken in according to the states of the internal address iA0 to iA13, registers 503 provided for the respective take-in logic for taking in the setting data (outputs of the take-in logic 502) of the data input/output modes of the respective SRAM cell groups by an output of the decoder circuit 501 which is selected by the enable signal CRE generated in the previously mentioned mode register setting (2) command cycle, the setting data being decoded by the address iA0 to iA3, and a multiplexer 504 for passing one of the outputs of the registers 503 holding the setting data of the SRAM cell groups by selectively controlling the iASR0 to iASR3 output from the SRAM internal row address latch circuit 350 in the read/write command cycle by using the signal decoded by the decoder circuit 509. The counter circuit 506 takes in an output of the multiplexer 504 to operate the semiconductor memory device in the data input/output mode set in the respective SRAM cell groups. The data input/output mode memory portion 505 must be provided for each of the data input/output modes to be set. The internal count-up signal CLKUP, the enable signal CRE, the control signals SCE and SCSL and the latch signal ASCL are the SRAM portion control signals generated by the operation control circuit shown in FIG. 54. Of course, it is possible to make the latch signal ASRL input to the SRAM internal row address latch circuit 350 and the latch signal ASCL input to the SRAM internal column address latch circuit 507 common.

Instead of the setting of the data input/output mode memory portion 505 performed for the respective SRAM cell groups by the mode register setting (2) command cycle, it is possible to set the same setting data of two or more SRAM cell groups at once or to set a logic of addresses A4 and A6 in setting the SRAM row data of the mode register setting (2) command shown in FIG. 10. For example, when A4=L and A5=L, the data input/output mode is set in every SRAM cell group, when A4=H and A5=L, the data input/output mode is set in two SRAM cell groups neglecting least 2 bits of the SRAM row data. In such manner, the data input/output mode memory portion 505 can be set in various combinations. Further, the number of the take-in logic 502 as well as the registers 503 is not always the same as that of the divided SRAM cell groups and it is possible to use one set of the take-in logic 502 and the register 503 commonly for a plurality of SRAM cell groups. Further, the addresses iASR0 to iASR3 are not always the signals from the SRAM internal row address latch circuit 350 and it is possible to provide a separate circuit therefor.

Figure 76:
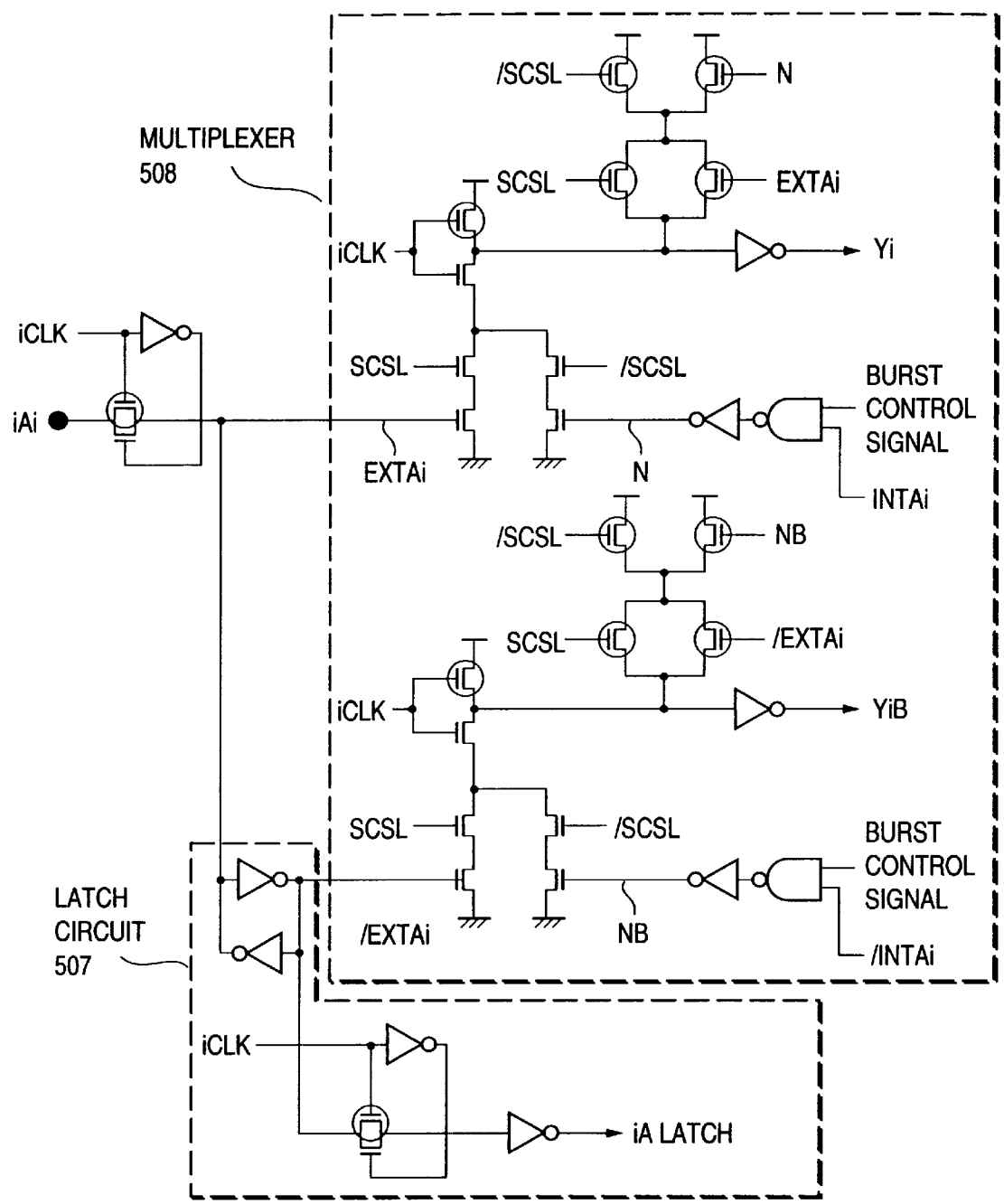
FIG. 76 shows a concrete example of a multiplexer and latch circuit shown in FIG. 75.
Figure 77:
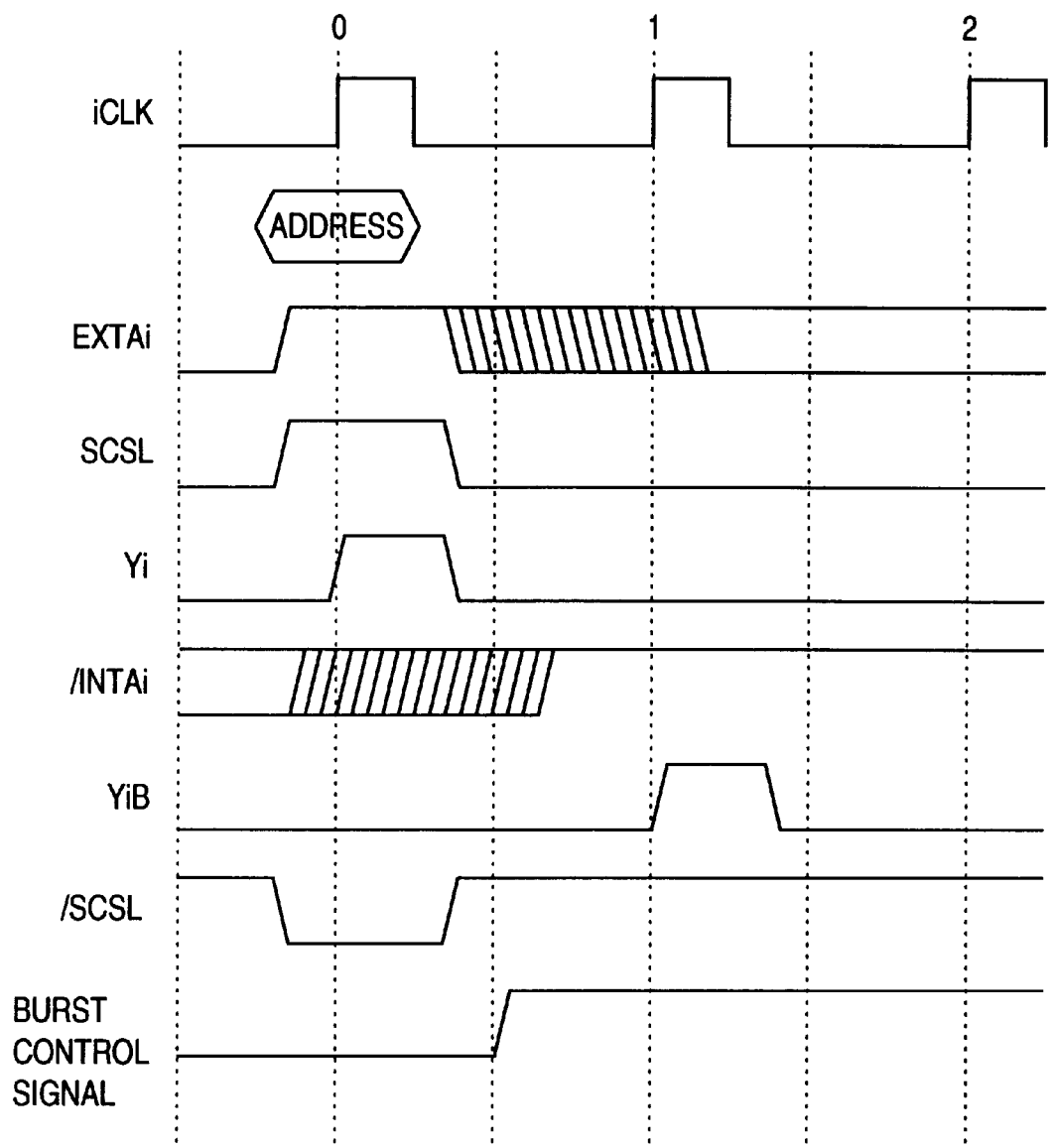
FIG. 77 shows signal waveforms showing an operation of the multiplexer shown in FIG. 76.

Further, it is possible to generate the internal address signals at high speed by constructing the SRAM internal column address latch circuit 507 and the multiplexer 508 such that the internal address is output immediately after a logic between the internal address and the internal clock signal iCLK synchronized with the external reference clock signal, as shown in FIG. 76. In FIG. 76, INTAi and /INTAi are address signals from the counter circuit 506 and EXTAi and /EXTAi are address signals generated from the internal address signal iAi. These signals are switched by the control signals SCSL and /SCSL and the burst control signal. SCSL is the control signal and /SCSL is a control signal having a phase opposite to that of the control signal SCSL. FIG. 77 shows an example of operation of this circuit. In this circuit construction, a delay from the internal clock iCLK to a time at which the internal address signal Yi is output corresponds to one stage of inverter and is minimized. The internal address signals Yi and YiB are output as address pulse signals.

[SRAM Column Decoder and Data Control Circuit Construction]

Figure 78:
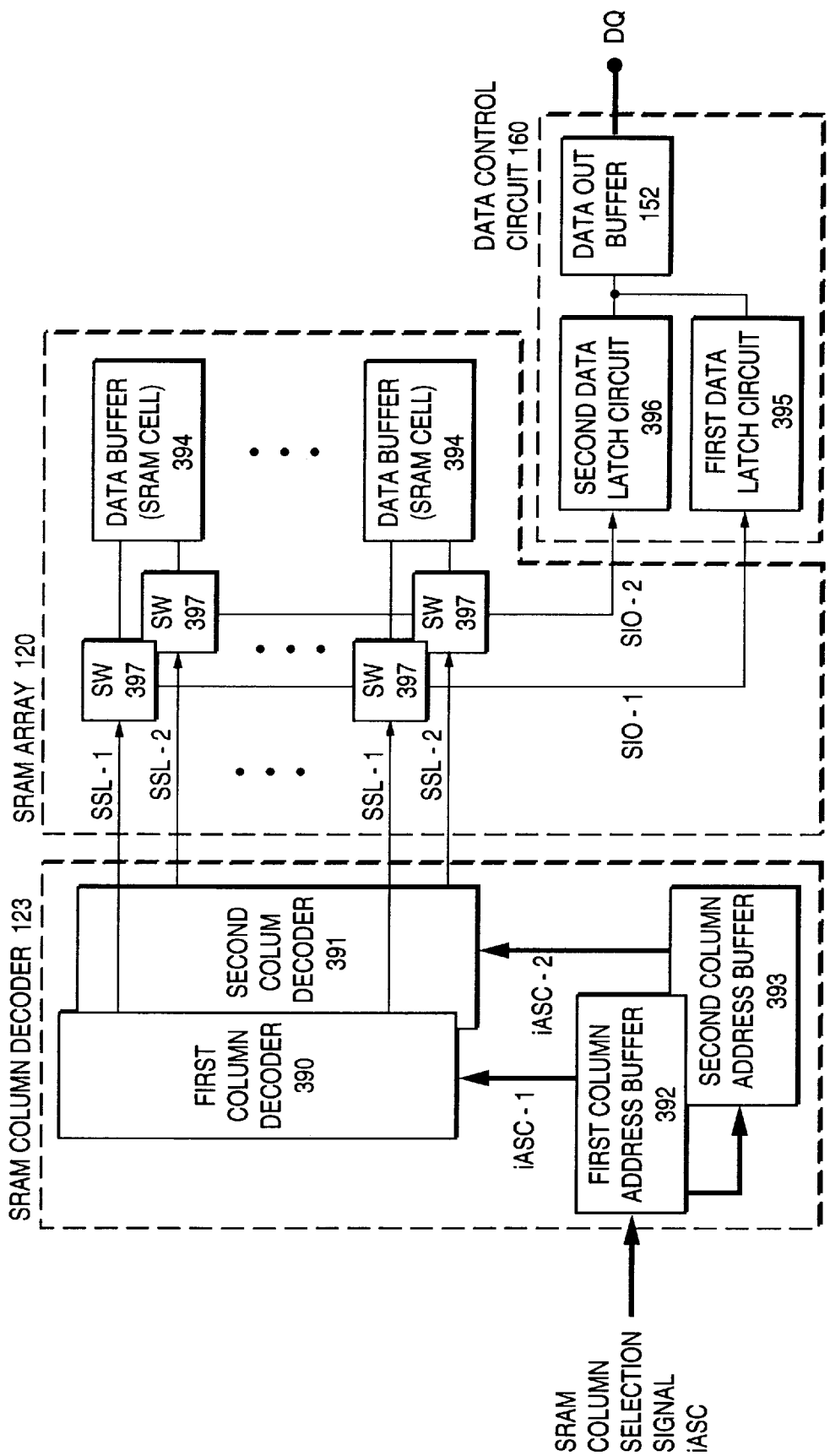
FIG. 78 is a block diagram showing the SRAM row decoder, the data control circuit and the DRAM array shown in FIG. 1.

FIG. 78 shows an example of construction of the SRAM column decoder 123 and the data control circuit. The circuit construction includes a first column decoder 390 and a second column decoder 391 and the SRAM column selection signal iASC is transmitted to these column decoders sequentially. In order to operate the first and second column decoders by one address selection data iASC, the first and second column decoders are connected to a first column address buffer 392 and a second column address buffer 393, respectively. Selection signal lines SSL from the first and second column decoders are juxtaposed in column direction and a first data latch circuit 395 associated with a data input/output line SIO and a second data latch circuit 396 associated with a data input/output line SIO are also provided correspondingly.

Figure 79:
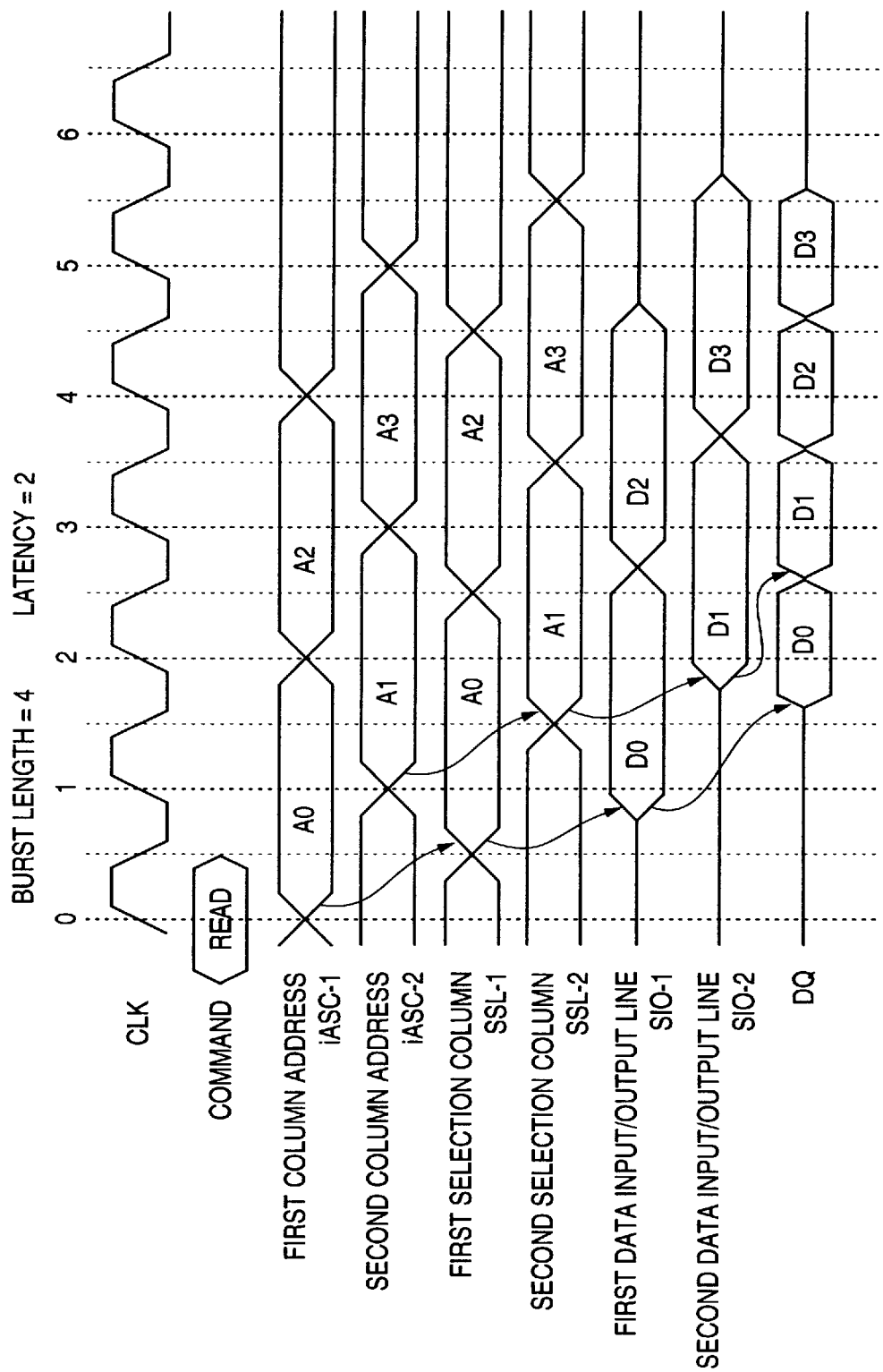
FIG. 79 shows signal waveforms showing an operation of the SRAM row decoder, the data control circuit and the SRAM array shown in FIG. 78.

FIG. 79 shows an internal operation timing of the SRAM column decoders. The respective column address buffers perform column decoder selection signal (iASC-1 and iASC-2) sequentially on the basis of the CLK signal. That is, when the column address selection is successively performed as in the burst mode, the first column decoder and the second column decoder operate alternately. Data of the columns (SSL-1 and SSL-2) selected by the respective column decoders are output sequentially to the corresponding data input/output lines (SIO-1 and SIO-2). These data input/output lines operate with a cycle time which is twice a request cycle time and the first data latch circuit 395 and the second data latch circuit 396 hold the data temporarily. These two sets of data are synthesized before the data out buffer and output from the data input/output terminals DQ in the requested cycle time.

With using the above mentioned construction, it is possible to increase the cycle speed of the successive data output and/or successive data write without increasing the internal operation cycle speed. This is also true in the synchronous DRAM of DOUBLE DATA RATE (DDR).

[Other Construction of SRAM Portion including Data Input/Output Terminals]

Figure 80:
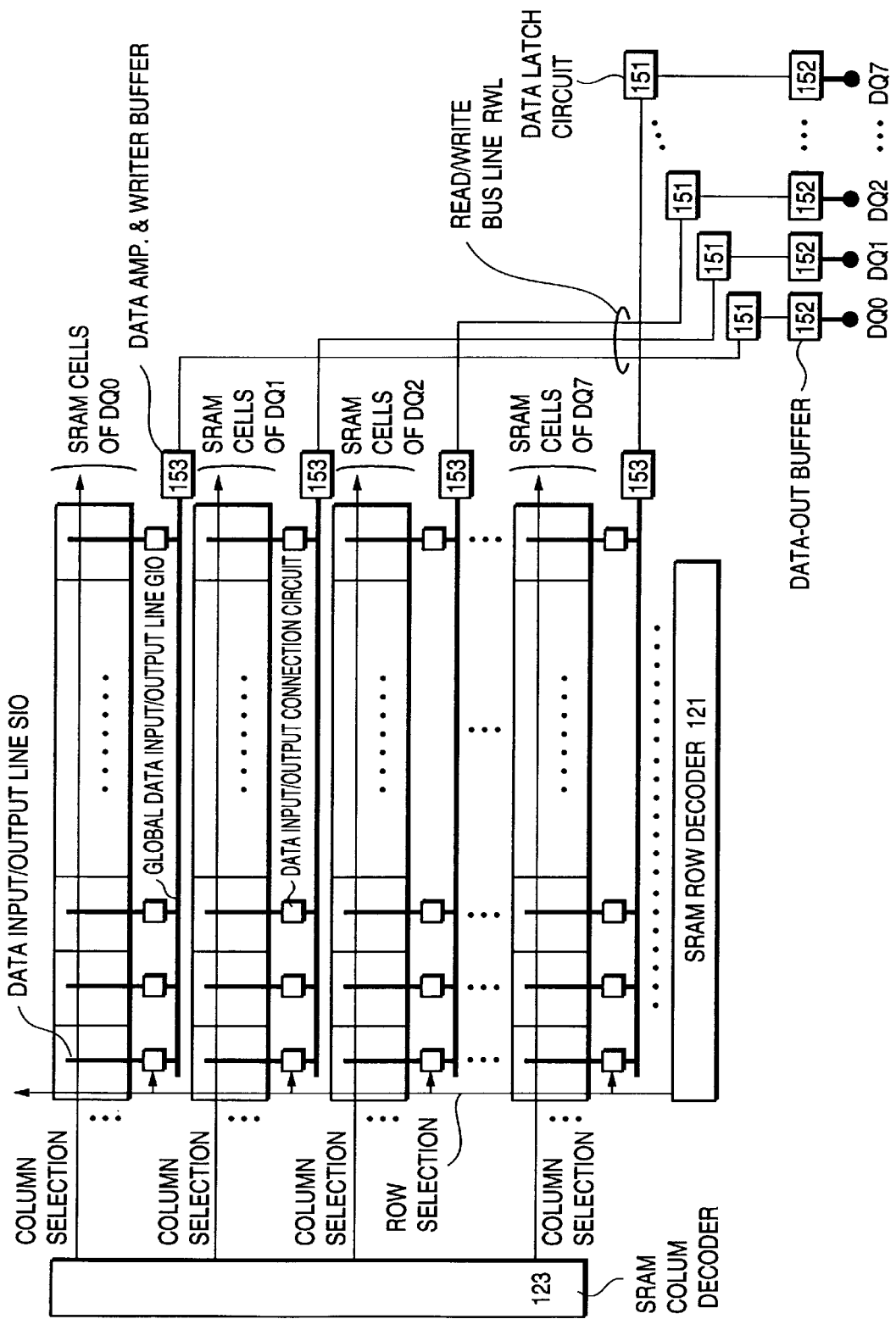
FIG. 80 shows a concrete example of a construction of the SRAM portion and the data input/output terminal.

FIG. 80 schematically shows another example of construction of the SRAM portion including the data input/output terminals in a case where it has the ×8-bit construction. In a case of the data output from the SRAM, data of the SRAM cells of a selected column are output to the respective data input/output lines SIO. The data input/output lines SIO of the selected row is connected to the global data input/output line GIO and the data are sent to a corresponding data amplifier 153. Thereafter, the data pass through a read/write bus line RWL, a data latch circuit 151 and a data buffer 152 to the data input/output terminal DQ. Since the SRAM portion has the ×8-bit construction, 8 sets of data input/output circuits operate simultaneously and output 8 data. Data are written in the SRAM cells along a path reverse to the data read path. With using this circuit construction using the data input/output lines SIO and the global data input/output lines GIO, the SRAM row selection of every SRAM cell becomes unnecessary, the load of the SRAM row selection signal lines is reduced and a high speed data input/output of the SRAM cells becomes possible. Further, with using this construction, the load of the data input/output lines SIO is not increased, ;realizing high speed operation even when the number of rows of the SRAM cells is increased.

[SRAM Column Redundancy Circuit]

Figure 81:
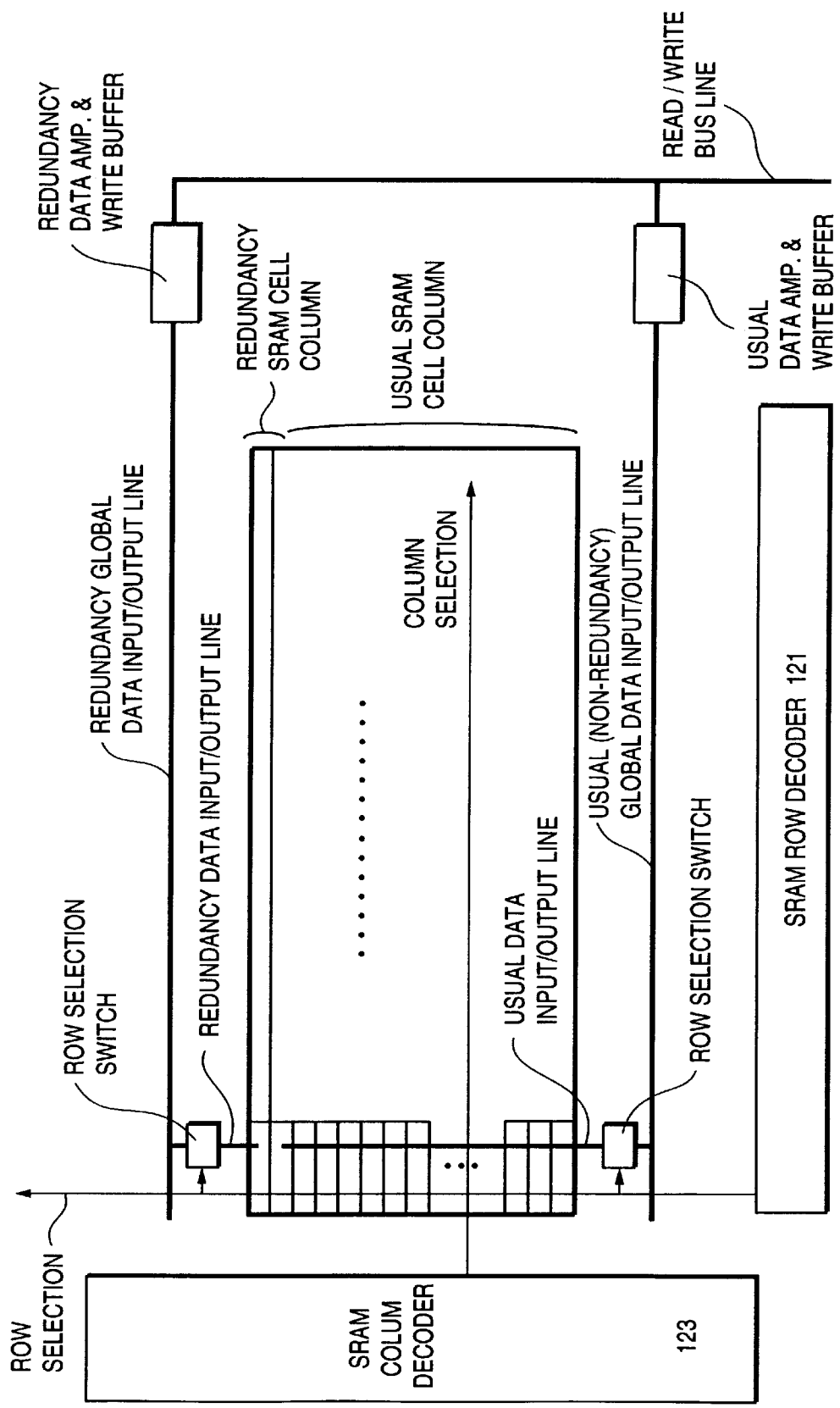
FIG. 81 shows a concrete construction in a case where a row redundancy line of the SRAM array portion.

FIG. 81 shows an example of construction of the SRAM column redundancy circuit for an SRAM cell array corresponding to one of the input/output terminals DQ. In FIG. 81, a redundancy SRAM cell column is arranged in an upper end of the SRAM cell array. A redundancy data input/output line extends upward from the SRAM cell array through an SRAM row selection switch and a usual (non-redundancy) data input/output line extends downward from the SRAM cell array through another row selection switch. A global data input/output line is arranged in an upper portion of the SRAM array and connected to a redundancy data amplifier and write buffer and a usual (non-redundancy) global data input/output line is arranged in a lower portion of the SRAM array and connected to a usual data amplifier and write buffer. A switching from an SRAM cell column to a redundancy SRAM cell column is performed by switching the global data input/output line or switching of the data amplifier and write buffer. With such construction, a switching of the SRAM array to the redundancy cell column for every input/output terminal DQ becomes possible and it is possible to remove a difference in access time to the redundancy cell column even when the switching to the redundancy cell column. Although, in this example, the redundancy SRAM cell column, the data input/output line and the global data input/output line are arranged in the upper portion of the SRAM cell array, the arrangement of them is not limited thereto.

(8) Others

1. {Power Source Voltage}

[Power Source Voltage Applied to DRAM and SRAM]

Figure 82:
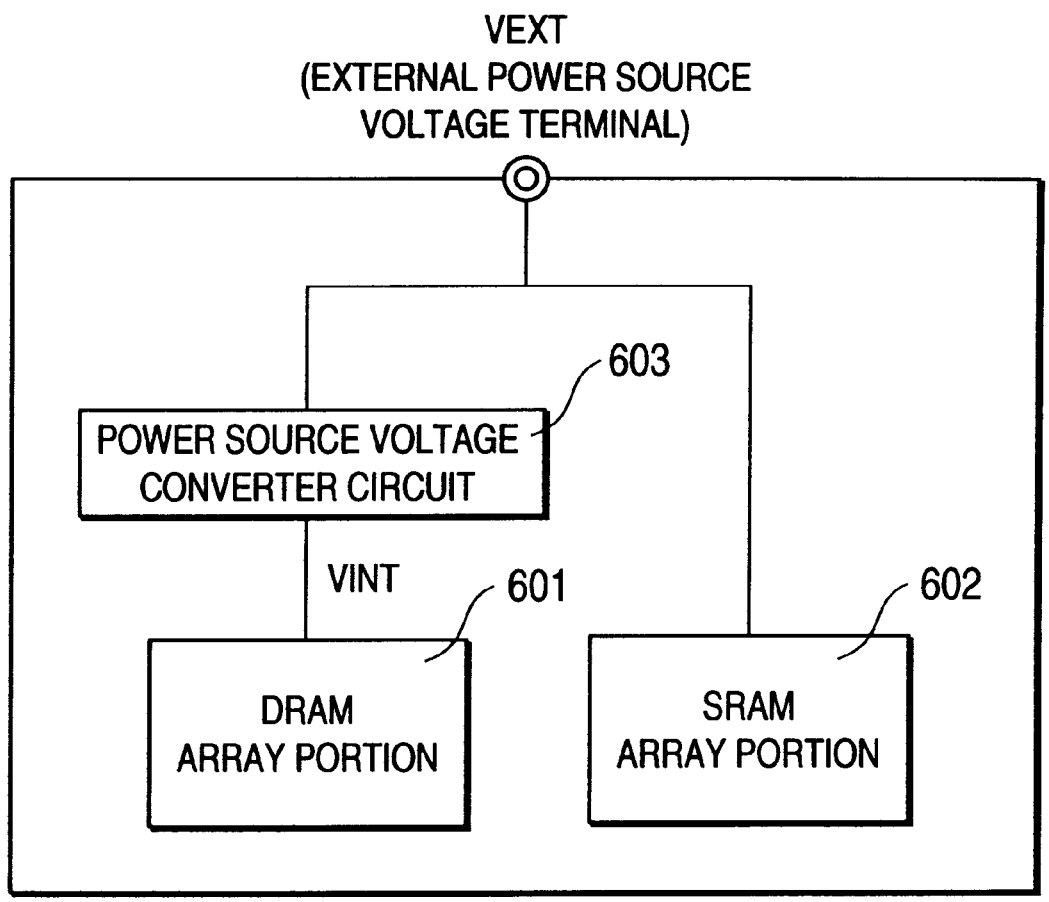
FIG. 82 shows an example of a power source voltage supplied to the DRAM array portion and the SRAM array portion.

FIG. 82 shows an example of construction of the power source connection to the DRAM array portion and the SRAM array portion.

Figure 84:
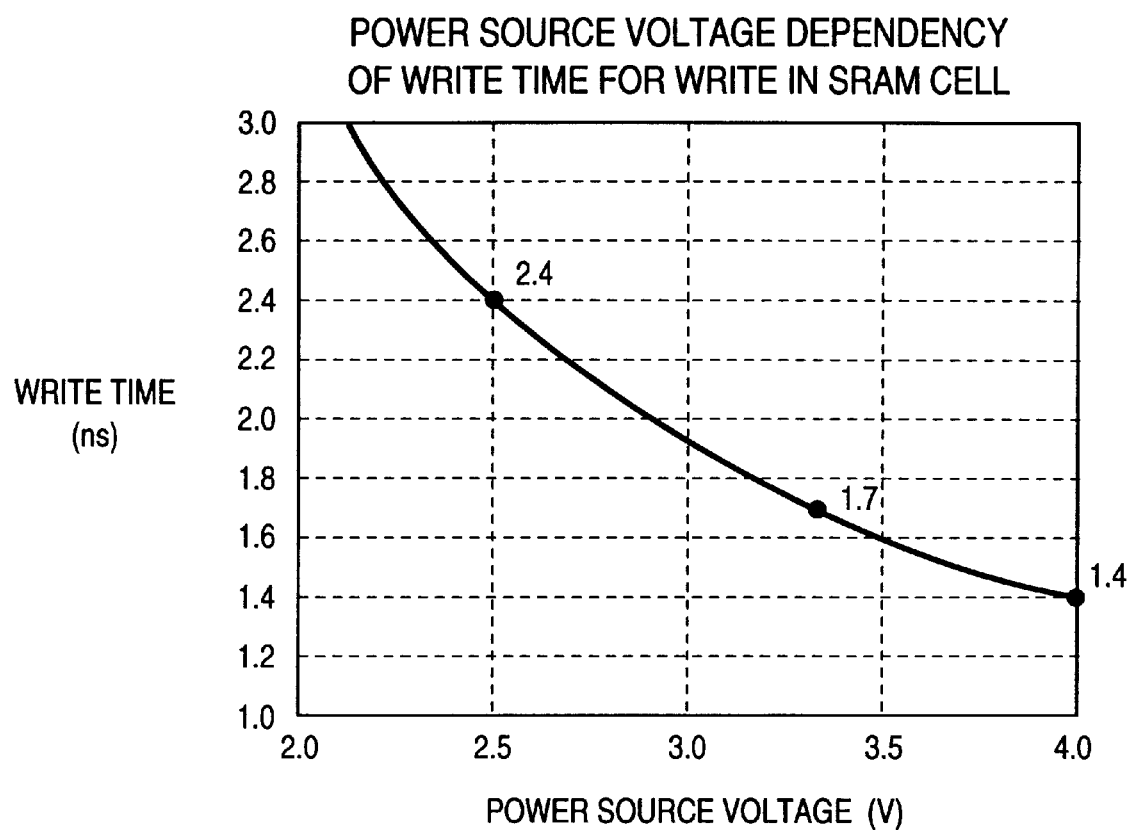
FIG. 84 shows a result of simulation of dependency of write time to the SRAM cell on power source voltage.

In FIG. 82, this semiconductor memory device includes a power source voltage converter circuit 603 which generates an internal power source voltage VINT on the basis of an external power source voltage VEXT. The internal power source voltage VINT is applied to the DRAM array portion 601 and the external power source voltage VEXT is applied to the SRAM array portion 602 directly. In the recent DRAM, the miniaturization of process is enhanced and the breakdown voltage of a memory cell becomes lower. In order to solve this problem, it is usual that the power source voltage in a memory cell array is made lower than an external power source voltage. However, the driving ability of transistor is necessarily degraded with lower power source voltage, which is an obstacle for speed-up of operation. In this embodiment, the miniaturization of the SRAM array portion is restricted compared with that of the DRAM array portion and the high operation speed of the SRAM portion is achieved by allowing the external power source voltage VEXT to be used in the SRAM portion. For example, the write speed in writing data in an SRAM cell is increased by 41% in a case where external power source voltage VEXT=3.3 V and the internal power source voltage VINT=2.5 V, as shown in FIG. 84 which is a result of simulation of the power source voltage dependency of data write time in an SRAM cell.

Figure 83:
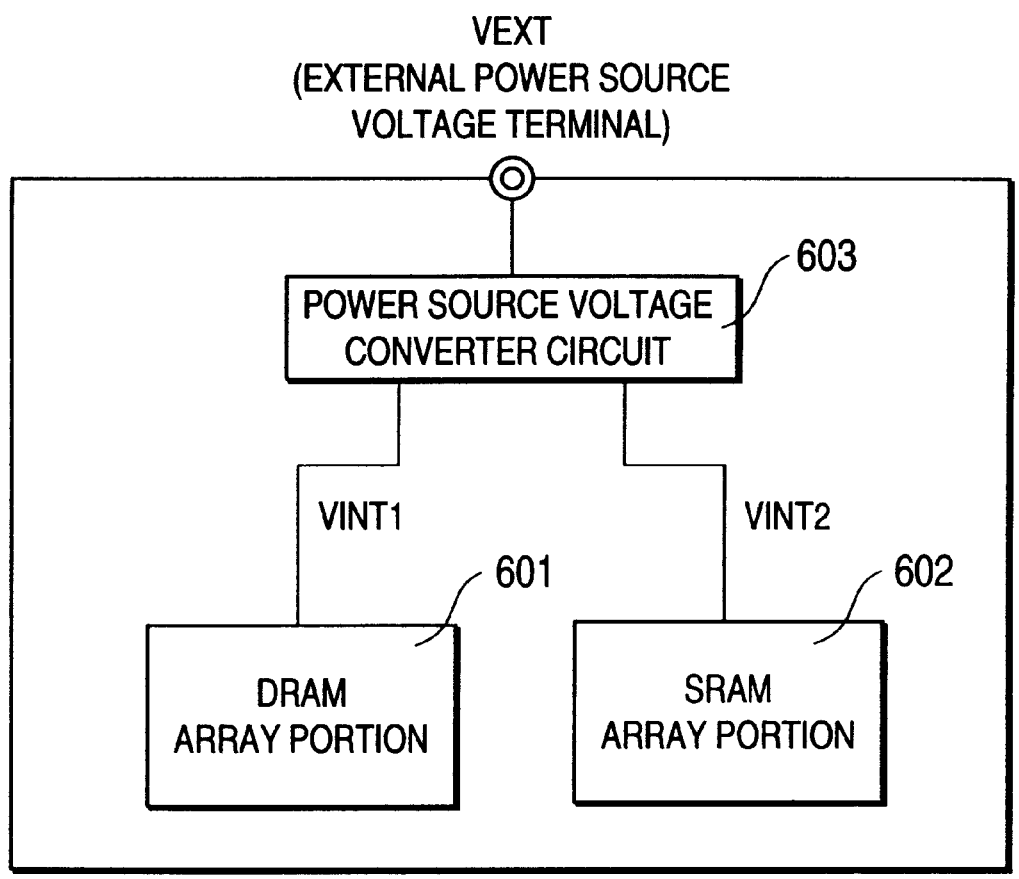
FIG. 83 shows an example of a power source voltage supplied to the DRAM array portion and the SRAM array portion.

FIG. 83 shows another example of construction of the power source connection to the DRAM array portion and the SRAM array portion.

In FIG. 83, this semiconductor memory device includes a power source voltage converter circuit 603 which generates a first internal power source voltage VINT1 and a second internal power source voltage VINT2 on the basis of an external power source voltage VEXT. The first internal power source voltage VINT1 is applied to the DRAM array portion 601 and the second internal power source voltage VINT2 is applied to the SRAM array portion 602 directly. In this case, the same effect as that obtained by the construction shown in FIG. 82 is obtainable by making the second internal power source voltage VINT2 higher than the first internal power source voltage VINT1. In this case, it may be possible to use two power source voltage converters 603 for generating the first internal power source voltage VINT1 and the second internal power source voltage VINT2, respectively.

As to the substrate potential which is related to the power source voltage, various cases may be considered depending upon the kinds of memory cell constituting the main memory portion and the sub memory portion. For example, when the main memory portion is constructed with dynamic memory cells, it is possible to use the potential of the substrate for the main memory portion lower or for the main memory portion, the sub memory portion and the bi-directional data transfer circuit lower than other area of the substrate. These substrate potentials may be realized by forming, in a P type substrate, a P well, an N well and a deeper N well.

2. {Description of Other Functions}

[Function 1: Copy Transfer]

The semiconductor memory device according to the present invention may have a function of data transfer between SRAM memory cells on the same column, for example, between a memory cell SMC1 and a memory cell SMC16 in FIG. 68.

With such function, it is possible to copy a cell data of one row of the SRAM cell array to another row at substantially higher speed than that in a case of transfer from the DRAM cell. Further, this function can be executed without influence of data transfer operation with respect to the DRAM.

A data transfer operation from cells of one row including the memory cell SMC1 to cells of one row including the memory cell SMC16 will be described with reference to FIG. 68. First, SRAM cell read/write row selection signal SWL1 is activated and transmit data of the cells of one row including the memory cell SMC1 to the respective SRAM bit lines. Thereafter, the SRAM cell read/write row selection signal SWL16 is activated to transmit the data of the respective bit lines to the cells of one row including the memory cell SMC16 and rewrite the cell data. Since the data is transferred by using the SRAM bit lines SBL, the data transfer between, for example, the cells of one row including the memory cell SMC2, which is selected by the SRAM cell data transfer row selection signal TWL2, and the DRAM cells can be performed by using the data transfer bus lines TBL regardless of the data transfer from the cells of the row including the memory cell SMC1 to the cells of the row including the memory cell SMC16. All of these operations are performed by command input and, therefore, commands for assigning a transferring SRAM cell group and a transferred SRAM cell group must be added.

[Function 2: Temporary Cell Transfer]

Figure 85:
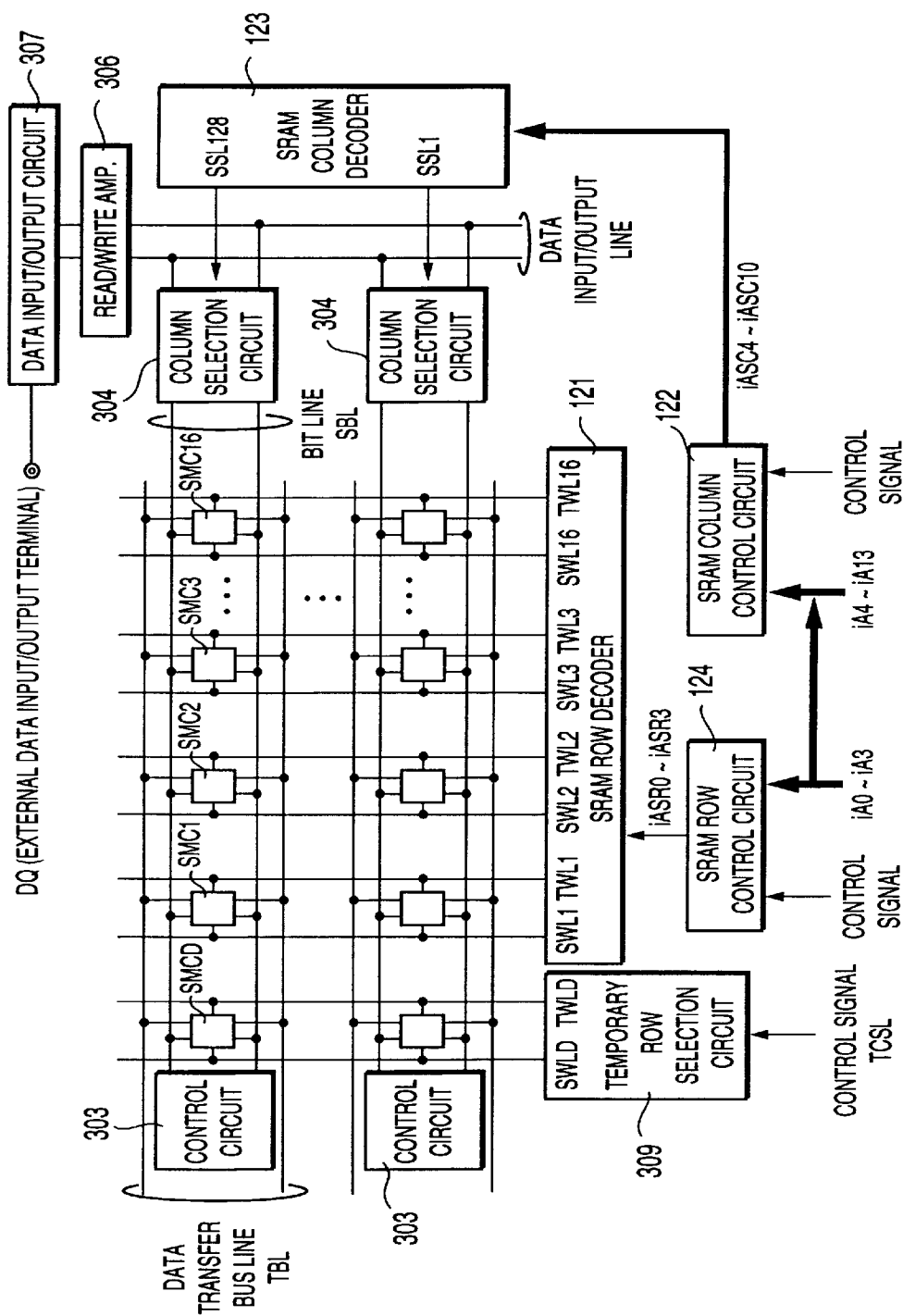
FIG. 85 shows a concrete example of construction of the SRAM array portion realizing a temporary cell transfer function.

In the construction of the SRAM array portion shown in FIG. 68, when there is data in the assigned SRAM cell and the data is newly read by performing a data transfer (prefetch transfer operation) from a DRAM cell of another row, the data written in the SRAM cell is read by temporarily transferring the data to the DRAM (restore transfer operation) and then performing a data transfer from a DRAM of another row (prefetch transfer operation). Depicting the cycle time of data transfer to the DRAM cell as tRC and a time from the data transfer from the DRAM cell to the DRAM cell (prefetch transfer operation) to the read-out of the data of the SRAM cell as tRAC, it takes a time tRC+tRAC to complete the data read. However, it is possible to read the data at higher speed by providing the following function. FIG. 85 shows an example of concrete construction of an SRAM array portion which realizes the function.

In FIG. 85, the construction is substantially the same as that shown in FIG. 68 except that the construction shown in FIG. 85 includes additionally one row of temporary SRAM cells and a selector circuit 309 for selecting temporary cell row by a control signal TCSL. The control signal TCSL is one of the transfer control signals generated by the operation control circuit shown in FIG. 54 and is generated when a data transfer to the temporary cell is performed. Instead thereof, it is possible to construct the SRAM array such that one of the existing SRAM cell rows can be selected as the temporary SRAM cell row or to add a plurality of temporary SRAM cell rows.

Figure 86:
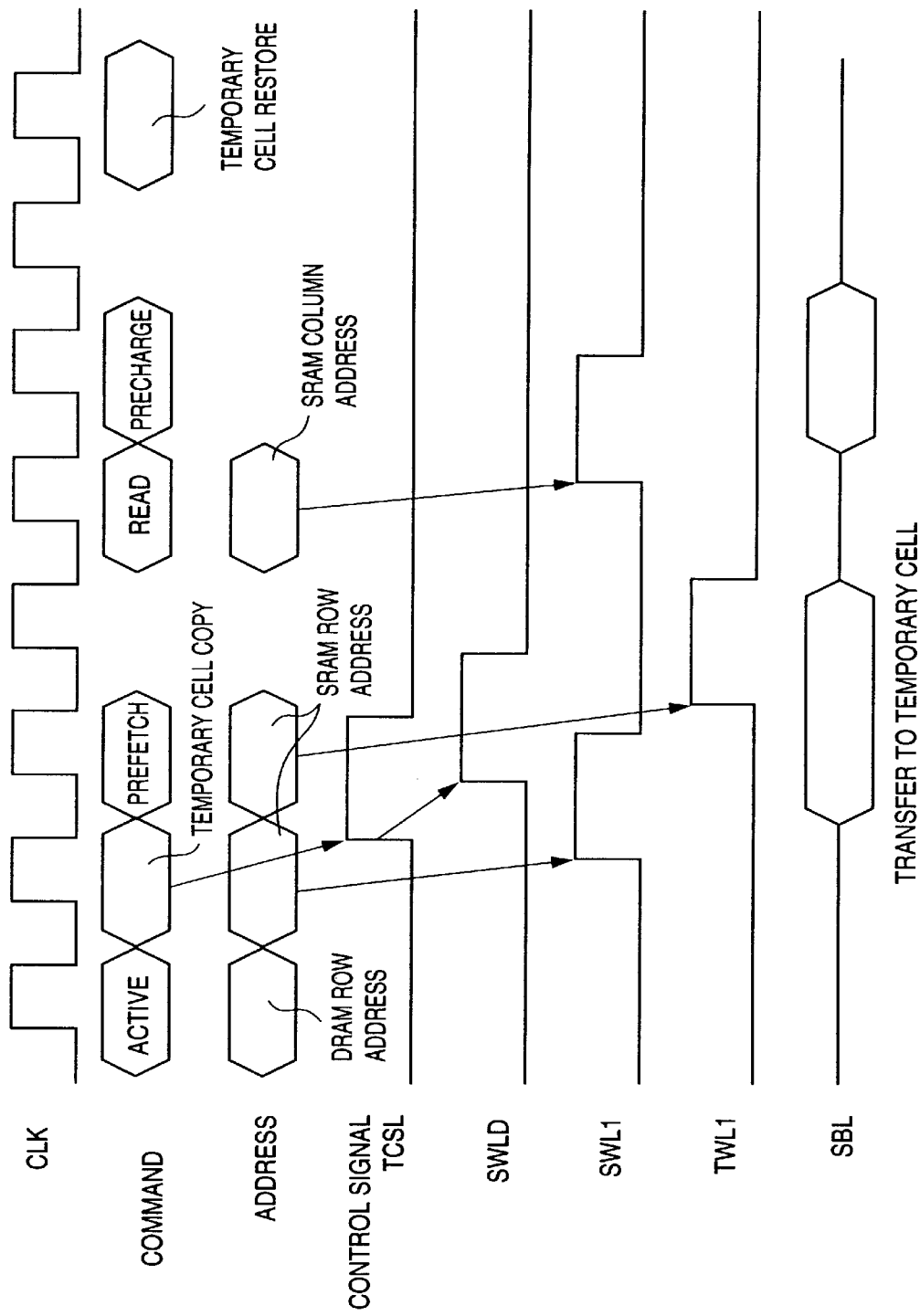
FIG. 86 shows signal waveforms showing an operation of the SRAM cell when, in FIG. 85, data of the SRAM cell is read out by performing the temporary cell transfer.

An example of operation when, in FIG. 85, data of the SRAM cells is read by transferring (copying) data of memory cells of one row including the memory cell SMC1 to memory cells of one row including a temporary memory cell SMCD and transferring (prefetching) data from the DRAM cells to the cells of one row including the memory cell SMC1 will be described with reference to FIG. 86.

First, an active command is input to select a certain DRAM cell row having data to be read out. Then, when a newly added command (temporary cell copy command) for transfer of data to the temporary SRAM cells is input, the control signal TCSL is activated. the SRAM cell read/write row selection signal SWL1 is activated by an SRAM row address which is input simultaneously with the command and to which the data is transferred, and the data of the cells of one row including the memory cell SMC1 is transmitted to the respective SRAM bit lines. Thereafter, the SRAM temporary cell read/write row selection signal SWLD is activated by the control signal TCSL, and the data of the respective bit lines are transmitted to the temporary cells of one row including the temporary memory cell SMCD to rewrite the cell data. This operation is the same as the operation for copying the cell data of a certain one row of the SRAM cell array described in the term of [Function 1]. With this operation, it is possible to temporarily store the cell data to be transferred to the DRAM. Then, the prefetch command is input to perform a data transfer (prefetch transfer operation) from the DRAM cells to the cells of one row including the memory cell SMC1 to transmit the data to be read out to the SRAM memory cells. Then, the read command is input to read the data from the SRAM cells. As mentioned above, it is possible to remove the time tRC and to read the data for the time tRAC. Thereafter, the data transferred to the temporary cells is transferred (temporary cell restore transfer operation) to the DRAM.

[Function 3: Simultaneous Transfer of Plural Rows]

The semiconductor memory device according to the present invention can have a function of transferring same data by simultaneously selecting SRAM cell groups of a plurality of rows when the data of cell groups in a selected row of a DRAM is transferred to the SRAM portion.

This function can be added by a simple circuit. In FIG. 68, it is enough to activate a plurality of SRAM cell data transfer row selection signals TWL by adding a control signal to be generated by a newly added command for executing the above function to the SRAM row control circuit 124 and controlling the SRAM internal row address signal by the control signal.

[Function 4: Auto Successive Prefetch/Restore Transfer]

When, among data of DRAM cells of a selected row, data of DRAM cell groups selected by the DRAM column decoder is transferred to the SRAM portion, the semiconductor memory device may have a function of reducing a total time of data transfer by not repeating the data transfer by a plurality of commands but successively repeating the transfer operation with interval corresponding to a predetermined in-chip delay time by one command.

Figure 87:
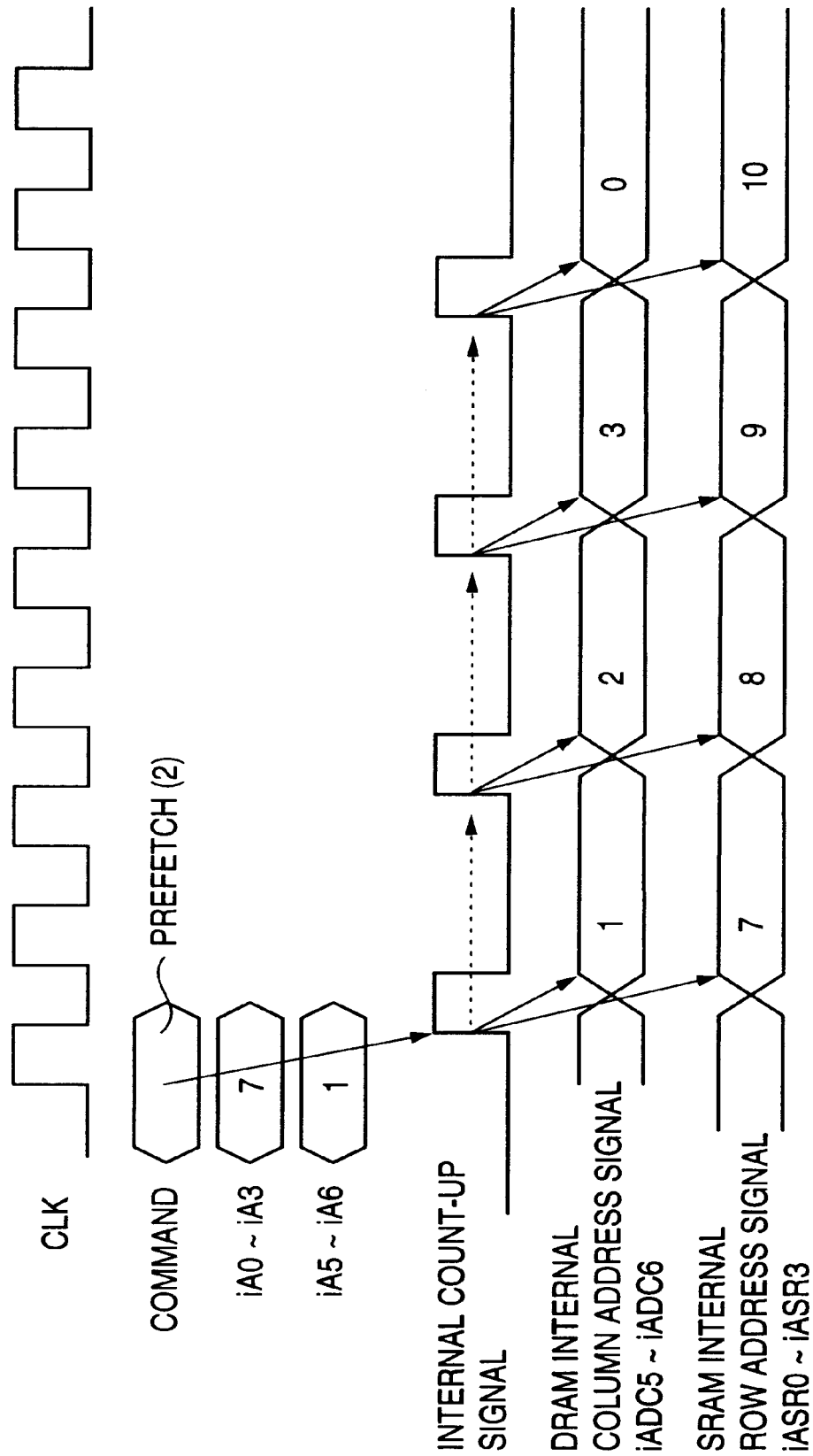
FIG. 87 shows signal waveforms showing an auto successive prefetch transfer function.

FIG. 87 shows an example of an internal operation related to this function. In this description, it is assumed that the DRAM cells in one row are divided to four DRAM cell groups by the DRAM column decoder. However, the DRAM cells can be divided to any number of DRAM cell groups.

In FIG. 87, when the newly added command (prefetch (2) command) defining this function is input, four internal count-up signals are generated successively with the interval corresponding to the predetermined delay time in the chip. The DRAM column control circuit for generating the internal column address signal and the SRAM row control circuit for generating the SRAM internal row address signal are provided with counter circuits, respectively. The DRAM column address and the SRAM row address, which are input simultaneously with the input of the command, are taken in by an initial internal count-up signal and the respective addresses are counted up sequentially by the succeeding internal count-up signals. The respective data are transferred in the cycle of the four internal count-up signals.

Similarly, when data of a plurality of SRAM cell groups is transferred to a plurality of DRAM cell groups selected by the DRAM row decoder and the DRAM column decoder, the semiconductor memory device may have a function of transferring the plurality of the DRAM cell groups, respectively, by not repeating the data transfer by a plurality of commands but successively repeating the transfer operation with interval corresponding to a predetermined in-chip delay time by one command. This function can be realized similarly to the preceding function, by generating internal count-up signals successively with the interval corresponding to the predetermined delay time in the chip and providing counter circuits in the DRAM column control circuit for generating the internal column address signal and the SRAM row control circuit for generating the SRAM internal row address signal, respectively.

[Function 5: Plural Row Successive Read/Write]

The semiconductor memory device according to the present invention may have a function of reading/writing all data of SRAM cell groups of a plurality of rows according to a sequence predetermined for the SRAM cell groups of the plurality of rows successively with a predetermined interval by one command.

With such function, when, for example, data of cells of one row of a DRAM is held in a plurality of SRAM cell groups, it becomes possible to successively read/write all cell data of one row of the DRAM in a predetermined sequence, so that the load of the memory controller and/or chip set for controlling the semiconductor memory device is reduced and the operation of the latter together with other SRAM cell groups and the DRAM portion becomes possible. Further, it is possible to provide other effects when this function is used together with the function 4.

Figure 88:
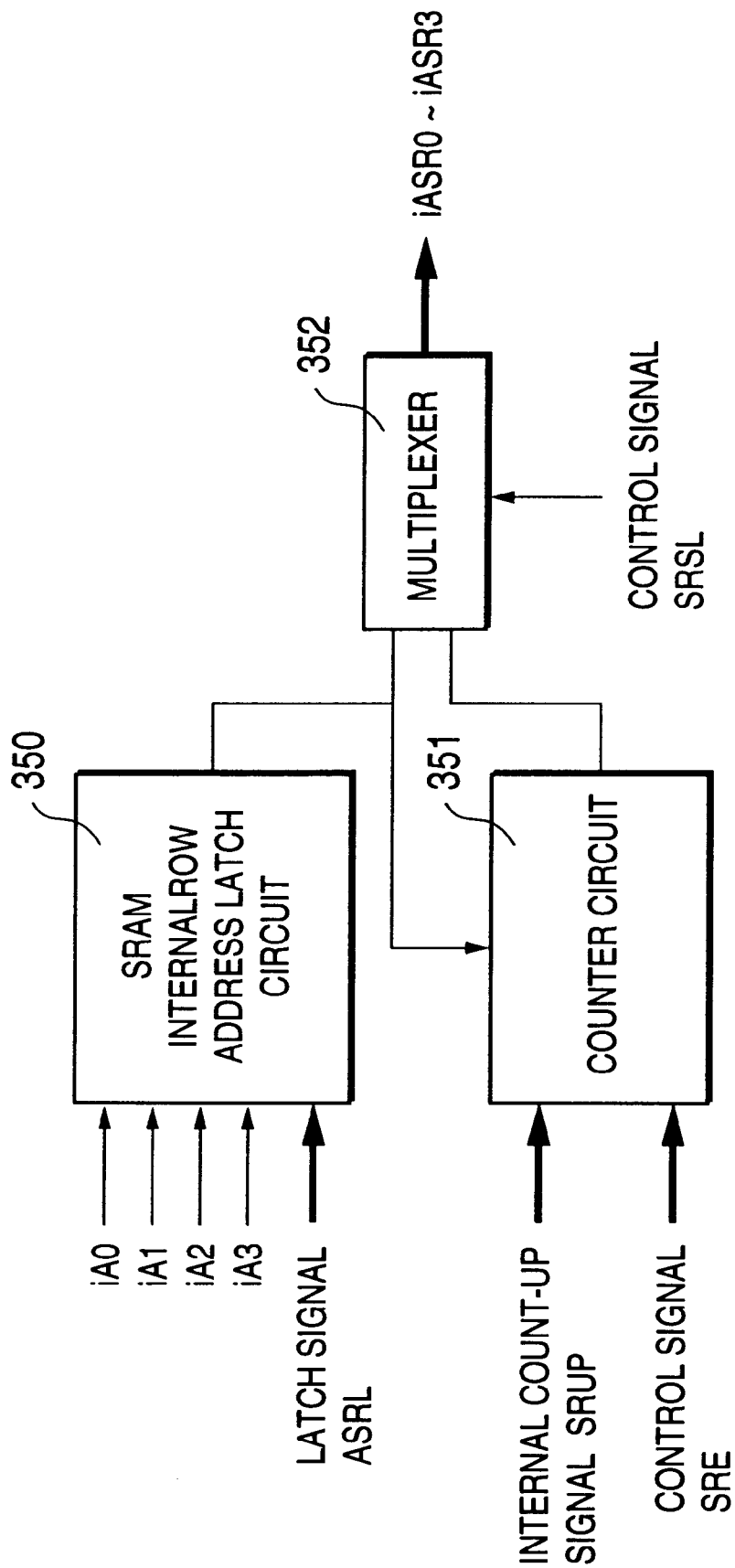
FIG. 88 shows a concrete example of the SRAM line control circuit for realizing a plural line successive read/write function.

FIG. 88 shows an example of concrete construction of an SRAM row control circuit for realizing this function.

In FIG. 88, this SRAM row control circuit is constructed by adding a counter circuit 351 for taking in the output of the SRAM internal row address latch circuit 350 shown in FIG. 74 by a control signal SRE and counting up the output in a predetermined address sequence by an internal count-up signal SRUP generated when the SRAM column address becomes the uppermost address and a multiplexer 352 for passing either one of the outputs of the latch circuit 350 and the counter circuit 351 to the SRAM internal row address latch circuit 350. The multiplexer 352 is controlled by a control signal SRSL such that it selects the output of the latch circuit 350 in the clock cycle at the input of the read/write command and outputs the SRAM internal row address signal as fast as possible. The SRAM column control circuit has a function of sequentially shifting up from the taken column address to the uppermost address when the newly added command defining this function is input to the counter circuit 506 shown in FIG. 75.

Figure 89:
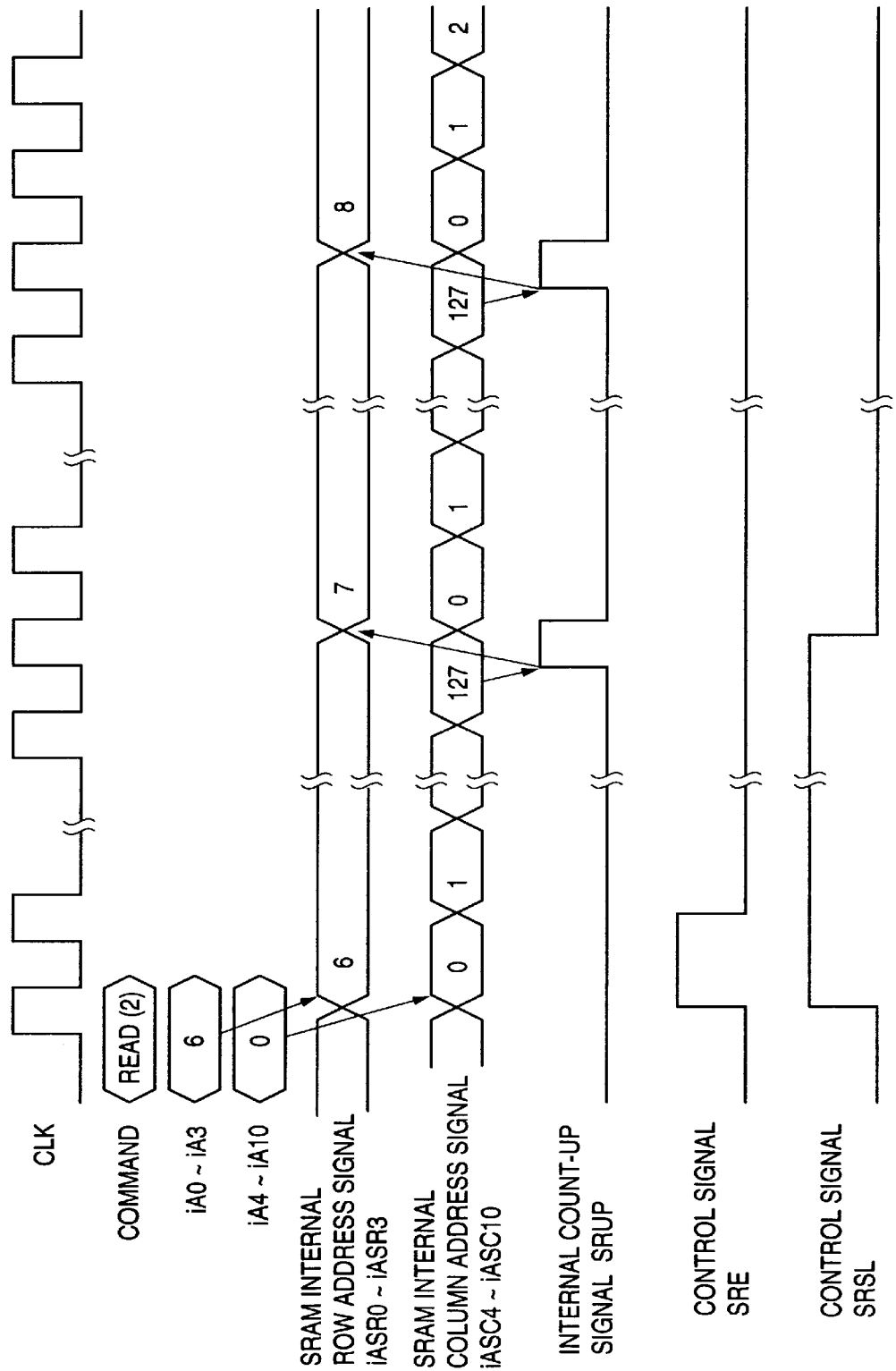
FIG. 89 shows a concrete example of a read out function of the plural row successive read/write function.

FIG. 89 shows an example of internal operation of a read function of this function.

In FIG. 89, when a newly added command (read (2) command) defining this function is input, the control signal SRSL is generated and the output of the SRAM internal row address latch circuit 350 becomes the SRAM internal row address iASR0 to iASR3 by the multiplexer 352 and is taken in the counter circuit 351 by the control signal SRE. Thereafter, the column address is incremented in synchronism with the reference clock signal CLK and the counter 351 increments the row address by the internal count-up signal SRUP generated when the count becomes the uppermost address. After the count becomes the uppermost address, the multiplexer 352 is controlled by the control signal SRSL and the output of the counter circuit 351 becomes the SRAM internal row address iASR0 to iASR3. Thus, it is possible to successively read all data of the SRAM cell groups of a plurality of rows by shifting the row and column addresses sequentially.

The internal count-up signal SRUP, the control signal SRE and the control signal SRSL are SRAM portion control signals generated by the operation control circuit shown in FIG. 54.

[Function 6: Real Time Mode Setting]

The semiconductor memory device according to the present invention may have a function of setting the data input/output modes such as burst length, data input/output address sequence and latency, etc., simultaneously with a read/write command input when read/write operation is performed with respect to the SRAM cell by an input of the command.

With such function, it is possible to substantially reduce the load of the memory controller and chip set for controlling the semiconductor memory device of the present invention and improve the system performance since it is possible to assign different data input/output modes at once every time of requests of such modes.

FIG. 90 shows a correspondence table between read(3)/write (3) commands according to this function and the states of respective input terminals. The table shown in FIG. 90 differs from the table shown in FIG. 10 in that burst length selection is assigned to address terminals A11, A12 and A13 which are not used at the time of read/write command input. Thus, according to the states of the 3-bit address terminals, it is possible to select/assign the burst length shown in FIG. 26 simultaneously with the read (3)/write (3) command input. Although the burst length selection is assigned in this embodiment, it is possible to assign the data input/output modes such as data input/output address sequence, latency, etc., in the similar manner.

Figure 91:
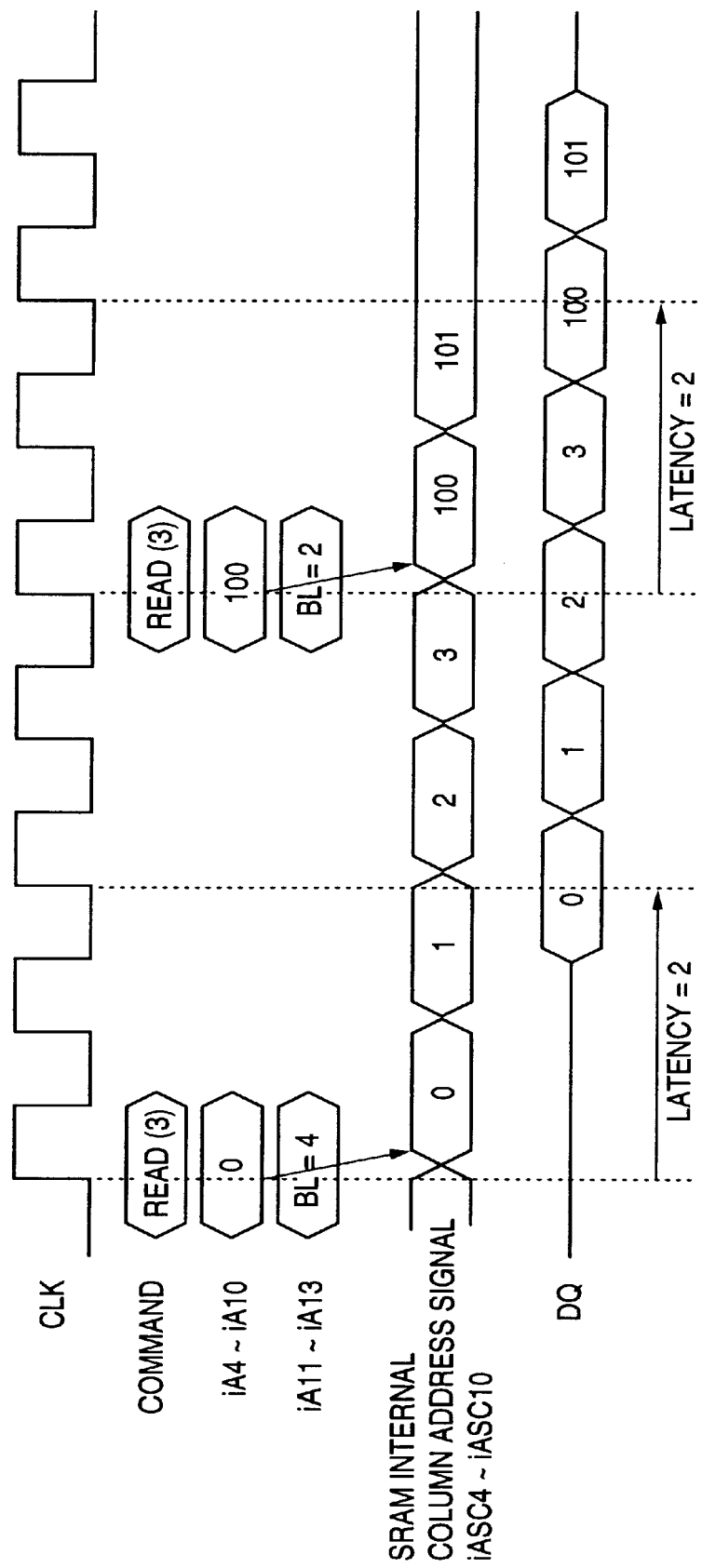
FIG. 91 shows signal waveforms showing the real time mode setting function.
Figure 92:
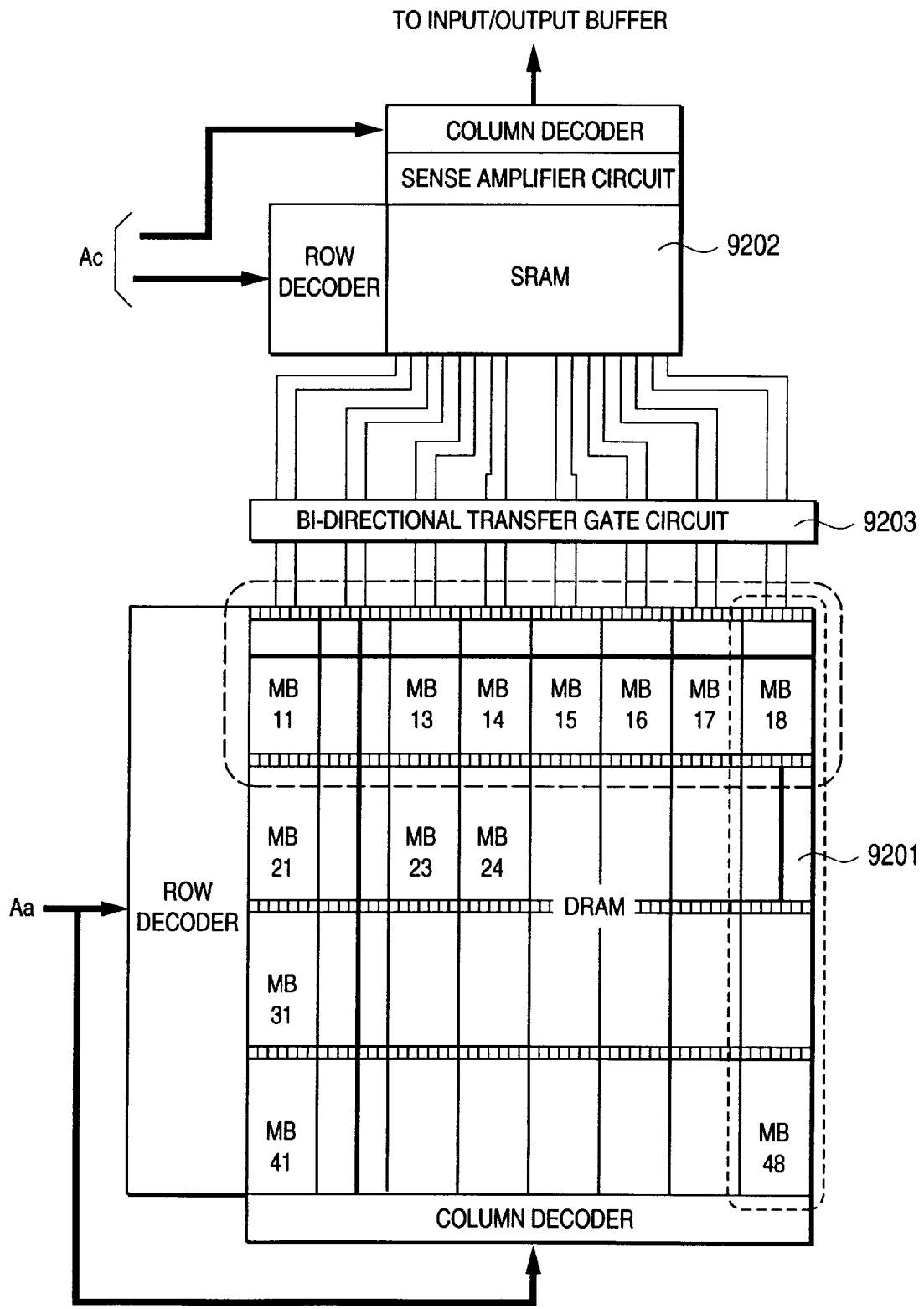
FIG. 92 schematically shows a construction of a memory array portion of a CDRAM.
Figure 93:
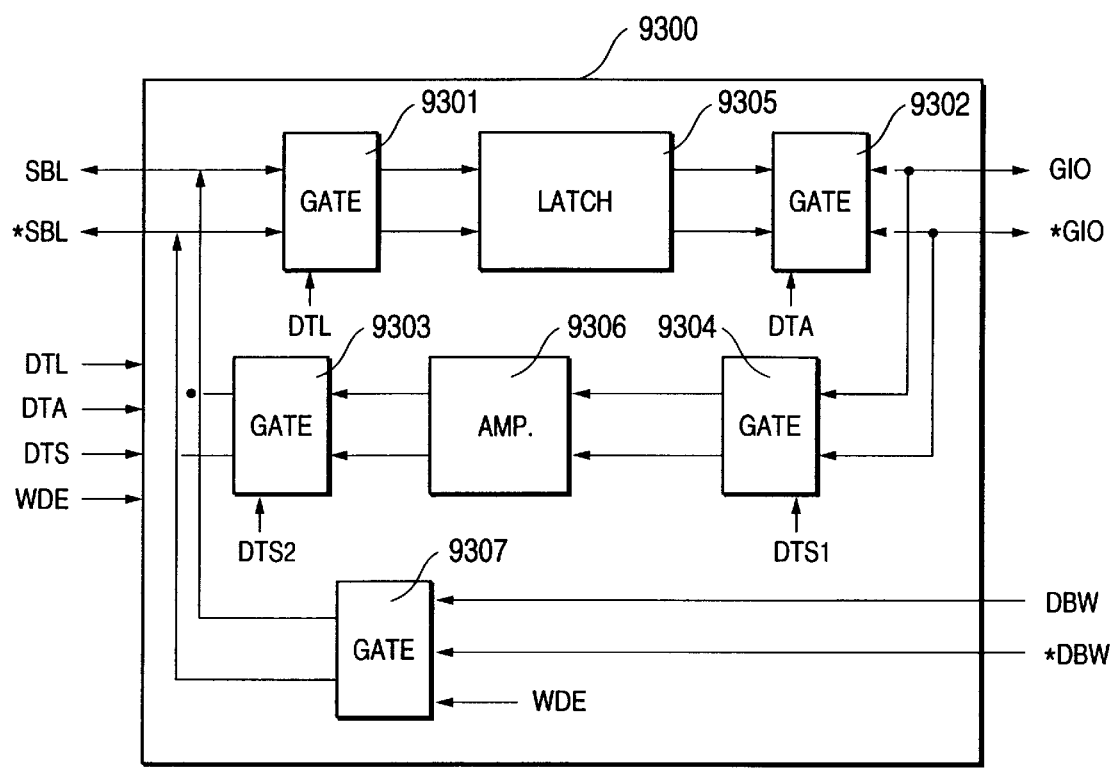
FIG. 93 is a block diagram of a bi-directional transfer gate circuit of the CDRAM shown in FIG. 92.
Figure 94:
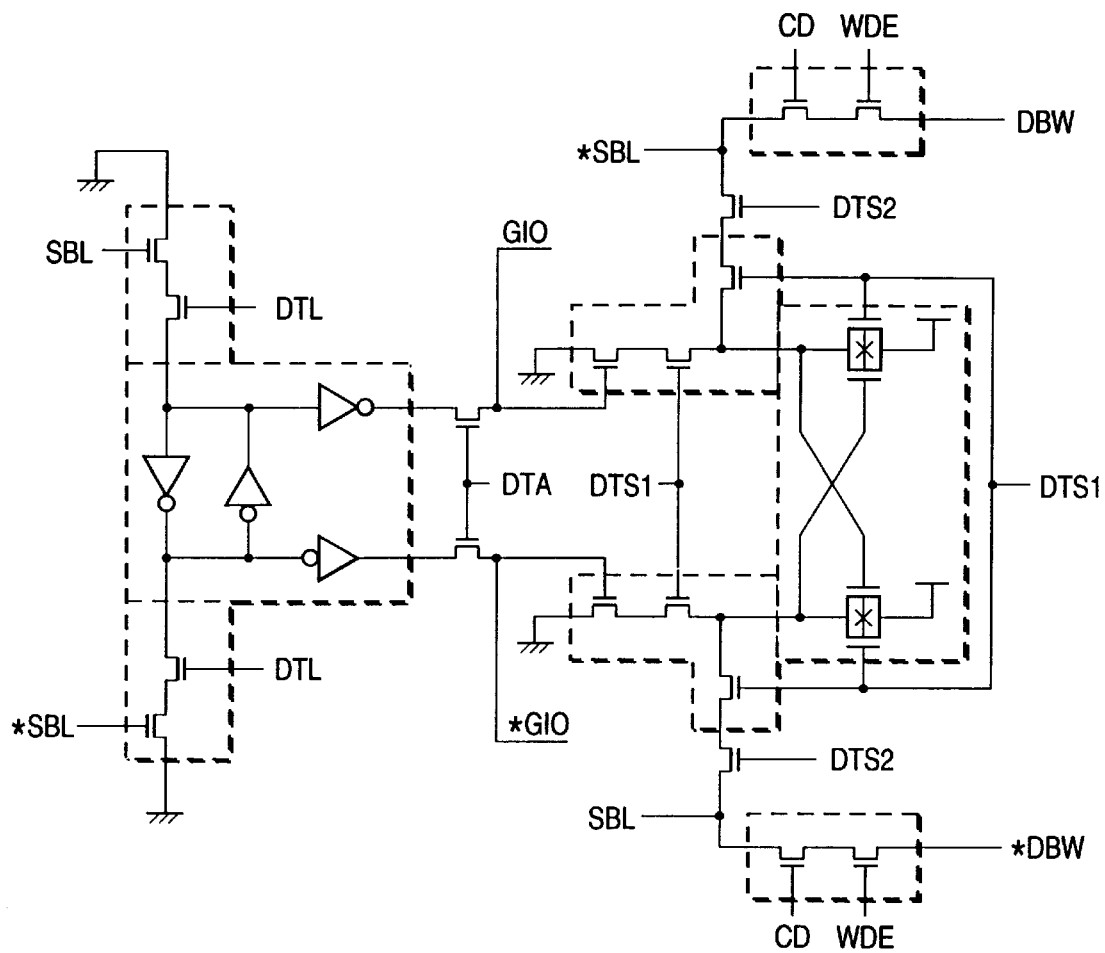
FIG. 94 is a circuit diagram of the CDRAM bi-directional transfer gate circuit shown in FIG. 92.
Figure 95:
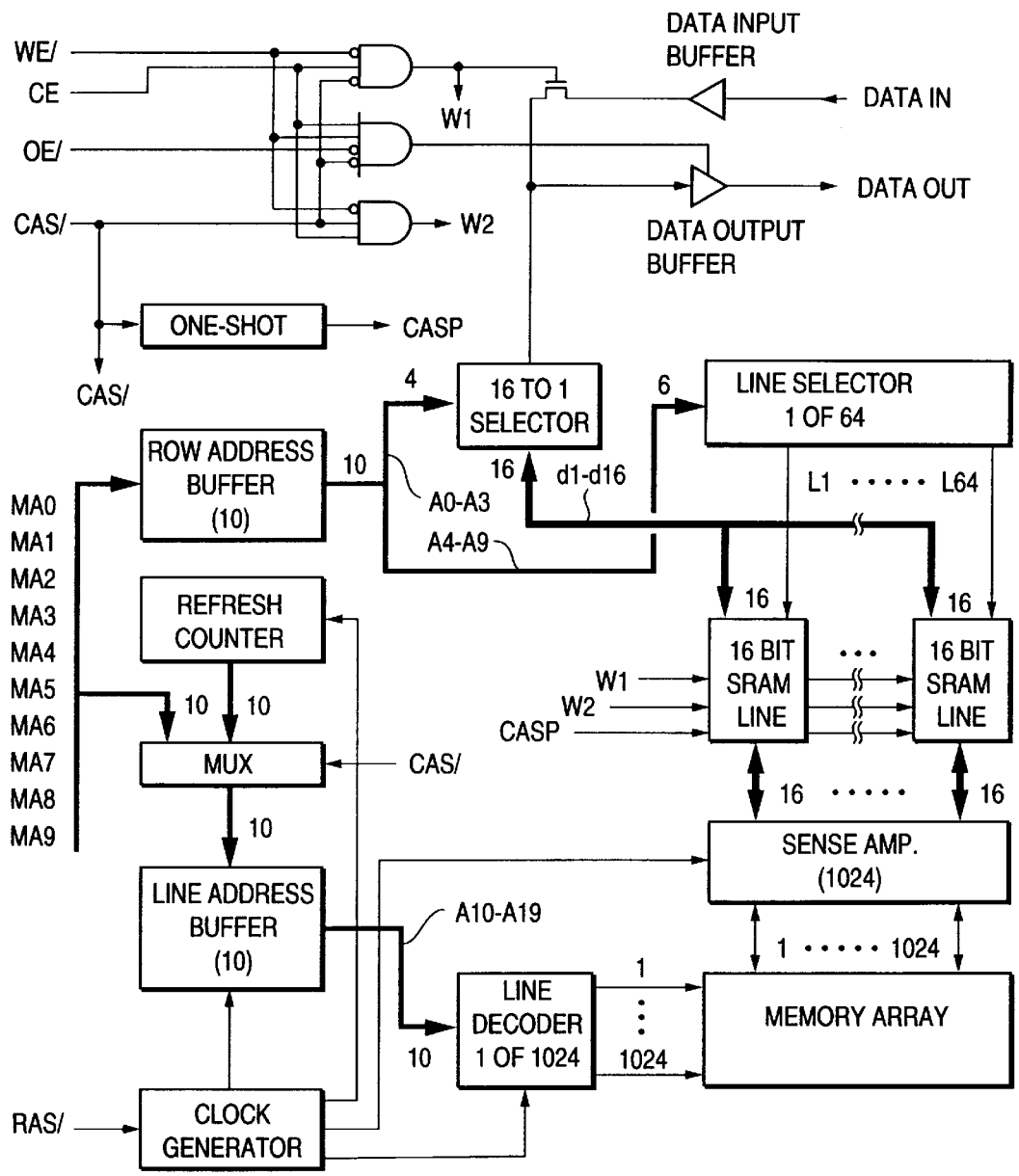
FIG. 95 is a block diagram schematically showing the CDRAM.
Figure 96:
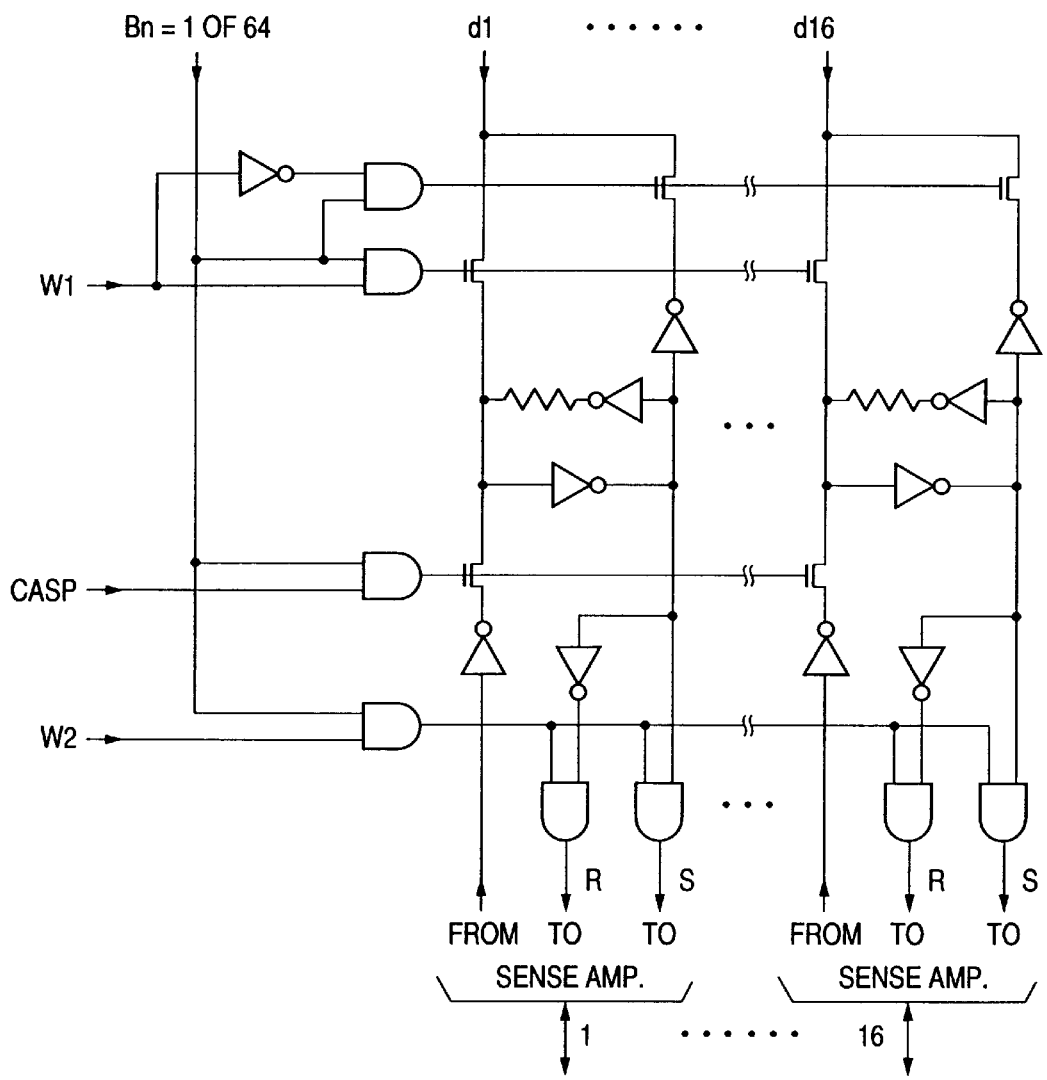
FIG. 96 is a circuit diagram of the SRAM of the CDRAM shown in FIG. 95.
Figure 97:
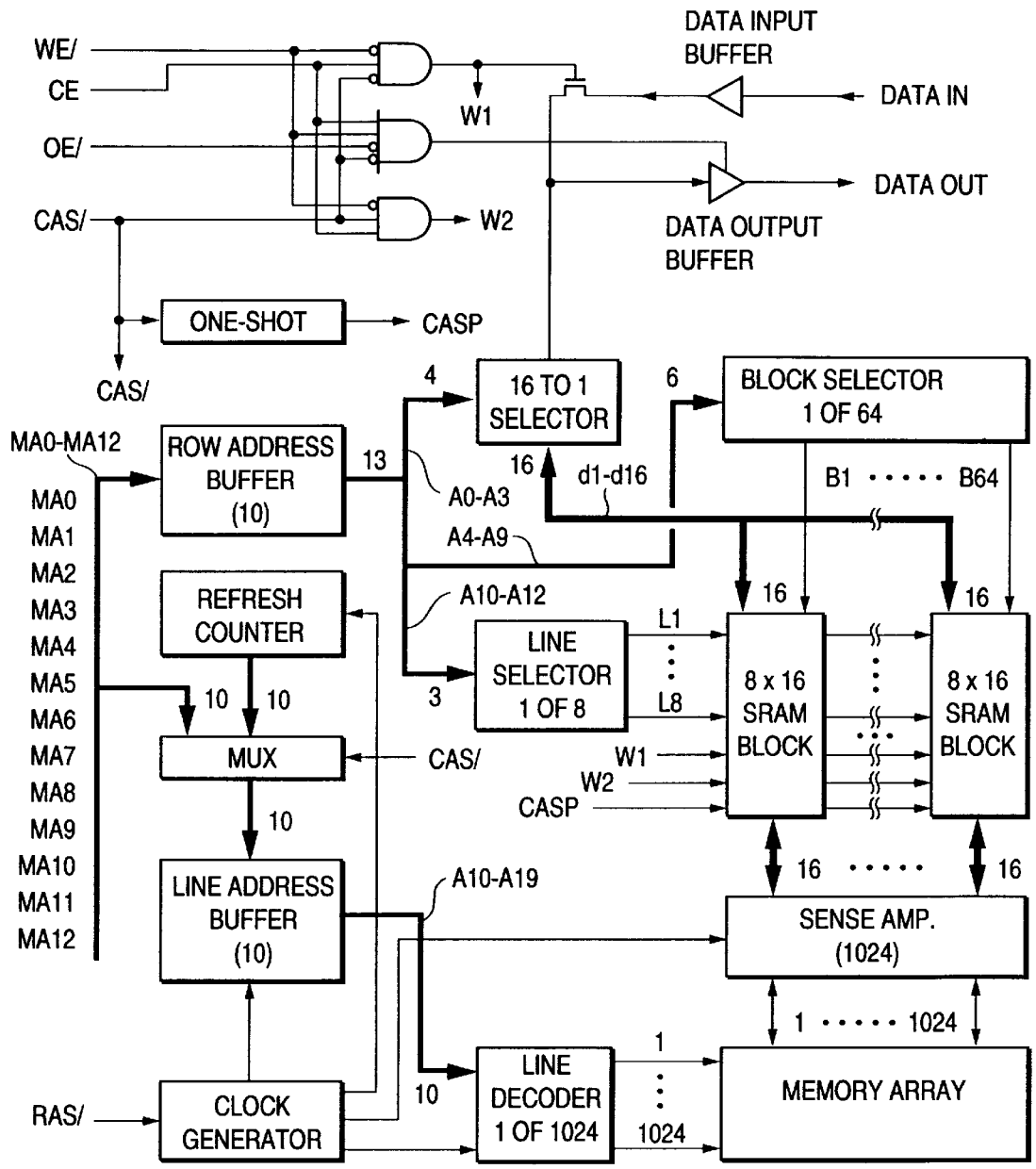
FIG. 97 is a block diagram schematically showing a construction of the CDRAM.
Figure 98:
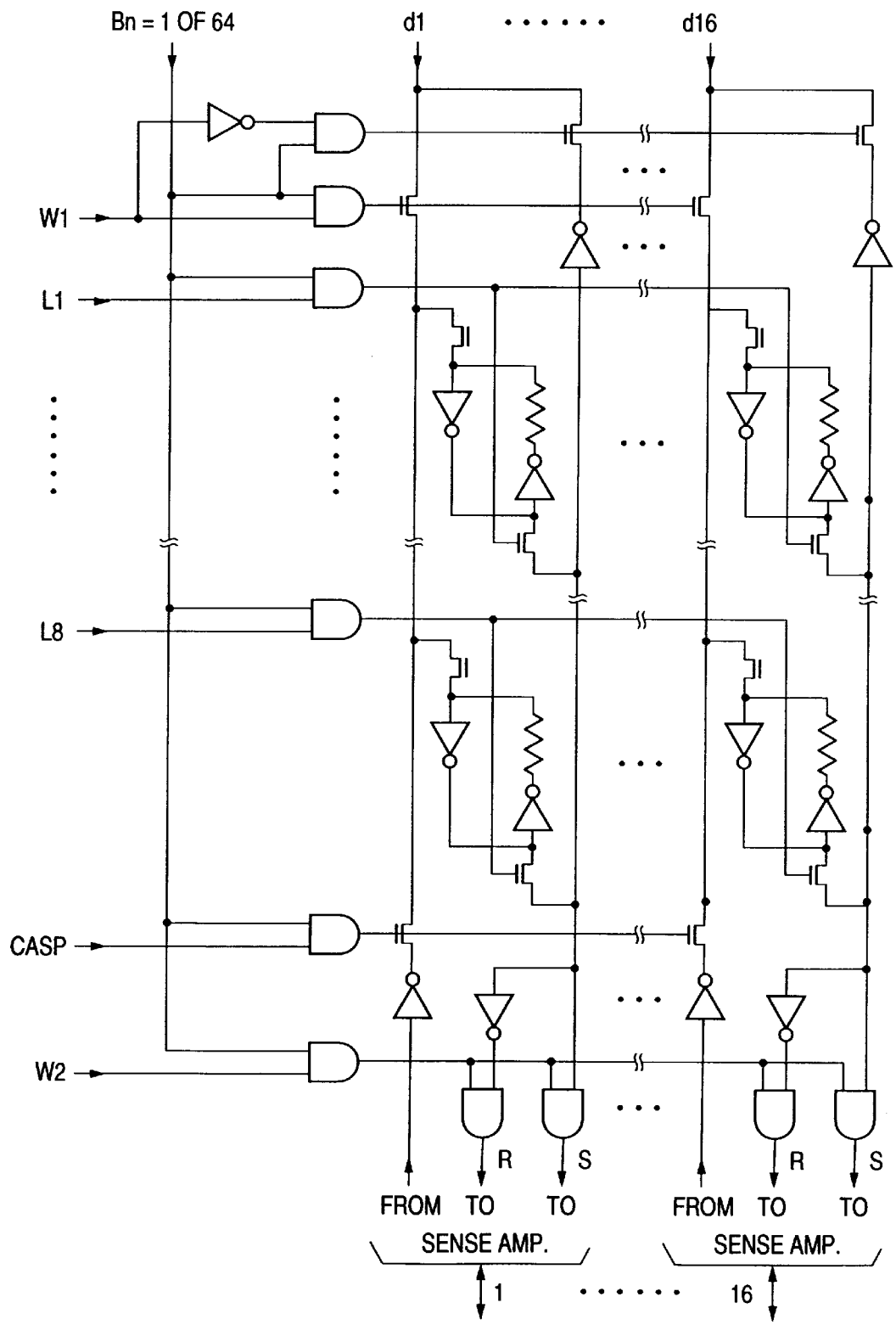
FIG. 98 is a circuit diagram of the SRAM block of the CDRAM shown in FIG. 97.
Figure 99:
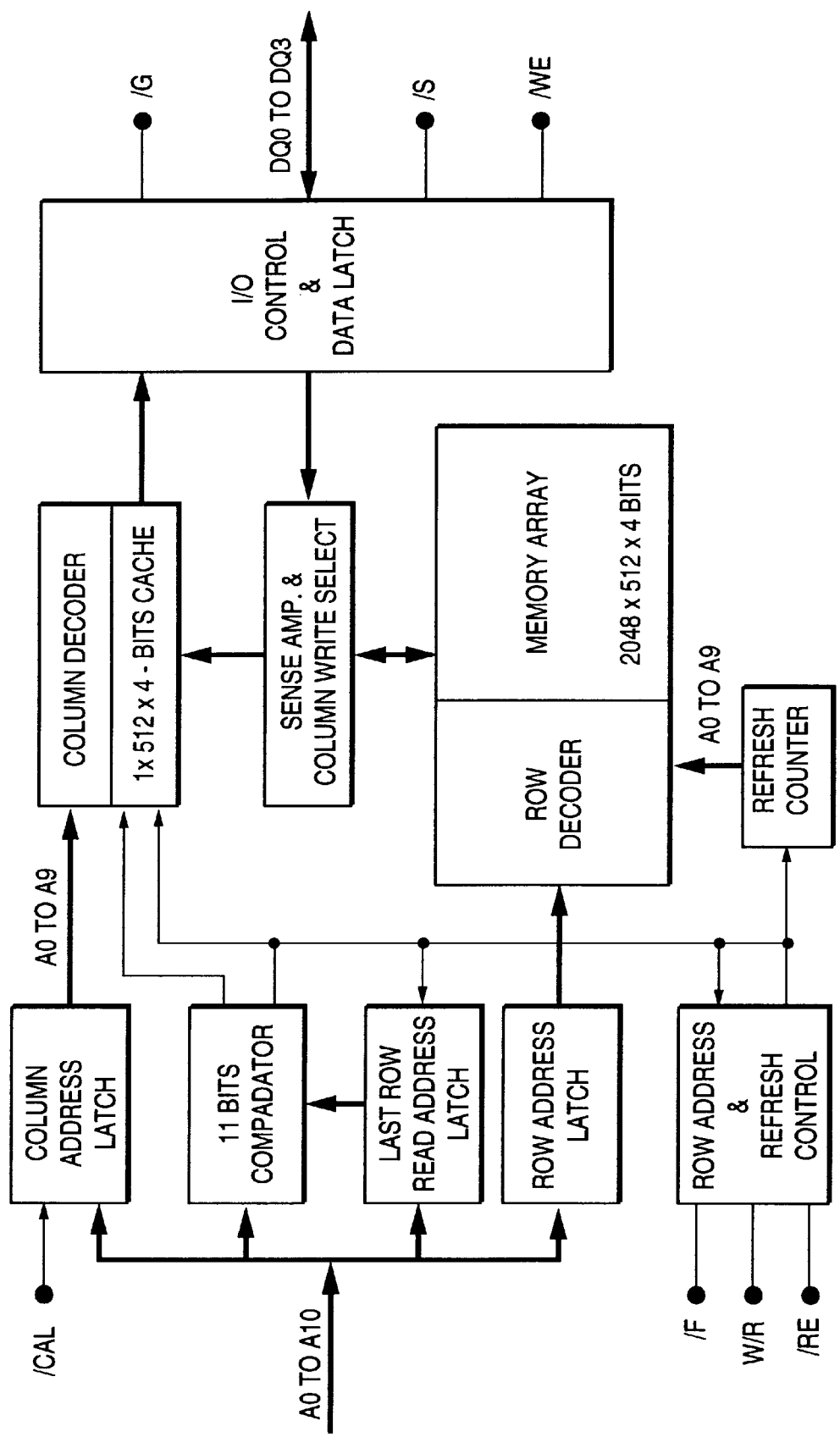
FIG. 99 is a block diagram schematically showing a construction of an EDRAM.
Figure 100:
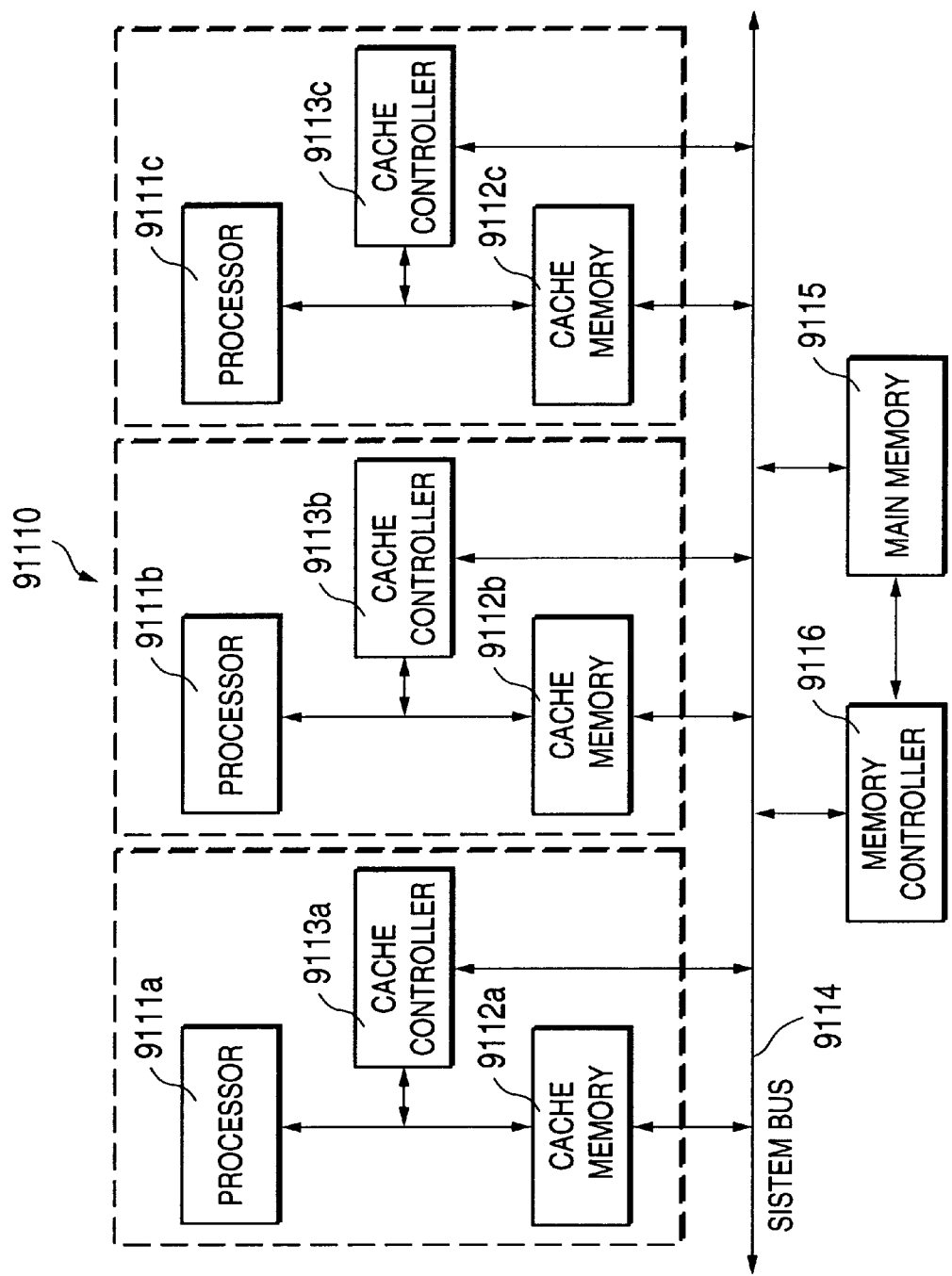
FIG. 100 is a block diagram schematically showing a construction of the memory system having a plurality of processing devices.

FIG. 91 shows an example of operation when this function is used. In FIG. 91, the data input/output address sequence is set to sequential and the latency is set to 2 and the burst length is changed by the address signals A11 to A13 (internal address signal iA11 to iA13) at the read (3) command input. This can be realized by controlling the counter circuit in the SRAM column control circuit shown in FIG. 75 according to the setting of the burst length and controlling the SRAM internal column address iASC4 to iASC10, as in the usual SDRAM.

[Function 7: Auto Restore/Prefetch Transfer]

Further, the semiconductor memory device according to the present invention may have a function of transferring, after data is transferred from a DRAM cell group to an SRAM cell group, data of another SRAM cell group to the DRAM cell group. In order to realize this function, it is enough to internally hold the DRAM row address and the DRAM column address at the data transfer, and, therefore, it is possible to realize the function by using the DRAM internal row address latch circuit shown in FIG. 60 and the DRAM internal column address latch circuit shown in FIG. 61. Further, by providing such latch circuits every bank, an alternate access of different banks becomes possible. Therefore, there is no need of assigning the DRAM row address and the DRAM column address at the restore transfer operation and an effective time required for the restore operation is shortened, so that the control in the memory controller and chip set for controlling the semiconductor memory device becomes simple, the load is reduced and the system performance is improved.

Completely similarly thereto, the semiconductor memory device according to the present invention may have a function of transferring, after data is transferred from a DRAM cell group to an SRAM cell group, data of another DRAM cell group to the SRAM cell group.

According to the present invention, in a system including a plurality of processing devices (memory masters), it is possible to obtain a semiconductor integrated circuit device having a main memory portion and a sub memory portion capable of being assigned corresponding to a plurality of access requests in order to increase an operation speed of the whole system without reducing the cache hit even when there are access requests from a plurality of memory masters.

What is claimed is:

1. A semiconductor memory device comprising a main memory portion constructed with memory cells arranged in a plurality of rows and in a plurality of columns, a sub memory portion constructed with a plurality of memory cells arranged in a plurality of rows and in a plurality of columns and a bi-directional data transfer circuit for connecting said main memory portion and said sub memory portion through data transfer bus lines, respectively, wherein said data transfer bus lines in a memory cell area of said main memory portion are arranged in parallel to bit lines in a column direction and connected to said bit lines through a column selection circuit.

2. A semiconductor memory device as claimed in claim 1, wherein a signal wiring for controlling said column selection circuit are perpendicular to said data transfer bus lines.

3. A semiconductor memory device comprising a main memory portion constructed with memory cells arranged in a plurality of rows and in a plurality of columns, a sub memory portion constructed with a plurality of memory cells arranged in a plurality of rows and in a plurality of columns and a bi-directional data transfer circuit for connecting said main memory portion and said sub memory portion through data transfer bus lines, respectively, wherein said main memory portion is constituted with a plurality of memory cell arrays, said data transfer bus lines are provided every memory cell array and selection circuits provided between said data transfer bus lines and said memory cell arrays of said sub memory portion, respectively, said selection circuits being controlled by selection signals of said memory cell arrays.

4. A semiconductor memory device as claimed in claim 3, wherein said main memory portion is constructed with a plurality of memory cell arrays, said sub memory portion is provided between at least two said memory cell arrays and said data transfer bus lines are selected by selector circuits provided on both sides of said sub memory portion and controlled by selection signals of said memory cell arrays.

5. A semiconductor memory device as claimed in claim 3, wherein the plurality of said memory cell arrays belong to different banks.

6. A semiconductor memory device as claimed in claim 5, wherein said semiconductor memory device has a function of, even when a data transfer bus line connecting one of said banks and said sub memory portion is selected and a data transfer operation is being performed, making a next transfer data in a waiting state in the other of said bank and in a non-selected data transfer bus line.

7. A semiconductor memory device as claimed in claim 1, wherein said data transfer bus lines are formed in at least two wiring layers.

8. A semiconductor memory device as claimed in claim 1, wherein said sub memory portion is constructed with static memory cells having dual ports, a memory node of said memory cell is connected to said data transfer bus line through a first connecting circuit and said memory node is connected to a bus line connecting said sub memory portion and an input/output circuit through a second connecting circuit.

9. A semiconductor memory device as claimed in claim 8, wherein said data transfer bus line connected to said sub memory portion and said bus line connecting said sub memory portion and said input/output circuit are arranged in parallel in a sub memory portion area.

10. A semiconductor memory device as claimed in claim 1, wherein said main memory portion has a construction in which data transfer is performed between a plurality of said memory cell groups of said sub memory portion with $1/n$ ($n=2^m$, is an integer equal to or large than 1) of data of one row as transfer unit, and said bit lines of the data transfer unit of said main memory portion have a construction in which n lines ior n pairs of lines having different data transfer units or n sets each including identical input/outputdata are arranged continuously.

* * * * *